US012350787B2

(12) United States Patent
Yamaguchi et al.

(10) Patent No.: US 12,350,787 B2
(45) Date of Patent: Jul. 8, 2025

(54) SUBSTRATE PROCESSING APPARATUS

(71) Applicant: EBARA CORPORATION, Tokyo (JP)

(72) Inventors: Kuniaki Yamaguchi, Tokyo (JP); Itsuki Kobata, Tokyo (JP); Toshio Mizuno, Tokyo (JP); Mitsuru Miyazaki, Tokyo (JP); Naoki Toyomura, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 18/347,464

(22) Filed: Jul. 5, 2023

(65) Prior Publication Data

US 2023/0405762 A1    Dec. 21, 2023

Related U.S. Application Data

(60) Division of application No. 16/228,525, filed on Dec. 20, 2018, now Pat. No. 11,731,240, which is a
(Continued)

(30) Foreign Application Priority Data

Aug. 26, 2014  (JP) ................................. 2014-171837
Aug. 26, 2014  (JP) ................................. 2014-171841
(Continued)

(51) Int. Cl.
*B24B 1/00*    (2006.01)
*B08B 1/32*    (2024.01)
(Continued)

(52) U.S. Cl.
CPC .............. *B24B 53/017* (2013.01); *B08B 1/32* (2024.01); *B08B 3/02* (2013.01);
(Continued)

(58) Field of Classification Search
None
See application file for complete search history.

(56) References Cited

U.S. PATENT DOCUMENTS 4,401,699 A    8/1983  Baskett
5,487,629 A    1/1996  Watanabe
(Continued)

FOREIGN PATENT DOCUMENTS

EP    0764478 A1    3/1997
EP    1738871 A1    1/2007
(Continued)

OTHER PUBLICATIONS

Translation of JP2007158190 by Asada, dated Jun. 21, 2007.*
(Continued)

*Primary Examiner* — Eric W Golightly
*Assistant Examiner* — Ryan L Coleman
(74) *Attorney, Agent, or Firm* — BakerHostetler

(57) ABSTRACT

An embodiment of the present invention provides a buff process module. The buff process module includes: a buff table on which a processing target object is mounted; a buff head that holds a buff pad for applying a predetermined process to the processing target object; a buff arm that supports and swings the buff head; a dresser for dressing the buff pad; and a cleaning mechanism that is disposed between the buff table and the dresser and is for cleaning the buff pad.

9 Claims, 57 Drawing Sheets

Related U.S. Application Data continuation of application No. 15/604,328, filed on May 24, 2017, now Pat. No. 10,201,888, which is a division of application No. 14/832,767, filed on Aug. 21, 2015, now Pat. No. 9,700,988.

(30) Foreign Application Priority Data

| Sep. 11, 2014 | (JP) | 2014-185489 |
|---|---|---|
| Sep. 11, 2014 | (JP) | 2014-185508 |
| Sep. 25, 2014 | (JP) | 2014-195584 |
| Dec. 19, 2014 | (JP) | 2014-257563 |

(51) Int. Cl.
  *B08B 3/02* (2006.01)
  *B24B 53/017* (2012.01)
  *H01L 21/67* (2006.01)

(52) U.S. Cl.
  CPC .. *H01L 21/67046* (2013.01); *H01L 21/67051* (2013.01); *B08B 2203/0288* (2013.01)

(56) References Cited

U.S. PATENT DOCUMENTS

| | | | |
|---|---|---|---|
| 5,655,954 A | 8/1997 | Oishi et al. | |
| 5,676,590 A | 10/1997 | Hiraoka | |
| 5,860,181 A | 1/1999 | Maekawa et al. | |
| 5,938,504 A | 8/1999 | Talieh | |
| 5,961,377 A | 10/1999 | Jeong | |
| 5,966,635 A | 10/1999 | Hiatt et al. | |
| 6,227,956 B1 | 5/2001 | Halley | |
| 6,284,092 B1 | 9/2001 | Manfredi | |
| 6,309,279 B1 | 10/2001 | Bowman et al. | |
| 6,340,326 B1 | 1/2002 | Kistler et al. | |
| 6,402,588 B1 | 6/2002 | Matsuo et al. | |
| 6,439,962 B1 | 8/2002 | Ato | |
| 6,488,573 B1 | 12/2002 | Kobayashi et al. | |
| 6,502,273 B1 * | 1/2003 | Mihara | H01L 21/67046 |
| | | | 492/31 |
| 6,547,651 B1 | 4/2003 | Boyd et al. | |
| 6,796,890 B1 | 9/2004 | Goldrick | |
| 6,852,020 B2 | 2/2005 | Petroski et al. | |
| 7,170,190 B1 * | 1/2007 | Treur | B08B 1/32 |
| | | | 134/1.2 |
| 7,234,224 B1 | 6/2007 | Naugler et al. | |
| 7,238,087 B1 | 7/2007 | Kashiwa et al. | |
| 7,910,157 B2 | 3/2011 | Terada et al. | |
| 8,133,097 B2 | 3/2012 | Lin et al. | |
| 9,478,444 B2 | 10/2016 | Lyu et al. | |
| 10,026,760 B2 | 7/2018 | Hamada et al. | |
| 2002/0053358 A1 | 5/2002 | Denda et al. | |
| 2002/0155795 A1 | 10/2002 | Ferra et al. | |
| 2004/0166782 A1 | 8/2004 | Boyd et al. | |
| 2007/0066192 A1 | 3/2007 | Kumahara | |
| 2007/0135024 A1 | 6/2007 | Kobata et al. | |
| 2009/0258588 A1 | 10/2009 | Hsu et al. | |
| 2010/0136884 A1 | 6/2010 | Oh et al. | |
| 2014/0162536 A1 | 6/2014 | Umemoto et al. | |
| 2015/0306637 A1 * | 10/2015 | Zuniga | H01L 21/67046 |
| | | | 15/97.1 |
| 2016/0059380 A1 | 3/2016 | Yamaguchi et al. | |

FOREIGN PATENT DOCUMENTS

| | | | |
|---|---|---|---|
| JP | 01171762 | * | 7/1989 |
| JP | H06-075655 U | | 10/1994 |
| JP | H07-009321 A | | 1/1995 |
| JP | 08-071511 A | | 3/1996 |
| JP | 09-092633 A | | 4/1997 |
| JP | H10-223740 A | | 8/1998 |
| JP | H11333677 | * | 12/1999 |
| JP | 2000-190192 A | | 7/2000 |
| JP | 2000-254855 A | | 9/2000 |
| JP | 2001-135604 A | | 5/2001 |
| JP | 2001-237202 A | | 8/2001 |
| JP | 2002-205257 A | | 7/2002 |
| JP | 2003-045841 A | | 2/2003 |
| JP | 2006-055971 A | | 3/2006 |
| JP | 2006-100607 A | | 4/2006 |
| JP | 2006-344878 A | | 12/2006 |
| JP | 2007-088143 A | | 4/2007 |
| JP | 2007-158190 A | | 6/2007 |
| JP | 2007-189196 A | | 7/2007 |
| JP | 2007-260850 A | | 10/2007 |
| JP | 2007-301661 A | | 11/2007 |
| JP | 2008-036744 A | | 2/2008 |
| JP | 2009-038267 A | | 2/2009 |
| JP | 2010-135524 A | | 6/2010 |
| JP | 2011-031359 A | | 2/2011 |
| JP | 2011-517111 A | | 5/2011 |
| JP | 2014-008538 A | | 1/2014 |
| JP | 2014-111301 A | | 6/2014 |
| JP | 2014-117776 A | | 6/2014 |
| KR | 1998-0065993 A | | 10/1998 |
| KR | 10-0412542 B1 | | 5/2004 |
| KR | 2006-0074572 A | | 7/2006 |
| KR | 2007-0035282 A | | 3/2007 |
| KR | 2011-0016706 A | | 2/2011 |
| KR | 2011-0017671 A | | 2/2011 |

OTHER PUBLICATIONS

Translation of KR20110016706 by Choi, dated Feb. 18, 2011.*
Translation of JPH11333677 by Hiyama, dated Dec. 7, 1999.*
Translation of JP01171762 by Kobayashi, published Jul. 6, 1989.*
Merriam-Webster dictionary definition of "pad".*
Merriam-Webster dictionary definition of "cushion".*
Singapore Patent Application No. 10201906815X; Search Report and Written Opinion; dated May 16, 2023; 8 pages.
Translation of JP2007-158190 by Asada, published Jun. 21, 2007.
Translation of KR2011-0016706 by Choi et al. published Feb. 18, 2011.
Translation of KR2011-0017671 by Choi et al. published Feb. 22, 2011.
Translation of KR2007-0035282 by Jeong, published Mar. 30, 2007.

* cited by examiner

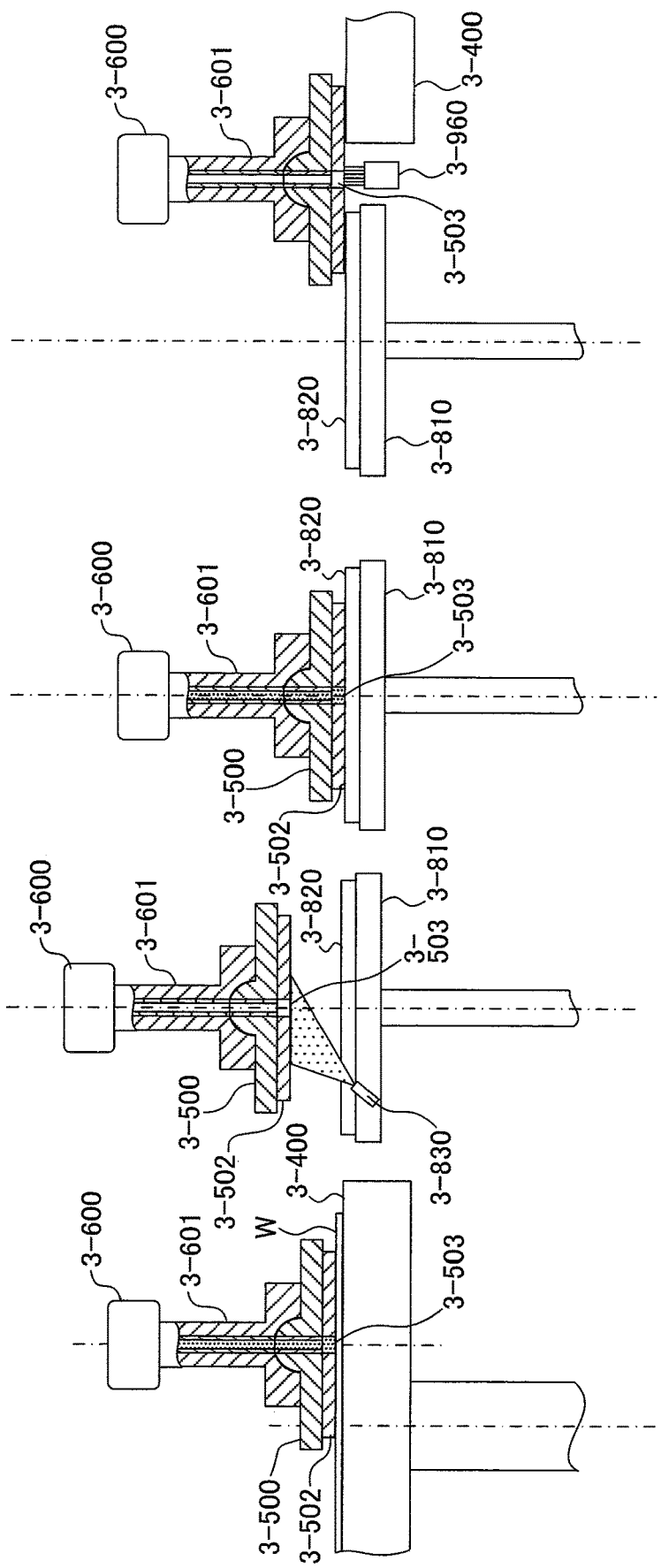

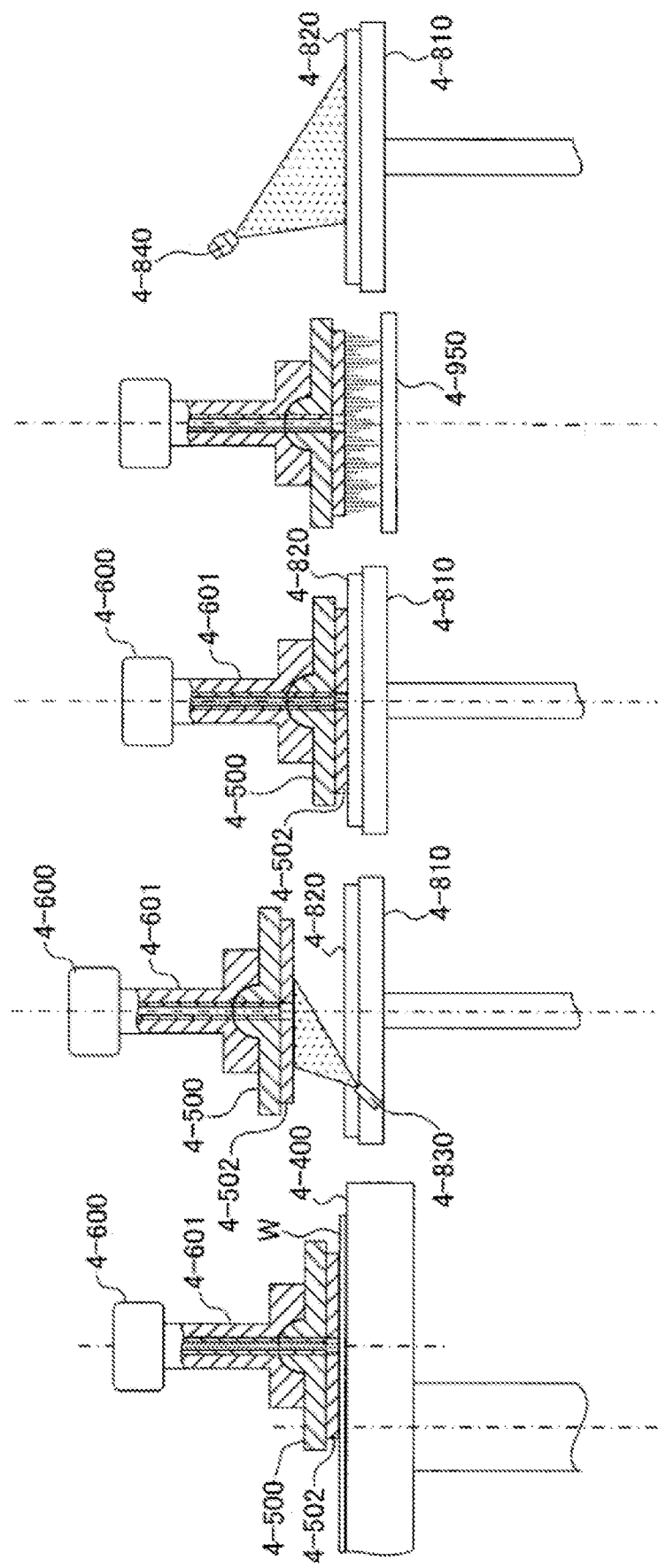

A-A SECTION

A-A SECTION

SUBSTRATE PROCESSING APPARATUS

CROSS REFERENCE TO RELATED APPLICATIONS

This application is a divisional of U.S. patent application Ser. No. 16/228,525 filed on Dec. 20, 2018, which is a continuation of U.S. patent application Ser. No. 15/604,328 filed on May 24, 2017, issued as U.S. Pat. No. 10,201,888, which is a divisional of U.S. patent application Ser. No. 14/832,767 filed on Aug. 21, 2015; issued as U.S. Pat. No. 9,700,988, which claims the priority and the benefit of Japanese Patent Application No. 2014-171837 filed on Aug. 26, 2014, Japanese Patent Application No. 2014-171841 filed on Aug. 26, 2014, Japanese Patent Application No. 2014-185489 filed on Sep. 11, 2014, Japanese Patent Application No. 2014-185508 filed on Sep. 11, 2014, Japanese Patent Application No. 2014-195584 filed on Sep. 25, 2014 and Japanese Patent Application No. 2014-257563 filed on Dec. 19, 2014, the entire contents are incorporated herein by reference.

BACKGROUND OF THE INVENTION

Technical Field

The present invention relates to an apparatus for processing a substrate, such as a semiconductor wafer.

Background Art

Chemical mechanical polishing (CMP) apparatuses for polishing a surface of a substrate have been known in production of semiconductor devices. In a CMP apparatus, a polishing pad is pasted on the upper surface of a polishing table to form a polishing surface. The CMP apparatus presses a polishing target surface of a substrate held by a top ring against the polishing surface, and rotates the polishing table and the top ring while supplying a slurry as a polishing liquid to the polishing surface. Accordingly, the polishing surface and the polishing target surface are relatively moved with the surfaces being in sliding contact, and the polishing target surface is polished.

In a typical CMP apparatus, the polishing table or the polishing pad is larger than a substrate to be polished. While the substrate is held by the top ring such that a polishing target surface faces downward, the substrate is polished. The polished substrate is cleaned by a sponge member, such as of polyvinyl alcohol (PVA), rotating in contact with the substrate, and is then dried.

The applicant of the present application has filed an application on a technique where, after polishing of a substrate, a finishing process unit that presses a contact member having a smaller diameter than the substrate against the polished substrate to relatively move the contact member is provided in a CMP apparatus separately from a main polishing unit, and the substrate is slightly and additionally polished and cleaned (Japanese Patent Laid-Open No. 8-71511).

The CMP apparatus includes: a polishing unit for performing a substrate polishing process; a cleaning unit for performing a substrate cleaning process and drying process; and a load/unload unit that passes a substrate to the polishing unit and receives the substrate having been subjected to the cleaning process and the drying process by the cleaning unit. The CMP apparatus further includes a conveyor mechanism that conveys the substrate in the polishing unit, the cleaning unit, and the load/unload unit. The CMP apparatus sequentially performs various types of processes including polishing, cleaning and drying, while allowing the conveyor mechanism to convey the substrate. A cleaning unit has been disclosed that brings a cleaning member into contact with a semiconductor substrate to scrub and clean the substrate, and then brings the cleaning member having been cleaned into contact with a flat and rough surface of a correction member to perform self-cleaning (see Japanese Patent Laid-Open No. 9-92633).

In some cases, a substrate processing apparatus may be provided with a buff process module. The buff process module applies at least one of a buff-polishing process and a buff-cleaning process to a substrate. The buff-polishing process is a process that relatively moves a wafer and a buff pad against each other while the buff pad is in contact with the wafer, and causes a slurry to intervene between the wafer and the buff pad, thereby polishing and removing unwanted portions on a processing target surface of the wafer. On the other hand, the buff-cleaning process is a process that relatively moves the wafer and the buff pad against each other while the buff pad is in contact with the wafer, and causes a cleaning process liquid (a chemical solution, or the chemical solution and pure water) to intervene between the wafer and the buff pad, thereby removing contaminants on the surface of the wafer or modifying the property of the processing target surface.

Unfortunately, continuation of the buff-polishing process and the buff-cleaning process by the buff pad clogs the surface of the buff pad, thereby reducing the polishing performance and the cleaning performance. Accordingly, in order to renew the performance of the buff pad, conditioning which is referred to as a dressing process is required. The conditioning is performed by a conditioner. The conditioner includes a dressing table, and a dresser installed on the dressing table. The dressing table can be rotated by a drive mechanism. The dresser may be formed of a diamond dresser or a brush dresser, or a combination of these dressers.

When the buff pad is conditioned, the buff process module swings the buff arm such that the buff pad reaches a position facing the dresser. The buff process module rotates the dressing table about a predetermined rotation axis while rotating the buff head, and presses the buff pad against the dresser, thereby applying the dressing process to the buff pad (conditioning).

The attached FIG. 38 does not show the buff pad, but shows the dresser 4-33A used for the polishing unit. The polishing unit adopts the dresser 4-33A having a smaller diameter than a polishing pad 4-10, which has a larger diameter. In the dressing process, a process liquid is dropped from a process liquid supply nozzle 4-32A onto the center of the polishing pad 4-10, and the dresser 4-33A moves to and from along a radius of the polishing pad 4-10. This movement is combined with the rotational motion of the polishing pad 4-10, thereby applying the dressing process to the entire surface of the polishing pad 4-10. In many cases, the process liquid for the polishing pad 4-10 may be a liquid with a high viscosity, such as a slurry. Unfortunately, solid components made from the process liquid adhere and deposit into grooves formed on the surface of the polishing pad 4-10. Such contamination cannot be removed only by the dressing process. Accordingly, a cleaning mechanism referred to as an atomizer 4-34A is used to clean the surface of the polishing pad 4-10. Here, as shown in FIG. 36B, the atomizer 4-34A is a cleaning mechanism that can jet a high pressure liquid or a mixture of the liquid and a gas to the polishing pad 4-10. As shown in FIG. 38A, the atomizer 4-34A is disposed for a radius portion of the polishing pad, the polishing pad 4-10 is rotated at the same time of jetting of the high pressure cleaning fluid, thereby removing the contamination adhering and depositing in the grooves of the polishing pad 4-10.

In a finishing process unit, in order to bring a contact member into contact at a high pressure and improve the cleaning effect and to increase the polishing speed, a substrate is required to be held by a table that is in contact with the entire rear surface of the substrate. In the case where a substrate is supported by a table that supports the substrate at an entire surface, abrasive grains and polishing by-products (organic residues) sometimes accumulate on the table surface, and contaminates the substrate to be processed. Accordingly, the table that supports the substrate, and structural components (a substrate conveyor mechanism etc.) accompanying the table are always required to have high cleanliness.

The present invention has an object to improve the degree of cleaning of a table on which a substrate is mounted and structural components accompanying the table during a polishing process.

The conventional technique only cleans the buff pad by relatively moving the buff pad and the dresser against each other. The cleaning process can thus be achieved to a certain extent, only with which the buff pad however cannot sufficiently cleaned in some cases.

Accordingly, the invention of the present application has an object to provide a buff process module having an enhanced buff pad cleaning power.

If the buff process module in the aforementioned example is provided with an atomizer, the following problem occurs. That is, in the example of the conventional technique in FIGS. 38A and 38B, the polishing pad 4-10 has a larger diameter than the dresser 4-33A has. Consequently, in the example of FIGS. 38A and 38B, the atomizer 4-34 can be installed so as to face an area on the surface of the polishing pad 4-10 that is not covered with the dresser 4-33A.

On the contrary, in the buff process module, the buff pad has a size equivalent or smaller than the dresser. Consequently, in the buff process module, the entire surface of the buff pad is covered with the dresser. As a result, unlike the conventional technique, it is difficult to install the atomizer in the buff process module.

Accordingly, the invention of the present application has an object to provide an atomizer applicable to a buff process module that includes a buff pad having a size equivalent to or smaller than a dresser.

Furthermore, the aforementioned conventional technique has the following problems. That is, when the dresser of the conditioner continues applying the dressing process to the buff pad, contamination accumulates. Consequently, the surface of the dresser is required to be periodically cleaned (dress-rinsed). At this time, the surface of the dresser and the surface of the wafer, which is a processing target object, reside in the substantially same surface. This arrangement is adopted because the buff-polishing process, the buff-cleaning process and the dressing process can be achieved only by parallel (e.g., horizontal) movement of the buff pad. Unfortunately, if no measures are taken for cleaning the dresser, the cleaning liquid jetted toward the dresser is dispersed to the wafer and contaminates the wafer.

Accordingly, the invention of the present application has an object to provide a conditioner that does not contaminate the wafer on the buff table adjacent to the dresser even when the dresser is cleaned (dress-rinsed).

Furthermore, the aforementioned cleaning unit adopts only one cleaning method. Consequently, a cleaning target member cannot be sufficiently cleaned in some cases. For example, if grooves are formed on the cleaning target member, particles having entered the grooves (e.g., a slurry used for polishing, polishing dust on a substrate, etc.) cannot be sufficiently removed only by brushing in some cases. In such cases, it is preferred that in addition to the process of dressing the cleaning member using a brush or the like, pressurized water be separately jetted to the cleaning member by the atomizer to sufficiently remove the particles. That is, it is preferred that two or more types of conditioning be performed. If the two or more types of conditioning are to be performed, multiple conditioning devices are required to be installed for performing the respective types of conditioning. In this case, the installation space of the devices increases with the number of the conditioning devices. The increase, in turn, increases the entire size of the facility. Furthermore, the cleaning member is required to be moved between these devices. Consequently, the processing time is increased by a time required for the movement. These problems are commonly found not only in the cleaning unit but also in a final polishing unit that performs final polishing after polishing by a main polishing unit.

SUMMARY OF INVENTION

The present invention is made to solve at least a part of the aforementioned problem, and can be achieved as the following embodiments.

Embodiment 1

Embodiment 1 of the present invention is an apparatus for buff-processing a processing target object, including: a buff table that includes a support surface for supporting the processing target object; and a nozzle for supplying the support surface with a chemical solution for cleaning the support surface of the buff table.

Embodiment 2

Embodiment 2 of the present invention is the apparatus for buff-processing according to Embodiment 1, wherein the buff table includes a stage film, and a surface of the stage film serves as the support surface for supporting the processing target object.

Embodiment 3

Embodiment 3 of the present invention is the apparatus for buff-processing according to Embodiment 1 or 2, wherein the nozzle is configured such that a direction of the nozzle can be changed in a plane of the buff table.

Embodiment 4

Embodiment 4 of the present invention is the apparatus for buff-processing according to any one of Embodiments 1 to 3, wherein the nozzle is configured such that a direction of the nozzle can be changed in a plane perpendicular to a plane of the buff table.

Embodiment 5

Embodiment 5 of the present invention is the apparatus for buff-processing according to any one of Embodiments 1 to 4, wherein the nozzle is configured such that a position of the nozzle can be changed in a direction perpendicular to a plane of the buff table.

Embodiment 6

Embodiment 6 of the present invention is the apparatus for buff-processing according to any one of Embodiments 1 to 5, wherein the buff table includes a fluid passage that extends to the support surface and is for supplying a fluid to the support surface through the buff table while the support surface of the buff table is cleaned.

Embodiment 7

Embodiment 7 of the present invention is the apparatus for buff-processing according to Embodiment 6, wherein the fluid passage is configured to communicate with a pure water and/or chemical solution supply source.

Embodiment 8

Embodiment 8 of the present invention is the apparatus for buff-processing according to Embodiment 6 or 7, wherein the fluid passage is configured to be communicable with a vacuum source for causing the processing target object to be vacuum-sucked onto the support surface while the processing target object is buff-processed.

Embodiment 9

Embodiment 9 of the present invention is the apparatus for buff-processing according to any one of Embodiments 1 to 8, further including a cleaning mechanism for cleaning the support surface of the buff table through physical contact.

Embodiment 10

Embodiment 10 of the present invention is the apparatus for buff-processing according to Embodiment 9, further including a buff head to which a buff pad for buff-processing the processing target object through physical contact can be attached, wherein the apparatus is configured to clean the support surface of the buff table through physical contact using the buff head and the buff pad.

Embodiment 11

Embodiment 11 of the present invention is the apparatus for buff-processing according to Embodiment 10, further including a fluid passage for supplying a fluid to the support surface through the buff head and the buff pad.

Embodiment 12

Embodiment 12 of the present invention is the apparatus for buff-processing according to Embodiment 9, further including a buff head to which a buff pad for buff-processing the processing target object through physical contact can be attached, wherein the buff head is configured such that a brush or a sponge member for cleaning the support surface of the buff table through physical contact can be attached to the buff head.

Embodiment 13

Embodiment 13 of the present invention is the apparatus for buff-processing according to Embodiment 9, further including: a buff head to which a buff pad for buff-processing the processing target object through physical contact can be attached; and a cleaning head to which a cleaning member, a brush, or a sponge member for cleaning the support surface of the buff table through physical contact can be attached.

Embodiment 14

Embodiment 14 of the present invention is the apparatus for buff-processing according to Embodiment 9, further including a roll sponge member configured to clean the support surface of the buff table through physical contact by rotating on the buff table.

Embodiment 15

Embodiment 15 of the present invention is the apparatus for buff-processing according to any one of Embodiments 1 to 14, further including at least one of an atomizer cleaner, an ultrasonic cleaner, and a cavitation jet cleaner for cleaning the support surface of the buff table.

Embodiment 16

Embodiment 16 of the present invention is any one of Embodiments 1 to 15, wherein the buff table includes a conveyor mechanism for conveying the processing target object to and/or from the buff table, and the apparatus is configured such that the conveyor mechanism is cleaned while the support surface is cleaned.

Embodiment 17

Embodiment 17 of the present invention provides a method of cleaning a support surface of a buff table of an apparatus for buff-processing a processing target object, the buff table being for supporting the processing target object, the method including a step of supplying the support surface with a chemical solution for cleaning the support surface of the buff table.

Embodiment 18

Embodiment 18 of the present invention is the method of cleaning the support surface of the buff table according to Embodiment 17, wherein the buff table includes a stage film, and a surface of the stage film serves as the support surface for supporting the processing target object.

Embodiment 19

Embodiment 19 of the present invention is the method of cleaning the support surface of the buff table according to Embodiment 17 or 18, wherein the buff table includes a conveyor mechanism for conveying the processing target object to and/or from the buff table, and the method further includes a step of cleaning the conveyor mechanism while cleaning the support surface.

Embodiment 20

Embodiment 20 of the present invention is the method of cleaning the support surface of the buff table according to any one of Embodiments 17 to 19, further including a step of changing a position where the chemical solution is supplied to the support surface, while the support surface of the buff table is cleaned.

Embodiment 21

Embodiment 21 of the present invention is the method of cleaning the support surface of the buff table according to any one of Embodiments 17 to 20, wherein the buff table includes a fluid passage that extends to the support surface and is for supplying a fluid to the support surface through the buff table while the support surface of the buff table is cleaned, and the method further includes a step of causing the fluid to flow through the fluid passage.

Embodiment 22

Embodiment 22 of the present invention is the method of cleaning the support surface of the buff table according to Embodiment 21, further including a step of causing pure water and/or the chemical solution to flow through the fluid passage.

Embodiment 23

Embodiment 23 of the present invention is the method of cleaning the support surface of the buff table according to any one of Embodiments 17 to 22, further including a step of cleaning the support surface of the buff table through physical contact.

Embodiment 24

Embodiment 24 of the present invention is the method of cleaning the support surface of the buff table according to any one of Embodiments 17 to 23, wherein the apparatus includes a buff head to which a buff pad for buff-processing the processing target object through physical contact can be attached, and the method further includes a step of cleaning the support surface of the buff table through physical contact using the buff head and the buff pad.

Embodiment 25

Embodiment 25 of the present invention is the method of cleaning the support surface of the buff table according to Embodiment 24, wherein the apparatus includes a fluid passage for supplying a fluid to the support surface through the buff head and the buff pad, and the method further includes a step of supplying the fluid through the fluid passage.

Embodiment 26

Embodiment 26 of the present invention is the method of cleaning the support surface of the buff table according to Embodiment 23, further including a step of cleaning the support surface of the buff table using a brush or a sponge member.

Embodiment 27

Embodiment 27 of the present invention is the method of cleaning the support surface of the buff table according to any one of Embodiments 17 to 26, further including a step of cleaning the support surface of the buff table using at least one of an atomizer cleaner, an ultrasonic cleaner, and a cavitation jet cleaner.

Embodiment 28

Embodiment 28 of the present invention provides an apparatus for buff-processing a processing target object, including: a buff table that includes a support surface for supporting the processing target object; and chemical solution supplying device for supplying the support surface with a chemical solution for cleaning the support surface of the buff table.

Embodiment 29

Embodiment 29 of the present invention is the apparatus for buff-processing the processing target object according to Embodiment 28, wherein the buff table includes a stage film, and a surface of the stage film serves as the support surface for supporting the processing target object.

Embodiment 30

Embodiment 30 of the present invention is the apparatus for buff-processing the processing target object according to Embodiment 28 or 29, wherein the buff table includes a conveyor mechanism for conveying the processing target object to and/or from the buff table, and the apparatus is configured such that the conveyor mechanism is cleaned while the support surface is cleaned.

Embodiment 31

Embodiment 31 of the present invention is the apparatus for buff-processing the processing target object according to any one of Embodiments 28 to 30, wherein the buff table includes a fluid passage that extends to the support surface and is for supplying a fluid to the support surface through the buff table while the support surface of the buff table is cleaned.

Embodiment 32

Embodiment 32 of the present invention is the apparatus for buff-processing the processing target object according to Embodiment 31, wherein the fluid passage is configured to be communicable with a vacuum source for causing the processing target object to be vacuum-sucked onto the support surface while the processing target object is buff-processed.

Embodiment 33

Embodiment 33 of the present invention is the apparatus for buff-processing the processing target object according to any one of Embodiments 28 to 32, further including a cleaning mechanism for cleaning the support surface of the buff table through physical contact.

Embodiment 34

Embodiment 34 of the present invention is the apparatus for buff-processing the processing target object according to Embodiment 33, further including a buff head to which a buff pad for buff-processing the processing target object through physical contact can be attached, wherein the apparatus is configured to clean the support surface of the buff table through physical contact using the buff head and the buff pad.

Embodiment 35

Embodiment 35 of the present invention is the apparatus for buff-processing the processing target object according to Embodiment 34, further including a fluid passage for supplying a fluid to the support surface through the buff head and the buff pad.

Embodiment 36

Embodiment 36 of the present invention is the apparatus for buff-processing the processing target object according to Embodiment 33, further including a buff head to which a buff pad for buff-processing the processing target object through physical contact can be attached, wherein the buff head is configured such that a brush or a sponge member for cleaning the support surface of the buff table through physical contact can be attached to the buff head.

Embodiment 37

Embodiment 37 of the present invention is the apparatus for buff-processing the processing target object according to Embodiment 33, further including: a buff head to which a buff pad for buff-processing the processing target object through physical contact can be attached; and a cleaning head to which a cleaning member, a brush, or a sponge member for cleaning the support surface of the buff table through physical contact can be attached.

Embodiment 38

Embodiment 38 of the present invention is the apparatus for buff-processing the processing target object according to Embodiment 33, further including a roll sponge member configured to clean the support surface of the buff table through physical contact by rotating on the buff table.

Embodiment 39

Embodiment 39 of the present invention is the apparatus for buff-processing the processing target object according to any one of Embodiments 28 to 38, further including at least one of an atomizer cleaner, an ultrasonic cleaner, and a cavitation jet cleaner for cleaning the support surface of the buff table.

Embodiment 40

Embodiment 40 of the present invention provides an apparatus for buff-processing a processing target object, including: a buff table that includes a support surface for supporting the processing target object; and a cleaning mechanism for cleaning the support surface of the buff table through physical contact.

Embodiment 41

Embodiment 41 of the present invention is the apparatus for buff-processing the processing target object according to Embodiment 40, further including a buff head to which a buff pad for buff-processing the processing target object through physical contact can be attached, wherein the apparatus is configured to clean the support surface of the buff table through physical contact using the buff head and the buff pad.

Embodiment 42

Embodiment 42 of the present invention is the apparatus for buff-processing the processing target object according to Embodiment 41, further including a fluid passage for supplying a fluid to the support surface through the buff head and the buff pad.

Embodiment 43

Embodiment 43 of the present invention is the apparatus for buff-processing the processing target object according to Embodiment 40, further including a buff head to which a buff pad for buff-processing the processing target object through physical contact can be attached, wherein the buff head is configured such that a brush or a sponge member for cleaning the support surface of the buff table through physical contact can be attached to the buff head.

Embodiment 44

Embodiment 44 of the present invention is the apparatus for buff-processing the processing target object according to Embodiment 40, further including: a buff head to which a buff pad for buff-processing the processing target object through physical contact can be attached; and a cleaning head to which a cleaning pad, a brush, or a sponge member for cleaning the support surface of the buff table through physical contact can be attached.

Embodiment 45

Embodiment 45 of the present invention is the apparatus for buff-processing the processing target object according to Embodiment 40, further including a roll sponge member configured to clean the support surface of the buff table through physical contact by rotating on the buff table.

Embodiment 46

Embodiment 46 of the present invention is the apparatus for buff-processing the processing target object according to any one of Embodiments 40 to 45, further including at least one of an atomizer cleaner, an ultrasonic cleaner, and a cavitation jet cleaner for cleaning the support surface of the buff table.

Embodiment 47

Embodiment 47 of the present invention is the apparatus for buff-processing the processing target object according to any one of Embodiments 40 to 46, further including a nozzle for supplying the support surface with a liquid for cleaning the support surface of the buff table.

Embodiment 48

Embodiment 48 of the present invention is the apparatus for buff-processing the processing target object according to Embodiment 47, wherein the nozzle is configured such that a direction of the nozzle can be changed in a plane of the buff table.

Embodiment 49

Embodiment 49 of the present invention is the apparatus for buff-processing the processing target object according to Embodiment 47 or 48, wherein the nozzle is configured such that a direction of the nozzle can be changed in a plane perpendicular to a plane of the buff table.

Embodiment 50

Embodiment 50 of the present invention is the apparatus for buff-processing the processing target object according to any one of Embodiments 47 to 49, wherein the nozzle is configured such that a position of the nozzle can be changed in a direction perpendicular to a plane of the buff table.

Embodiment 51

Embodiment 51 of the present invention is the apparatus for buff-processing the processing target object according to any one of Embodiments 40 to 50, wherein the buff table includes a fluid passage that extends to the support surface and is for supplying a fluid to the support surface through the buff table while the support surface of the buff table is cleaned.

Embodiment 52

Embodiment 52 of the present invention is the apparatus for buff-processing the processing target object according to Embodiment 51, wherein the fluid passage is configured to communicate with a pure water and/or chemical solution supply source.

Embodiment 53

Embodiment 53 of the present invention is the apparatus for buff-processing the processing target object according to Embodiment 51 or 52, wherein the fluid passage is configured to be communicable with a vacuum source for causing the processing target object to be vacuum-sucked onto the support surface while the processing target object is buff-processed.

Embodiment 54

Embodiment 54 of the present invention is the apparatus for buff-processing the processing target object according to any one of Embodiments 40 to 53, wherein the buff table includes a conveyor mechanism for conveying the processing target object to and/or from the buff table, and the apparatus is configured such that the conveyor mechanism is cleaned while the support surface is cleaned.

Embodiment 55

Embodiment 55 of the present invention provides a method of cleaning a support surface of a buff table of an apparatus for buff-processing a processing target object, the buff table being for supporting the processing target object, the method including a step of cleaning the support surface of the buff table through physical contact.

Embodiment 56

Embodiment 56 of the present invention is the method of cleaning the support surface of the buff table of the apparatus for buff-processing the processing target object according to Embodiment 55, wherein the apparatus includes a buff head to which a buff pad for buff-processing the processing target object through physical contact can be attached, and the method further includes a step of cleaning the support surface of the buff table through physical contact using the buff head and the buff pad.

Embodiment 57

Embodiment 57 of the present invention is the method of cleaning the support surface of the buff table of the apparatus for buff-processing the processing target object according to Embodiment 56, wherein the apparatus includes a fluid passage for supplying a fluid to the support surface through the buff head and the buff pad, and the method further includes a step of supplying the fluid through the fluid passage.

Embodiment 58

Embodiment 58 of the present invention is the method of cleaning the support surface of the buff table of the apparatus for buff-processing the processing target object according to Embodiment 55, further including a step of cleaning the support surface of the buff table using a brush or a sponge member.

Embodiment 59

Embodiment 59 of the present invention is the method of cleaning the support surface of the buff table of the apparatus for buff-processing the processing target object according to any one of Embodiments 55 to 58, further including a step of cleaning the support surface of the buff table using at least one of an atomizer cleaner, an ultrasonic cleaner, and a cavitation jet cleaner.

Embodiment 60

Embodiment 60 of the present invention is the method of cleaning the support surface of the buff table of the apparatus for buff-processing the processing target object according to any one of Embodiments 55 to 59, wherein the buff table includes a conveyor mechanism for conveying the processing target object to and/or from the buff table, and the method further includes a step of cleaning the conveyor mechanism while cleaning the support surface.

Embodiment 61

Embodiment 61 of the present invention is a buff process module, including: a buff table on which a processing target object is mounted; a buff head that holds a buff pad for applying a predetermined process to the processing target object; a buff arm that supports and swings the buff head; a dresser for dressing the buff pad; and a brush-cleaning mechanism that is disposed between the buff table and the dresser and is for cleaning the buff pad.

Embodiment 62

Embodiment 62 of the present invention adopts, in addition to the configuration of Embodiment 61, a configuration wherein the brush-cleaning mechanism can clean an entire surface of the buff pad configured to move between the buff table and the dresser.

Embodiment 63

Embodiment 63 of the present invention adopts, in addition to the configuration of Embodiment 62, a configuration wherein the brush-cleaning mechanism is disposed such that the brush-cleaning mechanism can be in contact with a radius portion of the buff pad configured to move between the buff table and the dresser, and can clean the entire surface of the buff pad through rotation of the buff head.

Embodiment 64

Embodiment 64 of the present invention adopts, in addition to the configuration of any one of Embodiments 61 to 63, a configuration wherein the brush-cleaning mechanism can access and retract from a movement path of the buff pad.

Embodiment 65

Embodiment 65 of the present invention adopts, in addition to the configuration of Embodiment 64, a configuration wherein the brush-cleaning mechanism can be rotationally moved by a rotary actuator or linearly moved by a cylinder.

Embodiment 66

Embodiment 66 of the present invention adopts, in addition to the configuration of any one of Embodiments 61 to 65, a configuration wherein a base is provided in proximity to the dresser, and the brush-cleaning mechanism is installed on the base.

Embodiment 67

Embodiment 67 of the present invention adopts, in addition to the configuration of any one of Embodiments 61 to 66, a configuration wherein cleaning by the brush-cleaning mechanism is performed in at least any of stages before, during, and after a dressing process.

Embodiment 68

Embodiment 68 of the present invention adopts, in addition to the configuration of any one of Embodiments 61 to 67, a configuration wherein the brush-cleaning mechanism includes a process liquid jet orifice for jetting a process liquid toward the buff pad.

Embodiment 69

Embodiment 69 of the present invention adopts, in addition to the configuration of any one of Embodiments 61 to 68, a configuration wherein on a surface of the buff pad, a groove continuous from a center portion to an outer peripheral portion is formed, and a process liquid outlet from which a process liquid flows is provided at the center portion of the buff pad, and the process liquid flows from the process liquid outlet in a state where the buff pad is in contact with the dresser.

Embodiment 70

Embodiment 70 of the present invention adopts, in addition to the configuration of Embodiment 69, a configuration wherein the groove of the buff pad includes a flow rate reducer that reduces a flow rate of the process liquid in proximity to an outermost peripheral portion of the buff pad.

Embodiment 71

Embodiment 71 of the present invention adopts, in addition to the configuration of any one of Embodiments 61 to 70, a configuration wherein a dresser groove is formed on a surface of the dresser.

Embodiment 72

Embodiment 72 of the present invention adopts, in addition to the configuration of Embodiment 71, a configuration wherein the dresser groove is radial or spiral.

Embodiment 73

Embodiment 73 of the present invention adopts, in addition to the configuration of Embodiment 68, a configuration wherein an adjustment valve configured to adjust at least one of a flow rate or a pressure of the process liquid communicates with the process liquid jet orifice.

Embodiment 74

Embodiment 74 of the present invention adopts, in addition to the configuration of any one of Embodiments 61 to 73, a configuration wherein a buff pad cover configured to prevent the process liquid from dispersing is provided in proximity to the buff pad.

Embodiment 75

Embodiment 75 of the present invention adopts, in addition to the configuration of Embodiment 74, a configuration wherein at least a part of the buff arm performs a part of a function of the buff pad cover.

Embodiment 76

Embodiment 76 of the present invention adopts, in addition to the configuration of any one of Embodiments 61 to 75, a configuration wherein the process liquid is at least one liquid selected from a group consisting of deionized water, a chemical solution and a slurry, or a mixture of the liquid and compressed air.

Embodiment 77

Embodiment 77 of the present invention adopts, in addition to the configuration of Embodiment 76, a configuration wherein supply of each of the liquids is switchable.

Embodiment 78

Embodiment 78 of the present invention adopts, in addition to the configuration of any one of Embodiments 69 to 77, a configuration wherein the buff pad is cleaned by an ultrasonic cleaning fluid instead of or together with the process liquid.

Embodiment 79

Embodiment 79 of the present invention adopts a configuration of a substrate processing apparatus, including the buff process module according to any one of Embodiments 61 to 78.

Embodiment 80

Embodiment 80 of the present invention adopts a configuration of a buff pad cleaning method for cleaning a buff pad for applying a predetermined process to a processing target object, including: supporting and swinging a buff head that holds the buff pad by a buff arm; and cleaning the buff pad by a brush-cleaning mechanism disposed between a buff table on which the processing target object is mounted and a dresser for dressing the buff pad.

Embodiment 81

Embodiment 81 of the present invention adopts, in addition to the configuration of Embodiment 80, a configuration wherein the brush-cleaning mechanism cleans an entire surface of the buff pad configured to move between the buff table and the dresser.

Embodiment 82

Embodiment 82 of the present invention adopts, in addition to the configuration of Embodiment 81, a configuration wherein the entire surface of the buff pad is cleaned by the brush-cleaning mechanism disposed such that the brush-cleaning mechanism can be in contact with a radius portion of the buff pad configured to move between the buff table and the dresser, while the buff head is rotated.

Embodiment 83

Embodiment 83 of the present invention adopts, in addition to the configuration of any one of Embodiments 80 to 82, a configuration wherein the brush-cleaning mechanism can access and retract from a movement path of the buff pad.

Embodiment 84

Embodiment 84 of the present invention adopts, in addition to the configuration of any one of Embodiments 80 to 83, a configuration wherein the brush-cleaning mechanism is rotationally moved by a rotary actuator or linearly moved by a cylinder.

Embodiment 85

Embodiment 85 of the present invention adopts, in addition to the configuration of any one of Embodiments 80 to 84, a configuration wherein cleaning by the brush-cleaning mechanism is performed in at least any of stages before, during, and after a dressing process.

Embodiment 86

Embodiment 86 of the present invention adopts, in addition to the configuration of any one of Embodiments 80 to 85, a configuration wherein cleaning by the brush-cleaning mechanism is performed while a process liquid is jetted from a process liquid jet orifice provided for the brush-cleaning mechanism.

Embodiment 87

Embodiment 87 of the present invention adopts a configuration of a buff process module, including: a buff pad held by a buff head; and a cleaning mechanism that cleans a surface of the buff pad, wherein a groove is formed on the surface of the buff pad, and the cleaning mechanism includes an atomizer that jets a high pressure cleaning fluid to remove deposit in the groove.

Embodiment 88

Embodiment 88 of the present invention adopts, in addition to the configuration of Embodiment 87, a configuration wherein the atomizer is disposed below the buff pad that faces perpendicularly downward.

Embodiment 89

Embodiment 89 of the present invention adopts, in addition to the configuration of Embodiment 87 or 88, a configuration wherein the buff pad is movable between a buff table configured to hold a substrate and a dresser configured to dresse the buff pad, and the atomizer is disposed in a movement path of the buff pad.

Embodiment 90

Embodiment 90 of the present invention adopts, in addition to the configuration of Embodiment 89, a configuration wherein the buff head can be apart from the dresser, and the atomizer is positioned between the buff head and the dresser, and jets the high pressure cleaning fluid.

Embodiment 91

Embodiment 91 of the present invention adopts, in addition to the configuration of any one of Embodiments 87 to 90, a configuration wherein the atomizer is freely movable.

Embodiment 92

Embodiment 92 of the present invention adopts, in addition to the configuration of Embodiment 91, a configuration wherein the atomizer can be rotationally moved by a rotary actuator or linearly moved by a cylinder.

Embodiment 93

Embodiment 93 of the present invention adopts, in addition to the configuration of any one of Embodiments 87 to 92, a configuration wherein the atomizer is positioned such that the atomizer can clean at least a radius portion of the buff pad, and can clean the entire surface through rotation of the buff pad.

Embodiment 94

Embodiment 94 of the present invention adopts, in addition to the configuration of any one of Embodiments 87 to 93, a configuration wherein the atomizer includes a plurality of fluid jet orifices along a linearly shaped main body.

Embodiment 95

Embodiment 95 of the present invention adopts, in addition to the configuration of any one of Embodiments 87 to 94, a configuration wherein a cover configured to prevent the high pressure cleaning fluid from dispersing is provided in proximity to the buff pad.

Embodiment 96

Embodiment 96 of the present invention adopts, in addition to the configuration of Embodiment 95, further including a buff arm that holds the buff head, a configuration wherein the buff arm is covered with the cover.

Embodiment 97

Embodiment 97 of the present invention adopts, in addition to the configuration of Embodiment 95 or 96, a configuration wherein instead of the cover, a fixed cover fixed around the dresser is provided.

Embodiment 98

Embodiment 98 of the present invention adopts, in addition to the configuration of Embodiment 97, a configuration wherein the fixed cover has a notch formed to avoid contact with the buff arm.

Embodiment 99

Embodiment 99 of the present invention adopts, in addition to the configuration of Embodiment 96, a configuration wherein the buff arm itself has a function of the cover.

Embodiment 100

Embodiment 100 of the present invention adopts, in addition to the configuration of Embodiment 96, a configuration wherein the atomizer jets the high pressure cleaning fluid while being positioned below the buff arm.

Embodiment 101

Embodiment 101 of the present invention adopts, in addition to the configuration of Embodiment 96 or 100, a configuration wherein the atomizer cleans a lower surface of the buff arm at a same time of cleaning the buff pad.

Embodiment 102

Embodiment 102 of the present invention adopts, in addition to the configuration of any one of Embodiments 87 to 101, a configuration wherein the cleaning mechanism further includes at least one of an ultrasonic cleaning mechanism and a brush-cleaning mechanism in a cleaning liquid container.

Embodiment 103

Embodiment 103 of the present invention adopts, in addition to the configuration of any one of Embodiments 87 to 102, a configuration wherein the high pressure cleaning fluid is a liquid or a mixed fluid of the liquid and a gas.

Embodiment 104

Embodiment 104 of the present invention adopts, in addition to the configuration of Embodiment 103, a configuration wherein the cleaning liquid is at least any one liquid selected from a group consisting of deionized water, a chemical solution and a slurry, or a mixture of the liquid and compressed air.

Embodiment 105

Embodiment 105 of the present invention adopts, in addition to the configuration of Embodiment 104, a configuration wherein supply of each type of the liquid is switchable.

Embodiment 106

Embodiment 106 of the present invention adopts, in addition to the configuration of any one of Embodiments 87 to 105, a configuration wherein an ultrasonic cleaning fluid is used together with the high pressure cleaning fluid.

Embodiment 107

Embodiment 107 of the present invention adopts a configuration of a substrate processing apparatus, including the buff process module according to any one of Embodiments 87 to 106.

Embodiment 108

Embodiment 108 of the present invention adopts a configuration of a buff pad cleaning method for cleaning a buff pad used in a substrate processing apparatus, including using the buff pad subjected to a dressing process by a dresser, and jetting a high pressure cleaning fluid from an atomizer to the buff pad.

Embodiment 109

Embodiment 109 of the present invention is adopts, in addition to the configuration of Embodiment 108, a configuration wherein the jetting of the cleaning fluid to the buff pad is performed in parallel with a process to a substrate on the buff table.

Embodiment 110

Embodiment 110 of the present invention is adopts, in addition to the configuration of Embodiment 108 or 109, a configuration wherein when the buff pad is disposed above the dresser, the atomizer moves between the buff pad and the dresser and jets the cleaning fluid.

Embodiment 111

Embodiment 111 of the present invention is adopts, in addition to the configuration of any one of Embodiments 108 to 110, a configuration wherein when a buff arm for swinging the buff pad is above the atomizer, the atomizer jets the cleaning fluid.

Embodiment 112

Embodiment 112 of the present invention adopts a configuration of a conditioner including a dresser for dressing a buff pad of a substrate processing apparatus, the dresser further including a dresser cleaning mechanism configured to jet a cleaning liquid to the dresser to clean the dresser, wherein a surface of the dresser is at a lower position than a position of a buff table disposed adjacent to the dresser.

Embodiment 113

Embodiment 113 of the present invention adopts, in addition to the configuration of Embodiment 112, a configuration wherein the dresser cleaning mechanism jets the cleaning liquid in a direction away from the buff table.

Embodiment 114

Embodiment 114 of the present invention adopts, in addition to the configuration of Embodiment 112 or 113, a configuration wherein a cover for preventing the cleaning liquid from dispersing is disposed between the dresser and the buff table.

Embodiment 115

Embodiment 115 of the present invention adopts, in addition to the configuration of Embodiment 114, a configuration wherein the cover includes a contact avoiding mechanism that avoids contact with the swinging buff pad.

Embodiment 116

Embodiment 116 of the present invention adopts, in addition to the configuration of Embodiment 115, a configuration wherein the contact avoiding mechanism includes a cover moving mechanism configured to move the cover in an axial direction of a rotation axis of the dresser or the buff table.

Embodiment 117

Embodiment 117 of the present invention adopts, in addition to the configuration of Embodiment 115 or 116, a configuration wherein the cover includes a substantially cylindrical cover that covers at least a part of a periphery of the dresser, or a periphery of the buff table, and the contact avoiding mechanism includes a notch formed at least a part of the substantially cylindrical cover for allowing the buff pad to pass, and a rotational drive mechanism configured to rotate the cover concentrically with a rotation axis of the dresser or the buff table.

Embodiment 118

Embodiment 118 of the present invention adopts, in addition to the configuration of Embodiment 117, a configuration wherein the contact avoiding mechanism includes a movable cover member for opening and closing the notch.

Embodiment 119

Embodiment 119 of the present invention adopts, in addition to the configuration of Embodiment 118, a configuration wherein the movable cover member is movable along a circumferential direction or a central axial direction with respect to the cover.

Embodiment 120

Embodiment 120 of the present invention adopts, in addition to the configuration of any one of Embodiments 112 to 119, further including an air curtain forming mechanism configured to form an air curtain in a space between the buff table and this mechanism.

Embodiment 121

Embodiment 121 of the present invention adopts, in addition to the configuration of Embodiment 120, a configuration wherein while jetting of the cleaning liquid is stopped, formation of the air curtain is also stopped.

Embodiment 122

Embodiment 122 of the present invention adopts, in addition to the configuration of any one of Embodiments 112 to 121, further including a locally exhausted state forming mechanism configured to form a locally exhausted state around the dresser.

Embodiment 123

Embodiment 123 of the present invention adopts, in addition to the configuration of any one of Embodiments 112 to 122, a configuration wherein the cleaning liquid is a liquid including at least any one selected from a group consisting of deionized water, a chemical solution and a slurry, or a mixture of the liquid and compressed air.

Embodiment 124

Embodiment 124 of the present invention adopts, in addition to the configuration of Embodiment 123, a configuration wherein supply of each type of the liquid is switchable.

Embodiment 125

Embodiment 125 of the present invention adopts, in addition to the configuration of any one of Embodiments 112 to 124, a configuration wherein an ultrasonic cleaning fluid is used together with the high pressure cleaning fluid.

Embodiment 126

Embodiment 126 of the present invention adopts, in addition to the configuration of any one of Embodiments 112 to 125, a configuration wherein the cleaning liquid is a high pressure cleaning fluid.

Embodiment 127

Embodiment 127 of the present invention adopts a configuration of a buff process module, including: the conditioner according to any one of Embodiments 112 to 126; a buff table configured to hold a wafer; and a buff head configured to hold a buff pad and to buff-processe the wafer, wherein if a cover for preventing the cleaning liquid from dispersing is fixedly provided between the dresser and the buff table, the buff head is movable in a direction of a rotation axis of the dresser or a rotation axis of the wafer, and the buff head is movable between the conditioner and the buff table in a state of being moved to a higher position than a position of the cover.

Embodiment 128

Embodiment 128 of the present invention adopts, in addition to the configuration of Embodiment 127, a configuration wherein a buff table cover is provided at least a part of a periphery of the buff table.

Embodiment 129

Embodiment 129 of the present invention adopts, in addition to the configuration of Embodiment 127 or 128, a configuration including a descending air current generating mechanism configured to generate a descending air current from above the buff table.

Embodiment 130

Embodiment 130 of the present invention adopts a configuration of a substrate processing apparatus, including the conditioner according to any one of Embodiments 112 to 126.

Embodiment 131

Embodiment 131 of the present invention adopts a configuration of a substrate processing apparatus, including the buff process module according to any one of Embodiments 127 to 129.

Embodiment 132

Embodiment 132 of the present invention adopts a configuration of a dresser rinsing method of cleaning a dresser in a conditioner, the conditioner including the dresser, the dresser being for dressing a buff pad of a substrate processing apparatus, the method including: providing a dresser cleaning mechanism configured to jet a cleaning liquid to the dresser to clean the dresser; disposing a surface of the dresser at a lower position than a position of a buff table disposed adjacent to the dresser, and jetting the cleaning liquid from the dresser cleaning mechanism to the dresser.

Embodiment 133

Embodiment 133 of the present invention adopts, in addition to the configuration of Embodiment 132, a configuration wherein the jetting of the cleaning liquid to the dresser is performed in parallel with a process to a substrate on the buff table.

Embodiment 134

Embodiment 134 of the present invention adopts, in addition to the configuration of Embodiment 132 or 133, a configuration wherein a predetermined cover is provided at least at a part of a periphery of the dresser or a periphery of the buff table, and when the buff pad is moved between the buff table and the dresser, a contact avoiding mechanism is operated to avoid contact between the buff pad and the cover.

Embodiment 135

Embodiment 135 of the present invention adopts, in addition to the configuration of any one of Embodiments 132 to 134, a configuration wherein the method performs at least any one of forming an air curtain between the buff table and the dresser, forming a locally exhausted state around the dresser, and forming a descending air current from above the buff table, at a same time of jetting the cleaning liquid to the dresser.

Embodiment 136

Embodiment 136 of the present invention adopts a configuration of a conditioner including a dresser for dressing a buff pad of a substrate processing apparatus, further including a dresser cleaning mechanism configured to jet a cleaning liquid to the dresser to clean the dresser, wherein a cover for preventing the cleaning liquid from dispersing is provided between the dresser and a buff table disposed adjacent to the dresser.

Embodiment 137

Embodiment 137 of the present invention adopts a configuration of a conditioner including a dresser for dressing a buff pad of a substrate processing apparatus, further including a dresser cleaning mechanism configured to jet a cleaning liquid to the dresser to clean the dresser, wherein the dresser cleaning mechanism is configured to jet the cleaning liquid in a direction away from the buff table.

Embodiment 138

Embodiment 138 of the present invention provides a conditioning device for conditioning a buff pad used for a buff process. This conditioning device includes: a base plate configured to be rotatable; a first conditioner provided in an installation area of the base plate; and a second conditioner that is provided in the installation area of the base plate, but has different conditioning characteristics than the first conditioner has.

The conditioning device according to Embodiment 138 can perform two types of conditioning by the first conditioner and the second conditioner in the installation space of one base plate. Consequently, the installation space for the conditioning device can be reduced in comparison with the case of installing multiple conditioning devices each having a single type of conditioning function. Furthermore, in the case of applying two types of conditioning to the buff pad, there is no need to move the buff pad between the two conditioning devices. Consequently, the time required for conditioning the buff pad can be reduced. Alternatively, three or more types of conditioning may be applied to the buff pad. The multiple types of conditioning may be applied simultaneously or sequentially.

Embodiment 139

Embodiment 139 of the present invention is according to Embodiment 138, wherein the first conditioner includes a plurality of blocks separated from each other by intervals. The second conditioner is provided between the blocks. This embodiment can easily install the first conditioner and the second conditioner in the installation area of the base plate. Consequently, the conditioning device can be easily manufactured.

Embodiment 140

Embodiment 140 of the present invention is according to Embodiment 138, wherein at least one of a hole, a groove, and a notch is formed at the first conditioner. The at least one of the hole, the groove, and the notch is provided with the second conditioner. This embodiment can appropriately form the first conditioner and the second conditioner in the installation area of the base plate. The hole may be a through-hole, or a blind hole.

Embodiment 141

Embodiment 141 of the present invention is according to any one of Embodiments 138 to 140, wherein the second conditioner includes at least one of a brush and a jet nozzle. According to this embodiment, the buff pad can be appropriately conditioned by at least one of brushing and fluid jetting.

Embodiment 142

Embodiment 142 of the present invention is according to Embodiment 141, wherein the second conditioner includes a plurality of jet nozzles. This embodiment facilitates conditioning over the entire surface of the buff pad.

Embodiment 143

Embodiment 143 of the present invention is according to Embodiment 142, wherein a common supply path for supplying a fluid to each of the jet nozzles is formed in the base plate. This embodiment can simplify the configuration of the fluid supply path. Consequently, the size of the conditioning device can be reduced. Alternatively, the conditioning device can be easily manufactured or maintained.

Embodiment 144

Embodiment 144 of the present invention is according to any one of Embodiments 141 to 143, wherein the first conditioner has a through-hole formed to penetrate the first conditioner in a front-and-rear-surface direction. The through-hole functions as the jet nozzle. This embodiment allows the through-hole of the first conditioner to function as the second conditioner. Consequently, the configuration of the conditioning device can be simplified.

Embodiment 145

Embodiment 145 of the present invention is according to any one of Embodiments 141 to 143, wherein the first conditioner has a through-hole formed to penetrate the first conditioner in a front-and-rear-surface direction. The jet nozzle is disposed in the through-hole. According to this embodiment, the jet nozzle is provided on the base plate, and the first conditioner is attached to the base plate such that the through-hole can accommodate the jet nozzle, thereby allowing the conditioning device to be manufactured. Consequently, manufacture can be facilitated.

Embodiment 146

Embodiment 146 of the present invention is according to any one of Embodiments 142 and 143 and Embodiments 144 and 145 dependent on Embodiment 142, wherein the jet nozzles are configured such that if the buff pad is disposed at a predetermined position where conditioning is performed, jetting areas of the respective jet nozzles do not overlap with each other between the jet nozzles and the buff pad disposed at the predetermined position. This embodiment can prevent the jets of fluid emitted by the respective jet nozzles from colliding with each other, which in turn can prevent the pressure applied by the fluid to the buff pad from being reduced. Consequently, reduction in conditioning performance due to the collision can be prevented.

Embodiment 147

Embodiment 147 of the present invention is according to any one of Embodiments 142, 143 and 146 and Embodiments 144 and 145 dependent on Embodiment 142, wherein the jet nozzles are disposed at respective positions different in a radial direction from each other. According to this embodiment, during rotation of the first and second conditioners due to rotation of the base plate, the jet nozzles are arranged on the respective rotation trajectories different from each other. Consequently, a small number of jet nozzles can condition the entire surface of the buff pad. In other words, the state where the multiple jet nozzles are arranged on the same trajectory can be prevented, which allows the number of jet nozzles to be reduced.

Embodiment 148

Embodiment 148 of the present invention is according to Embodiment 147, wherein the jet nozzles are configured to have fluid jetting rates different from each other. This embodiment can achieve highly flexible conditioning. For example, the jet nozzle arranged relatively outside in the radial direction has a larger area to be conditioned than the jet nozzle arranged relatively inside has. Accordingly, the jetting rate of the jet nozzle arranged outside is configured to be higher than the jet nozzle arranged inside. This configuration can achieve the balance of the distribution of flow rates of fluid colliding against the buff pad per unit area.

Embodiment 149

Embodiment 149 of the present invention is according to any one of Embodiments 138 to 148, wherein the first conditioner is formed of diamond, ceramic, or a brush. This embodiment can appropriately condition the buff pad by the first conditioner.

Embodiment 150

Embodiment 150 of the present invention provides a buff process apparatus, including the conditioning device according to any one of Embodiments 138 to 149. This buff process apparatus can exert advantageous effects similar to those of any one of Embodiments 138 to 149.

Embodiment 151

Embodiment 151 of the present invention provides a substrate processing apparatus. This substrate processing apparatus includes: a chemical mechanical polishing apparatus; and the buff process apparatus according to Embodiment 150 for applying postprocessing to a substrate having been processed by the chemical mechanical polishing apparatus. This substrate processing apparatus can exert advantageous effects similar to those of any one of Embodiments 138 to 149.

Embodiment 152

Embodiment 152 of the present invention provides a dresser for conditioning a buff pad used for a buff process. This dresser has at least one of a hole, a groove and a notch formed in the dresser. This dresser can be used for the conditioning device of Embodiment 140.

Embodiment 153

Embodiment 153 of the present invention provides a conditioning method for conditioning a buff pad used for a buff process. This method includes a step of simultaneously applying two types of conditioning to the buff pad using a first area for conditioning the buff pad, and a second area for conditioning that has conditioning characteristics different than the conditioning characteristics the first area has. This method can exert advantageous effects similar to those of Embodiment 138. Furthermore, the time required for conditioning can be reduced.

Embodiment 154

Embodiment 154 of the present invention provides a conditioning method for conditioning a buff pad used for a buff process. This method includes: a step of preparing a conditioning device where a second area provided with a jet nozzle for conditioning, and a first area for conditioning by a method different from a method for the second area are formed in an installation area of a base plate; a first conditioning step of conditioning the buff pad in the first area, and a second conditioning step of conditioning the buff pad in the second area in a state where a distance between the base plate and the buff pad is more than the distance between the base plate and the buff pad in the first step, before or after the first step. This method can exert advantageous effects similar to those of Embodiment 138. More specifically, in the case of performing the second step after the first step, the fluid is jetted from the jet nozzle in the state where a gap is formed between the buff pad and the first conditioner. Consequently, conditioning dust generated by the first step and the second step can be easily ejected outside.

BRIEF DESCRIPTION OF DRAWINGS

FIGS. 22A, 22B, 22C, and 22D are diagrams illustrating the operations of the buff table, the dressing table, and the buff head showing the processing procedures disclosed in FIG. 21;

FIG. 23A shows a state where the buff pad is pressed against the dresser, FIG. 23B is a plan view showing the shape of dresser grooves formed on the dresser, and FIG. 23C is a plan view showing dresser grooves having a different shape;

FIG. 24A is an overall schematic view, and FIG. 24B is a detailed diagram of the brush-cleaning mechanism;

FIG. 25A shows a plan view, and FIG. 25B shows a partially sectional side view;

FIGS. 33A to 33E are diagrams illustrating the operations of the buff table, the dressing table, the buff head and the atomizer showing the processing procedures disclosed in FIG. 32;

FIG. 34A shows an example where the atomizer is disposed at a position different from the position of the dresser, and FIG. 34B shows an example where the atomizer can be moved above the dresser;

FIG. 35A shows a plan view, and FIG. 35B shows a left side view;

FIG. 36A shows a plan view, FIG. 36B shows a left side view, and FIG. 36C shows the buff arm viewed in a direction of arrow C in FIG. 36B;

FIG. 37A shows a buff head cover provided over the buff head, and FIG. 37B is a diagram showing a fixed cover fixedly arranged at the conditioner;

FIG. 38A is a schematic overall plan view including a polishing pad, and FIG. 38B is a side view showing the atomizer and the buff pad;

FIG. 47A shows an example where measures are taken for the cleaning liquid jetting direction, and FIG. 47B shows an example where a dresser cover is provided around the dresser;

FIG. 48A is a side view of the dresser cover, FIG. 48B is a diagram showing a state of the buff pad entering the inside of the dresser cover, and FIG. 48C shows a state where the buff pad has completely entered the inside of the dresser cover;

FIGS. 49A and 49B are a plan view and a side view in a state where the notch is closed with the movable cover member, respectively, FIGS. 49C and 49D are a plan view and a side view in a state where the movable cover member is moved downward, respectively, and FIGS. 49E and 49F are a plan view and a side view in a state where the movable cover member is moved in the circumferential direction;

DESCRIPTION OF EMBODIMENTS

A buff process apparatus, which is a substrate processing apparatus according to the present invention, is hereinafter described with reference to the accompanying FIGS. 1 to 15. In the accompanying drawings, the same and similar reference symbols are assigned to the same or similar elements. Redundant description of the same or similar elements in the description of each embodiment is sometimes omitted. The characteristics described in each embodiment are also applicable to the other embodiments as long as the characteristics are not contradicted.

Figure 1:
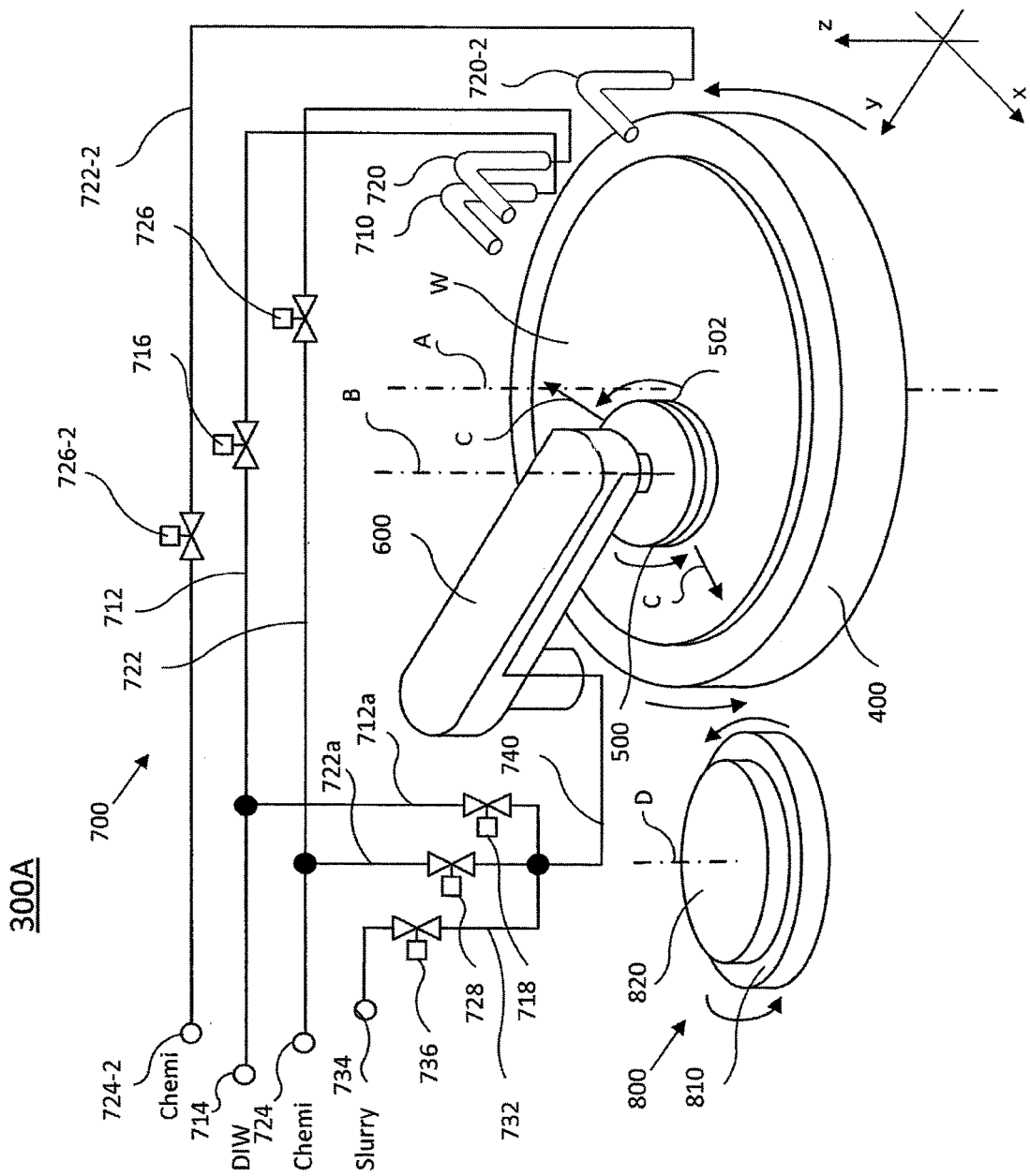
FIG. 1 is a diagram showing a schematic configuration of a buff process module according to one embodiment of the present invention.

FIG. 1 is a diagram showing a schematic configuration of a buff process apparatus according to one embodiment of the present invention. The buff process apparatus shown in FIG. 1 can be configured as a part of a CMP apparatus for applying a polishing process to a substrate, such as a semiconductor wafer, or as a unit in the CMP apparatus. As an example, the buff process apparatus can be integrated in a CMP apparatus that includes a polishing unit, a cleaning unit, and a substrate conveyor mechanism. The buff process apparatus can be used for a finishing process after main polishing in the CMP apparatus.

In this specification, the buff process includes at least one of a buff-polishing process and a buff-cleaning process.

The buff-polishing process is a process that relatively moves a substrate and a buff pad against each other while the buff pad is in contact with the substrate, and causes a slurry to intervene between the substrate and the buff pad, thereby polishing and removing unwanted portions on a processing target surface of the substrate. The buff-polishing process is a process that can apply a stronger physical action force to a substrate than a physical action force applied to the substrate when the substrate is cleaned by the physical action force using a sponge member (e.g., PVA sponge member). Accordingly, the buff pad may be, for example, a pad including foamed polyurethane and non-woven fabric that are stacked on each other, more specifically, a commercially available series of IC1000™/SUBA®, or a suede-like porous polyurethane non-fibrous pad, more specifically, a commercially available POLITEX® or the like. The buff-polishing process can achieve removal of a surface part which is damaged by a scratch or the like or to which contaminants adhere, additional removal of a portion which cannot have been removed by main polishing in the main polishing unit, or improvement in morphology, such as on unevenness in micro regions and film thickness distribution over the entire substrate after main polishing.

The buff-cleaning process is a process that relatively moves the substrate and the buff pad against each other while the buff pad is in contact with the substrate, and causes a cleaning process liquid (a chemical solution, or the chemical solution and pure water) to intervene between the substrate and the buff pad, thereby removing contaminants on the surface of the substrate or modifying the property of the processing target surface. The buff-cleaning process is a process that can apply a stronger physical action force to the substrate than a physical action force applied to the substrate when the substrate is cleaned by the physical action force using a sponge member or the like. Accordingly, the buff pad may be the aforementioned series of IC1000™/SUBA®, or series of POLITEX®. Alternatively, in the buff process apparatus according to the present invention, PVA sponge may be adopted as the buff pad.

FIG. 1 is a diagram schematically showing the configuration of a buff process module 1-300A in a state where a wafer W (substrate) is mounted, according to one embodiment. As shown in FIG. 1, the buff process module 1-300A according to the one embodiment includes: a buff table 1-400 on which the wafer W is mounted; a buff head 1-500 to which a buff pad 1-502 for applying a buff process to a processing target surface of the wafer W is attached; a buff arm 1-600 that holds the buff head 1-500; a liquid supply system 700 for supplying various types of process liquids; and a conditioner 1-800 for conditioning (dressing) the buff pad 1-502.

The buff process module 1-300A can perform the aforementioned buff-polishing process and/or buff-cleaning process. Although the details will be described later, the buff process module 1-300A can be used to clean a support surface 1-402 of the buff table 1-400 in a state shown in FIG. 2 where the wafer W is removed. Instead of the buff pad 1-502 for the buff process, a brush or a sponge member for cleaning may be attached to the buff head 1-500 for the sake of cleaning, which will be described later.

The buff table 1-400 has a support surface 1-402 for supporting the wafer W. The support surface 1-402 has an opening 1-404 of a fluid passage 1-410 (see FIG. 3) used to suck the wafer W. The fluid passage 1-410 communicates with a vacuum source, not shown, and allows the wafer W to be vacuum-sacked. The wafer W may be sucked onto the buff table 1-400 via a stage film 1-450 (see FIG. 3). The stage film 1-450 may be formed of e.g., foamed polyurethane, which is elastic. The stage film 1-450 serves as cushioning between the buff table 1-400 and the wafer W, and can prevent the wafer from being scratched, and alleviate adverse effects of the unevenness on the surface of the buff table 1-400 to the buff process. The stage film 1-450 can be attached onto the surface of the buff table 1-400 by adhesive tape. The stage film 1-450 may be a publicly known member. A member having a through-hole 1-452 at a position corresponding to the opening 1-404 of the buff table 1-400 may be used (see FIG. 3).

In this specification, in the case where the wafer W is mounted on the buff table 1-400 via the stage film 1-450, the surface of the stage film 1-450 in the state where this stage film 1-450 is attached serves as the "support surface" for supporting the wafer W. In the case where the wafer W is directly sucked onto the buff table 1-400 where the stage film 1-450 does not intervene, the surface of the buff table serves as the "support surface" for supporting the wafer W. Hereinafter, in the case of simply referring to "the support surface" or "the support surface of the buff table", these terms include both the cases.

The buff table 1-400 further includes lift pins 1-480 (see FIG. 3), as a conveyor mechanism on the table 1-400, for receiving the wafer W conveyed by a conveyor robot, not shown, and for mounting the wafer W on the buff table 1-400. The multiple lift pins 1-480 are arranged along the outer periphery of the buff table 1-400. The lift pins 1-480 are projected and retracted by a mechanism, not shown. The lift pins 1-480 receive the wafer W by supporting the outer peripheral portion of the wafer W in a state where the lift pins 1-480 are projected, and subsequently, the lift pins 1-480 are retracted to mount the wafer W on the support surface 1-402 of the buff table 1-400. After the buff process is finished, the lift pins 1-480 are projected to support the outer peripheral portion of the wafer W and thus lift the wafer W, and the conveyor robot picks up the wafer W at the bottom.

The buff table 1-400 can be rotated about a rotation axis A by a drive mechanism, not shown. The buff head 1-500 is configured to ascend and descend. The buff pad 1-502 is attached to a surface of the buff head 1-500 that faces the wafer W. The buff pad 1-502 is pressed against the wafer W held on the support surface 1-402 of the buff table 1-400 by descent of the buff head 1-500. The buff arm 1-600 can rotate the buff head 1-500 about a rotation axis B, and swing the buff head 1-500 in the radial direction of the wafer W as indicated by an arrow C. The buff arm 1-600 can swing the buff head 1-500 to a position where the buff pad 1-502 faces the conditioner 1-800.

The liquid supply system 1-700 includes a pure water nozzle 1-710 for supplying pure water (DIW: deionized water) to the processing target surface of the wafer W. The pure water nozzle 1-710 communicates with a pure water supply source 1-714 through pure water piping 1-712. The pure water piping 1-712 is provided with an on-off valve 1-716 that can open and close the pure water piping 1-712. The on-off valve 1-716 opening and closing control through a control device, not shown, can supply pure water to the processing target surface of the wafer W or the support surface 1-402 of the buff table 1-400 for supporting the wafer W, at any timing.

The direction of the pure water nozzle 1-710 can be changed (swung) in the plane (the direction in xy-plane) of the support surface 1-402 of the buff table 1-400. Alternatively or additionally, the direction of the pure water nozzle 1-710 can be changed (tilted) in a plane (the direction in zx-plane) perpendicular to the support surface 1-402 of the buff table 1-400. Furthermore, alternatively or additionally, the position of the pure water nozzle 1-710 can be changed in a direction (the z direction) perpendicular to the support surface 1-402 of the buff table 1-400. Any mechanism may be adopted to change the direction and the position of the pure water nozzle 1-710.

The liquid supply system 1-700 includes a first chemical solution nozzle 1-720 for supplying a chemical solution (Chemi) to the processing target surface of the wafer W. The first chemical solution nozzle 1-720 supplies the surface of the wafer W with the chemical solution during chemical solution cleaning after the buff-cleaning process or the buff-polishing process. The first chemical solution nozzle 1-720 communicates with a first chemical solution supply source 1-724 through chemical solution piping 1-722. The chemical solution piping 1-722 is provided with an on-off valve 1-726 that can open and close the chemical solution piping 1-722. The on-off valve 1-726 opening and closing control through a control device, not shown, can supply the chemical solution to the processing target surface of the wafer W or the support surface 1-402 of the buff table 1-400 for supporting the wafer W, at any timing.

The direction of the first chemical solution nozzle 1-720 can be changed (swung) in the plane (the direction in xy-plane) of the support surface 1-402 of the buff table 1-400. Alternatively or additionally, the direction of the first chemical solution nozzle 1-720 can be changed (tilted) in a plane (the direction in zx-plane) perpendicular to the support surface 1-402 of the buff table 1-400. Furthermore, alternatively or additionally, the position of the first chemical solution nozzle 1-720 can be changed in a direction (the z direction) perpendicular to the support surface 1-402 of the buff table 1-400. Any mechanism may be adopted to change the direction and the position of the first chemical solution nozzle 1-720.

Additionally, the liquid supply system 1-700 includes a second chemical solution nozzle 1-720-2 for supplying a chemical solution to the support surface 1-402 of the buff table 1-400 for supporting the wafer W. The second chemical solution nozzle 1-720-2 sprays the chemical solution on the support surface 1-402 during cleaning the support surface 1-402. The second chemical solution nozzle 1-720-2 communicates with a second chemical solution supply source 1-724-2 through chemical solution piping 1-722-2. The chemical solution piping 1-722-2 is provided with an on-off valve 1-726-2 that can open and close the chemical solution piping 1-722-2. The on-off valve 1-726-2 opening and closing control through the control device, not shown, can supply the chemical solution to the support surface 1-402, at any timing.

As with the first chemical solution nozzle 1-720, the second chemical solution nozzle 1-720-2 can change the direction and/or height of the nozzle.

The chemical solution supplied by the second chemical solution nozzle 1-720-2 may be different from or the same as the chemical solution supplied by the first chemical solution nozzle 1-720. In the case of using the same chemical solution, the second chemical solution nozzle 1-720-2 and the accompanying piping or the like may be omitted.

The buff process module 1-300A according to the illustrated embodiment can selectively supply the pure water, chemical solution, or slurry to the processing target surface of the wafer W or the support surface 1-420 of the buff table 1-400 for supporting the wafer W, through the buff arm 1-600, the buff head 1-500, and the buff pad 1-502.

That is, branched pure water piping 1-712a is branched from the pure water piping 1-712 between the pure water supply source 1-714 and the on-off valve 1-716. Furthermore, branched chemical solution piping 1-722a is branched from the chemical solution piping 1-722 between the first chemical solution supply source 1-724 and the on-off valve 1-726. The branched pure water piping 1-712a, the branched chemical solution piping 1-722a, and slurry piping 1-732, which communicates with a slurry supply source 1-734, join together into liquid supply piping 1-740. The branched pure water piping 1-712a is provided with an on-off valve 1-718 that can open and close the branched pure water piping 1-712a. The branched chemical solution piping 1-722a is provided with an on-off valve 1-728 that can open and close the branched chemical solution piping 1-722a. The slurry piping 1-732 is provided with an on-off valve 1-736 that can open and close the slurry piping 1-732.

A first end of the liquid supply piping 1-740 communicates with three systems of piping, which are the branched pure water piping 1-712a, the branched chemical solution piping 1-722a, and the slurry piping 1-732. The liquid supply piping 1-740 extends through the inside of the buff arm 1-600, the center of the buff head 1-500, and the center of the buff pad 1-502. A second end of the liquid supply piping 1-740 opens toward the processing target surface of the wafer W or the support surface 1-402 of the buff table 1-400 for supporting the wafer W. The control device, not shown, can supply the processing target surface of the wafer W or the support surface 1-402 of the buff table 1-400 for supporting the wafer W, with any one of the pure water, chemical solution, and slurry, or a mixed liquid that is any combination thereof, by controlling on and off of the on-off valve 1-718, the on-off valve 1-728 and the on-off valve 1-736.

The buff process module 1-300A according to the illustrated embodiment supplies the wafer W with the process liquid through the liquid supply piping 1-740, rotates the buff table 1-400 about the rotation axis A, presses the buff pad 1-502 against the processing target surface of the wafer W, and swings the buff head 1-500 in the direction of arrow C while rotating this head about the rotation axis B, thereby allowing the buff process to be applied to the wafer W.

The conditioner 1-800 shown in FIG. 1 is a member for conditioning the surface of the buff pad 1-502. The conditioner 1-800 includes a dressing table 1-810, and a dresser 1-820 installed on the dressing table 1-810. The dressing table 1-810 can be rotated about a rotation axis D by a drive mechanism, not shown. The dresser 1-820 may be formed of a diamond dresser or a brush dresser, or a combination of these dressers.

Figure 2:
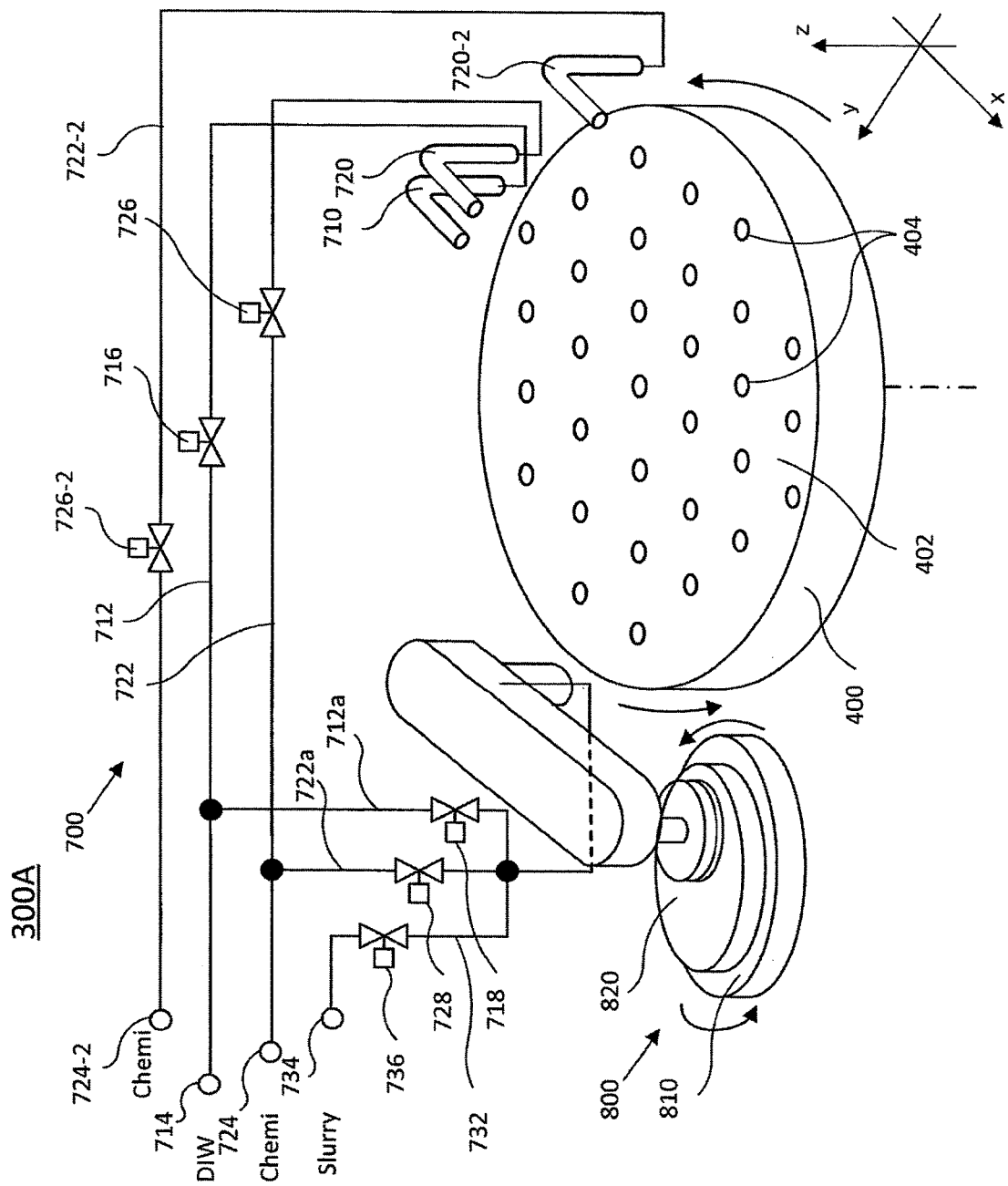
FIG. 2 a diagram showing the state of the buff process module that cleans a support surface in a state where a wafer W is removed.

When the buff pad 1-502 is conditioned, the buff process module 1-300A swings the buff arm 1-600 such that the buff pad 1-502 reaches a position facing the dresser 1-820 (see FIG. 2). The buff process module 1-300A rotates the dressing table 1-810 about the rotation axis D while rotating the buff head 1-500, and presses the buff pad 1-502 against the dresser 1-820, thereby conditioning the buff pad 1-502.

The illustrated embodiment can include a cover 1-470 that at least partially covers the buff table 1-400 (see FIG. 3) in order to prevent foreign substances from being dispersed on the wafer W on the buff table 1-400 and from contaminating the wafer W or the support surface 1-402 during conditioning the buff pad 1-502 or the like. The cover 1-470 shown in FIG. 3 covers the buff table 1-400 in the circumferential direction. The cover 1-470 can change its height.

FIG. 2 shows a state of cleaning the support surface 1-402 of the buff table 1-400 for supporting the wafer W after the buff process of the wafer W has been finished and the wafer W has been taken out of the buff table 1-400. In the example shown in FIG. 2, during cleaning the support surface 1-402, the buff pad 1-502 is conditioned in the conditioner 1-800. Alternatively, during cleaning the support surface 1-402, the buff head 1-500 may reside at an ascending position apart from the support surface 1-402 of the buff table 1-400.

During cleaning the support surface 1-402, the chemical solution is jetted to the support surface 1-402 from the second chemical solution nozzle 1-720-2, which communicates with the second chemical solution supply source 1-724-2, and the support surface 1-402 is cleaned. Use of the chemical solution can more efficiently clean abrasive grains and polishing by-products which adhere to the support surface 1-402, off this surface. Subsequently, pure water is supplied from the pure water nozzle 1-710 to the support surface 1-402, and the support surface 1-402 is further cleaned.

As with the first chemical solution nozzle 1-720, the second chemical solution nozzle 1-720-2 can change its direction and position, and clean the support surface 1-402 while changing the position at which the chemical solution is supplied.

The chemical solution supplied by the second chemical solution nozzle 1-720-2 may be different from the chemical solution supplied by the first chemical solution nozzle 1-720. Alternatively, the same chemical solution may be used. In the case of using the same chemical solution between the second chemical solution nozzle 1-720-2 and the first chemical solution nozzle 1-720, the second chemical solution nozzle 1-720-2 may be omitted.

Figure 3:
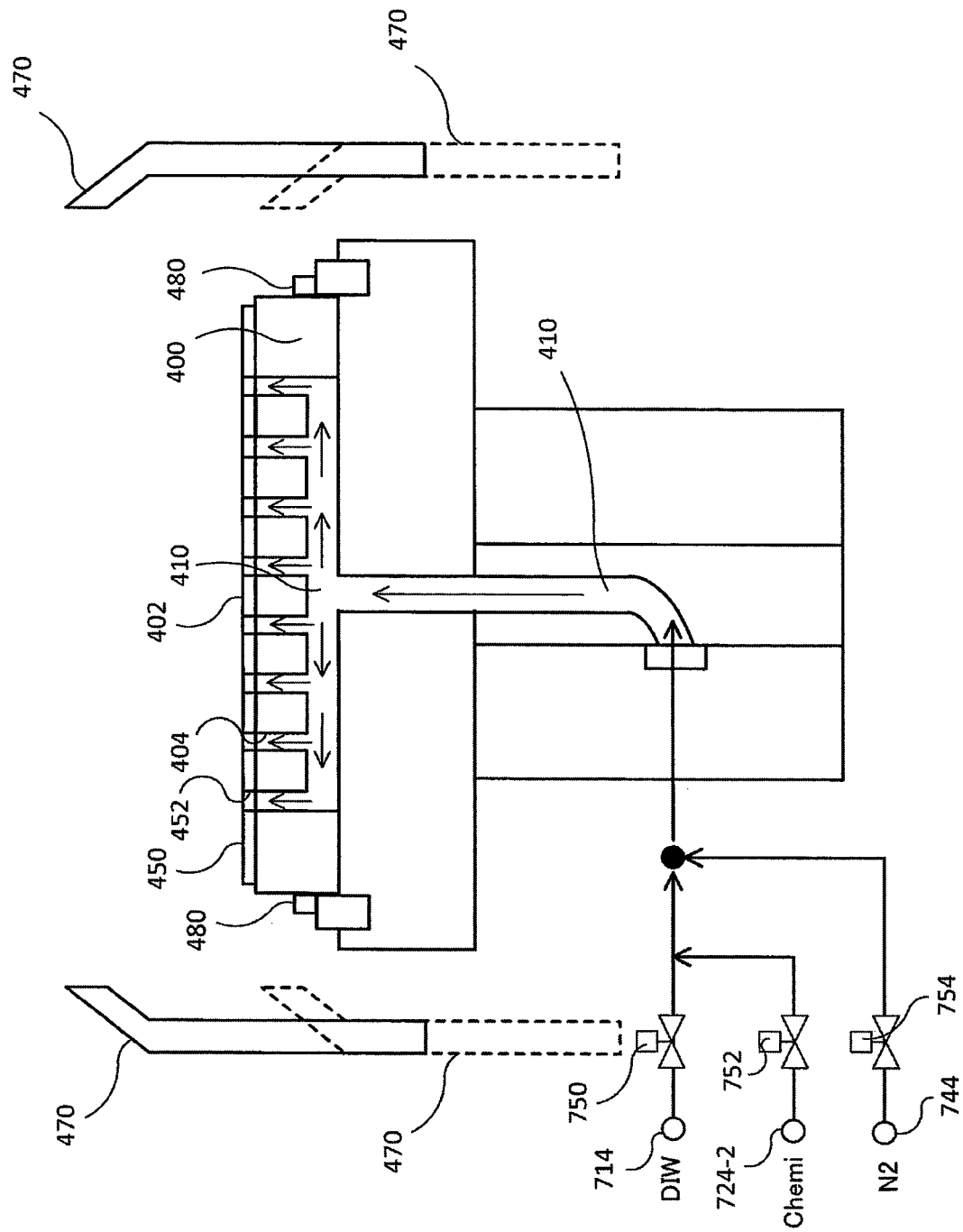
FIG. 3 is a sectional view showing a buff table and a stage film according to one embodiment of the present invention.

FIG. 3 is a diagram schematically showing the sectional view of the buff table 1-400 to which the stage film 1-450 is attached. As described above, the buff table 1-400 includes the fluid passage 1-410 used for allowing the wafer W to be vacuum-sucked onto the support surface 1-402. The fluid passage 1-410 may further communicate with a nitrogen source 1-744 used for attaching and detaching the wafer W, the pure water supply source 1-714 freely selectively used for cleaning the support surface 1-402 of the buff table 1-400, and the second chemical solution supply source 1-724-2 (the first chemical solution supply source 1-724 in the case of omitting the second chemical solution supply source 1-724-2 and the second chemical solution nozzle 1-720-2). Also during attaching or detaching the wafer W to or from the buff table 1-400, the pure water may be supplied from the pure water supply source 1-714, or a mixture of pure water and nitrogen may be supplied. The piping for supplying the pure water, chemical solution, and nitrogen gas to the fluid passage 1-410 of the buff table 1-400 is provided with on-off valves 1-750, 1-752 and 1-754. The on-off valves 1-750, 1-752 and 1-754 opening and closing control by means of the control device, not shown, can supply the pure water, chemical solution, and nitrogen gas to the support surface 1-402 through the fluid passage 1-410 of the buff table 1-400.

Supply of the pure water and/or chemical solution from the fluid passage 1-410 during cleaning of the buff table 1-400 can prevent foreign substances from entering the inside of the buff table 1-400 during cleaning, and improve the cleaning efficiency. Here, the chemical solution for cleaning the fluid passage 1-410 may be the same as the chemical solution for cleaning the support surface 1-402 of the buff table 1-400. Alternatively, different chemical solutions may be used for the respective cases.

Figure 4A:
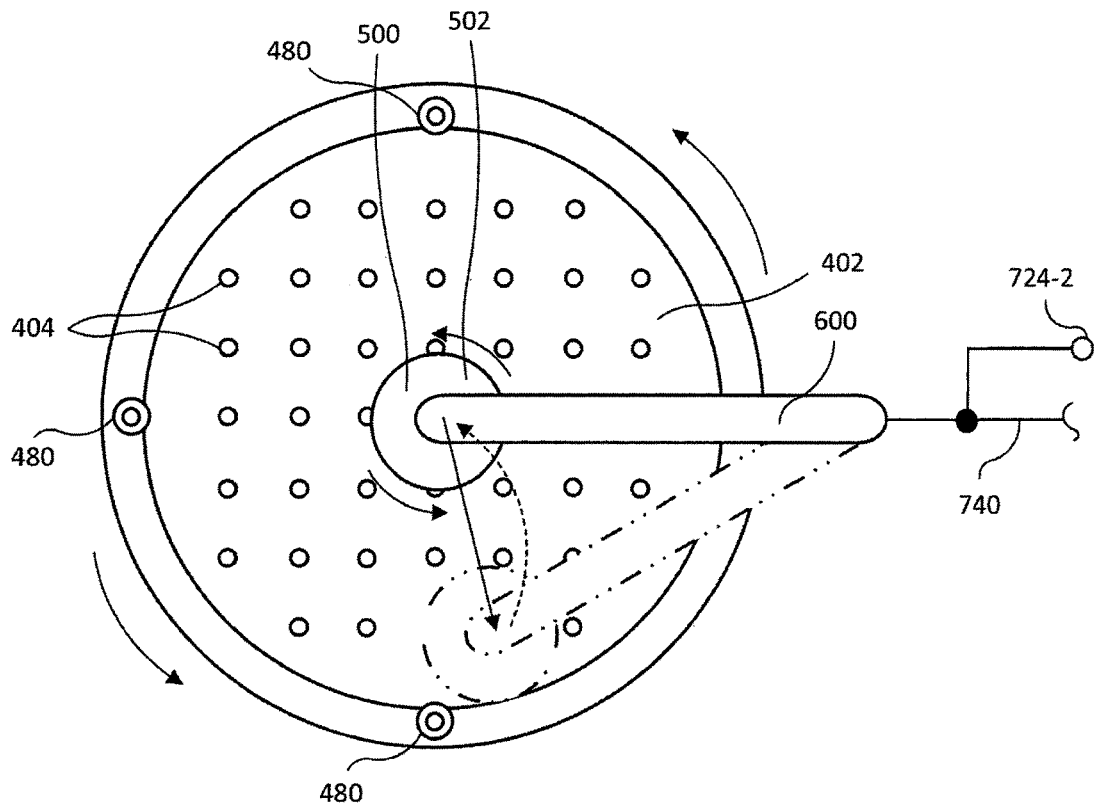
FIG. 4A is a plan view showing cleaning of the support surface of the buff table using a buff pad according to one embodiment of the present invention.
Figure 4B:
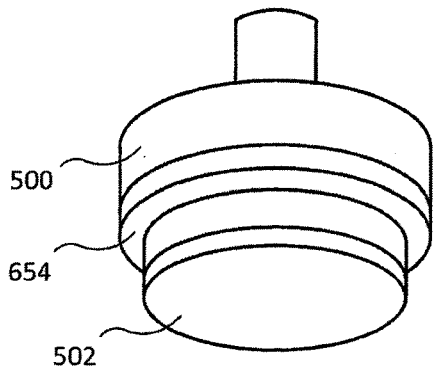
FIG. 4B is a diagram showing the buff pad and a cleaning member according to the embodiment of the present invention.
Figure 4C:
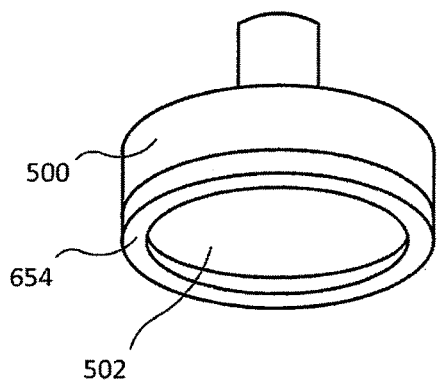
FIG. 4C is a diagram showing the buff pad and the cleaning member according to the embodiment of the present invention.

As shown in FIG. 4a, the support surface 1-402 may be cleaned while the buff pad 1-502 used for the buff process is being rotated and in contact with the support surface 1-402. Consequently, the physical force may be applied to foreign substances on the support surface 1-402, thereby allowing the substances to be removed. In this case, the second chemical solution supply source 1-724-2 for cleaning the support surface 1-402 may communicate with the liquid supply piping 1-740 of the liquid supply system 1-700 shown in FIG. 1. As shown in FIGS. 4B and 4C, the buff pad 1-502 for the buff process may be attached to the center of the buff head 1-500, a cleaning member 1-654 for cleaning the support surface 1-402 may be attached therearound, and these pad and member may be independently ascend and descend. FIG. 4B shows the state of the buff process, where the buff pad 1-502 protrudes with respect to the cleaning member 1-654. FIG. 4C shows the state of cleaning, where the cleaning member 1-654 protrudes with respect to the buff pad 1-502. The cleaning member 1-654 may be, for example, a brush or a sponge member. Consequently, through use of the same buff arm 1-600, the cleaning member 1-654 used only for cleaning the support surface 1-402 may be brought into contact with the support surface 1-402, and operated. The support surface 1-402 may be cleaned with application of the physical force to this surface, while the pure water may be supplied from the pure water nozzle 1-710, the pure water or chemical solution may be supplied through the liquid supply piping 1-740, or the chemical solution may be supplied from the second chemical solution nozzle 1-720-2, or freely selected combination thereof may be supplied.

Figure 5:
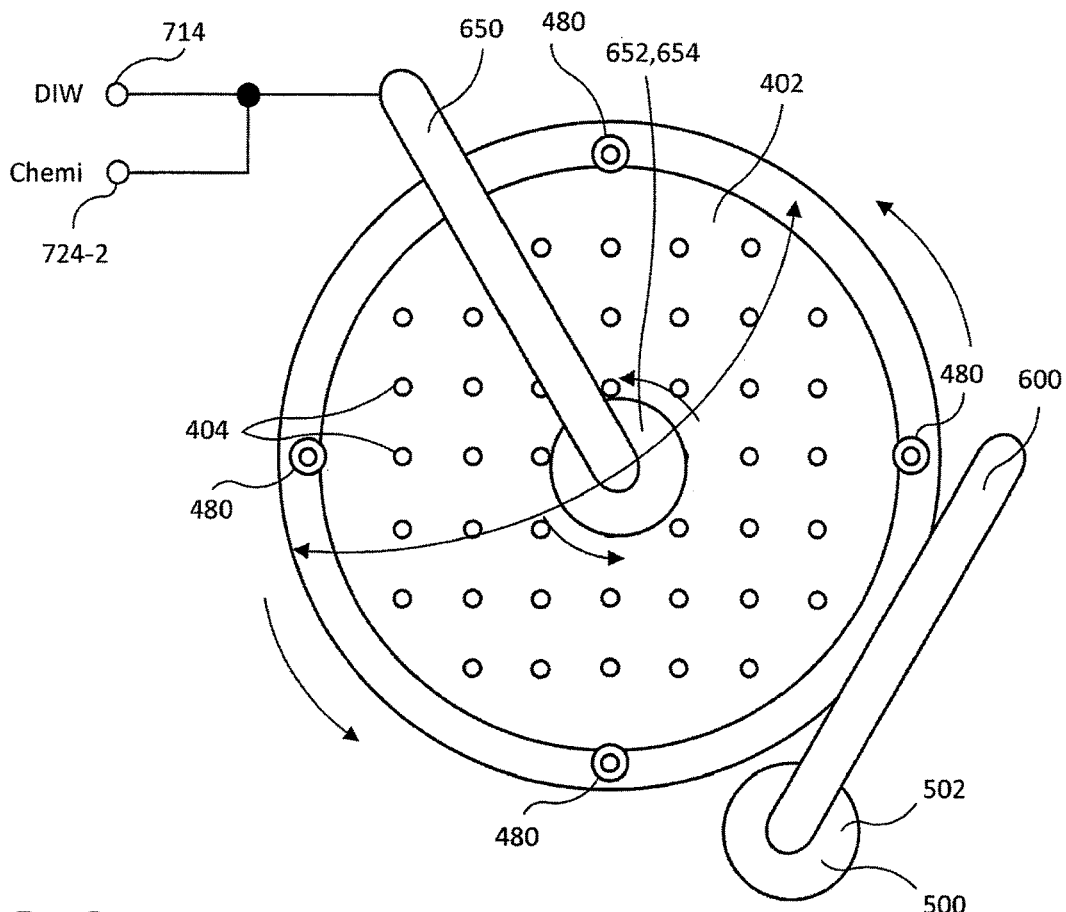
FIG. 5 is a plan view showing cleaning of the support surface of the buff table by another arm according to one embodiment of the present invention.

In one embodiment of this disclosure, the buff process module 1-300A may include: a dedicated cleaning arm 1-650 that is different from the buff arm 1-600, to which the buff pad 1-502 is attached, but is for cleaning the support surface 1-402 of the buff table 1-400; a cleaning head 1-652; and the cleaning member 1-654 (see FIG. 5). The cleaning arm 1-650, the cleaning head 1-652 and the cleaning member 1-654 may have configurations similar to those of the buff arm 1-600, the buff head 1-500 and the buff pad 1-502, respectively. The pure water and/or chemical solution may or may not be selectively supplied to the support surface 1-402 of the buff table 1-400 through the cleaning arm 1-650, the cleaning head 1-652 and the cleaning member 1-654.

The cleaning member 1-654 may have a configuration similar to that of the buff pad 1-502. The cleaning member 1-654 may be a brush or a sponge member.

Figure 6:
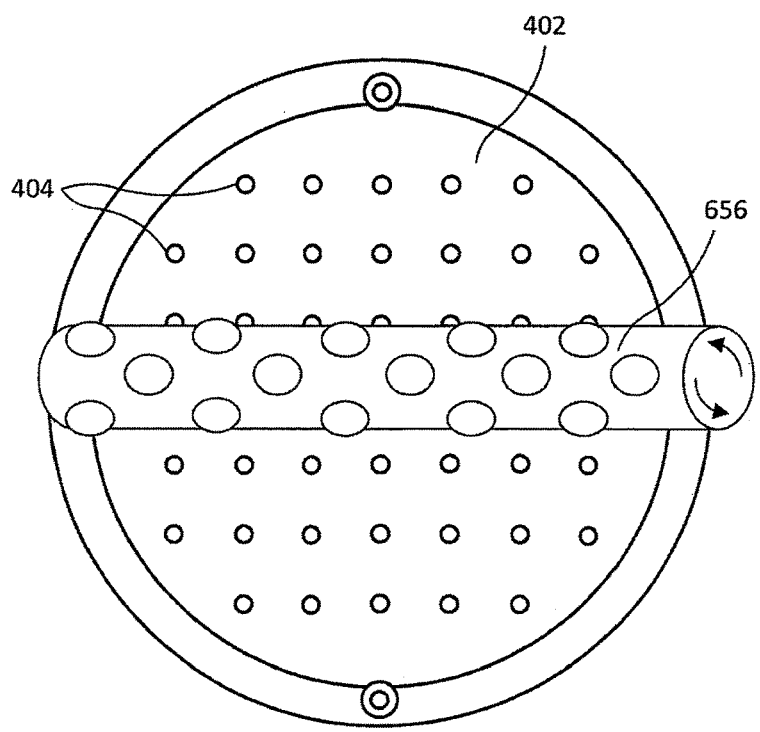
FIG. 6 is a plan view showing cleaning of the support surface of the buff table using roll sponge according to one embodiment of the present invention.

In one embodiment of this disclosure, the buff process module 1-300A includes roll sponge 1-656 for cleaning the support surface 1-402 of the buff table 1-400 (see FIG. 6). The roll sponge 1-656 is configured to rotate in contact with the support surface 1-402 of the buff table 1-400 and thus clean this support surface 1-402. Any mechanism may be used to move the roll sponge 1-656 to the support surface 1-402 of the buff table 1-400 and rotate this sponge.

Figure 7:
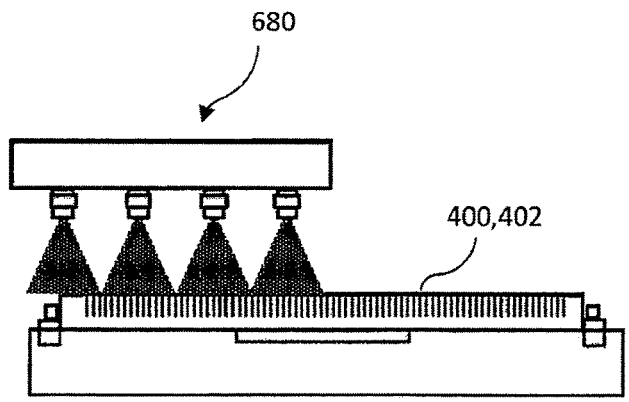
FIG. 7 is a side view showing cleaning of the support surface of the buff table using an atomizer cleaner according to one embodiment of the present invention.
Figure 8:
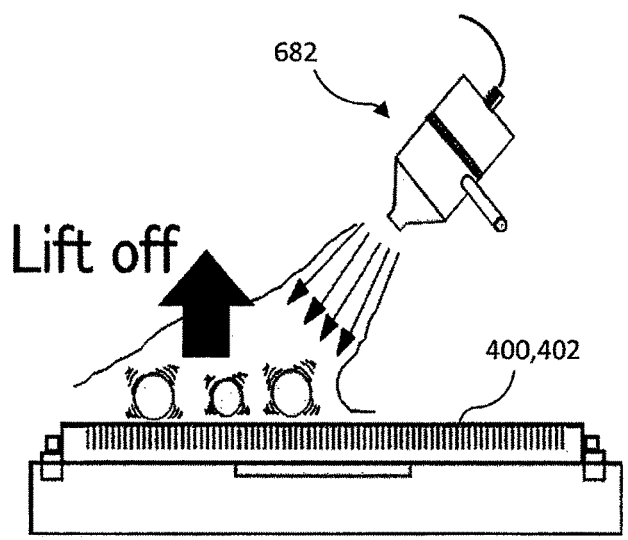
FIG. 8 is a side view showing cleaning of the support surface of the buff table using an ultrasonic cleaner according to one embodiment of the present invention.
Figure 9:
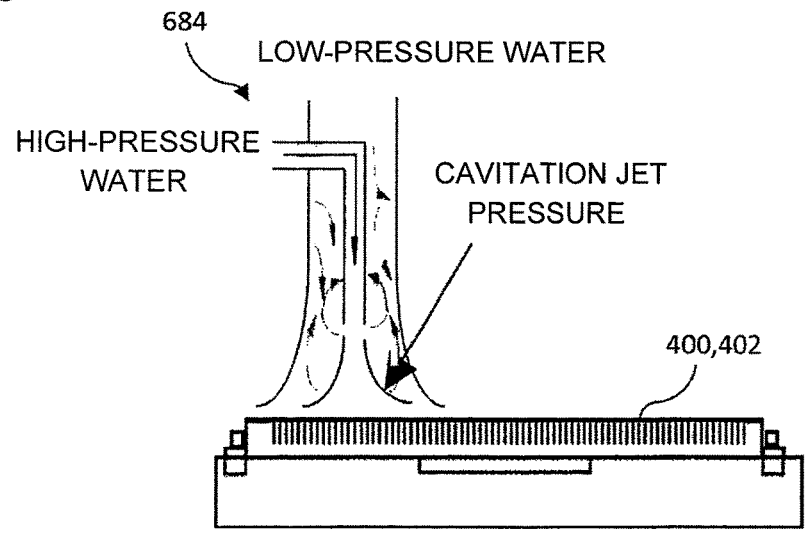
FIG. 9 is a side view showing cleaning of the support surface of the buff table using a cavitation jet cleaner according to one embodiment of the present invention.

In one embodiment of this disclosure, the buff process module 1-300A may include at least one of an atomizer cleaner 1-680, an ultrasonic cleaner 1-682 and a cavitation jet cleaner 1-684, which are for cleaning the support surface 1-402 of the buff table 1-400 (FIGS. 7, 8 and 9). These noncontact cleaners 1-680, 1-682 and 1-684 are effective in the case where there is a possibility that contact-cleaning using the buff pad 1-502 or a sponge member damages the stage film 1-450, the case where it is difficult to remove foreign substances by cleaning using the pure water and chemical solution, the case where it is difficult to remove foreign substances by cleaning using a combination of the pure water, chemical solution and contact-cleaning, the case of removing foreign substances entering concaves on the stage film 1-450, and the case of removing foreign substances adhering to a complicated conveyor mechanism (e.g., lift pins 1-480) near the buff table 1-400.

As shown in FIG. 7, the atomizer cleaner 1-680 is for jetting a high-pressure pure water or gas to the support surface 1-402 of the buff table 1-400 to clean this support surface 1-402. The atomizer cleaner 1-680 may be a publicly known or freely selected one.

As shown in FIG. 8, the ultrasonic cleaner 1-682 is for applying ultrasonic waves to the support surface 1-402 of the buff table 1-400 to remove foreign substance and the like adhering to the support surface 1-402. The ultrasonic cleaner 1-682 may be a publicly known or freely selected one.

As shown in FIG. 9, the cavitation jet cleaner 1-684 is for applying high-pressure water and low-pressure water to the support surface 1-402 of the buff table 1-400 to remove foreign substance and the like adhering to the support surface 1-402. The cavitation jet cleaner 1-684 may be a publicly known or freely selected one.

The cleaning on the support surface 1-402 of the buff table 1-400 has thus been described. That is, the cleaning on the support surface 1-402 by means of the pure water or chemical solution or physical contact of the buff pad 1-502 or the cleaning member 1-654 dedicated for buff-cleaning, or by means of the noncontact cleaner 1-680, 1-682 or 1-684 has been described. These measures may also clean the conveyor mechanism (lift pins 1-480) of the buff table 1-400.

A process of cleaning the support surface 1-402 of the buff table 1-400 that supports the wafer W, using the buff process module 1-300A, is hereinafter described as an embodiment of this disclosure.

Figure 10:
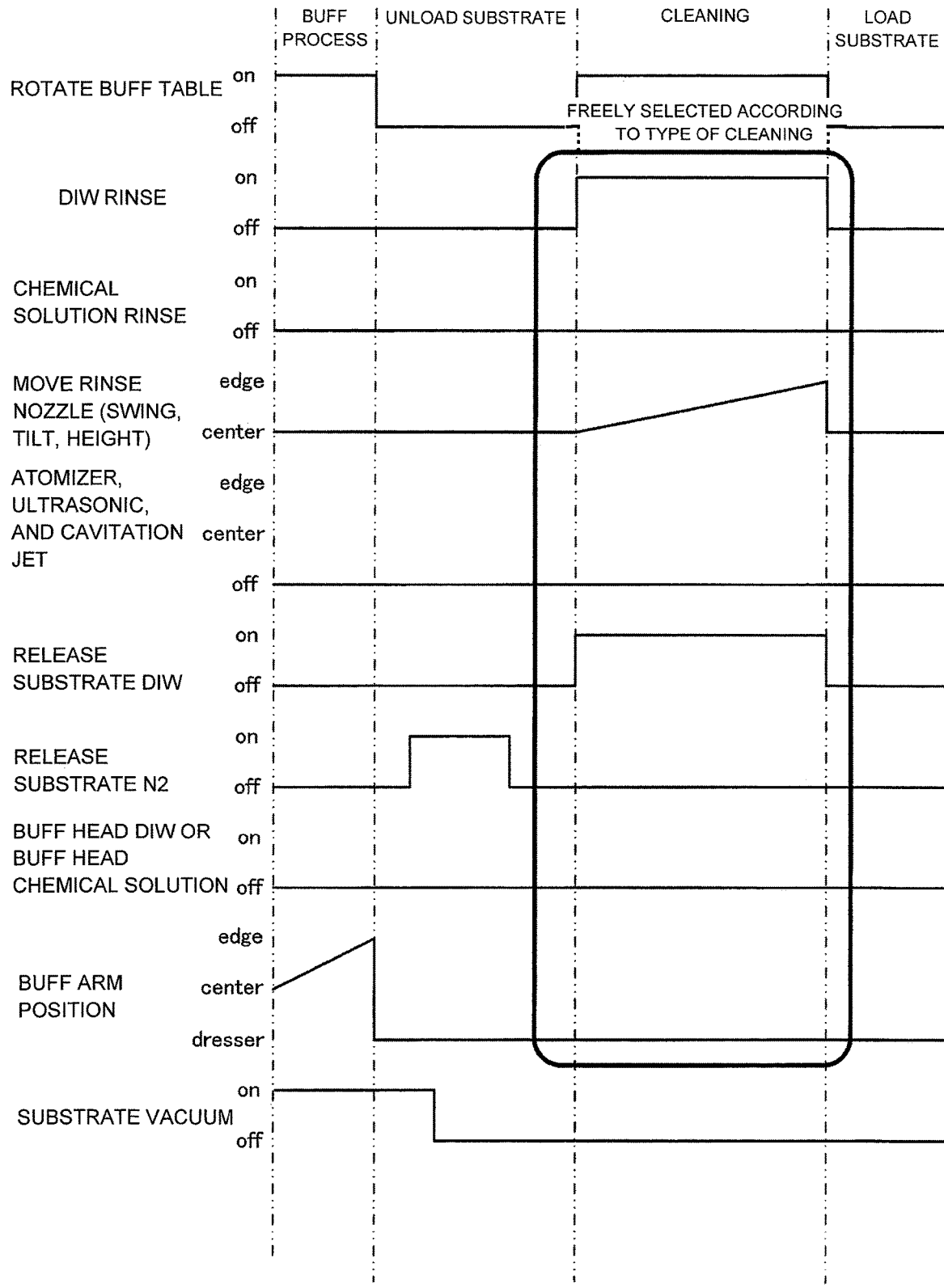
FIG. 10 is a diagram showing a timing chart of configuration components during cleaning of the support surface of the buff table using pure water (DIW: deionized water)

FIG. 10 is a diagram showing a timing chart of configuration components during cleaning of the support surface 1-402 of the buff table 400 using pure water (DIW: deionized water). In this diagram, the abscissa is the temporal axis, where the following phases are shown. That is, the phases are "BUFF PROCESS", "UNLOAD SUBSTRATE" for transferring the substrate on which the buff process has been completed, "CLEANING" for cleaning the support surface 1-402 of the buff table 1-400, and "LOAD SUBSTRATE" for buff-processing the next substrate after cleaning the support surface 1-402. The ordinate of this diagram indicates each configuration component, and shows the operation of the component.

As shown in FIG. 10, during the buff process, the buff table 1-400 rotates, the buff arm 1-600 is swung outward from the center of the wafer W, and the buff process is performed (see FIG. 1 etc.). During the buff process, the substrate (wafer W) is vacuum-sucked on the support surface 1-402 of the buff table 1-400. The details of the buff process are not the main topic of this disclosure. Accordingly, the description thereof is omitted.

After completion of the buff process, the rotation of the buff table 1-400 is finished, and the nitrogen gas is supplied through the fluid passage 1-410 in order to release the wafer W. Furthermore, ascent of the lift pins 1-480 raises the wafer W. The released wafer W is moved to the next processing section by the substrate conveyor robot.

After the substrate is unloaded, the support surface 1-402 of the buff table 1-400 is cleaned. FIG. 10 shows an example of cleaning using the pure water (DIW). During cleaning, the buff table 1-400 is rotated while the pure water is supplied from the pure water nozzle 1-710 to the center of the support surface 1-402 (see "DIW RINSE" in the diagram). Since the buff table 1-400 rotates, the centrifugal force forms a flow of pure water from the center of the support surface 1-402 toward the outside. Consequently, the foreign substances are washed out. At this time, the direction and height of the pure water nozzle 1-710 are changed to supply the pure water from the center of the support surface 1-402 toward the outside. Such supply more effectively forms the flow from the center of the support surface 1-402 toward the outside, thereby allowing foreign substances to be washed out (see "MOVE RINSE NOZZLE (SWING, TILT, HEIGHT) in FIG. 10). During cleaning, supply of the pure water through the fluid passage 1-410 of the buff table 1-400 to the support surface 1-402 can prevent foreign substances from entering the inside of the buff table 1-400 (see "RELEASE SUBSTRATE DIW" in the diagram). The buff table 1-400 can have a rotation speed of 50 to 1000 min-1. Preferably, the rotation speed is 100 to 200 min-1. Alternatively, in order to positively use the centrifugal force to remove foreign substances from the support surface 1-402 of the buff table 1-400, a higher rotation speed, such as 500 min-1 or higher, or 1000 min-1 or higher, may be adopted.

FIG. 10 shows the example of cleaning only using pure water (DIW). However, a section encircled by a thick line in FIG. 10 can be freely changed according to the type of cleaning. In some types of cleaning, the buff process module 1-300A does not necessarily include the entire configuration described above. For example, in the case of cleaning only using the pure water in FIG. 10, the configuration for supplying the pure water and/or chemical solution through the buff head 1-500 may be omitted. In the example shown in FIG. 10, the atomizer cleaner 1-680, the ultrasonic cleaner 1-682 and the cavitation jet cleaner 1-684 are not necessarily included.

Figure 11:
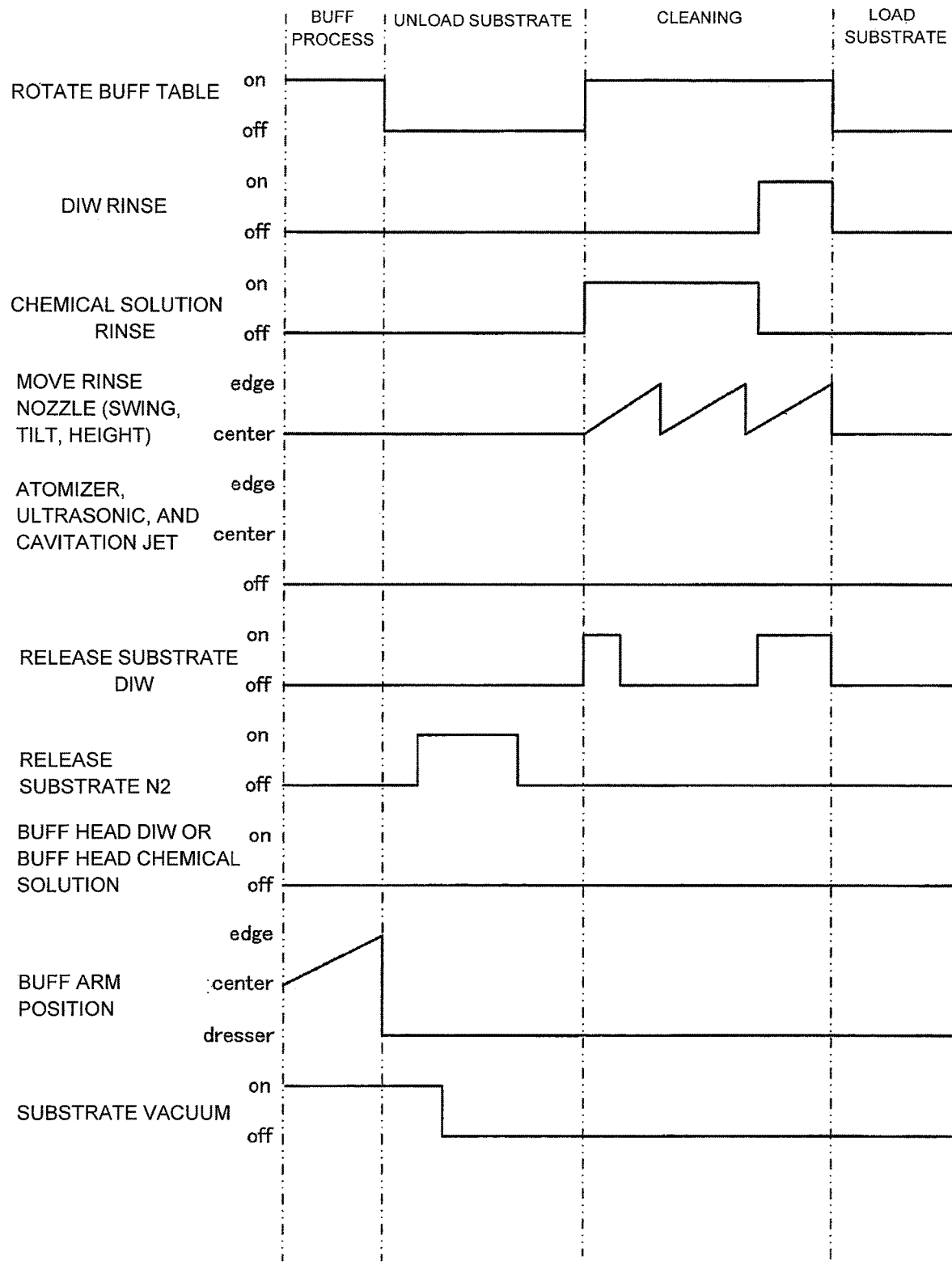
FIG. 11 is a diagram showing a timing chart of configuration components during cleaning of the support surface of the buff table using a chemical solution.

FIG. 11 is a diagram showing an example of a timing chart during cleaning of the support surface 1-402 of the buff table 1-400 using a chemical solution. In this example, during cleaning, the buff table 1-400 is rotated while the chemical solution is supplied from the second chemical solution nozzle 1-720-2 to the support surface 1-402. The direction and height of second chemical solution nozzle 1-720-2 are changed to supply the chemical solution from this nozzle to the center of the support surface 1-402 and then toward the outside as with the example of FIG. 10, thereby allowing cleaning to be effectively achieved. At the last stage of cleaning, supply of the chemical solution from the second chemical solution nozzle 1-720-2 is stopped, and the pure water is supplied from the pure water nozzle 1-710 to the support surface 1-402, thereby rinsing the chemical solution with the pure water. In the example of FIG. 11, at the beginning and the last of cleaning, the pure water is supplied through the fluid passage 1-410 to the support surface 1-402 from its bottom. At the beginning of cleaning, the pure water is injected into the fluid passage 1-410 and this fluid passage 1-410 is filled with the pure water, thereby preventing foreign substance from entering the inside of the fluid passage 1-410. At the middle of cleaning, injection of the pure water into the fluid passage 1-410 is stopped, thereby preventing the chemical solution for cleaning the support surface 1-402 from being diluted. At the last of cleaning, the pure water is injected into the fluid passage 1-410 again, thereby finally washing foreign substances out of the fluid passage. Alternatively, the chemical solution may be injected from the second chemical solution supply source 1-724-2 into the fluid passage 1-410 to clean the inside of the fluid passage 1-410.

The type of chemical solution used for cleaning the support surface 1-402 of the buff table 1-400 with this chemical solution may be any type according to the usage. For example, in the case of washing out dust and organic substances on the support surface 1-402, use of alkaline chemical solution, such as ammonia and hydrogen peroxide water, can remove particles on the support surface 1-402 by means of the action of zeta potential. Alternatively, use of a surfactant may apply a hydrophilization process onto the support surface, thereby preventing foreign substance from adhering.

In the case where foreign substances to be removed from the support surface 1-402 are metal ions, such as of copper, iron and aluminum, use of acid chemical solution, citric acid, and oxalic acid, and an addition agent can prevent the metal ion and the like from adhering again by means of the chelate effect.

As with the example of FIG. 10, also in the example of FIG. 11, the configuration for supplying the pure water and/or chemical solution through the buff head 1-500, the atomizer cleaner 1-680, the ultrasonic cleaner 1-682 and the cavitation jet cleaner 1-684 are not necessarily included.

Figure 12:
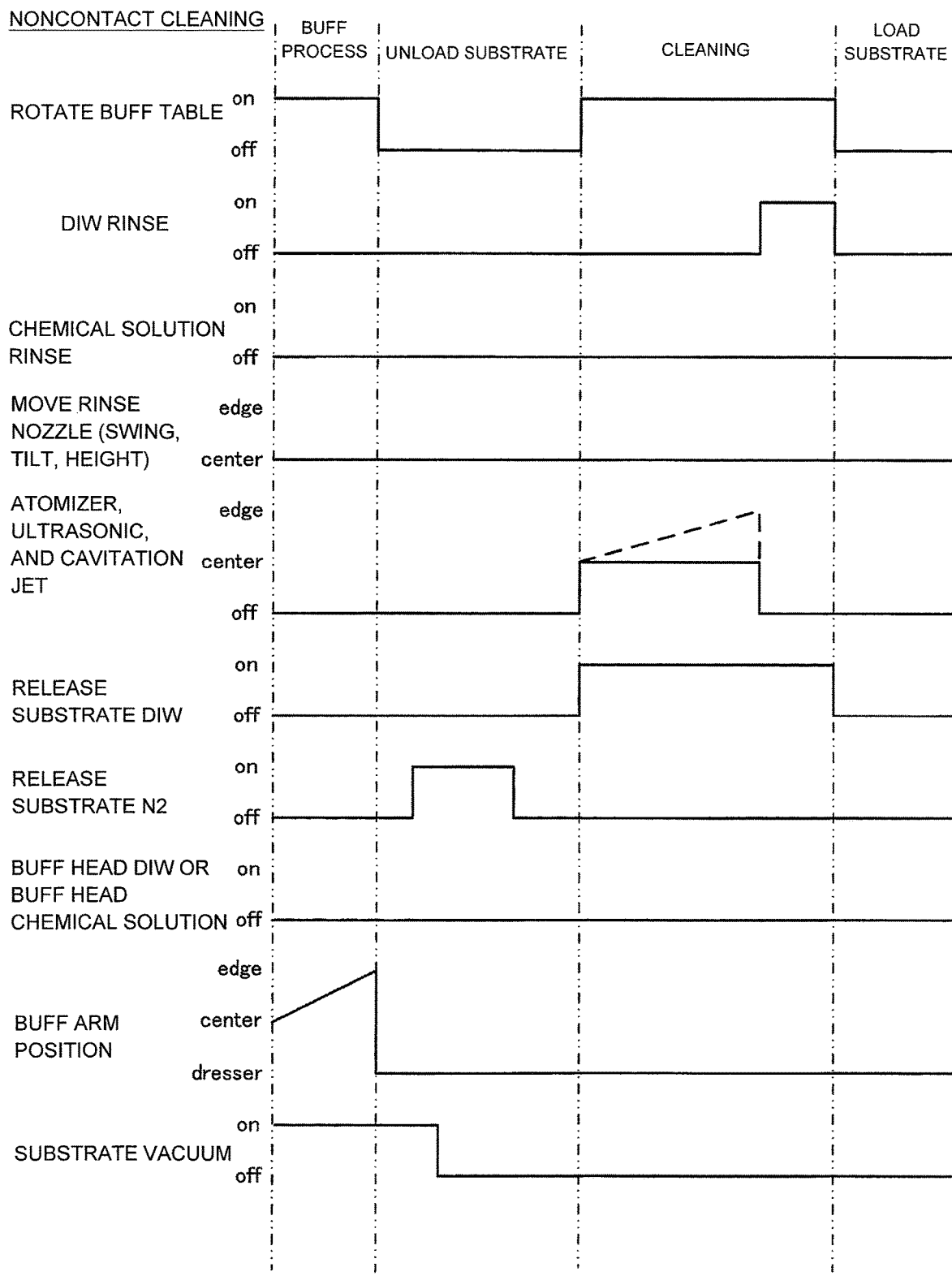
FIG. 12 is a diagram showing a timing chart of configuration components during cleaning of the support surface of the buff table using a noncontact cleaner.

FIG. 12 shows an example of a timing chart during cleaning the support surface 1-402 using the atomizer cleaner 1-680, the ultrasonic cleaner 1-682, or the cavitation jet cleaner 1-684. In this example, during cleaning, the buff table 1-400 is rotated while the support surface 1-402 of the buff table 1-400 is cleaned by the atomizer cleaner 1-680, the ultrasonic cleaner 1-682 or the cavitation jet cleaner 1-684. During cleaning, the ultrasonic cleaner 1-682 or the cavitation jet cleaner 1-684 may be swung from the center of the support surface 1-402 toward the outer periphery (indicated by a broken line in FIG. 12). On the other hand, in the case where a cleaning range covering the entire support surface 1-402 (a radius portion of the support surface 1-402) is supported as with the case of the atomizer cleaner 1-680, rotation of the buff table 1-400 can clean the entire support surface 1-402 (indicated by a solid line in FIG. 12), which negates the need of swinging. In the illustrated example, at the last stage of cleaning, cleaning by the atomizer cleaner 1-680, the ultrasonic cleaner 1-682 or the cavitation jet cleaner 1-684 is stopped, and the pure water is supplied from the pure water nozzle 1-710 to the support surface 1-402, thereby rinsing this support surface 1-402. During cleaning, supply of the pure water through the fluid passage 1-410 of the buff table 1-400 to the support surface 1-402 can prevent foreign substances from entering the inside of the buff table 1-400.

Figure 13:
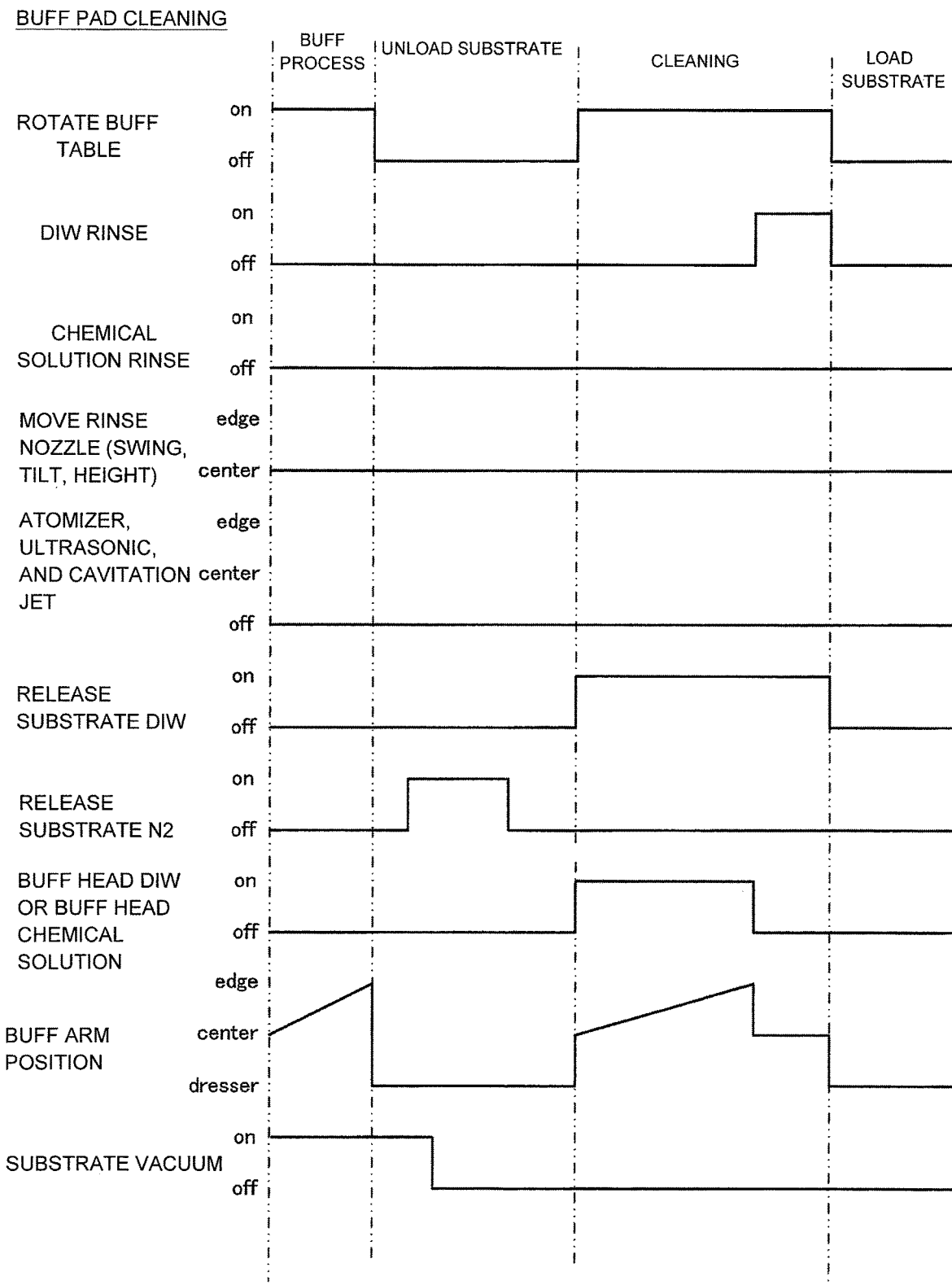
FIG. 13 is a diagram showing a timing chart of configuration components during cleaning of the support surface of the buff table using the buff pad.

FIG. 13 is a diagram showing an example of a timing chart during cleaning of the support surface 1-402 of the buff table 1-400 using the buff pad 1-502. In this example, the buff table 1-400 is rotated, the buff head 1-500 is pressed against the support surface 1-402 at the same time, and the buff head 1-500 is rotated while this head is swung from the center of the support surface 1-402 toward the outside (see "BUFF ARM POSITION" in FIG. 13), thereby performing cleaning (see FIGS. 4A, 4B and 4C). At this time, appropriate control of the on-off valves 1-718 and 1-728 can supply the pure water and/or chemical solution to the support surface 1-402 through the buff head 1-500 and the buff pad 1-502. In the case of using a chemical solution, any chemical solution, such as the chemical solution described with reference to FIG. 11, may be used. In the example shown in FIG. 13, the pure water is supplied from the pure water nozzle 1-710 at the last stage of cleaning to rinse the support surface 1-402. During cleaning, supply of the pure water through the fluid passage 1-410 of the buff table 1-400 to the support surface 1-402 can prevent foreign substances from entering the inside of the buff table 1-400. After completion of cleaning, while the next substrate is loaded onto the support surface 1-402, the buff pad 1-502 is moved to the dresser 1-820 and conditioned for the buff process for the next substrate.

In the example shown in FIG. 13, the description has been made such that the support surface 1-402 of the buff table 1-400 is cleaned using the buff pad 1-502 used for the buff process. Alternatively, instead of the buff pad 1-502 used for the buff process, a dedicated cleaning member, brush or sponge member may be attached to the buff head 1-500 and cleaning may be performed. In the example shown in FIG. 13, the description has been made such that cleaning is performed using the buff arm 1-600, the buff head 1-500 and the buff pad 1-502. Alternatively, a dedicated cleaning arm 1-650, cleaning head 1-652 and cleaning member 1-654 (including a brush or sponge member) that have respective structures similar thereto may be used to clean the support surface 1-402 (see FIG. 5).

Figure 14:
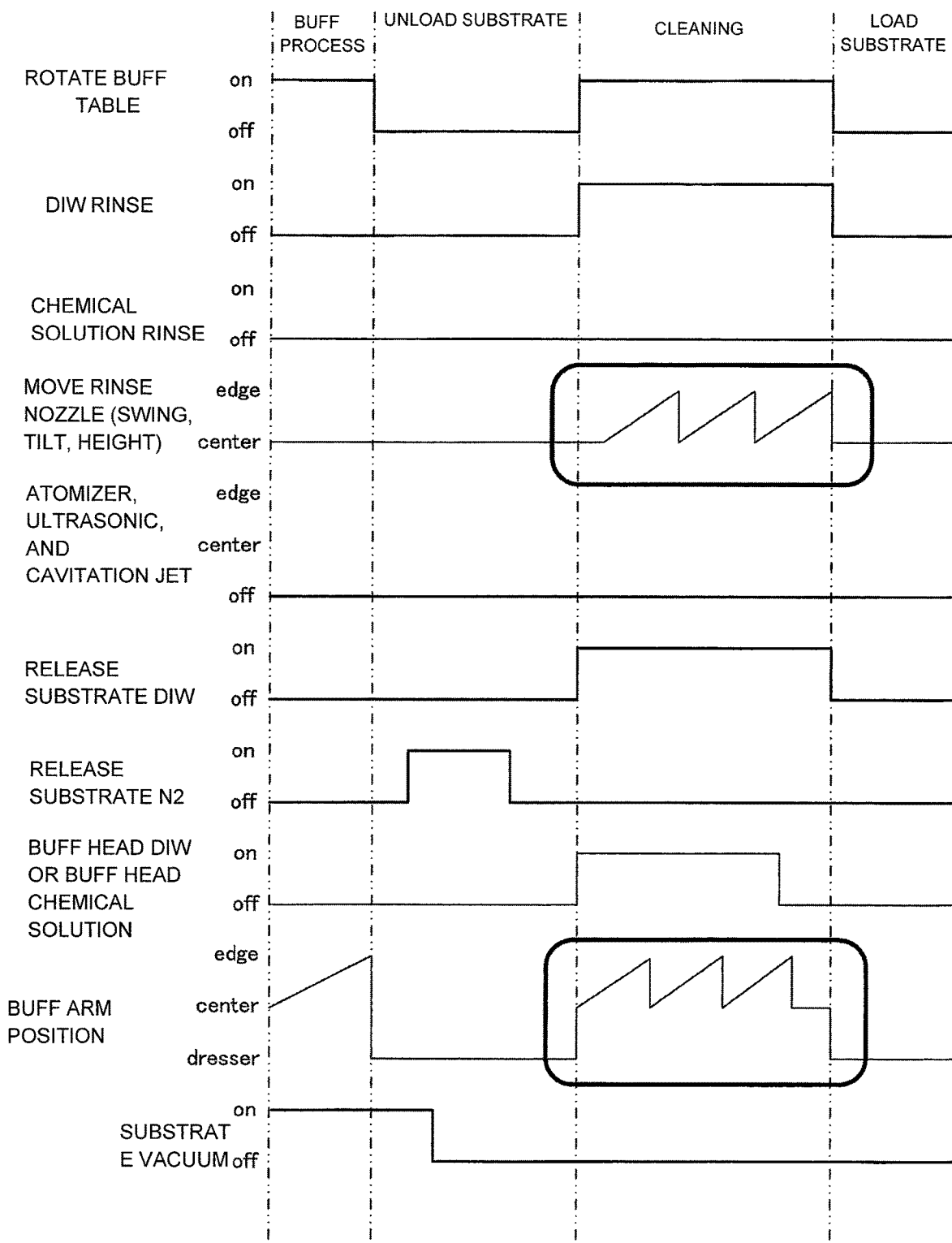
FIG. 14 is a diagram showing a timing chart of configuration components during cleaning of the support surface of the buff table through rinse cleaning using the buff pad and pure water.

FIG. 14 shows an example of a timing chart in the case where cleaning using the pure water shown in FIG. 10 and cleaning using the buff pad 1-502 shown in FIG. 13 are combined together. In cleaning in this example, the pure water or chemical solution is supplied from the buff pad 1-502 while the buff pad 1-502 is swung from the center of the support surface 1-402 toward the outside, thus cleaning the support surface 1-402 in a contact manner (see FIGS. 4A, 4B and 4C), and the pure water nozzle 1-710 is operated so as to follow the buff pad 1-502 to supply the pure water to the support surface 1-402 from the center of this support surface 1-402 toward the outside, thereby continuously rinsing the portions having been cleaned in the contact manner. In the example in FIG. 14, swing of the buff pad 1-502 from the center of the support surface 1-402 toward the outside and supply of the pure water from the pure water nozzle 1-710 starting from the center of the support surface 1-402 toward the outside are repeated three times with deviating timing. However, the number of repetitions may be freely selected. As with the other examples, during cleaning, supply of the pure water through the fluid passage 1-410 of the buff table 1-400 to the support surface 1-402 can prevent foreign substances from entering the inside of the buff table 1-400. In the example in FIG. 14, cleaning is performed through the pure water nozzle 1-710. Alternatively, the cleaning may be chemical solution cleaning through use of the second chemical solution nozzle 1-720-2.

In the example shown in FIG. 14, the description has been made such that the support surface 1-402 is cleaned using the buff pad 1-502 used for the buff process. Alternatively, instead of the buff pad 1-502 used for the buff process, a dedicated cleaning member, brush or sponge member may be attached to the buff head 1-500 and cleaning may be performed. In the example shown in FIG. 14, the description has been made such that cleaning is performed using the buff arm 1-600, the buff head 1-500 and the buff pad 1-502. Alternatively, a dedicated cleaning arm 1-650, cleaning head 1-652 and cleaning member 1-654 (including a brush or sponge member) that have respective structures similar thereto may be used to clean the support surface 1-402 (see FIG. 5).

Figure 15:
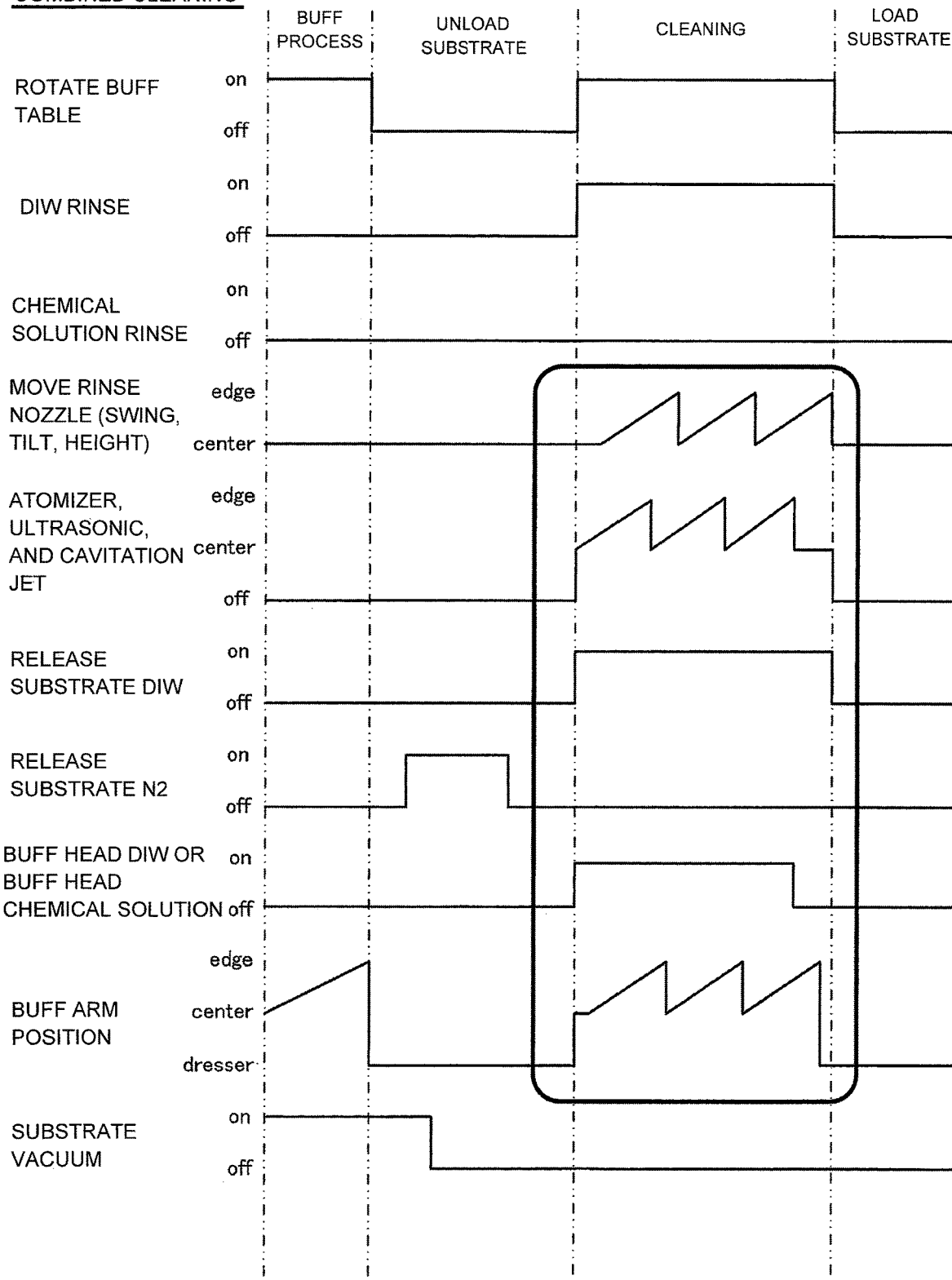
FIG. 15 is a diagram showing a timing chart of configuration components during cleaning of the support surface of the buff table through rinse cleaning by the noncontact cleaner using the buff pad and pure water.

FIG. 15 shows a timing chart where the pure water, noncontact cleaners (the atomizer cleaner 1-680, ultrasonic cleaner 1-682, cavitation jet cleaner 1-684, etc.) and contact cleaning by the buff head 1-500 are combined together. In the illustrated example, the position at which the pure water is supplied from the pure water nozzle 1-710, the position of the noncontact cleaner 1-680, 1-682 or 1-684, and the position of the buff head 1-500 are configured to be swung so as to follow each other with deviating timing. In the illustrated example, first, cleaning is performed by the noncontact cleaner 1-680, 1-682 or 1-684 to float foreign substances, subsequently, contact cleaning is performed by the buff head 1-500 to sweep out the foreign substances, and finally the foreign substances are washed out by the pure water. In the example of FIG. 15, the above sequence is adopted. The sequence is not limited to the above example. Alternatively, the sequence may be freely selected. As with the other examples, during cleaning, supply of the pure water through the fluid passage 1-410 of the buff table 1-400 to the support surface 1-402 can prevent foreign substances from entering the inside of the buff table 1-400.

In the example shown in FIG. 15, the description has been made such that the support surface 1-402 is cleaned using the buff pad 1-502 used for the buff process. Alternatively, instead of the buff pad 1-502 used for the buff process, a dedicated cleaning member, brush or sponge member may be attached to the buff head 1-500 and cleaning may be performed. In the example shown in FIG. 15, the description has been made such that cleaning is performed using the buff arm 1-600, the buff head 500 and the buff pad 502. Alternatively, a dedicated cleaning arm 1-650, cleaning head 1-652 and cleaning member 1-654 (including a brush or sponge member) that have respective structures similar thereto may be used to clean the support surface 1-402 (see FIG. 5).

Thus, the buff process apparatus that has a function of cleaning the support surface of the buff table, and the cleaning method have been described with reference to FIGS. 1 to 15. However, the present invention is not limited to the above embodiments. The characteristics of the respective embodiments can be combined or exchanged unless the characteristics contradict each other. For example, in the above embodiments, description and illustration have been made assuming that the buff table is horizontally oriented and the support surface faces vertically upward. However, a buff process apparatus where the support surface of the buff table faces horizontally may be adopted. In the above embodiments, description has been made such that instead of the buff pad 1-502 for the buff process, a buff pad dedicated to cleaning the support surface 1-402 of the buff table 1-400 may be attached to the buff head 1-500. Alternatively, a configuration may be adopted where a buff pad dedicated to cleaning, a brush or a sponge member may be attached to another position of the buff arm 1-600.

A substrate processing apparatus and a conditioner according to one embodiment of the invention of the present application are hereinafter described with reference to FIGS. 16 to 26.

<Substrate Processing Apparatus>

Figure 16:
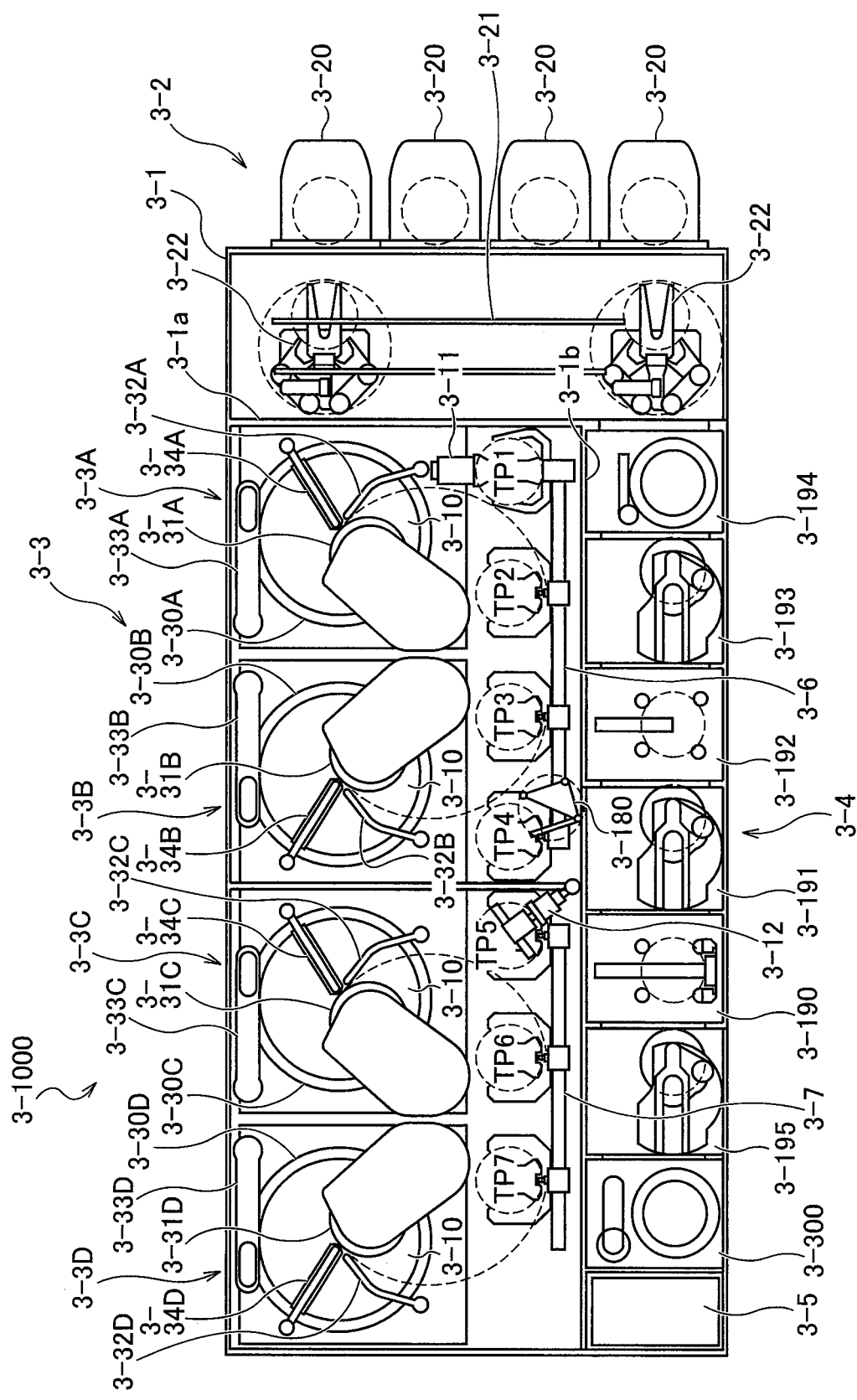
FIG. 16 is a plan view showing the overall configuration of a substrate processing apparatus of this embodiment.

FIG. 16 is a plan view showing the overall configuration of the substrate processing apparatus according to one embodiment of the present invention. As shown in FIG. 16, the substrate processing apparatus (CMP apparatus) 3-1000 includes a substantially rectangular housing 3-1. The inside of the housing 3-1 is separated by partitions 3-1a and 3-1b into a load/unload unit 3-2, a polishing unit 3-3 and a cleaning unit 3-4. The load/unload unit 3-2, the polishing unit 3-3 and the cleaning unit 3-4 are each independently assembled and independently exhausted. The cleaning unit 3-4 includes an electric power supply that supplies electric power to the substrate processing apparatus, and a control device 3-5 that controls a substrate processing operation.

<Load/Unload Unit>

The load/unload unit 3-2 includes at least two (four in this embodiment) front loaders 3-20 where wafer cassettes for stocking multiple wafers (substrates) are mounted. These front loaders 3-20 are disposed adjacent to the housing 3-1, and disposed in the width direction of the substrate processing apparatus (the direction perpendicular to the longitudinal direction). The front loader 3-20 can be mounted with an open cassette, a SMIF (Standard Manufacturing Interface) pod, or a FOUP (Front Opening Unified Pod). Here, the SMIF and FOUP are closed containers that can keep an environment independent from the external space by internally storing the wafer cassette and covering the internal space with partitions.

In the load/unload unit 3-2, a traveling mechanism 3-21 is laid along the arrangement of the front loaders 3-20. Two conveyor robots (loaders and conveyor mechanisms) 3-22 that can travel along the arrangement direction of the wafer cassettes are installed on the traveling mechanism 3-21. The conveyor robots 3-22 can access the wafer cassettes mounted on the front loaders 3-20 by traveling on the traveling mechanism 3-21. Each conveyor robot 3-22 includes vertically arranged two hands. The upper hand is used to return a processed wafer to the wafer cassette. The lower hand is used to take a wafer having not been processed yet from the wafer cassette. The upper and lower hands can thus be used differently. Furthermore, the lower hand of the conveyor robot 3-22 is configured so as to be capable of reversing the wafer.

The load/unload unit 3-2 defines a region where the cleanest state should be maintained. Accordingly, the inside of the load/unload unit 3-2 is always kept at a higher pressure than any of the pressures of the outside of the substrate processing apparatus, the polishing unit 3-3 and the cleaning unit 3-4. The polishing unit 3-3 defines the dirtiest region because a slurry is used as the polishing liquid. Consequently, a negative pressure is formed in the polishing unit 3-3. This pressure is maintained lower than the internal pressure of the cleaning unit 3-4. The load/unload unit 2 is provided with a filter-fan unit (not shown) that includes a clean air filter, such as a HEPA filter, ULPA filter, or chemical filter. Clean air from which particles, toxic vapor, or toxic gas have been removed is always blown from the filter-fan unit.

<Polishing Unit>

The polishing unit 3-3 defines a region where a wafer is polished (flattened). The polishing unit 3-3 includes a first polishing unit 3-3A, a second polishing unit 3-3B, a third polishing unit 3-3C, and a fourth polishing unit 3-3D. The first polishing unit 3-3A, the second polishing unit 3-3B, the third polishing unit 3-3C and the fourth polishing unit 3-3D are arranged along the longitudinal direction of the substrate processing apparatus, as shown in FIG. 16.

As shown in FIG. 16, the first polishing unit 3-3A includes: a polishing table 3-30A mounted with a polishing pad 3-10 having a polishing surface; a top ring 3-31A for polishing a wafer while holding the wafer and pressing the wafer against the polishing pad 3-10 on the polishing table 3-30A; a polishing liquid supply nozzle 3-32A for supplying the polishing pad 3-10 with the polishing liquid or dressing liquid (e.g., pure water); a dresser 3-33A for dressing the polishing surface of the polishing pad 3-10; and an atomizer 3-34A that atomizes a mixed fluid of liquid (e.g., pure water) and a gas (e.g., nitrogen gas) or a liquid (e.g., pure water) and jets the atomized fluid to the polishing surface.

Likewise, the second polishing unit 3-3B includes a polishing table 3-30B, a top ring 3-31B, a polishing liquid supply nozzle 3-32B, a dresser 3-33B, and an atomizer 3-34B. The third polishing unit 3-3C includes a polishing table 3-30C, a top ring 3-31C, a polishing liquid supply nozzle 3-32C, a dresser 3-33C, and an atomizer 3-34C. The fourth polishing unit 3-3D includes a polishing table 3-30D, a top ring 3-31D, a polishing liquid supply nozzle 3-32D, a dresser 3-33D, and an atomizer 3-34D.

Since the first polishing unit 3-3A, the second polishing unit 3-3B, the third polishing unit 3-3C and the fourth polishing unit 3-3D have the same configuration as each other, only the first polishing unit 3-3A is hereinafter described.

Figure 17:
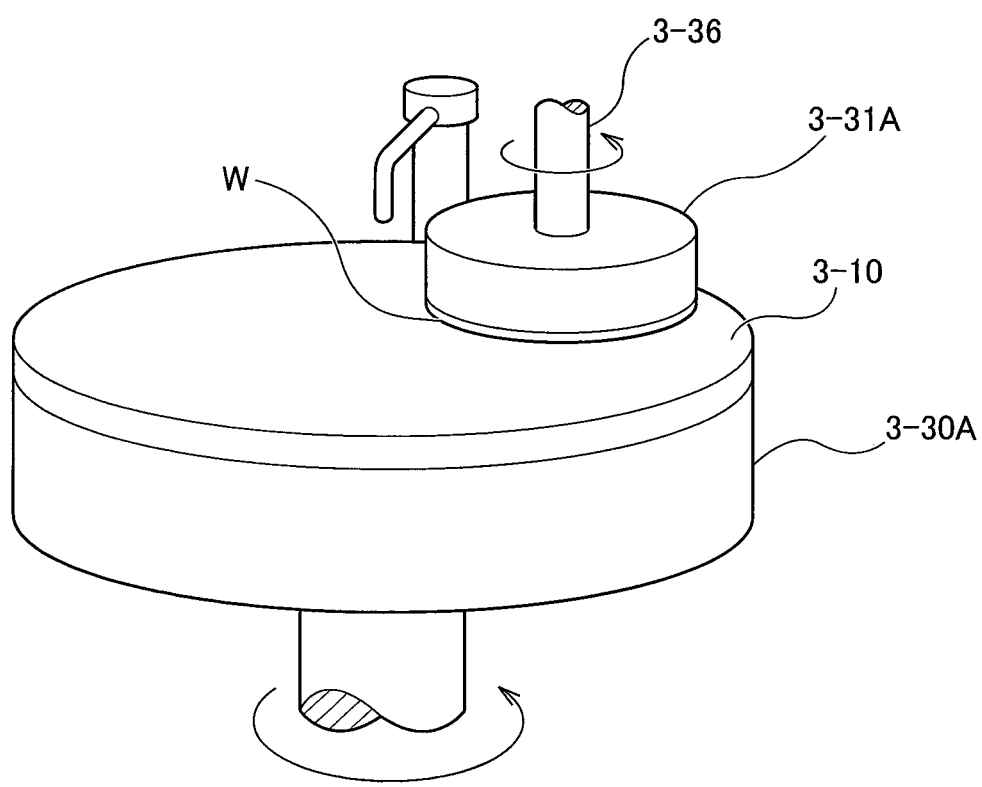
FIG. 17 is a perspective view schematically showing a polishing unit.

FIG. 17 is a perspective view schematically showing the first polishing unit 3-3A. The top ring 3-31A is supported by a top ring shaft 3-36. The polishing pad 3-10 is pasted on the upper surface of the polishing table 3-30A. The upper surface of the polishing pad 3-10 thus forms a polishing surface for polishing the wafer W. Instead of the polishing pad 3-10, fixed abrasive grains may be adopted. The top ring 3-31A and the polishing table 3-30A are configured to rotate about the respective axes, as indicated by arrows. The wafer W is held onto the lower surface of the top ring 3-31A by vacuum suction. During polishing, the polishing liquid is supplied to the polishing surface of the polishing pad 3-10 from the polishing liquid supply nozzle 3-32A, and the wafer W, which is a polishing target, is pressed by the top ring 3-31A against the polishing surface, thus allowing the wafer W to be polished.

<Conveyor Mechanism>

Next, the conveyor mechanism for conveying the wafer is described. As shown in FIG. 16, a first linear transporter 3-6 is disposed adjacent to the first polishing unit 3-3A and the second polishing unit 3-3B. The first linear transporter 3-6 is a mechanism that conveys the wafer between four conveyance positions (a first conveyance position 3-TP1, a second conveyance position 3-TP2, a third conveyance position 3-TP3 and a fourth conveyance position 3-TP4 sequentially from the site near the load/unload unit) along the direction in which the polishing units 3-3A and 3-3B are disposed.

Furthermore, a second linear transporter 3-7 is disposed adjacent to the third polishing unit 3-3C and the fourth polishing unit 3-3D. The second linear transporter 3-7 is a mechanism that conveys the wafer between three conveyance positions (a fifth conveyance position 3-TP5, a sixth conveyance position 3-TP6 and a seventh conveyance position 3-TP7 sequentially from the site near the load/unload unit) along the direction in which the polishing units 3-3C and 3-3D are disposed.

The wafer is conveyed by the first linear transporter 3-6 to the polishing units 3-3A and 3-3B. The top ring 3-31A of the first polishing unit 3-3A moves between the polishing position and the second conveyance position 3-TP2 by a swing operation of the top ring head. Consequently, the wafer is passed to the top ring 3-31A at the second conveyance position 3-TP2. Likewise, the top ring 3-31B of the second polishing unit 3-3B moves between the polishing position and the third conveyance position 3-TP3, and the wafer is passed to the top ring 3-31B at the third conveyance position 3-TP3. The top ring 3-31C of the third polishing unit 3-3C moves between the polishing position and the sixth conveyance position 3-TP6, and the wafer is passed to the top ring 3-31C at the sixth conveyance position 3-TP6.

The top ring 3-31D of the fourth polishing unit 3-3D moves between the polishing position and the seventh conveyance position 3-TP7, and the wafer is passed to the top ring 3-31D at the seventh conveyance position 3-TP7.

A lifter 3-11 for receiving the wafer from the conveyor robot 3-22 is disposed at the first conveyance position 3-TP1. The wafer is passed from the conveyor robot 3-22 to the first linear transporter 3-6 via the lifter 3-11. Between the lifter 3-11 and the conveyor robot 3-22, a shutter (not shown) is provided at the partition 3-1a. When the wafer is conveyed, the shutter is opened and the wafer is passed from the conveyor robot 3-22 to the lifter 3-11. A swing transporter 3-12 is disposed among the first linear transporter 3-6, the second linear transporter 3-7 and the cleaning unit 3-4. The swing transporter 3-12 includes a hand that is movable between the fourth conveyance position 3-TP4 and the fifth conveyance position 3-TP5. The wafer is passed from the first linear transporter 3-6 to the second linear transporter 3-7 by the swing transporter 3-12. The wafer is conveyed by the second linear transporter 3-7 to the third polishing unit 3-3C and/or the fourth polishing unit 3-3D. The wafer polished by the polishing unit 3-3 is conveyed to the cleaning unit 3-4 via the swing transporter 3-12.

<Cleaning Unit>

Figure 18A:
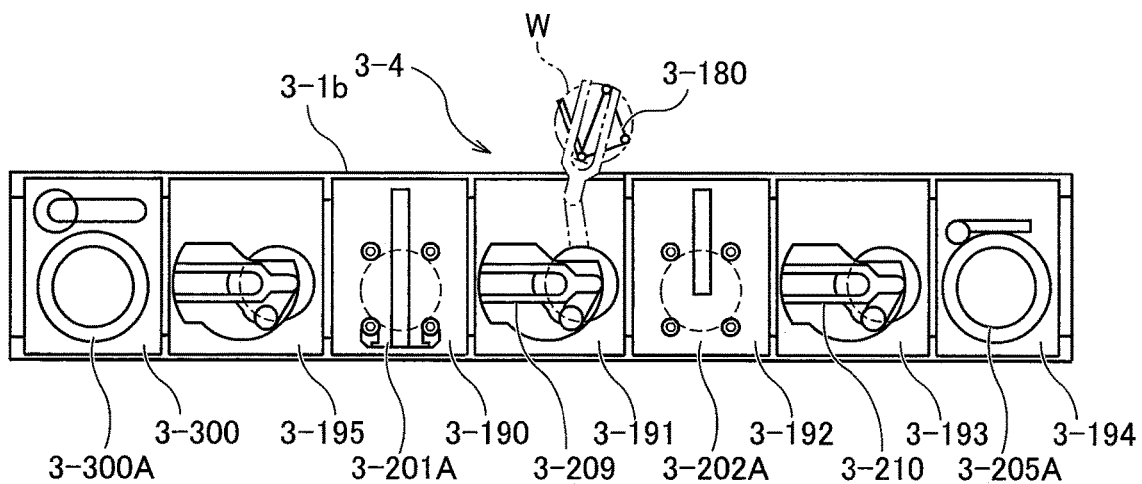
FIG. 18A is a plan view showing a cleaning unit.
Figure 18B:
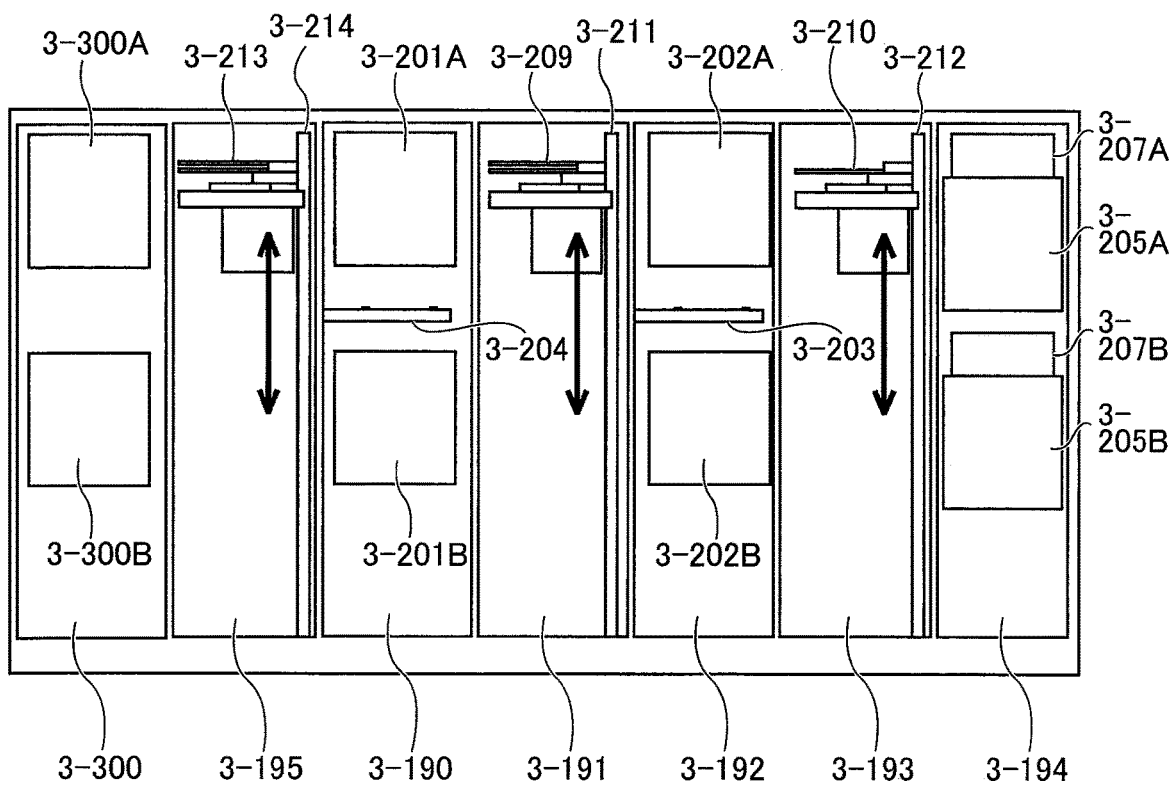
FIG. 18B is a side view showing the cleaning unit.

FIG. 18A is a plan view showing the cleaning unit 3-4, and FIG. 18B is a side view showing the cleaning unit 3-4. As shown in FIGS. 18A and 18B, the cleaning unit 3-4 are partitioned into a roll cleaning chamber 3-190, a first conveyance chamber 3-191, a pen cleaning chamber 3-192, a second conveyance chamber 3-193, a drying chamber 3-194, a buff process chamber 3-300 and a third conveyance chamber 3-195.

In the roll cleaning chamber 3-190, an upper roll cleaning module 3-201A and a lower roll cleaning module 3-201B, which are arranged in the vertical direction, are disposed. The upper roll cleaning module 3-201A is disposed above the lower roll cleaning module 3-201B. Each of the upper roll cleaning module 3-201A and the lower roll cleaning module 3-201B is a cleaner that supplies the cleaning liquid to the front and rear surfaces of the wafer while pressing the rotating two roll sponge members against the front and rear surfaces of the wafer, thereby cleaning the wafer. A wafer temporary stage 3-204 is provided between the upper roll cleaning module 3-201A and the lower roll cleaning module 3-201B.

In the pen cleaning chamber 3-192, an upper pen cleaning module 3-202A and a lower pen cleaning module 3-202B, which are arranged along the vertical direction, are disposed. The upper pen cleaning module 3-202A is disposed above the lower pen cleaning module 3-202B. Each of the upper pen cleaning module 3-202A and the lower pen cleaning module 3-202B is a cleaner that supplies the cleaning liquid to the surface of the wafer while pressing a rotating pencil sponge member against the surface of the wafer and swinging the sponge in the radial direction of the wafer, thereby cleaning the wafer. A wafer temporary stage 3-203 is provided between the upper pen cleaning module 3-202A and the lower pen cleaning module 3-202B.

In the drying chamber 3-194, an upper drying module 3-205A and a lower drying module 3-205B, which are arranged along the vertical direction, are disposed. The upper drying module 3-205A and the lower drying module 3-205B are separated from each other. Filter-fan units 3-207A and 3-207B that supply clean air into the drying modules 3-205A and 3-205B are provided above the upper drying module 3-205A and the lower drying module 3-205B, respectively.

The upper roll cleaning module 3-201A, the lower roll cleaning module 3-201B, the upper pen cleaning module 3-202A, the lower pen cleaning module 3-202B, the temporary stage 3-203, the upper drying module 3-205A and the lower drying module 3-205B are fixed to frames, not shown, with bolts and the like.

In the first conveyance chamber 3-191, a vertically movable first conveyor robot (conveyor mechanism) 3-209 is disposed. In the second conveyance chamber 3-193, a vertically movable second conveyor robot 3-210 is disposed. In the third conveyance chamber 3-195, a vertically movable third conveyor robot (conveyor mechanism) 3-213 is disposed. The first conveyor robot 3-209, the second conveyor robot 3-210 and the third conveyor robot 3-213 are movably supported by vertically extending support shafts 3-211, 3-212 and 3-214, respectively. The first conveyor robot 3-209, the second conveyor robot 3-210 and the third conveyor robot 3-213 internally includes drive mechanisms, such as motors, and are vertically movable along the support shafts 3-211, 3-212 and 3-214, respectively. As with the conveyor robot 3-22, the first conveyor robot 3-209 includes hands at upper and lower stages. As indicated by a broken line in FIG. 18A, in the first conveyor robot 3-209, the lower hand is disposed at a position accessible to the aforementioned temporary stage 3-180. When the lower hand of the first conveyor robot 3-209 accesses the temporary stage 3-180, a shutter (not shown) provided at the partition 3-1b is opened.

The first conveyor robot 3-209 operates so as to convey the wafer W between the temporary stage 3-180, the upper roll cleaning module 3-201A, the lower roll cleaning module 3-201B, the temporary stage 3-204, the temporary stage 3-203, the upper pen cleaning module 3-202A and the lower pen cleaning module 3-202B. The first conveyor robot 3-209 uses the lower hand for conveying the wafer having not been cleaned yet (wafer to which the slurry adheres), and uses the upper hand for conveying the cleaned wafer.

The second conveyor robot 3-210 operates so as to convey the wafer W between the upper pen cleaning module 3-202A, the lower pen cleaning module 3-202B, the temporary stage 3-203, the upper drying module 3-205A and the lower drying module 3-205B. Since the second conveyor robot 3-210 only conveys the cleaned wafer, this robot only includes one hand. The conveyor robot 3-22 shown in FIG. 16 uses the upper hand to takes the wafer from the upper drying module 3-205A or the lower drying module 3-205B, and returns the wafer to the wafer cassette. When the upper hand of the conveyor robot 3-22 accesses the drying modules 3-205A and 3-205B, the shutter (not shown) provided at the partition 3-1a is opened.

In the buff process chamber 3-300, an upper buff process module 3-300A and a lower buff process module 3-300B are provided. The third conveyor robot 3-213 operates so as to convey the wafer W between the upper roll cleaning module 3-201A, the lower roll cleaning module 3-201B, the temporary stage 3-204, the upper buff process module 3-300A and the lower buff process module 3-300B.

This embodiment exemplifies the example of disposing the buff process chamber 3-300, the roll cleaning chamber 3-190 and the pen cleaning chamber 3-192 in the cleaning unit 3-4, sequentially from the site far from the load/unload unit 3-2. The disposition is not limited to this example. The mode of disposing the buff process chamber 3-300, the roll cleaning chamber 3-190 and the pen cleaning chamber 3-192 may be appropriately selected according to the quality of wafer and the throughput. The upper buff process module 3-300A and the lower buff process module 3-300B are hereinafter described. Since the upper buff process module 3-300A and the lower buff process module 3-300B have similar configurations, only the upper buff process module 3-300A is described.

<Buff Process Module>

Figure 19:
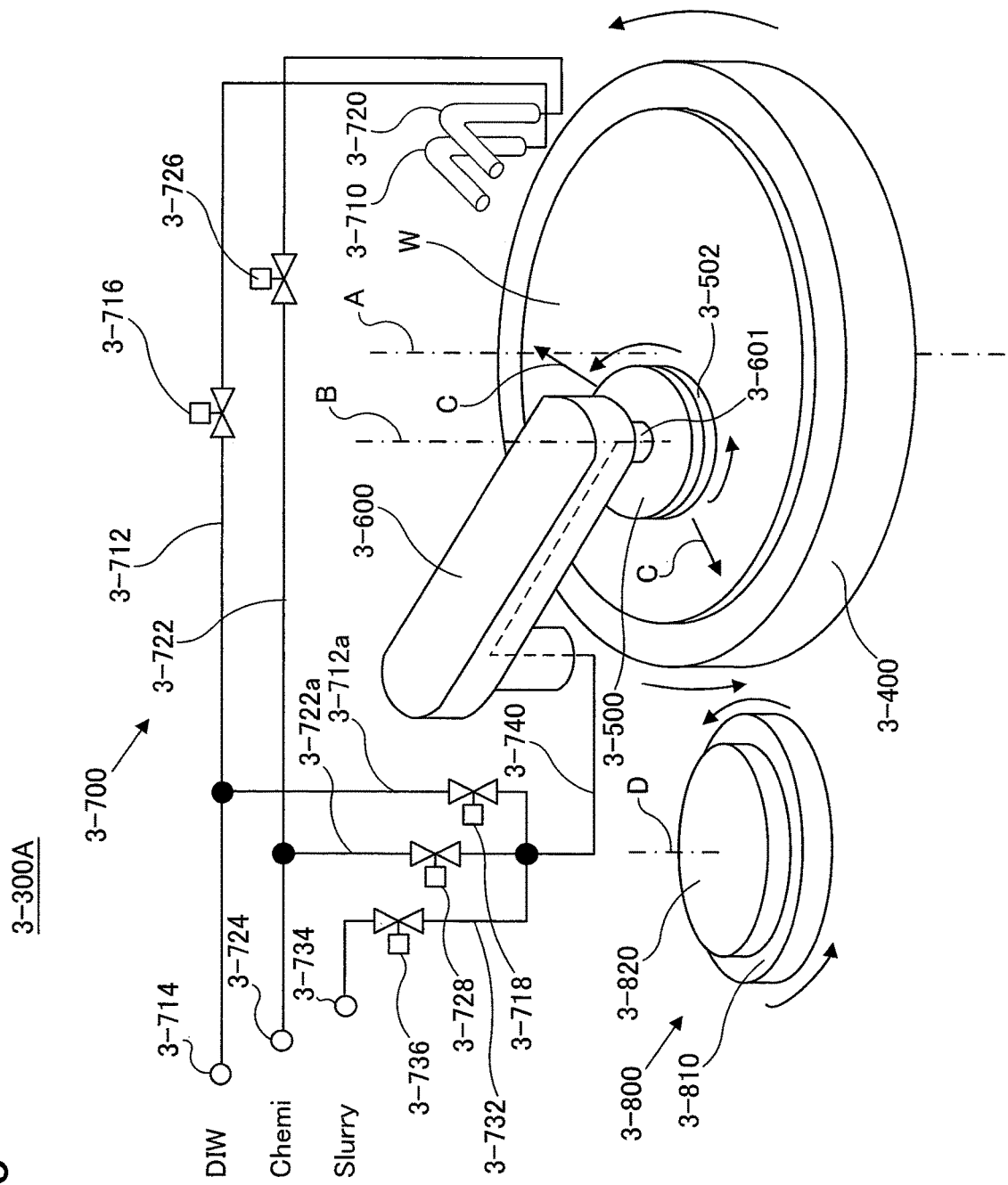
FIG. 19 is a diagram showing a schematic configuration of an upper buff process module.

FIG. 19 is a diagram showing a schematic configuration of the upper buff process module 3-300A. As shown in FIG. 19, the buff process module 3-300A includes: a buff table 3-400 on which the wafer W is mounted; a buff head 3-500 to which a buff pad 3-502 for applying a buff process to a processing target surface of the wafer W is attached; a buff arm 3-600 that holds the buff head 3-500; a liquid supply system 3-700 for supplying various types of process liquids; and a conditioner 3-800 for conditioning (dressing) the buff pad 3-502.

The buff table 3-400 includes a mechanism for sucking the wafer W. The buff table 3-400 can be rotated about a rotation axis A by a drive mechanism, not shown. The buff pad 3-502 is attached to a surface of the buff head 3-500 that faces the wafer W. The buff arm 3-600 can rotate the buff head 3-500 about a rotation axis B, and swing the buff head 3-500 in the radial direction of the wafer W as indicated by an arrow C. The buff arm 3-600 can swing the buff head 3-500 to a position where the buff pad 3-502 faces the conditioner 3-800.

The liquid supply system 3-700 includes a pure water nozzle 3-710 for supplying pure water (DIW) to the processing target surface of the wafer W. The pure water nozzle 3-710 communicates with a pure water supply source 3-714 through pure water piping 3-712. The pure water piping 3-712 is provided with an on-off valve 3-716 that can open and close the pure water piping 3-712. The on-off valve 3-716 opening and closing control through the control device, not shown, can supply the pure water to the processing target surface of the wafer W, at any timing.

The liquid supply system 3-700 includes a chemical solution nozzle 3-720 for supplying a chemical solution (Chemi) to the processing target surface of the wafer W. The chemical solution nozzle 3-720 communicates with a chemical solution supply source 3-724 through chemical solution piping 3-722. The chemical solution piping 3-722 is provided with an on-off valve 3-726 that can open and close the chemical solution piping 3-722. The on-off valve 3-726 opening and closing control through the control device can supply the chemical solution to the processing target surface of the wafer W, at any timing.

The upper buff process module 3-300A can selectively supply the pure water, chemical solution, or slurry to the processing target surface of the wafer W through the buff arm 3-600, the buff head 3-500, and the buff pad 3-502.

That is, branched pure water piping 3-712a is branched from the pure water piping 3-712 between the pure water supply source 3-714 and the on-off valve 3-716. Furthermore, branched chemical solution piping 3-722a is branched from the chemical solution piping 3-722 between the chemical solution supply source 3-724 and the on-off valve 3-726. The branched pure water piping 3-712a, the branched chemical solution piping 3-722a, and slurry piping 3-732, which communicates with a slurry supply source 3-734, join together into liquid supply piping 3-740. The branched pure water piping 3-712a is provided with an on-off valve 3-718 that can open and close the branched pure water piping 3-712a. The branched chemical solution piping 3-722a is provided with an on-off valve 3-728 that can open and close the branched chemical solution piping 3-722a. The slurry piping 3-732 is provided with an on-off valve 3-736 that can open and close the slurry piping 3-732.

A first end of the liquid supply piping 3-740 communicates with three systems of piping, which are the branched pure water piping 3-712a, the branched chemical solution piping 3-722a, and the slurry piping 3-732. The liquid supply piping 3-740 extends through the inside of the buff arm 3-600, the center of the buff head 3-500, and the center of the buff pad 3-502. A second end of the liquid supply piping 3-740 is opened toward the processing target surface of the wafer W. The control device, not shown, can supply the processing target surface of the wafer W with any one of the pure water, chemical solution, and slurry, or a mixed liquid that is any combination thereof, by controlling on and off of the on-off valve 3-718, the on-off valve 3-728 and the on-off valve 3-736.

The upper buff process module 3-300A supplies the wafer W with the process liquid through the liquid supply piping 3-740, rotates the buff table 3-400 about the rotation axis A, presses the buff pad 3-502 against the processing target surface of the wafer W, and swings the buff head 3-500 in the direction of arrow C while rotating this head about the rotation axis B, thereby allowing the buff process to be applied to the wafer W. Note that the buff pad of this embodiment has a considerably smaller diameter than the wafer, which is a processing target, has. This is because a high flatness can be achieved by the buff process.

Here, the buff process includes at least one of a buff-polishing process and a buff-cleaning process. The buff-polishing process is a process that relatively moves a wafer W and a buff pad 3-502 against each other while the buff pad 3-502 is in contact with the wafer W, and causes a slurry to intervene between the wafer W and the buff pad 3-502, thereby polishing and removing unwanted portions of a processing target surface of the wafer W. The buff-polishing process is a process that can apply a stronger physical action force to the wafer W than the physical action force applied to the wafer W by the roll sponge in the roll cleaning chamber 3-190 and the physical action force applied to the wafer W by the pen sponge in the pen cleaning chamber 3-192. The buff-polishing process can achieve removal of a surface part which is damaged by a scratch or the like or to which contaminants adhere, additional removal of a portion which cannot have been removed by main polishing in the main polishing unit 3, or improvement in morphology after the main polishing.

The buff-cleaning process is a process that relatively moves the wafer W and the buff pad 3-502 against each other while the buff pad 3-502 is in contact with the wafer W, and causes the cleaning process liquid (the chemical solution, or the chemical solution and pure water) to intervene between the wafer W and the buff pad 3-502, thereby removing contaminants on the surface of the wafer W or modifying the property of the processing target surface. The buff-cleaning process is a process that can apply a stronger physical action force to the wafer W than the physical action force applied to the wafer W by the roll sponge in the roll cleaning chamber 3-190 and the physical action force applied to the wafer W by the pen sponge in the pen cleaning chamber 3-192.

The conditioner 3-800 is a member for conditioning the surface of the buff pad 3-502. The conditioner 3-800 includes a dressing table 3-810, and a dresser 3-820 installed on the dressing table 3-810. The dressing table 3-810 can be rotated about a rotation axis D by a drive mechanism, not shown. The dresser 3-820 may be formed of a diamond dresser or a brush dresser, or a combination of these dressers.

When the buff pad 3-502 is conditioned, the upper buff process module 3-300A swings the buff arm 3-600 such that the buff pad 3-502 reaches a position facing the dresser 3-820. The upper buff process module 3-300A rotates the dressing table 3-810 about the rotation axis D while rotating the buff head 3-500, and presses the buff pad 3-502 against the dresser 3-820, thereby conditioning the buff pad 3-502.

<Conditioner>

Figure 20:
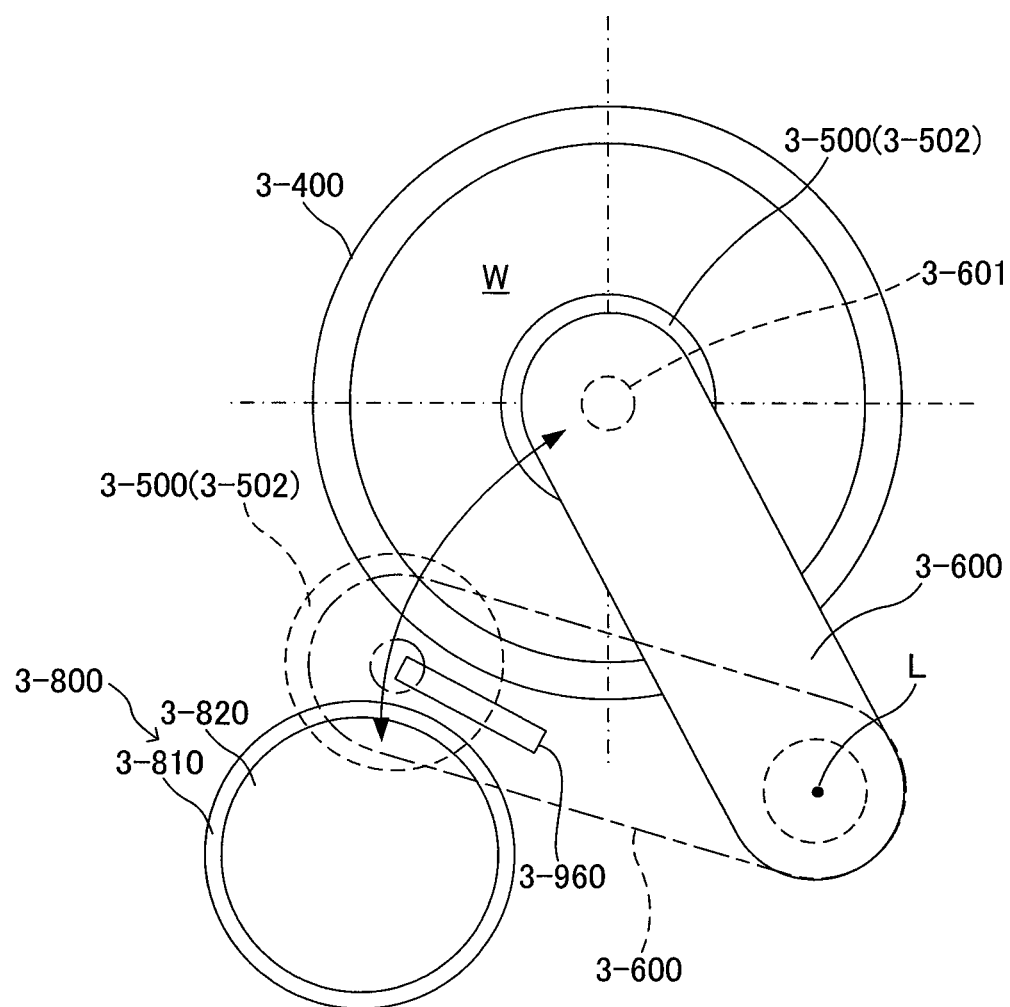
FIG. 20 is a diagram for illustrating the positional relationship between the buff table and a dressing table and swing of a buff arm.

Next, referring to the various drawings, specific processes of cleaning processes for the conditioner 3-800 and the buff pad 3-502 are described. FIG. 20 shows a buff table 3-400 that holds the wafer W, and a dressing table 3-810 that supports the dresser 3-820 for conditioning the buff pad 3-502. These dresser 3-820 and the dressing table 3-810 and other configuration components constitute the conditioner 3-800.

The conditioner 3-800 is disposed adjacent to the buff table 3-400, and positioned at a radius position substantially identical to that of the buff table 3-400 with respect to the center of swing L of the buff arm 3-600. Accordingly, when the buff arm 3-600 is swung (swung counterclockwise in FIG. 20), the buff pad 3-502 can be positioned above the dresser 3-820 in the conditioner 3-800. In the conditioner 3-800, the dressing table 3-810 is rotated, which causes a combined operation with the rotation of the buff pad 3-502, thereby applying the dressing process to the surface of the buff pad 3-502.

A brush-cleaning mechanism 3-960 is provided between the buff table 3-400 and the dressing table 3-810. The brush-cleaning mechanism 3-960 is for brush-cleaning the surface of the buff pad 3-502. The brush-cleaning mechanism 3-960 is thus provided between the buff table 3-400 and the dressing table 3-810 because this position is on a path along which the buff pad 502 is moved by swing of the buff arm 3-600. The specific structure and operation of the brush-cleaning mechanism 3-960 is described later.

Figure 21:
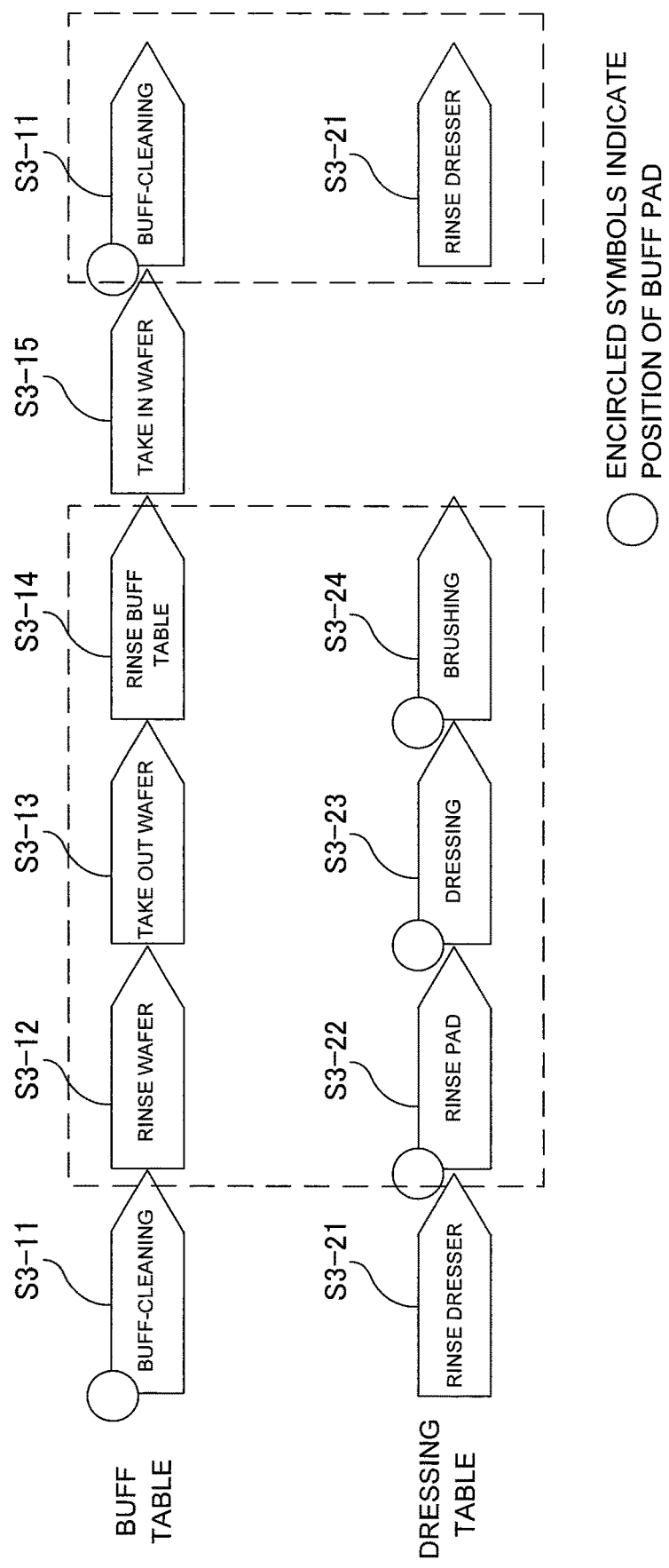
FIG. 21 is a diagram showing processing procedures at the buff table and the dressing table disclosed in FIG. 20.

FIGS. 21 and 22A to 22D are diagrams for illustrating the buff-cleaning and accompanying specific processes. In FIG. 21, the upper stage shows the processes at the buff table 3-400, and the lower stage shows the processes at the dressing table 3-810. These series of processes are performed simultaneously in parallel. Each of the circles in the diagram shows the position of the buff pad 3-502. For example, during the buff-cleaning process, the buff pad 3-502 is positioned on the buff table 3-400. During a subsequent pad rinsing process, this pad moves onto the dressing table 3-810. Note that in FIGS. 22A to 22D, a part of the buff head 3-500 is a sectional view for the sake of illustration. The buff head 3-500 used in this embodiment is provided with a gimbal mechanism that includes concave and convex surfaces, thereby allowing slight precession of the buff head 3-500.

First, on the buff table 3-400, the buff-cleaning process (step S3-11) is applied to the wafer W. Needless to say, at this time, the buff pad 3-502 is positioned on the buff table 3-400. During the buff-cleaning process, the process liquid for buff-cleaning is supplied from the liquid supply piping 3-740, through the inside of the buff arm and the inside of the buff head rotating shaft 3-601 (see FIG. 20), to the center of the buff pad 3-502. At the same time, the buff arm 3-600 is swung in a state where the rotating buff pad 3-502 is pressed against the wafer W, thus applying the cleaning process to the surface of the wafer W rotating together with the buff table 3-400 (see FIG. 22A). The buff pad 3-502 moves above the dresser 3-820 in the next process, and subsequently dressing-related processes are performed. These processes are described later.

On the buff table 3-400, a wafer rinsing process (step S3-12) is applied. The wafer rinsing process is a process of cleaning the wafer W with DIW. After completion of applying the wafer rinsing process to the wafer W, the wafer W is then taken out of the buff table 3-400 (step S3-13) and conveyed to the next step. Subsequently, the buff table 3-400 is cleaned according to the buff table rinsing process (step S3-14). The series of processes at the buff table has thus been completed. A new wafer W to be processed next is taken in (step S3-15), and the above processes are repeated.

On the other hand, on the dressing table 3-810, the dressing process is applied to the buff pad 3-502 in parallel to the above processes. The buff pad 3-502 (see FIG. 22A) used for the buff-cleaning (step S3-11) is moved above the dresser 3-820. At this time, the buff pad 3-502 faces perpendicularly downward. The cleaning liquid (DIW) is jetted from a buff pad cleaning mechanism 3-830 disposed obliquely downward of the buff pad 3-502, thus applying the pad rinsing process to the surface of the buff pad 3-502 (step S3-22) (see FIG. 22B). During the pad rinsing process, the buff pad 3-502 is rotated, thereby allowing the entire surface to be uniformly cleaned. The cleaning liquid used for cleaning the buff pad may be an ultrasonic cleaning liquid.

Next, the buff head 3-500 is lowered and brought into contact with the dresser 3-820, and the dressing process is applied to the buff pad 3-502 (step S3-23) (see FIG. 22C). The dressing process is performed in a state where the process liquid is supplied to the center of the buff pad 3-502. During the dressing process, both the buff pad 3-502 and the dresser 3-820 rotate. The dressing process is performed in a state where the rotation axis of the buff pad 3-502 deviates from the rotation axis of the dresser 3-820. This measures are taken in order to prevent specific parts of the buff pad 3-502 and the dresser 3-820 from continuously sliding against each other.

After application of the dressing process, the buff head 3-500 moves above the brush-cleaning mechanism, a brushing process (step S3-24) is applied to the buff head after the dressing process (see FIG. 22D). A dresser rinsing process (step S3-21) is applied to the dresser 3-820 having been used for the dressing process (S3-23), with the cleaning liquid (DIW) jetted from the dresser cleaning mechanism (not shown) provided adjacent thereto. During the dresser rinsing process, the dressing table 3-810 is rotated, thereby allowing the surface of the dresser 3-820 to be uniformly cleaned.

The description has thus been made for the case where the buff pad 3-502 faces perpendicularly downward. However, the present invention is not limited to this case. The present invention is also applicable to the case where the buff pad 3-502 faces perpendicularly upward, and the case where this pad faces horizontally.

Next, referring to FIG. 23, cleaning of the buff pad 3-502 during the dressing process (step S3-23 in FIG. 21) is described in detail. As described above, the surface of the buff pad 3-502 is dressed according to the dressing process. In this process, the buff pad 3-502 is in the state of being in contact with the surface of the dresser. On the surface of the buff pad, grooves continuous from the center toward the outer peripheral portion are formed. The process liquid then flows from the process liquid outlet 3-503 at the center of the buff pad 3-502. The flowing process liquid is discharged through the grooves of the buff pad 3-502 to the outside owing to the centrifugal force generated by rotation of the buff pad 3-502 and the discharge pressure. Consequently, deposit accumulating in the grooves is discharged together with the process liquid. In addition to the above operation, if the process liquid is caused to flow at a high pressure, the process liquid flows through the inside of the grooves fast, thereby allowing the inside of the grooves to be cleaned further effectively.

Figure 23A:
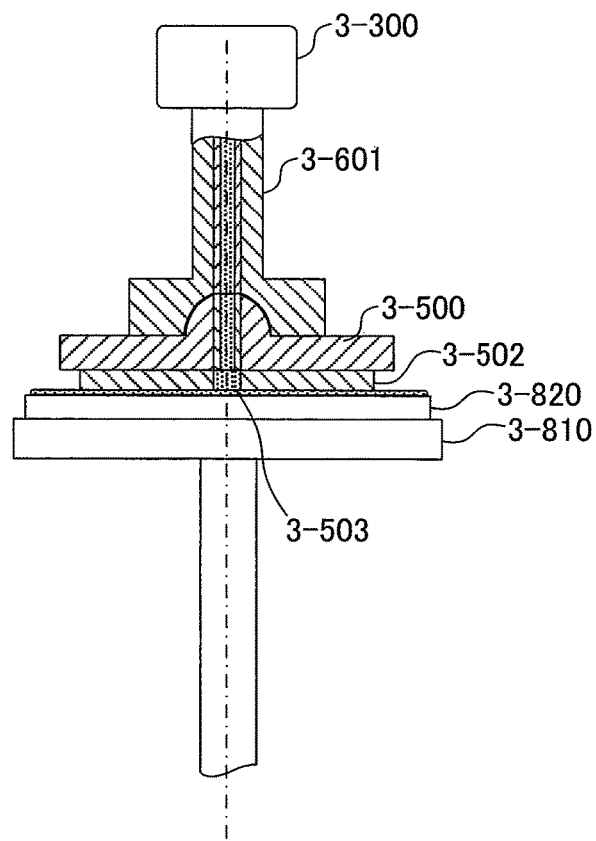
FIGS. 23A, 23B and 23C are diagrams for illustrating cleaning of the buff pad.

Various shapes can be considered as the shapes of the grooves formed on the buff pad. For example, it can be considered that simple linear grooves may be formed radially over the circumference, or spiral grooves may be formed. Even lattice-shaped grooves can discharge deposit to the outside only if the grooves are continuous to the outermost peripheral portion of the buff pad 3-502. The sectional shapes and sectional areas of grooves are not necessarily constant along the longitudinal directions. In particular, the buff pad 3-502 rotates at a high speed. Accordingly, if no measures are taken for the structure of the grooves, the process liquid is sometimes dispersed over a wide range. To avoid such situations, flow rate reducers are formed at the grooves in proximity to the outermost peripheral portion of the buff pad 3-502. For example, for the sake of illustration, FIG. 23A shows a state where a flow path of the process liquid is formed in the rotating shaft 3-601 of the buff head 3-500, and the process liquid accumulates at the process liquid outlet 3-503 at the center of the buff pad 3-502. This diagram further shows the state where the process liquid also accumulates at the boundary region between the buff pad 3-502 and the dresser 3-820.

Figure 23B:
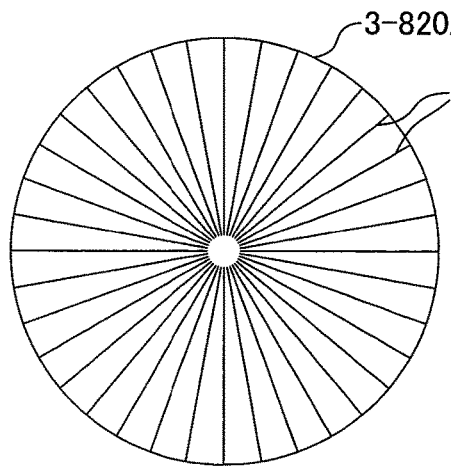
Figure 23C:
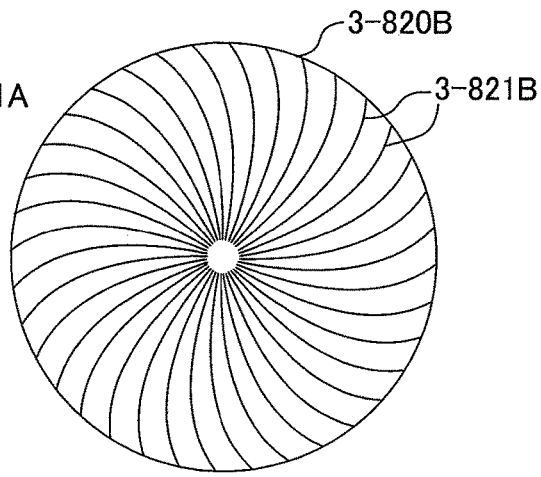

FIGS. 23B and 23C show dresser grooves 3-821A and 3-821B formed on the surfaces of the respective dressers 3-820A and 3-820B. The dresser grooves 3-821A in FIG. 23B are radial grooves. Such radial grooves allow the process liquid to be smoothly discharged owing to the centrifugal force. At this time, even if deposit peeled off the grooves on the buff pad 3-502 has a relatively large size, the deposit can easily pass through the dresser grooves 3-821A of the dresser 3-820A. Consequently, this configuration can improve the discharge effect in comparison with the case where the deposit is discharged only through the grooves on the buff pad 3-502.

FIG. 23C shows the spiral dresser grooves 3-821B formed on the surface of the dresser 3-820B. Appropriate setting of the rotational direction and rotation speed can achieve a more improved deposit discharge effect of the spiral dresser grooves 3-821B than that of the radial dresser grooves 3-821A, in some cases. The dresser grooves may have a configuration where radial grooves and spiral grooves are combined. In this embodiment, total 36 grooves are formed at angles of every ten degrees. However, this case is an example. The number of grooves may be lower or higher.

Figure 24A:
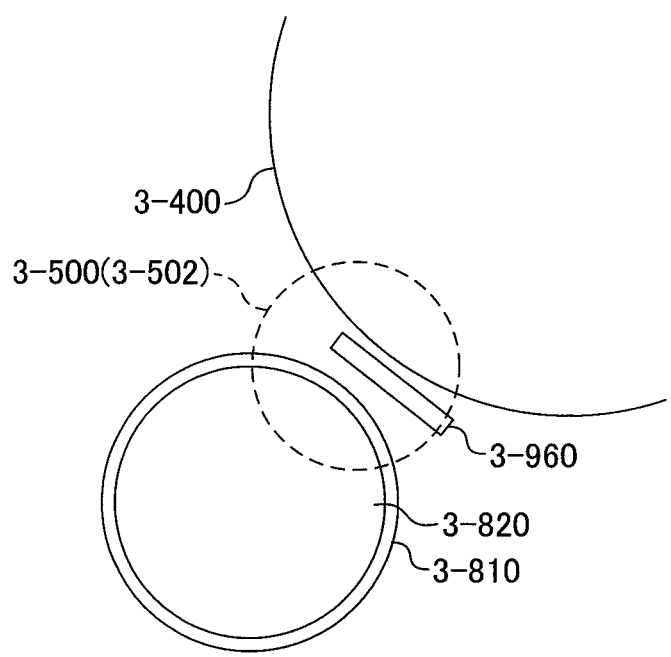
FIGS. 24A and 24B show the buff process module that includes a brush-cleaning mechanism.
Figure 24B:
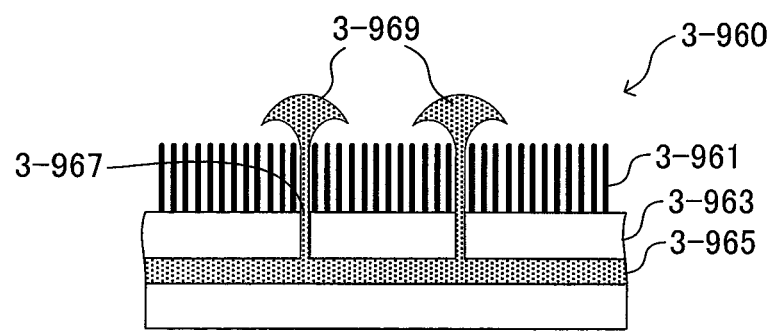

FIGS. 24A and 24B show an embodiment where the brush-cleaning mechanism 3-960 is provided adjacent to the dressing table 3-810. In FIG. 24A, the brush-cleaning mechanism 3-960 is provided in a region between the buff table 3-400 and the dressing table 3-810. Consequently, when the buff head 3-500 and the buff pad 3-502 pass between the buff table 3-400 and the dressing table 3-810, the surface of the buff pad 3-502 is brought into contact with the brush-cleaning mechanism 3-960 (see FIG. 22D), and the surface of the buff pad 3-502 is brush-cleaned. Note that the brush-cleaning mechanism sometimes interferes with the movement of the buff pad 3-502. Consequently, a mechanism may be provided that raises the brush-cleaning mechanism or retracts this brush-cleaning mechanism in the horizontal direction from the movement path of the buff pad. According to this embodiment, the brush-cleaning mechanism 3-960 is thus provided, which allows the buff pad 3-502 to be cleaned by the brush-cleaning mechanism 3-960 in addition to cleaning of the buff pad 3-502 using the dresser 3-820. As a result, this embodiment can improve the cleaning power of the buff pad 3-502.

It is sufficient that the brush-cleaning mechanism 3-960 of this embodiment has dimensions that can cover at least an extent of a radius portion of the buff pad 3-502. This is because the buff pad 3-502 itself rotates and one revolution of the buff pad 3-502 allows the entire surface to be in contact with the brush-cleaning mechanism 3-960. Alternatively, the dimensions and position of the brush-cleaning mechanism 3-960 may be configured such that the brush-cleaning mechanism 3-960 can cover the diameter of the buff pad 3-502.

FIG. 24B is a detailed diagram of the brush-cleaning mechanism 3-960. As shown in this diagram, the brush-cleaning mechanism 3-960 includes a brush section 3-961, and a main body 3-963 that supports the brush section 3-961. In the main body 3-963, a liquid passage 3-965 is formed. Liquid jet orifices 3-967 for allowing the liquid to be jetted through the brush section 3-961 are formed on the upper surface of the main body 3-963. The liquid jet orifices 3-967 communicate with the liquid passage 3-965. Consequently, when a high-pressure liquid is supplied to the liquid passage 3-965, the liquid (cleaning liquid) 3-969 is jetted from the liquid jet orifices 3-967.

Figure 25A:
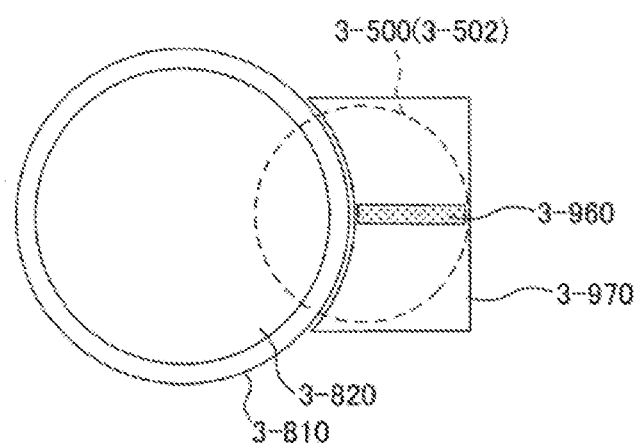
FIGS. 25A and 25B are diagrams showing a base and the brush-cleaning mechanism that are provided adjacent to the dressing table.
Figure 25B:
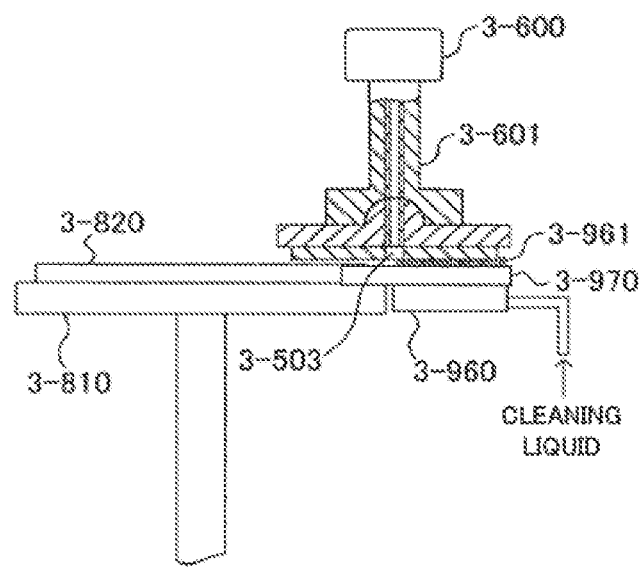

FIG. 25 shows an example where a base 3-970 is provided adjacent to the dressing table 3-810, and the brush-cleaning mechanism 3-960 is provided on the base 3-970. As shown in the diagram, the base 3-970 has an arc-shaped portion along the outer peripheral portion of the dressing table 3-810, and is adjacent to the dressing table over a predetermined angular range. The base 3-970 is positioned so as to have a surface substantially flush with the surface of the 3-820. This positional relationship is adopted because the buff head 3-500 includes the gimbal mechanism and, if the base 3-970 and the dresser 3-820 had different heights, the buff head 3-500 would be tilted.

The brush-cleaning mechanism is fixed to the base 3-970. The brush-cleaning mechanism 3-960 is configured such that the brush section 3-961 protrudes from the surface of the base 3-970. This brush section is brought into contact with the surface of the buff pad 3-502, and brush-cleaning is performed. According to an example, the brush-cleaning mechanism 3-960 extends in a direction parallel to the radial direction of the dressing table 3-810. Also in such a case where the brush-cleaning mechanism 3-960 and the base 3-970 are provided, movement of the buff pad 3-502 between the buff table 3-400 and the dressing table 3-810 allows the surface of the buff pad 3-502 to be cleaned by the brush-cleaning mechanism.

Figure 26:
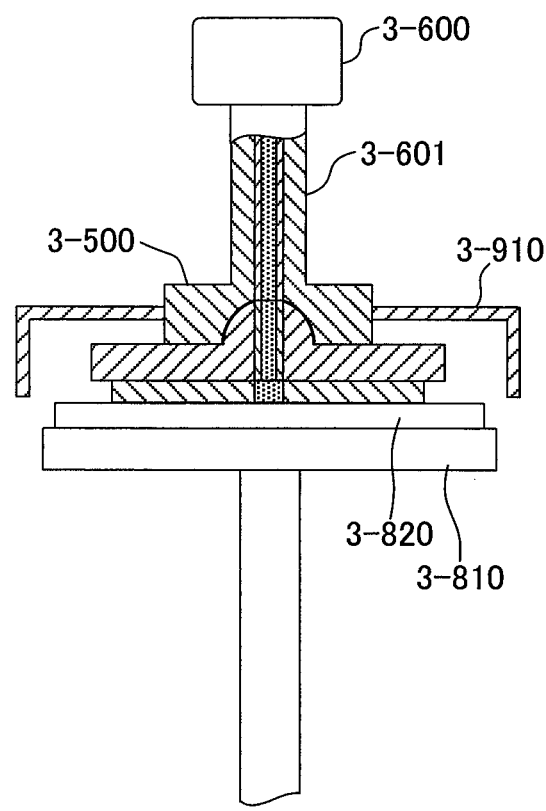
FIG. 26 is a diagram showing a buff head cover provided for the buff head.

Next, referring to FIG. 26, a modified example of a cover for preventing dispersion is described. In the example shown in FIG. 26, a buff head cover 3-910 is attached to the buff head 3-500. That is, the buff head cover 3-910 having a shape of a cylinder with a bottom is provided at a predetermined position on the buff head 3-500 such that the opening of this cover is oriented downward. The dimensions and shape of the buff head cover 3-910 are configured such that the lower edge of this cover is at a slightly higher position than that of the surface of the dresser 3-820. The inner diameter of the buff head cover 3-910 is larger than the diameter of the dresser 3-820. Consequently, if the process liquid flowing through the boundary between the buff pad 3-502 and the dresser 3-820 is dispersed owing to the centrifugal force, the buff head cover 3-910 prevents the dispersion. In particular, the buff head cover 910 is swung together with the buff arm. Consequently, this cover can always receive the process liquid and the cleaning liquid that are dispersed from the buff pad and the dresser. Furthermore, the buff head cover 3-910 also functions as a cover for preventing the cleaning liquid from being dispersed while the surface of the buff pad 3-502 is cleaned by the brush-cleaning mechanism 3-960. That is, even if the liquid (cleaning liquid) 3-969 jetted from the liquid jet orifices 3-967 is dispersed from the buff pad 3-502 while the surface of the buff pad 3-502 is cleaned by the brush-cleaning mechanism 3-960, the buff head cover 3-910 can prevent the dispersion.

The description has thus been made on various characteristic points with reference to the FIGS. 16 to 26. The aspect of the invention having these characteristic points is also an aspect of the invention encompassed by the present application. Meanwhile, each characteristic point can solely configure an aspect of the invention in some cases. Consequently, the scope of the technical thought encompassed by the present invention involves not only the scope solely defined by each characteristic point, but also the scope defined any combination of these characteristic points.

A substrate processing apparatus and a conditioner according to one embodiment of the invention of the present application are hereinafter described with reference to FIGS. 27 to 38A and 38B.

<Substrate Processing Apparatus>

Figure 27:
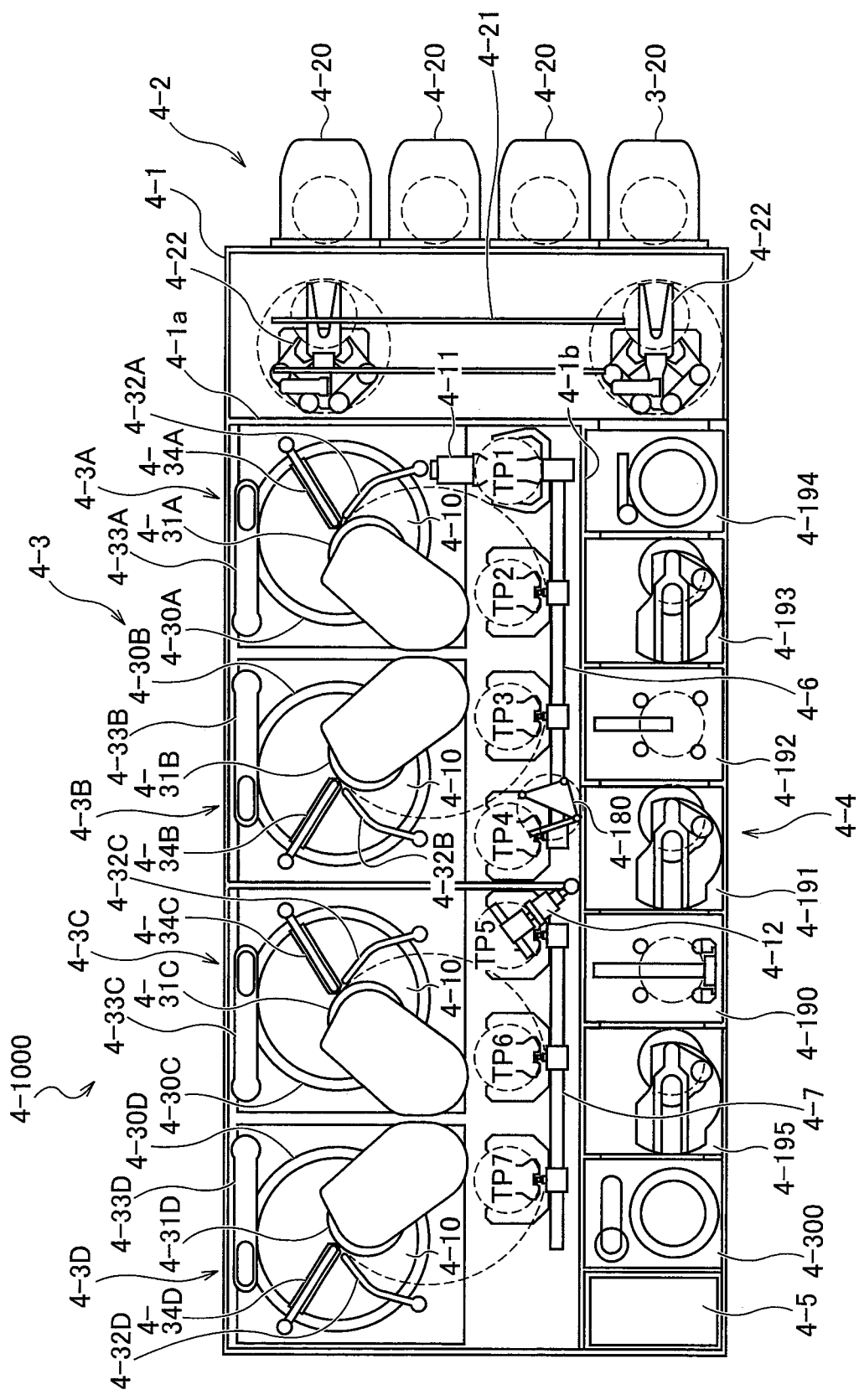
FIG. 27 is a plan view showing the overall configuration of a substrate processing apparatus of this embodiment.

FIG. 27 is a plan view showing the overall configuration of the substrate processing apparatus according to one embodiment of the present invention. As shown in FIG. 27, the substrate processing apparatus (CMP apparatus) 4-1000 includes a substantially rectangular housing 4-1. The inside of the housing 4-1 is separated by partitions 4-1a and 4-1b into a load/unload unit 4-2, a polishing unit 4-3 and a cleaning unit 4-4. The load/unload unit 4-2, the polishing unit 4-3 and the cleaning unit 4-4 are each independently assembled and independently exhausted. The cleaning unit 4-4 includes an electric power supply that supplies electric power to the substrate processing apparatus, and a control device 4-5 that controls a substrate processing operation.

<Load/Unload Unit>

The load/unload unit 4-2 includes at least two (four in this embodiment) front loaders 4-20 where wafer cassettes for stocking multiple wafers (substrates) are mounted. These front loaders 4-20 are disposed adjacent to the housing 4-1, and disposed in the width direction of the substrate processing apparatus (the direction perpendicular to the longitudinal direction). The front loader 4-20 can be mounted with an open cassette, a SMIF (Standard Manufacturing Interface) pod, or a FOUP (Front Opening Unified Pod). Here, the SMIF and FOUP are closed containers that can keep an environment independent from the external space by internally storing the wafer cassette and covering the internal space with partitions.

In the load/unload unit 4-2, a traveling mechanism 4-21 is laid along the arrangement of the front loaders 4-20. Two conveyor robots (loaders and conveyor mechanisms) 4-22 that can travel along the arrangement direction of the wafer cassettes are installed on the traveling mechanism 4-21. The conveyor robots 4-22 can access the wafer cassettes mounted on the front loaders 4-20 by traveling on the traveling mechanism 4-21. Each conveyor robot 4-22 includes vertically arranged two hands. The upper hand is used to return a processed wafer to the wafer cassette. The lower hand is used to take a wafer having not been processed yet from the wafer cassette. The upper and lower hands can thus be used differently. Furthermore, the lower hand of the conveyor robot 4-22 is configured so as to be capable of reversing the wafer.

The load/unload unit 4-2 defines a region where the cleanest state should be maintained. Accordingly, the inside of the load/unload unit 4-2 is always kept at a higher pressure than any of the pressures of the outside of the substrate processing apparatus, the polishing unit 4-3 and the cleaning unit 4-4. The polishing unit 4-3 defines the dirtiest region because a slurry is used as the polishing liquid. Consequently, a negative pressure is formed in the polishing unit 4-3. This pressure is maintained lower than the internal pressure of the cleaning unit 4-4. The load/unload unit 4-2 is provided with a filter-fan unit (not shown) that includes a clean air filter, such as a HEPA filter, ULPA filter, or chemical filter. Clean air from which particles, toxic vapor, or toxic gas have been removed is always blown from the filter-fan unit.

<Polishing Unit>

The polishing unit 4-3 defines a region where a wafer is polished (flattened). The polishing unit 4-3 includes a first polishing unit 4-3A, a second polishing unit 4-3B, a third polishing unit 4-3C, and a fourth polishing unit 4-3D. The first polishing unit 4-3A, the second polishing unit 4-3B, the third polishing unit 4-3C and the fourth polishing unit 4-3D are arranged along the longitudinal direction of the substrate processing apparatus, as shown in FIG. 27.

As shown in FIG. 27, the first polishing unit 4-3A includes: a polishing table 4-30A mounted with a polishing pad 4-10 having a polishing surface; a top ring 4-31A for polishing a wafer while holding the wafer and pressing the wafer against the polishing pad 4-10 on the polishing table 4-30A; a polishing liquid supply nozzle 4-32A for supplying the polishing pad 4-10 with the polishing liquid or dressing liquid (e.g., pure water); a dresser 4-33A for dressing the polishing surface of the polishing pad 4-10; and an atomizer 4-34A that atomizes a mixed fluid of liquid (e.g., pure water) and a gas (e.g., nitrogen gas) or a liquid (e.g., pure water) and jets the atomized fluid to the polishing surface.

Likewise, the second polishing unit 4-3B includes a polishing table 4-30B, a top ring 4-31B, a polishing liquid supply nozzle 4-32B, a dresser 4-33B, and an atomizer 4-34B. The third polishing unit 4-3C includes a polishing table 4-30C, a top ring 4-31C, a polishing liquid supply nozzle 4-32C, a dresser 4-33C, and an atomizer 4-34C. The fourth polishing unit 4-3D includes a polishing table 4-30D, a top ring 4-31D, a polishing liquid supply nozzle 4-32D, a dresser 4-33D, and an atomizer 4-34D.

Since the first polishing unit 4-3A, the second polishing unit 4-3B, the third polishing unit 4-3C and the fourth polishing unit 4-3D have the same configuration as each other, only the first polishing unit 4-3A is hereinafter described.

Figure 28:
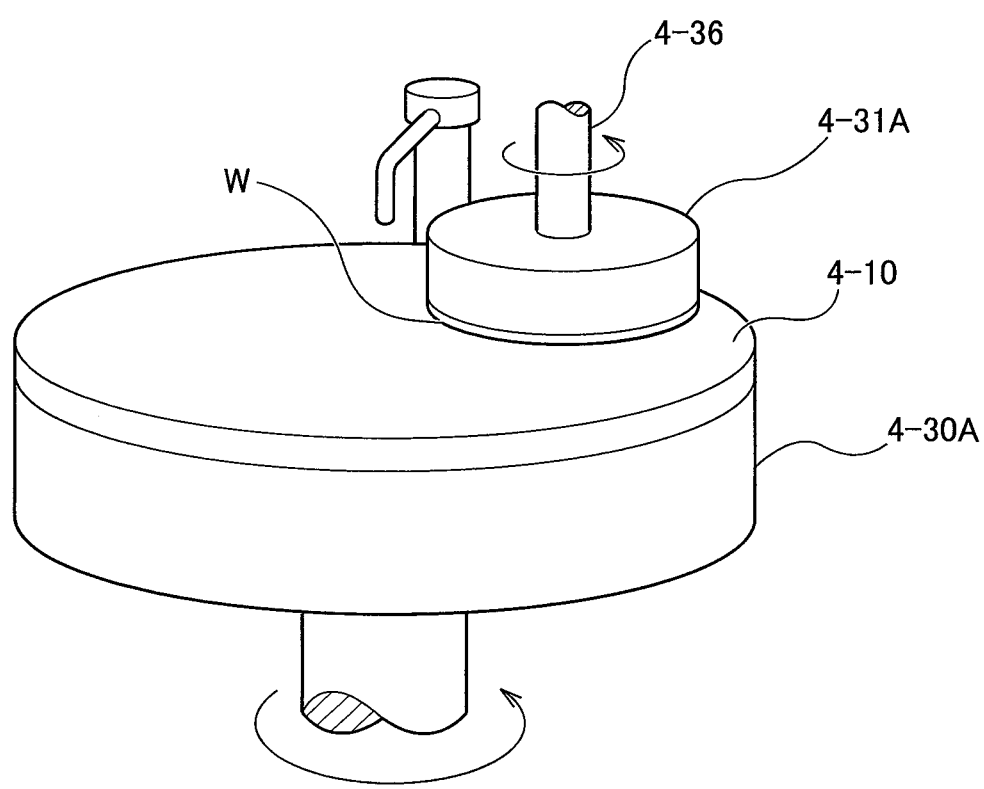
FIG. 28 is a perspective view schematically showing a polishing unit.

FIG. 28 is a perspective view schematically showing the first polishing unit 4-3A. The top ring 4-31A is supported by a top ring shaft 4-36. The polishing pad 4-10 is pasted on the upper surface of the polishing table 4-30A. The upper surface of the polishing pad 4-10 thus forms a polishing surface for polishing the wafer W. Instead of the polishing pad 4-10, fixed abrasive grains may be adopted. The top ring 4-31A and the polishing table 4-30A are configured to rotate about the respective axes, as indicated by arrows. The wafer W is held onto the lower surface of the top ring 4-31A by vacuum suction. During polishing, the polishing liquid is supplied to the polishing surface of the polishing pad 4-10 from the polishing liquid supply nozzle 4-32A, and the wafer W, which is a polishing target, is pressed by the top ring 4-31A against the polishing surface, thus allowing the wafer W to be polished.

<Conveyor Mechanism>

Next, the conveyor mechanism for conveying the wafer is described. As shown in FIG. 27, a first linear transporter 4-6 is disposed adjacent to the first polishing unit 4-3A and the second polishing unit 4-3B. The first linear transporter 4-6 is a mechanism that conveys the wafer between four conveyance positions (a first conveyance position 4-TP1, a second conveyance position 4-TP2, a third conveyance position 4-TP3 and a fourth conveyance position 4-TP4 sequentially from the site near the load/unload unit) along the direction in which the polishing units 4-3A and 4-3B are disposed.

Furthermore, a second linear transporter 4-7 is disposed adjacent to the third polishing unit 4-3C and the fourth polishing unit 4-3D. The second linear transporter 4-7 is a mechanism that conveys the wafer between three conveyance positions (a fifth conveyance position 4-TP5, a sixth conveyance position 4-TP6 and a seventh conveyance position 4-TP7 sequentially from the site near the load/unload unit) along the direction in which the polishing units 4-3C and 4-3D are disposed.

The wafer is conveyed by the first linear transporter 4-6 to the polishing units 4-3A and 4-3B. The top ring 4-31A of the first polishing unit 4-3A moves between the polishing position and the second conveyance position 4-TP2 by a swing operation of the top ring head. Consequently, the wafer is passed to the top ring 4-31A at the second conveyance position 4-TP2. Likewise, the top ring 4-31B of the second polishing unit 4-3B moves between the polishing position and the third conveyance position 4-TP3, and the wafer is passed to the top ring 4-31B at the third conveyance position 4-TP3. The top ring 4-31C of the third polishing unit 4-3C moves between the polishing position and the sixth conveyance position 4-TP6, and the wafer is passed to the top ring 4-31C at the sixth conveyance position 4-TP6. The top ring 4-31D of the fourth polishing unit 4-3D moves between the polishing position and the seventh conveyance position 4-TP7, and the wafer is passed to the top ring 4-31D at the seventh conveyance position 4-TP7.

A lifter 4-11 for receiving the wafer from the conveyor robot 4-22 is disposed at the first conveyance position 4-TP1. The wafer is passed from the conveyor robot 4-22 to the first linear transporter 4-6 via the lifter 4-11. Between the lifter 4-11 and the conveyor robot 4-22, a shutter (not shown) is provided at the partition 4-1a. When the wafer is conveyed, the shutter is opened and the wafer is passed from the conveyor robot 4-22 to the lifter 4-11. A swing transporter 4-12 is disposed among the first linear transporter 4-6, the second linear transporter 4-7 and the cleaning unit 4-4. The swing transporter 4-12 includes a hand that is movable between the fourth conveyance position 4-TP4 and the fifth conveyance position 4-TP5. The wafer is passed from the first linear transporter 4-6 to the second linear transporter 4-7 by the swing transporter 4-12. The wafer is conveyed by the second linear transporter 4-7 to the third polishing unit 4-3C and/or the fourth polishing unit 4-3D. The wafer polished by the polishing unit 4-3 is conveyed to the cleaning unit 4-4 via the swing transporter 4-12.

<Cleaning Unit>

Figure 29A:
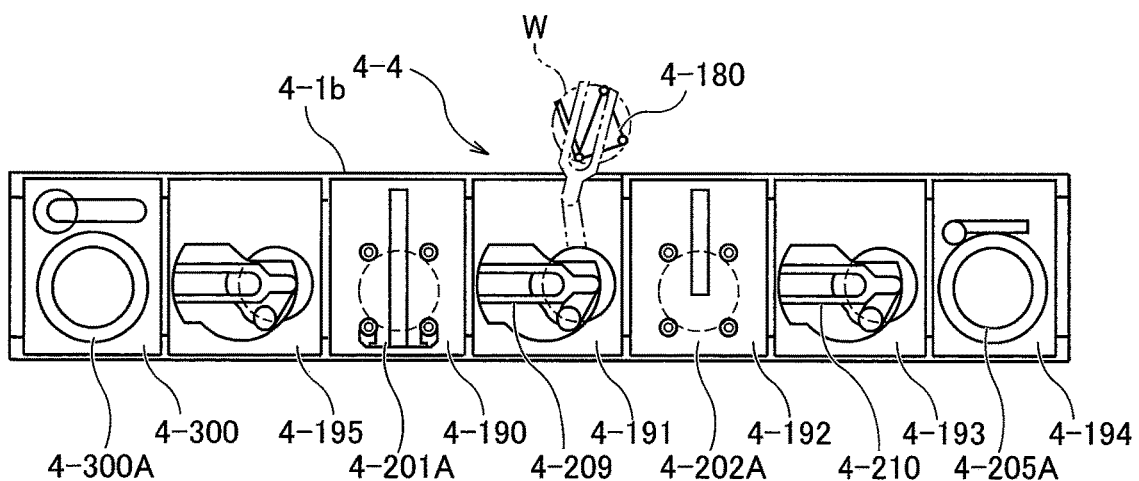
FIG. 29A is a plan view showing a cleaning unit.
Figure 29B:
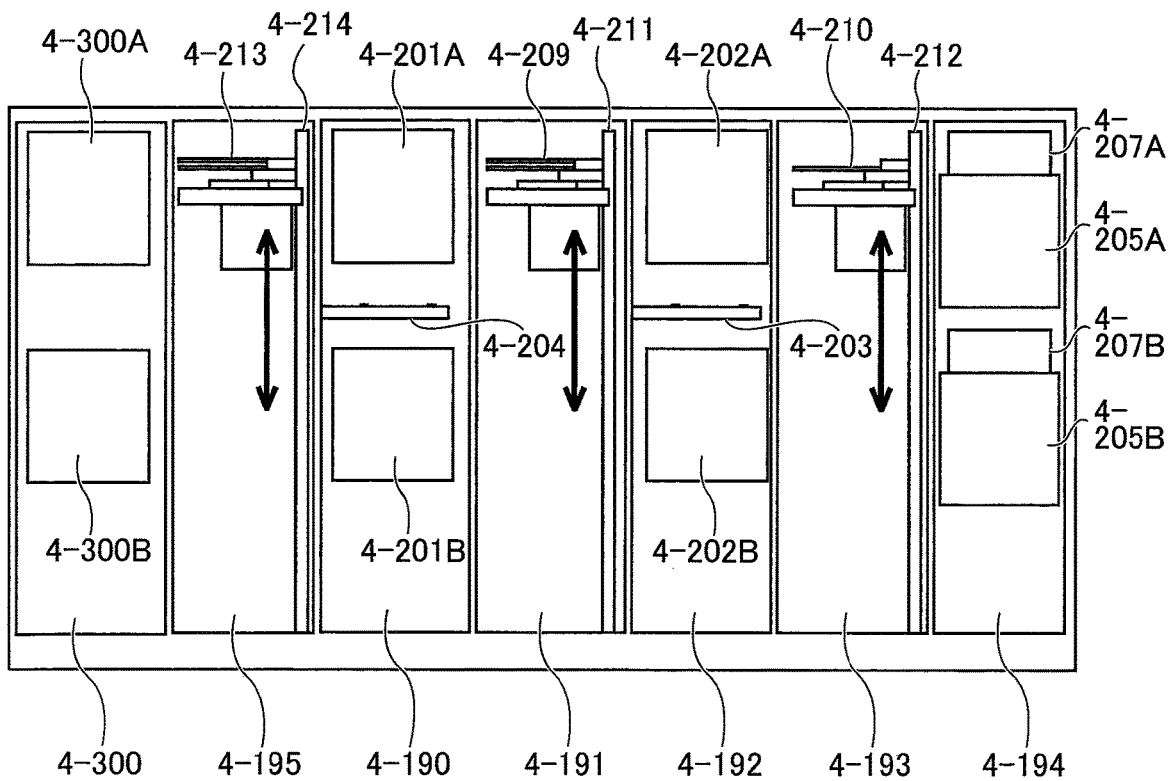
FIG. 29B is a side view showing the cleaning unit.

FIG. 29A is a plan view showing the cleaning unit 4-4, and FIG. 29B is a side view showing the cleaning unit 4-4. As shown in FIGS. 29A and 29B, the cleaning unit 4-4 are partitioned into a roll cleaning chamber 4-190, a first conveyance chamber 4-191, a pen cleaning chamber 4-192, a second conveyance chamber 4-193, a drying chamber 4-194, a buff process chamber 4-300 and a third conveyance chamber 4-195.

In the roll cleaning chamber 4-190, an upper roll cleaning module 4-201A and a lower roll cleaning module 4-201B, which are arranged along the vertical direction, are disposed. The upper roll cleaning module 4-201A is disposed above the lower roll cleaning module 4-201B. Each of the upper roll cleaning module 4-201A and the lower roll cleaning module 4-201B is a cleaner that supplies the cleaning liquid to the front and rear surfaces of the wafer while pressing the rotating two roll sponge members against the front and rear surfaces of the wafer, thereby cleaning the wafer. A wafer temporary stage 4-204 is provided between the upper roll cleaning module 4-201A and the lower roll cleaning module 4-201B.

In the pen cleaning chamber 4-192, an upper pen cleaning module 4-202A and a lower pen cleaning module 4-202B, which are arranged along the vertical direction, are disposed. The upper pen cleaning module 4-202A is disposed above the lower pen cleaning module 4-202B. Each of the upper pen cleaning module 4-202A and the lower pen cleaning module 4-202B is a cleaner that supplies the cleaning liquid to the surface of the wafer while pressing a rotating pencil sponge member against the surface of the wafer and swinging the sponge in the radial direction of the wafer, thereby cleaning the wafer. A wafer temporary stage 4-203 is provided between the upper pen cleaning module 4-202A and the lower pen cleaning module 4-202B.

In the drying chamber 4-194, an upper drying module 4-205A and a lower drying module 4-205B, which are arranged along the vertical direction, are disposed. The upper drying module 4-205A and the lower drying module 4-205B are separated from each other. Filter-fan units 4-207A and 4-207B that supply clean air into the drying modules 4-205A and 4-205B are provided above the upper drying module 4-205A and the lower drying module 4-205B, respectively.

The upper roll cleaning module 4-201A, the lower roll cleaning module 4-201B, the upper pen cleaning module 4-202A, the lower pen cleaning module 4-202B, the temporary stage 4-203, the upper drying module 4-205A and the lower drying module 4-205B are fixed to frames, not shown, with bolts and the like.

In the first conveyance chamber 4-191, a vertically movable first conveyor robot (conveyor mechanism) 4-209 is disposed. In the second conveyance chamber 4-193, a vertically movable second conveyor robot 4-210 is disposed. In the third conveyance chamber 4-195, a vertically movable third conveyor robot (conveyor mechanism) 4-213 is disposed. The first conveyor robot 4-209, the second conveyor robot 4-210 and the third conveyor robot 4-213 are movably supported by vertically extending support shafts 4-211, 4-212 and 4-214, respectively. The first conveyor robot 4-209, the second conveyor robot 4-210 and the third conveyor robot 4-213 internally includes drive mechanisms, such as motors, and are vertically movable along the support shafts 4-211, 4-212 and 4-214, respectively. As with the conveyor robot 4-22, the first conveyor robot 4-209 includes hands at upper and lower stages. As indicated by a broken line in FIG. 29A, in the first conveyor robot 4-209, the lower hand is disposed at a position accessible to the aforementioned temporary stage 4-180. When the lower hand of the first conveyor robot 4-209 accesses the temporary stage 4-180, a shutter (not shown) provided at the partition 4-1b is opened.

The first conveyor robot 4-209 operates so as to convey the wafer W between the temporary stage 4-180, the upper roll cleaning module 4-201A, the lower roll cleaning module 4-201B, the temporary stage 4-204, the temporary stage 4-203, the upper pen cleaning module 4-202A and the lower pen cleaning module 4-202B. The first conveyor robot 4-209 uses the lower hand for conveying the wafer having not been cleaned yet (wafer to which the slurry adheres), and uses the upper hand for conveying the cleaned wafer.

The second conveyor robot 4-210 operates so as to convey the wafer W between the upper pen cleaning module 4-202A, the lower pen cleaning module 4-202B, the temporary stage 4-203, the upper drying module 4-205A and the lower drying module 4-205B. Since the second conveyor robot 4-210 only conveys the cleaned wafer, this robot only includes one hand. The conveyor robot 4-22 shown in FIG. 27 uses the upper hand to takes the wafer from the upper drying module 4-205A or the lower drying module 4-205B, and returns the wafer to the wafer cassette. When the upper hand of the conveyor robot 4-22 accesses the drying modules 4-205A and 4-205B, the shutter (not shown) provided at the partition 4-1a is opened.

In the buff process chamber 4-300, an upper buff process module 4-300A and a lower buff process module 4-300B are provided. The third conveyor robot 4-213 operates so as to convey the wafer W between the upper roll cleaning module 4-201A, the lower roll cleaning module 4-201B, the temporary stage 4-204, the upper buff process module 4-300A and the lower buff process module 4-300B.

This embodiment exemplifies the example of disposing the buff process chamber 4-300, the roll cleaning chamber 4-190 and the pen cleaning chamber 4-192 in the cleaning unit 4-4, sequentially from the site far from the load/unload unit 4-2. The disposition is not limited to this example. The mode of disposing the buff process chamber 4-300, the roll cleaning chamber 4-190 and the pen cleaning chamber 4-192 may be appropriately selected according to the quality of wafer and the throughput. The upper buff process module 4-300A and the lower buff process module 4-300B are hereinafter described. Since the upper buff process module 4-300A and the lower buff process module 4-300B have similar configurations, only the upper buff process module 4-300A is described.

<Buff Process Module>

Figure 30:
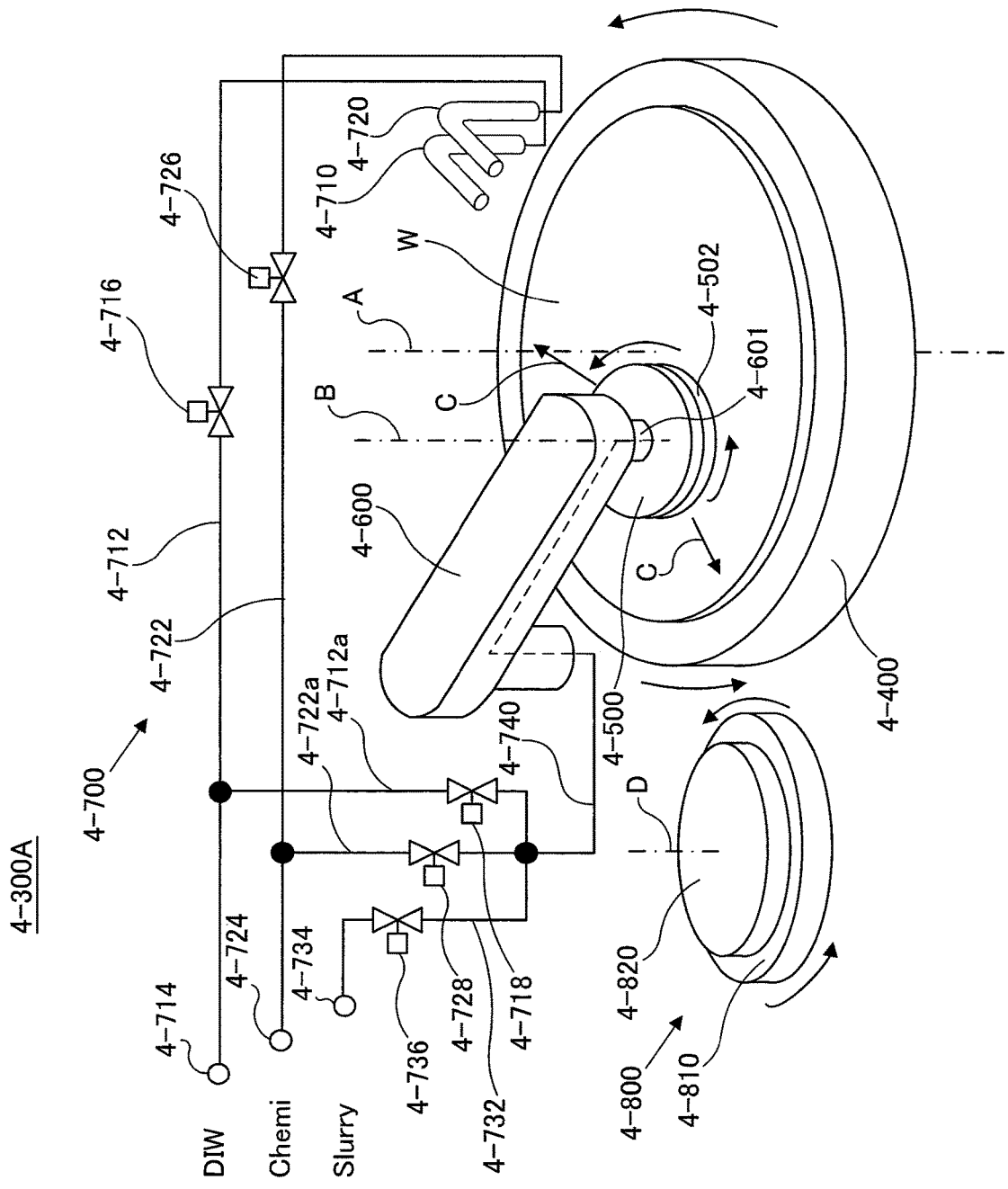
FIG. 30 is a diagram showing a schematic configuration of an upper buff process module.

FIG. 30 is a diagram showing a schematic configuration of the upper buff process module 4-300A. As shown in FIG. 30, the buff process module 4-300A includes: a buff table 4-400 on which the wafer W is mounted; a buff head 4-500 to which a buff pad 4-502 for applying a buff process to a processing target surface of the wafer W is attached; a buff arm 4-600 that holds the buff head 4-500; a liquid supply system 4-700 for supplying various types of process liquids; and a conditioner 4-800 for conditioning (dressing) the buff pad 4-502.

The buff table 4-400 includes a mechanism for sucking the wafer W. The buff table 4-400 can be rotated about a rotation axis A by a drive mechanism, not shown. The buff pad 4-502 is attached to a surface of the buff head 4-500 that faces the wafer W. The buff arm 4-600 can rotate the buff head 4-500 about a rotation axis B, and swing the buff head 4-500 in the radial direction of the wafer W as indicated by an arrow C. The buff arm 4-600 can swing the buff head 4-500 to a position where the buff pad 4-502 faces the conditioner 4-800.

The liquid supply system 4-700 includes a pure water nozzle 4-710 for supplying pure water (DIW) to the processing target surface of the wafer W. The pure water nozzle 4-710 communicates with a pure water supply source 4-714 through pure water piping 4-712. The pure water piping 4-712 is provided with an on-off valve 4-716 that can open and close the pure water piping 4-712. The on-off valve 4-716 opening and closing control through the control device, not shown, can supply the pure water to the processing target surface of the wafer W, at any timing.

The liquid supply system 4-700 includes a chemical solution nozzle 4-720 for supplying a chemical solution (Chemi) to the processing target surface of the wafer W. The chemical solution nozzle 4-720 communicates with a chemical solution supply source 4-724 through chemical solution piping 4-722. The chemical solution piping 4-722 is provided with an on-off valve 4-726 that can open and close the chemical solution piping 4-722. The on-off valve 4-726 opening and closing control through the control device can supply the chemical solution to the processing target surface of the wafer W, at any timing.

The upper buff process module 4-300A can selectively supply the pure water, chemical solution, or slurry to the processing target surface of the wafer W through the buff arm 4-600, the buff head 4-500, and the buff pad 4-502.

That is, branched pure water piping 4-712a is branched from the pure water piping 4-712 between the pure water supply source 4-714 and the on-off valve 4-716. Furthermore, branched chemical solution piping 4-722a is branched from the chemical solution piping 4-722 between the chemical solution supply source 4-724 and the on-off valve 4-726. The branched pure water piping 4-712a, the branched chemical solution piping 4-722a, and slurry piping 4-732, which communicates with a slurry supply source 4-734, join together into liquid supply piping 4-740. The branched pure water piping 4-712a is provided with an on-off valve 4-718 that can open and close the branched pure water piping 4-712a. The branched chemical solution piping 4-722a is provided with an on-off valve 4-728 that can open and close the branched chemical solution piping 4-722a. The slurry piping 4-732 is provided with an on-off valve 4-736 that can open and close the slurry piping 4-732.

A first end of the liquid supply piping 4-740 communicates with three systems of piping, which are the branched pure water piping 4-712a, the branched chemical solution piping 4-722a, and the slurry piping 4-732. The liquid supply piping 4-740 extends through the inside of the buff arm 4-600, the center of the buff head 4-500, and the center of the buff pad 4-502. A second end of the liquid supply piping 4-740 is opened toward the processing target surface of the wafer W. The control device, not shown, can supply the processing target surface of the wafer W with any one of the pure water, chemical solution, and slurry, or a mixed liquid that is any combination thereof, by controlling on and off of the on-off valve 4-718, the on-off valve 4-728 and the on-off valve 4-736.

The upper buff process module 4-300A supplies the wafer W with the process liquid through the liquid supply piping 4-740, rotates the buff table 4-400 about the rotation axis A, presses the buff pad 4-502 against the processing target surface of the wafer W, and swings the buff head 4-500 in the direction of arrow C while rotating this head about the rotation axis B, thereby allowing the buff process to be applied to the wafer W. Note that the buff pad of this embodiment has a considerably smaller diameter than the wafer, which is a processing target, has. This is because a high flatness can be achieved by the buff process.

Here, the buff process includes at least one of a buff-polishing process and a buff-cleaning process. The buff-polishing process is a process that relatively moves a wafer W and a buff pad 4-502 against each other while the buff pad 4-502 is in contact with the wafer W, and causes a slurry to intervene between the wafer W and the buff pad 4-502, thereby polishing and removing unwanted portions of a processing target surface of the wafer W. The buff-polishing process is a process that can apply a stronger physical action force to the wafer W than the physical action force applied to the wafer W by the roll sponge in the roll cleaning chamber 4-190 and the physical action force applied to the wafer W by the pen sponge in the pen cleaning chamber 4-192. The buff-polishing process can achieve removal of a surface part which is damaged by a scratch or the like or to which contaminants adhere, additional removal of a portion which cannot have been removed by main polishing in the main polishing unit 4-3, or improvement in morphology after the main polishing.

The buff-cleaning process is a process that relatively moves the wafer W and the buff pad 4-502 against each other while the buff pad 4-502 is in contact with the wafer W, and causes the cleaning process liquid (the chemical solution, or the chemical solution and pure water) to intervene between the wafer W and the buff pad 4-502, thereby removing contaminants on the surface of the wafer W or modifying the property of the processing target surface. The buff-cleaning process is a process that can apply a stronger physical action force to the wafer W than the physical action force applied to the wafer W by the roll sponge in the roll cleaning chamber 4-190 and the physical action force applied to the wafer W by the pen sponge in the pen cleaning chamber 4-192.

The conditioner 4-800 is a member for conditioning the surface of the buff pad 4-502. The conditioner 4-800 includes a dressing table 4-810, and a dresser 4-820 installed on the dressing table 4-810. The dressing table 4-810 can be rotated about a rotation axis D by a drive mechanism, not shown. The dresser 4-820 may be formed of a diamond dresser or a brush dresser, or a combination of these dressers.

When the buff pad 4-502 is conditioned, the upper buff process module 4-300A swings the buff arm 4-600 such that the buff pad 4-502 reaches a position facing the dresser 4-820. The upper buff process module 4-300A rotates the dressing table 4-810 about the rotation axis D while rotating the buff head 4-500, and presses the buff pad 4-502 against the dresser 4-820, thereby conditioning the buff pad 4-502.

<Conditioner>

Figure 31:
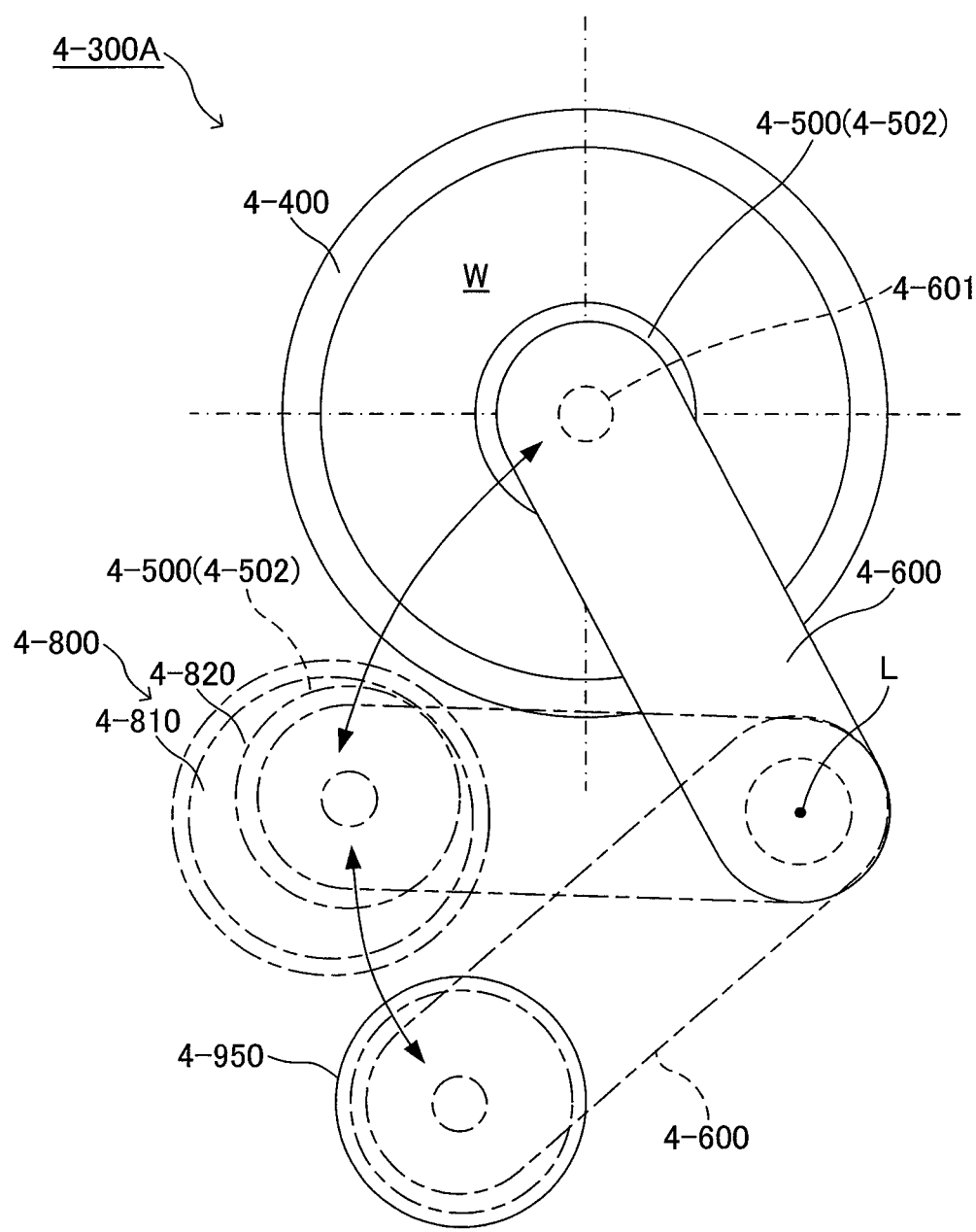
FIG. 31 the positional relationship between the buff table, the dresser and the atomizer that are arranged in a swing range of the buff arm.

Next, referring to various diagrams, the positional relationship between the buff table 4-400, the conditioner 4-800, the atomizer 4-950 and the buff pad 4-502, and specific processes of cleaning the buff pad 4-502 by the atomizer 4-950 are described. FIG. 31 shows a buff table 4-400 that holds the wafer W, and a dressing table 4-810 that supports the dresser 4-820 for conditioning the buff pad 4-502. These dresser 4-820 and the dressing table 4-810 and other configuration components constitute the conditioner 4-800.

The conditioner 4-800 is disposed adjacent to the buff table 4-400, and positioned at a radius position substantially identical to that of the buff table 4-400 with respect to the center of swing L of the buff arm 4-600. Accordingly, when the buff arm 4-600 is swung (swung counterclockwise in FIG. 31), the buff pad 4-502 can be positioned above the dresser 4-820 in the conditioner 4-800. In the conditioner 4-800, the dressing table 4-810 is rotated, which causes a combined operation with the rotation of the buff pad 4-502, thereby applying the dressing process to the surface of the buff pad 4-502. In proximity to the dressing table 4-810, a predetermined atomizer 4-950 is provided at a radius position substantially identical to the radius positions of the buff table 4-400 and the dressing table 4-810 with respect to the center of swing L of the buff arm 4-600.

Figure 32:
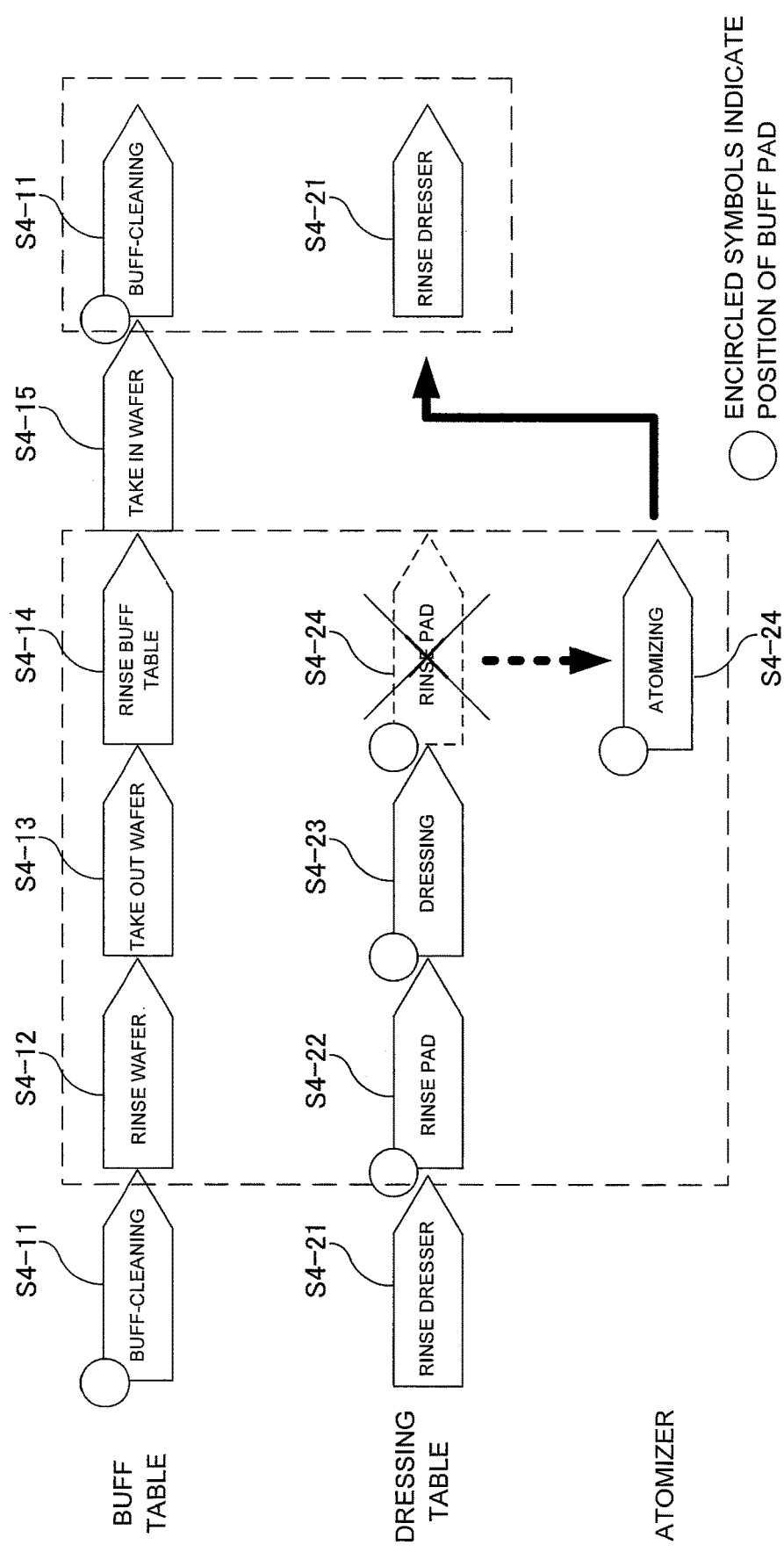
FIG. 32 is a diagram showing processing procedures at the buff process module disclosed in FIG. 31.

FIGS. 32 and 33A to 33E are diagrams for illustrating buff-cleaning and accompanying specific processes including the process of cleaning the buff pad 4-502 using the atomizer 4-950. In FIG. 32, the upper stage shows the processes at the buff table 4-400, the middle stage shows the processes at the dressing table 4-810, and the lower stage shows the processes at the atomizer 4-950. These series of processes on the respective stages are performed simultaneously in parallel. Each of the circles in the diagram shows the position of the buff pad 4-502. For example, during the buff-cleaning process, the buff pad 4-502 is positioned on the buff table 4-400. During a subsequent pad rinsing process, this pad moves onto the dressing table 4-810. Note that in FIGS. 33A to 33E, a part of the buff head 4-500 is a sectional view for the sake of illustration. The buff head 4-500 used in this embodiment is provided with a gimbal mechanism that includes concave and convex surfaces, thereby allowing slight precession of the buff head 4-500.

First, on the buff table 4-400, the buff-cleaning process (step S4-11) is applied to the wafer W. Needless to say, at this time, the buff pad 4-502 is positioned on the buff table 4-400. During the buff-cleaning process, the process liquid for buff-cleaning is supplied from the liquid supply piping 4-740, through the inside of the buff arm and the inside of the buff head rotating shaft 4-601 (see FIG. 31), to the center of the buff pad 4-502. At the same time, the buff arm 4-600 is swung in a state where the rotating buff pad 4-502 is pressed against the wafer W, thus applying the cleaning process to the surface of the wafer W rotating together with the buff table 4-400 (see FIG. 33A). The buff pad 4-502 moves above the dresser 4-820 in the next process, and subsequently dressing-related processes are performed. These processes are described later.

On the buff table 4-400, a wafer rinsing process (step S4-12) is applied. The wafer rinsing process is a process of cleaning the wafer W with DIW. After completion of applying the wafer rinsing process to the wafer W, the wafer W is then taken out of the buff table 4-400 (step S4-13) and conveyed to the next step. Subsequently, the buff table 4-400 is cleaned with DIW according to the buff table rinsing process (step S4-14). The series of processes at the buff table has thus been completed. A new wafer W to be processed next is taken in (step S4-15), and the above processes are repeated.

On the other hand, on the dressing table 4-810, the dressing process is applied to the buff pad 4-502 in parallel to the above processes. The buff pad 4-502 (see FIG. 33A) used for the buff-cleaning (step S4-11) is moved above the dresser 4-820. At this time, the buff pad 4-502 faces perpendicularly downward. The cleaning liquid (DIW) is jetted from a buff pad cleaning mechanism 4-830 disposed obliquely downward of the buff pad 4-502, thus applying the pad rinsing process to the surface of the buff pad 4-502 (step S4-22) (see FIG. 33B). During the pad rinsing process, the buff pad 4-502 is rotated, thereby allowing the entire surface to be uniformly cleaned. The cleaning liquid used for cleaning the buff pad may be an ultrasonic cleaning liquid.

Next, the buff head 4-500 is lowered and brought into contact with the dresser 4-820, and the dressing process is applied to the buff pad 4-502 (step S4-23) (see FIG. 33C). The dressing process is performed in a state where the process liquid is supplied to the center of the buff pad 4-502. During the dressing process, both the buff pad 4-502 and the dresser 4-820 rotate. The dressing process is performed in a state where the rotation axis of the buff pad 4-502 deviates from the rotation axis of the dresser 4-820. This measures are taken in order to prevent specific parts of the buff pad 4-502 and the dresser 4-820 from continuously sliding against each other. Furthermore, deviation between the rotation axis of the buff pad 4-502 and the rotation axis of the dresser 4-820 can achieve relative speeds with respect to the dresser 4-820 over the entire surface of the buff pad 4-502.

After the dressing process, the buff head 4-500 ascends again and moves above the atomizer 4-950, a high pressure cleaning fluid is jetted from the aforementioned atomizer 4-950 toward the buff pad, and this buff pad 4-502 having been subjected to the dressing process is then subjected to an atomizing process (step S4-24) (see FIG. 33D). A dresser rinsing process (step S4-21) is applied to the dresser 4-820 having been used for the dressing process (S4-23), with the cleaning liquid (DIW) jetted from the dresser cleaning mechanism 4-840 provided adjacent thereto (see FIG. 33E). During the dresser rinsing process, the dressing table 4-810 is rotated, thereby allowing the surface of the dresser 4-820 to be uniformly cleaned. The buff head 4-500 used in this embodiment is provided with a gimbal mechanism that includes hemispherical concave and convex surfaces, thereby allowing slight precession of the buff head 4-500.

The description has thus been made for the case where the buff pad 4-502 faces perpendicularly downward. However, the present invention is not limited to this case. The present invention is also applicable to the case where the buff pad 4-502 faces perpendicularly upward, and the case where this pad faces horizontally.

Even only with the atomizer 4-950, a sufficient cleaning effect in cleaning the buff pad 4-502 can be achieved. However, in order to further improve the cleaning effect, a combination with ultrasonic cleaning, brush-cleaning or the like can be considered. For example, a predetermined cleaning liquid container (not shown) is provided adjacent to the atomizer 4-950, the ultrasonic cleaning, brush-cleaning or the like is performed in this container. This configuration can remove contaminations that cannot be completely removed only through the cleaning process by the atomizer 4-950. This embodiment can provide an atomizer applicable to the buff process module that includes the buff pad 4-502 having a size equivalent to or smaller than the dresser 4-820 has.

Figure 34A:
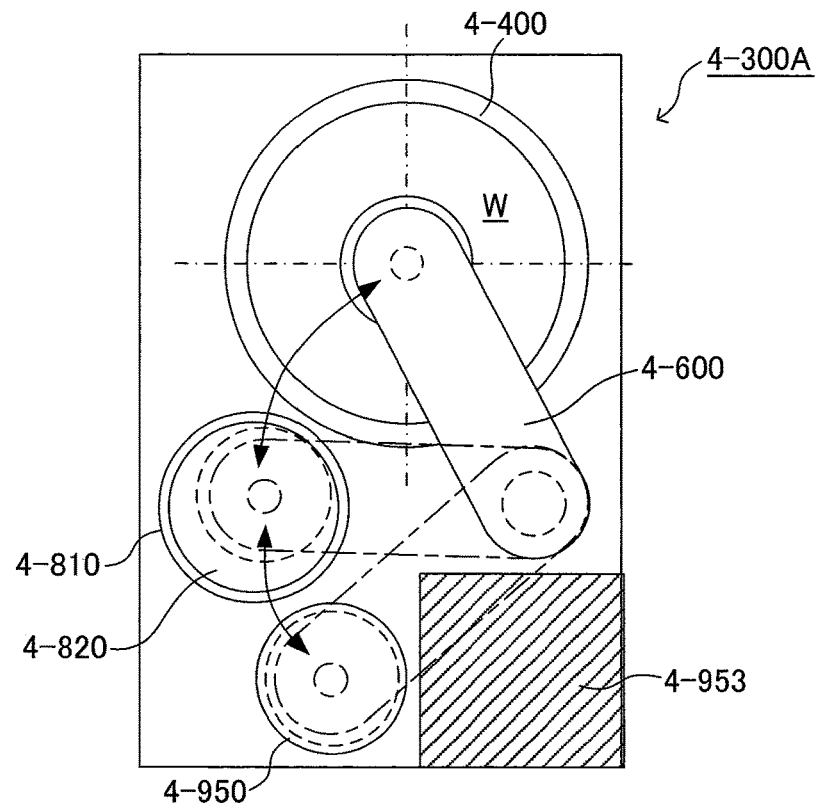
FIGS. 34A and 34B are diagrams for illustrating reduction in dead space in the case of a movable atomizer.
Figure 34B:
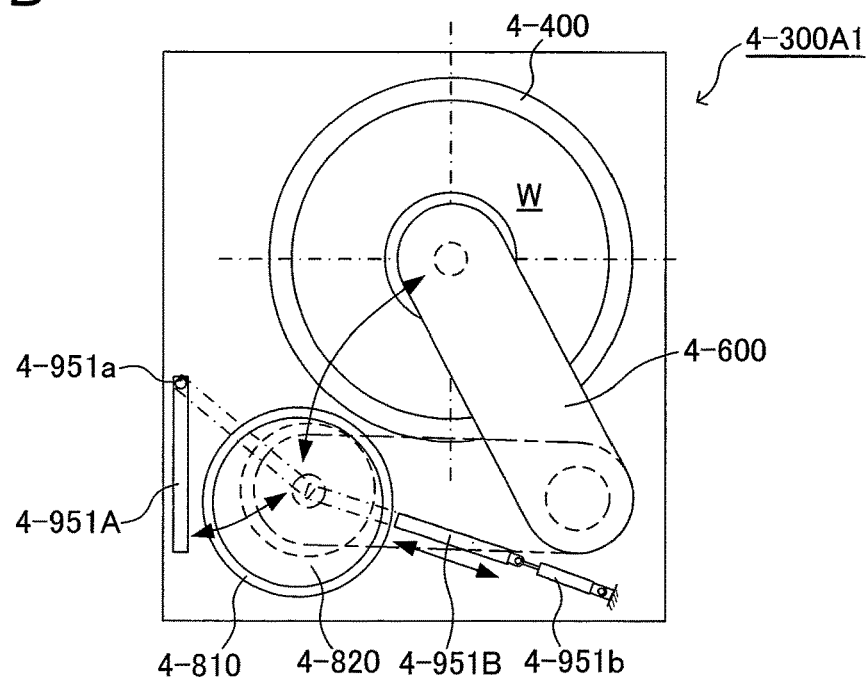

Next, referring to FIGS. 34A and 34B, a configuration for the sake of reducing the size of the buff process module 4-300A is described. FIG. 34A shows a layout in the case where the atomizer 4-950 is fixed at a predetermined position, separately from the dressing table 4-810. On the other hand, FIG. 34B shows a layout for achieving reduction in size. As apparent from this FIG. 34B, the atomizers 4-951A and 4-951B are configured to be movable. The atomizers 4-951A and 4-951B do not require high positioning accuracy in comparison with the buff table 4-400 and the dressing table 4-810. Consequently, these atomizers may adopt the movable configurations as shown in the diagrams.

In FIG. 34, the two atomizers 4-951A and 4-951B are shown. However, to implement the present invention, it is sufficient that any one of the atomizers is provided. In this embodiment, the atomizers 4-951A and 4-951B are disposed in a dead space adjacent to the dressing table 4-810. This disposition negates the need of a specific space dedicated to the atomizers 4-951A and 4-951B. More specifically, in FIG. 34A, an area (hatched area) below the center of swing L of the buff arm 4-600 is the dead space 4-953. The movable configurations of the atomizers 4-951A and 4-951B can eliminate the dead space 4-953.

As with the configuration in FIG. 34A, the configuration in FIG. 34B can eliminate the time for reciprocating movement of the buff pad 4-502 between the conditioner 4-800 and the atomizer 4-950. In configuration of FIG. 34B, only a relatively short one-way movement time of the atomizers 4-951A and 4-951B (from the retracted positions to the atomizing positions) is added. Consequently, this configuration can improve the throughput. Note that the buff arm 4-600 can move from the dresser 4-820 to the buff table 4-400 without waiting for the retraction movement (from the atomizing positions to the retracted positions) of the atomizers 4-951A and 4-951B.

Although the atomizers 4-951A and 4-951B of this embodiment are examples, these atomizers include rod-like main bodies and can project and be retracted to and from a region above the dresser 4-820. FIG. 34B shows examples of a rotational movement system and a linear movement system. The rotationally movable atomizer 4-951A includes a rotating shaft 4-951a at one end, a rotary actuator turns the rotating shaft 4-951a. While the atomizer 4-951A does not clean the buff pad 4-502, the atomizer 4-951A is retracted from the region above the dresser 4-820 (position indicated by solid lines in the diagrams). During cleaning the buff pad 4-502, this atomizer moves to the region above the dresser 4-820 (position indicated by broken lines in the diagrams).

As shown in FIG. 34B, the configuration allowing the atomizer 4-951B to linearly move is also effective. That is, an actuator, such as a cylinder 4-951b, allows the atomizer 4-951B to project and be retracted to and from the region above the dresser 4-820. More specifically, according to the example of the linear movement system, the dead space to be caused by the buff table 4-400 and the dressing table 4-810 can be effectively utilized, and the atomizer 4-951B can be installed in this space, thereby negating the need of an additional installation space. Note that the layout in FIG. 34 is only one example. The movable configurations of the atomizers 4-951A and 4-951B allow various layouts for minimizing the dead space to be adopted.

As to both the rotational movement system and the linear movement system, it is sufficient that the atomizers 4-951A and 4-951B can reach a position allowing cleaning at least a radius portion of the buff pad 4-502. This is because the rotatable configuration of the buff pad 4-502 allows the entire surface to be cleaned through rotation of the buff pad 4-502 only if at least a radius portion can be cleaned. Alternatively, if the movable ranges of the atomizers 4-951A and 4-951B can be sufficiently secured, the dimensions and positions of the atomizers 4-951A and 4-951B may be configured so as to allow a diameter portion of the buff pad 4-502 to be cleaned. In this case, in a theoretical view, half a revolution of the buff pad 4-502 can clean the entire surface. This case can achieve an effect twice as high as the effect in the case of cleaning only the radius portion.

Figure 35A:
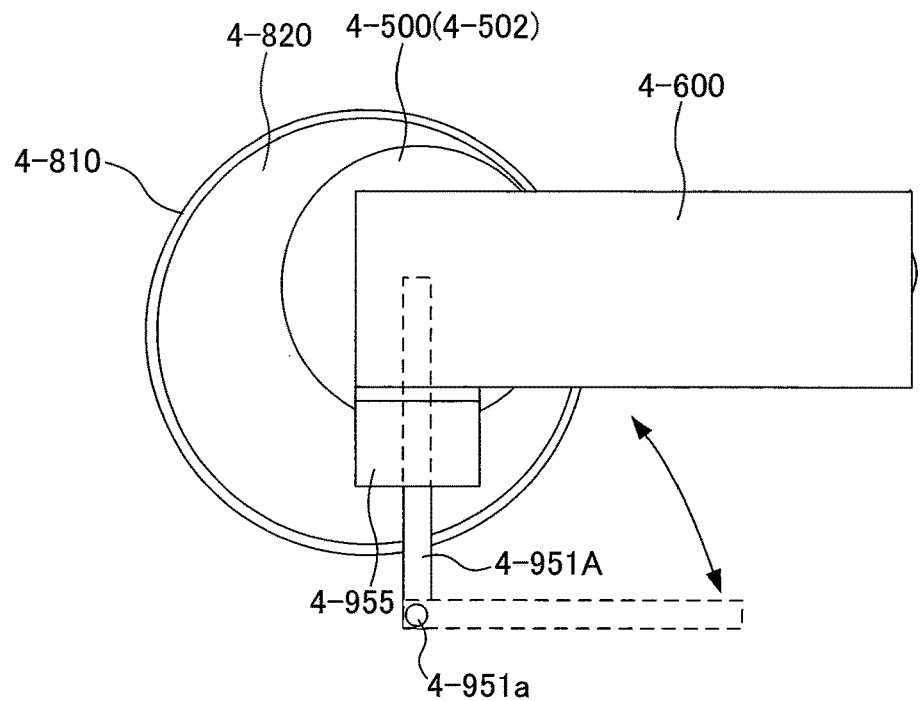
FIGS. 35A and 35B are diagrams showing a movable atomizer, and a cover for preventing dispersion.
Figure 35B:
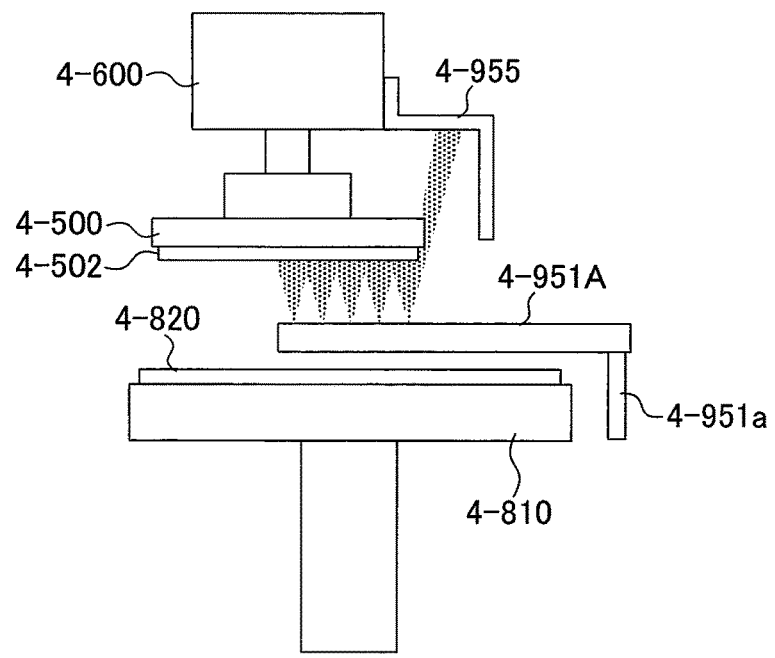

Next, referring to FIGS. 35A and 35B, a cover 4-955 for preventing dispersion is described. As shown in FIGS. 35A and 35B, an angled cover 4-955 is provided at a predetermined position on the buff arm 4-600. The attachment position of this cover 4-955 in conformity with the position of the atomizer 4-951A while the atomizer 4-951A performs cleaning. That is, while the atomizer 4-951A cleans the buff pad 4-502, the atomizer 4-951A projects into the region above the dresser 4-820. At this time, the atomizer 4-951A jets the cleaning liquid so as to allowing sufficient cleaning to be applied to the outermost peripheral portion of the buff pad 4-502. Consequently, as shown in FIG. 35B, a part of the cleaning liquid jetted to the outermost peripheral portion of the buff pad 4-502 tends to be dispersed obliquely upward out of the buff head 4-500 and the buff pad 4-502. However, since the cover 4-955 is provided at the position in conformity with the atomizer 4-951A, the cleaning liquid is checked by the cover 4-955, thereby securely preventing dispersion to the surroundings.

The cover shown in FIGS. 35A and 35B has the angled shape. However, the present invention is not limited to this case. That is, the shape may be a simple plate-like shape. Alternatively, a box-like cover having an opening only toward the atomizer 4-951A may be adopted. In the embodiment, the cover is fixed to the side of the buff arm 4-600. Alternatively, the cover may be attached to the upper surface or lower surface of the buff arm. As described above, the cover 4-955 is thus provided in conformity with the movable positions of the atomizer 4-951A. This configuration can reduce the installation area for the cover 4-955 to the minimum, and maintain the swing trajectory of the buff arm 4-600 to be small.

Figure 36A:
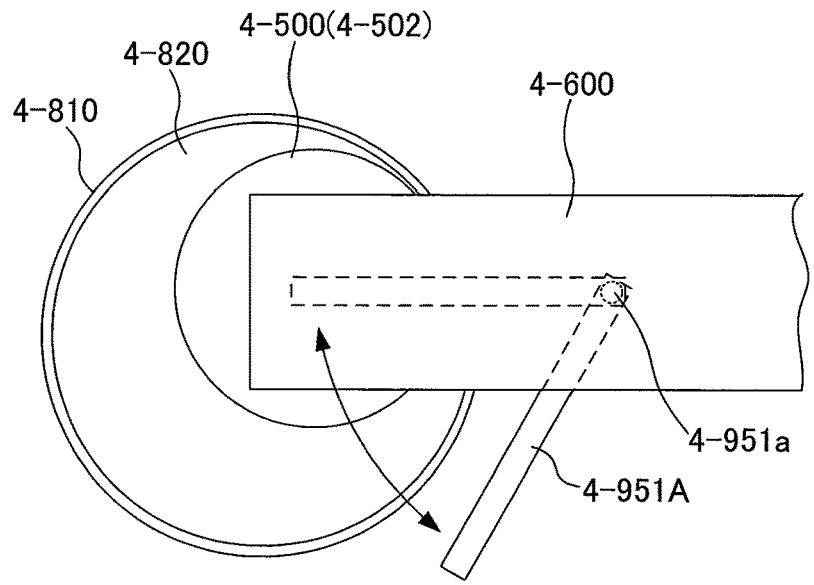
FIGS. 36A, 36B and 36C are diagrams showing another embodiment of a movable atomizer having a function of cleaning the lower surface of the buff arm, and a cover for preventing dispersion.
Figure 36B:
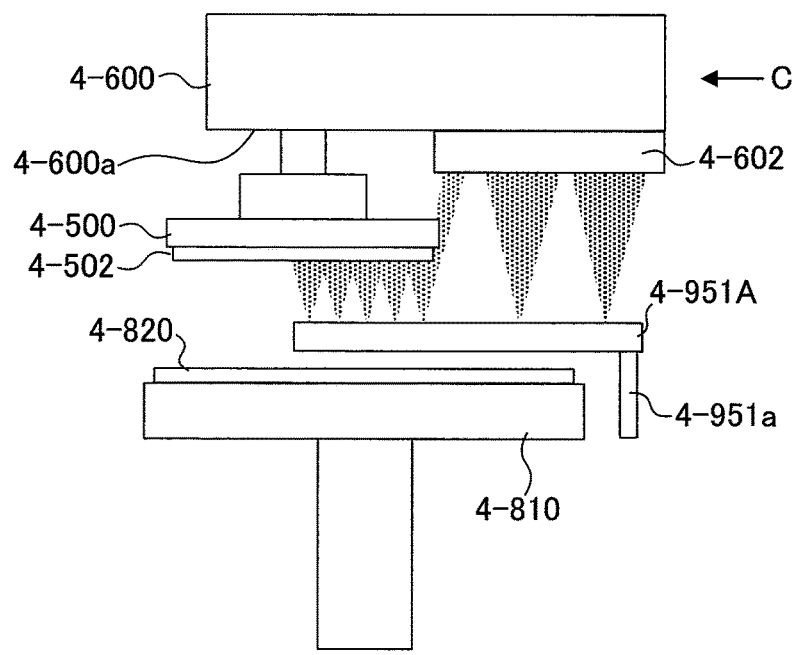
Figure 36C:
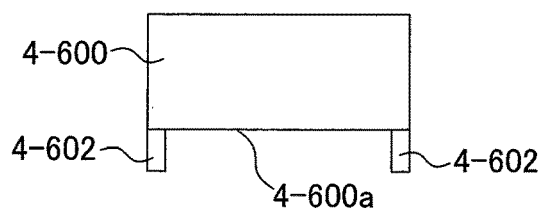

FIGS. 36A, 36B and 36C show an example of taking measures for the positional relationship between the atomizer 4-951A and the buff arm 4-600. That is, according to this configuration, the entire atomizer 4-951A is disposed below the buff arm 4-600 (at the position indicated by broken lines in the diagram) while the atomizer 4-951A performs the cleaning process. In this example, when the buff pad 4-502 is disposed above the dresser 4-820 by swing of the buff arm 4-600, the rotating shaft 4-951a of the atomizer 4-951A is below the buff arm 4-600. Consequently, during cleaning by the atomizer 4-951A, the entire atomizer 4-951A is disposed below the buff arm 4-600. Such a configuration allows the buff arm 4-600 itself to function as the cover for preventing dispersion, thereby negating the need to separately provide another cover. Alternatively, even if a certain cover is added, the cover is required to have a minimum size. As shown in FIGS. 36B and 36C, two plate-shaped arm covers 4-602 are provided on the lower surface 4-600a of the buff arm 4-600 to which the buff head 4-500 is attached. The two arm covers 4-602 are provided at regions on the lower surface 4-600a of the buff arm 4-600 where the cleaning liquid jetted from the atomizer 4-951A collides. The two arm covers 4-602 are attached on the lower surface 4-600a of the buff arm 4-600 along the buff arm 4-600 extending direction on both the right and left sides with respect to the buff arm 4-600 extending direction. The two arm covers 4-602 are thus provided, thereby preventing the cleaning liquid from being dispersed to the surroundings.

Furthermore, the atomizer 4-951A is thus positioned below the buff arm 4-600, thereby achieving the following secondary advantageous effects. That is, in each of the buff polishing, buff-cleaning, and dressing processes, the process liquid or cleaning liquid is dispersed and adheres onto the lower surface of the buff arm 4-600. Consequently, periodical cleaning is required. Typically, another piece of cleaning means is provided. However, since this embodiment includes the atomizer 4-951A, the lower surface of the buff arm 4-600 is cleaned by the atomizer 4-951A. This configuration negates the need to separately provide the other piece of cleaning means.

Figure 37A:
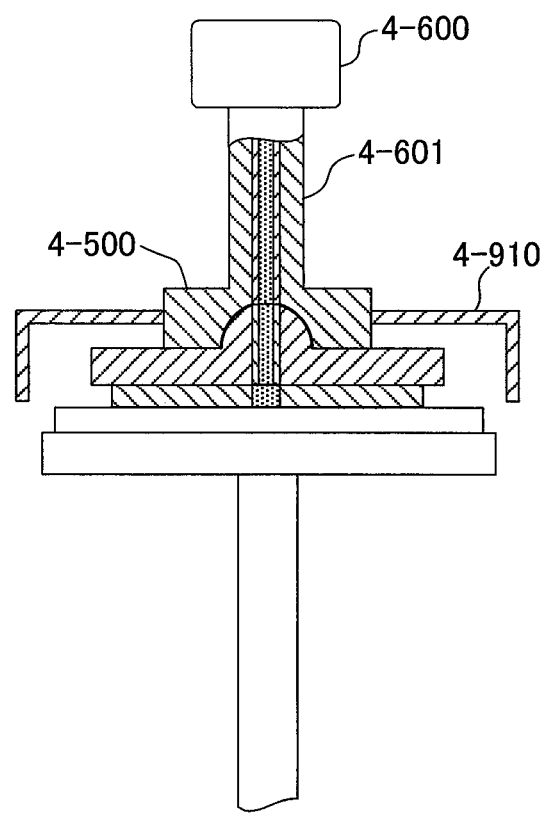
FIGS. 37A and 37B are diagrams showing another example of a cover.
Figure 37B:
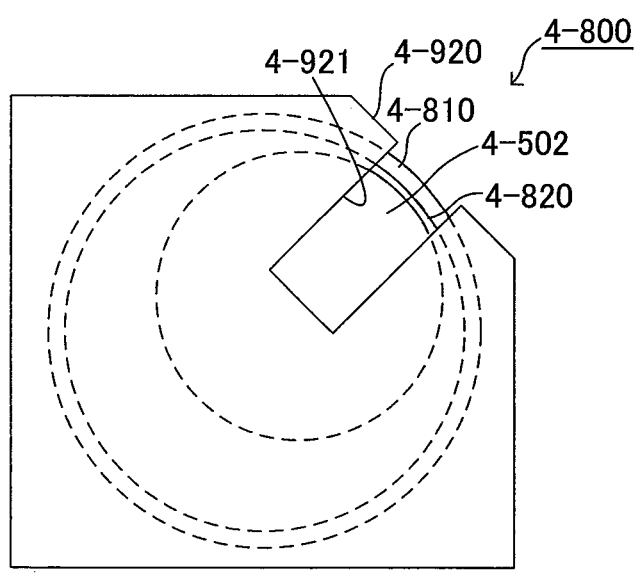
Figure 38A:
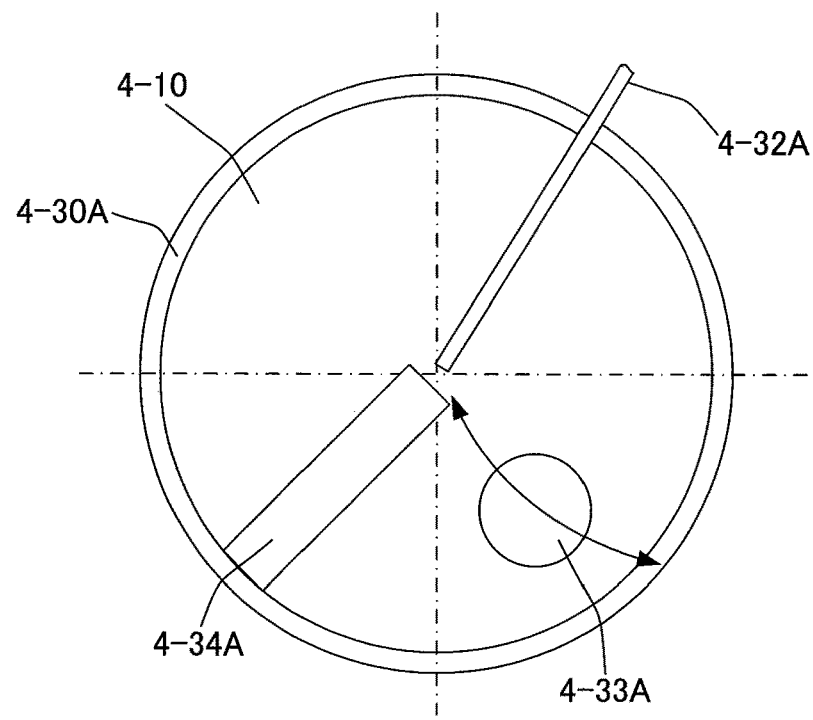
FIGS. 38A and 38B are diagrams showing the case where the polishing unit is provided with an atomizer.
Figure 38B:
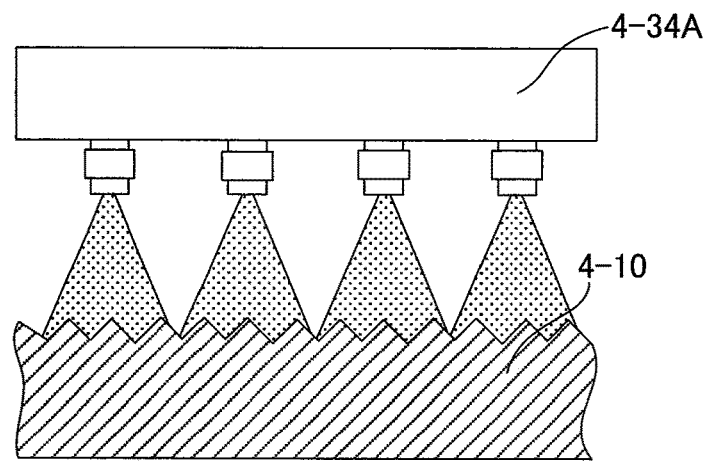

Next, referring to FIGS. 37A and 37B, modified examples of covers for preventing dispersion are described. In the example shown in FIG. 37A, a buff head cover 4-910 is attached to the buff head 4-500. That is, the buff head cover 4-910 having a shape of a cylinder with a bottom is provided at a predetermined position on the buff head 4-500 such that the opening of this cover is oriented downward. The dimensions and shape of the buff head cover 4-910 are configured such that the lower edge of this cover is at a slightly higher position than that of the surface of the dresser 4-820. The inner diameter of the buff head cover 4-910 is larger than the diameter of the dresser 4-820. Consequently, if the process liquid flowing through the boundary between the buff pad 4-502 and the dresser 4-820 is dispersed owing to the centrifugal force, the buff head cover 4-910 prevents the dispersion. In particular, the buff head cover 4-910 is swung together with the buff arm. Consequently, this cover can always receive the process liquid and the cleaning liquid that are dispersed from the buff pad and the dresser.

FIG. 37B shows an example of a fixed cover 4-920. The fixed cover 4-920 is provided for the conditioner 4-800 that includes the dresser 4-820. The fixed cover 4-920 covers the dresser 4-820, thereby effectively preventing the process liquid and cleaning liquid from being dispersed from the dresser 4-820. The shape, in plan view, of the fixed cover 4-920 is substantially rectangular. However, this shape is an example. Alternatively, a circular-shaped fixed cover may be provided. The fixed cover 4-920 has a notch 4-921 formed to prevent contact with the rotating shaft 4-601 of the buff head 4-500 (see FIG. 30). Consequently, even when the rotating shaft 4-601 of the buff head 4-500 approaches the fixed cover 4-920 by swing of the buff arm 4-600, contact is prevented by the arrangement of the notch 4-921. Each of the above embodiments can provide an atomizer applicable to the buff process module that includes the buff pad 4-502 having a size equivalent to or smaller than the dresser 4-820 has.

The description has thus been made on various characteristic points in a mutually related manner with reference to the FIGS. 27 to 38A and 38B. Accordingly, combinations of the characteristic points can achieve aspects of the invention that can exert specific technical effects. Meanwhile, each of the characteristic points can solely achieve an aspect of the invention. Accordingly, the aspects of the invention encompassed by the present application are not limited to aspects of the invention that are combinations of the multiple characteristic points. Instead, a sole characteristic point and any combination of the characteristic points can each constitute the present invention.

A substrate processing apparatus and a conditioner according to one embodiment of the invention of the present application are hereinafter described with reference to FIGS. 39 to 53.

<Substrate Processing Apparatus>

Figure 39:
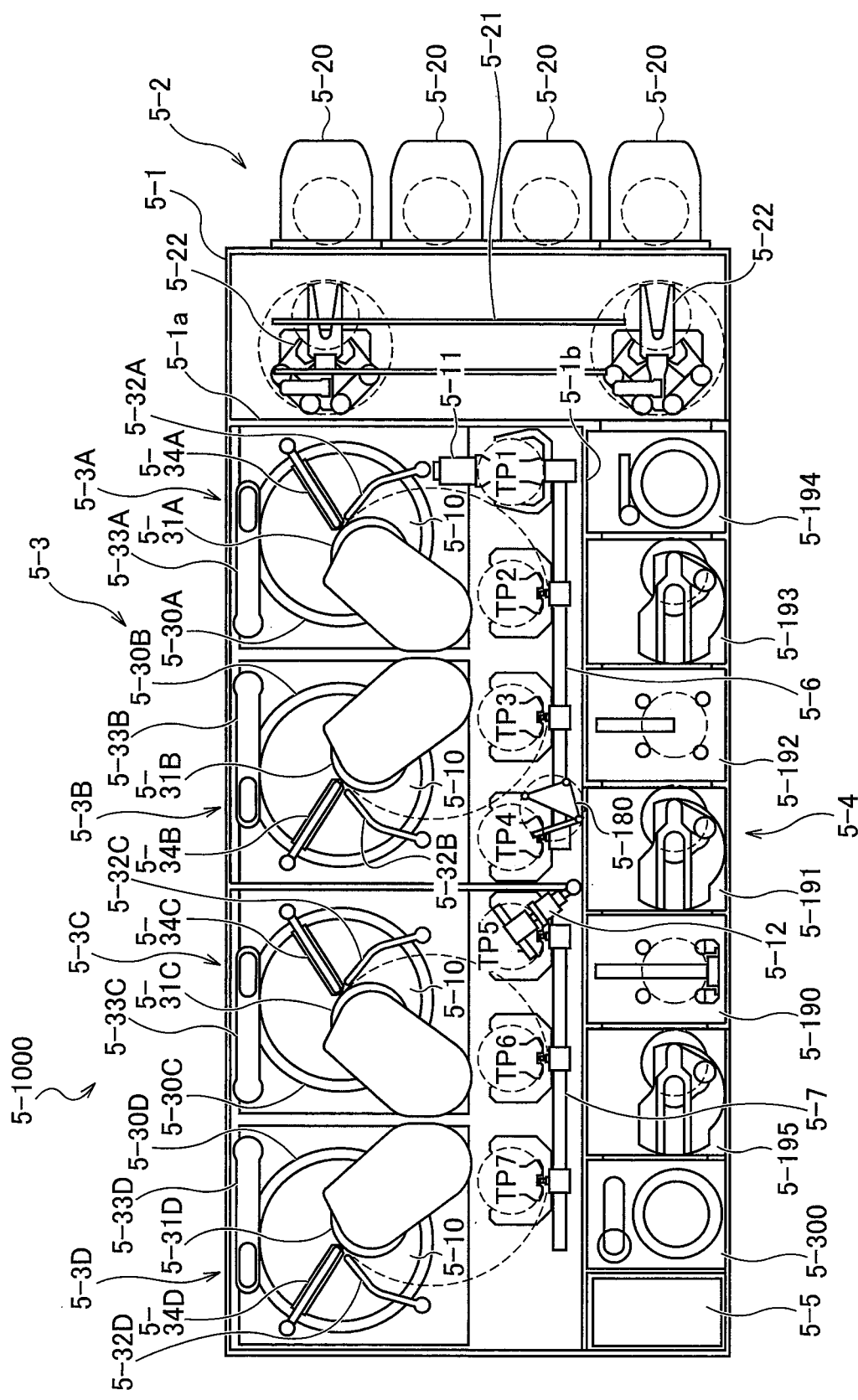
FIG. 39 is a plan view showing the overall configuration of a substrate processing apparatus of this embodiment.

FIG. 39 is a plan view showing the overall configuration of the substrate processing apparatus according to one embodiment of the present invention. As shown in FIG. 39, the substrate processing apparatus (CMP apparatus) 5-1000 includes a substantially rectangular housing 5-1. The inside of the housing 5-1 is separated by partitions 5-1a and 5-1b into a load/unload unit 5-2, a polishing unit 5-3 and a cleaning unit 5-4. The load/unload unit 5-2, the polishing unit 5-3 and the cleaning unit 5-4 are each independently assembled and independently exhausted. The cleaning unit 5-4 includes an electric power supply that supplies electric power to the substrate processing apparatus, and a control device 5-5 that controls a substrate processing operation.

<Load/Unload Unit>

The load/unload unit 5-2 includes at least two (four in this embodiment) front loaders 5-20 where wafer cassettes for stocking multiple wafers (substrates) are mounted. These front loaders 5-20 are disposed adjacent to the housing 5-1, and disposed in the width direction of the substrate processing apparatus (the direction perpendicular to the longitudinal direction). The front loader 5-20 can be mounted with an open cassette, a SMIF (Standard Manufacturing Interface) pod, or a FOUP (Front Opening Unified Pod). Here, the SMIF and FOUP are closed containers that can keep an environment independent from the external space by internally storing the wafer cassette and covering the internal space with partitions.

In the load/unload unit 5-2, a traveling mechanism 5-21 is laid along the arrangement of the front loaders 5-20. Two conveyor robots (loaders and conveyor mechanisms) 5-22 that can travel along the arrangement direction of the wafer cassettes are installed on the traveling mechanism 5-21. The conveyor robots 5-22 can access the wafer cassettes mounted on the front loaders 5-20 by traveling on the traveling mechanism 5-21. Each conveyor robot 5-22 includes vertically arranged two hands. The upper hand is used to return a processed wafer to the wafer cassette. The lower hand is used to take a wafer having not been processed yet from the wafer cassette. The upper and lower hands can thus be used differently. Furthermore, the lower hand of the conveyor robot 5-22 is configured so as to be capable of reversing the wafer.

The load/unload unit 5-2 defines a region where the cleanest state should be maintained. Accordingly, the inside of the load/unload unit 5-2 is always kept at a higher pressure than any of the pressures of the outside of the substrate processing apparatus, the polishing unit 5-3 and the cleaning unit 5-4. The polishing unit 5-3 defines the dirtiest region because a slurry is used as the polishing liquid. Consequently, a negative pressure is formed in the polishing unit 5-3. This pressure is maintained lower than the internal pressure of the cleaning unit 5-4. The load/unload unit 2 is provided with a filter-fan unit (not shown) that includes a clean air filter, such as a HEPA filter, ULPA filter, or chemical filter. Clean air from which particles, toxic vapor, or toxic gas have been removed is always blown from the filter-fan unit.

<Polishing Unit>

The polishing unit 5-3 defines a region where a wafer is polished (flattened). The polishing unit 5-3 includes a first polishing unit 5-3A, a second polishing unit 5-3B, a third polishing unit 5-3C, and a fourth polishing unit 5-3D. The first polishing unit 5-3A, the second polishing unit 5-3B, the third polishing unit 5-3C and the fourth polishing unit 5-3D are arranged along the longitudinal direction of the substrate processing apparatus, as shown in FIG. 39.

As shown in FIG. 39, the first polishing unit 5-3A includes: a polishing table 5-30A mounted with a polishing pad 5-10 having a polishing surface; a top ring 5-31A for polishing a wafer while holding the wafer and pressing the wafer against the polishing pad 5-10 on the polishing table 5-30A; a polishing liquid supply nozzle 5-32A for supplying the polishing pad 5-10 with the polishing liquid or dressing liquid (e.g., pure water); a dresser 5-33A for dressing the polishing surface of the polishing pad 5-10; and an atomizer 5-34A that atomizes a mixed fluid of liquid (e.g., pure water) and a gas (e.g., nitrogen gas) or a liquid (e.g., pure water) and jets the atomized fluid to the polishing surface.

Likewise, the second polishing unit 5-3B includes a polishing table 5-30B, a top ring 5-31B, a polishing liquid supply nozzle 5-32B, a dresser 5-33B, and an atomizer 5-34B. The third polishing unit 5-3C includes a polishing table 5-30C, a top ring 5-31C, a polishing liquid supply nozzle 5-32C, a dresser 5-33C, and an atomizer 5-34C. The fourth polishing unit 5-3D includes a polishing table 5-30D, a top ring 5-31D, a polishing liquid supply nozzle 5-32D, a dresser 5-33D, and an atomizer 5-34D.

Since the first polishing unit 5-3A, the second polishing unit 5-3B, the third polishing unit 5-3C and the fourth polishing unit 5-3D have the same configuration as each other, only the first polishing unit 5-3A is hereinafter described.

Figure 40:
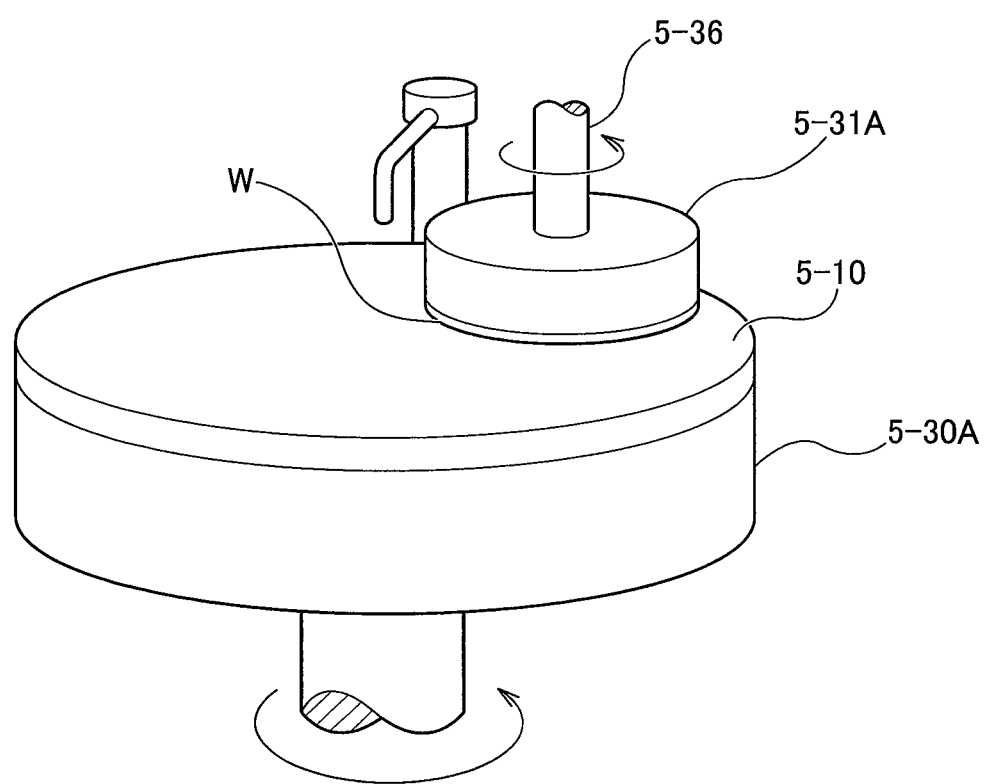
FIG. 40 is a perspective view schematically showing a polishing unit.

FIG. 40 is a perspective view schematically showing the first polishing unit 5-3A. The top ring 5-31A is supported by a top ring shaft 5-36. The polishing pad 5-10 is pasted on the upper surface of the polishing table 5-30A. The upper surface of the polishing pad 5-10 thus forms a polishing surface for polishing the wafer W. Instead of the polishing pad 5-10, fixed abrasive grains may be adopted. The top ring 5-31A and the polishing table 5-30A are configured to rotate about the respective axes, as indicated by arrows. The wafer W is held onto the lower surface of the top ring 5-31A by vacuum suction. During polishing, the polishing liquid is supplied to the polishing surface of the polishing pad 5-10 from the polishing liquid supply nozzle 5-32A, and the wafer W, which is a polishing target, is pressed by the top ring 5-31A against the polishing surface, thus allowing the wafer W to be polished.

<Conveyor Mechanism>

Next, the conveyor mechanism for conveying the wafer is described. As shown in FIG. 39, a first linear transporter 5-6 is disposed adjacent to the first polishing unit 5-3A and the second polishing unit 5-3B. The first linear transporter 5-6 is a mechanism that conveys the wafer between four conveyance positions (a first conveyance position 5-TP1, a second conveyance position 5-TP2, a third conveyance position 5-TP3 and a fourth conveyance position 5-TP4 sequentially from the site near the load/unload unit) along the direction in which the polishing units 5-3A and 5-3B are disposed.

Furthermore, a second linear transporter 5-7 is disposed adjacent to the third polishing unit 5-3C and the fourth polishing unit 5-3D. The second linear transporter 5-7 is a mechanism that conveys the wafer between three conveyance positions (a fifth conveyance position 5-TP5, a sixth conveyance position 5-TP6 and a seventh conveyance position 5-TP7 sequentially from the site near the load/unload unit) along the direction in which the polishing units 5-3C and 5-3D are disposed.

The wafer is conveyed by the first linear transporter 5-6 to the polishing units 5-3A and 5-3B. The top ring 5-31A of the first polishing unit 5-3A moves between the polishing position and the second conveyance position 5-TP2 by a swing operation of the top ring head. Consequently, the wafer is passed to the top ring 5-31A at the second conveyance position 5-TP2. Likewise, the top ring 5-31B of the second polishing unit 5-3B moves between the polishing position and the third conveyance position 5-TP3, and the wafer is passed to the top ring 5-31B at the third conveyance position 5-TP3. The top ring 5-31C of the third polishing unit 5-3C moves between the polishing position and the sixth conveyance position 5-TP6, and the wafer is passed to the top ring 5-31C at the sixth conveyance position 5-TP6. The top ring 5-31D of the fourth polishing unit 5-3D moves between the polishing position and the seventh conveyance position 5-TP7, and the wafer is passed to the top ring 5-31D at the seventh conveyance position 5-TP7.

A lifter 5-11 for receiving the wafer from the conveyor robot 5-22 is disposed at the first conveyance position 5-TP1. The wafer is passed from the conveyor robot 5-22 to the first linear transporter 5-6 via the lifter 5-11. Between the lifter 5-11 and the conveyor robot 5-22, a shutter (not shown) is provided at the partition 5-1a. When the wafer is conveyed, the shutter is opened and the wafer is passed from the conveyor robot 5-22 to the lifter 5-11. A swing transporter 5-12 is disposed among the first linear transporter 5-6, the second linear transporter 5-7 and the cleaning unit 5-4. The swing transporter 5-12 includes a hand that is movable between the fourth conveyance position 5-TP4 and the fifth conveyance position 5-TP5. The wafer is passed from the first linear transporter 5-6 to the second linear transporter 5-7 by the swing transporter 5-12. The wafer is conveyed by the second linear transporter 5-7 to the third polishing unit 5-3C and/or the fourth polishing unit 5-3D. The wafer polished by the polishing unit 5-3 is conveyed to the cleaning unit 5-4 via the swing transporter 5-12.

<Cleaning Unit>

Figure 41A:
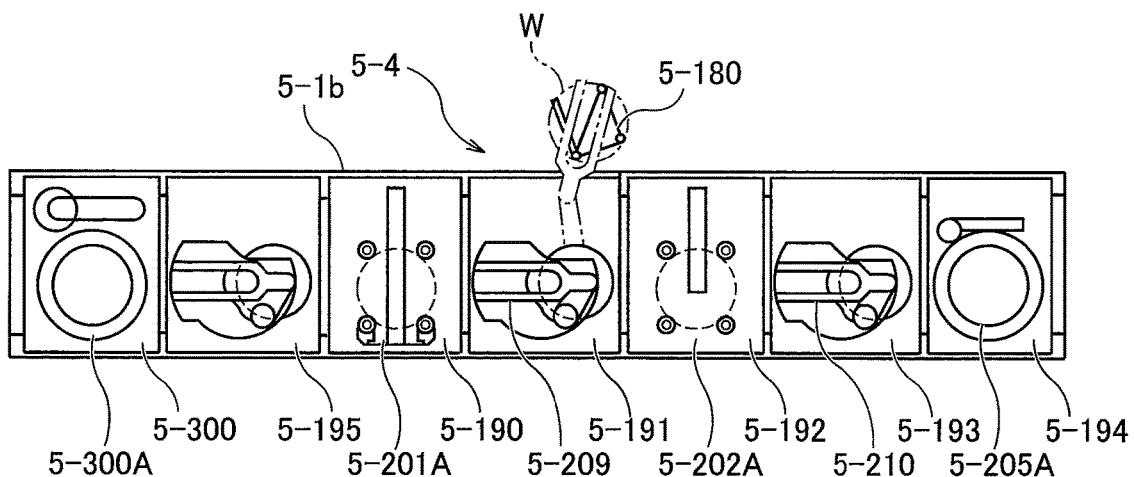
FIG. 41A is a plan view showing a cleaning unit.
Figure 41B:
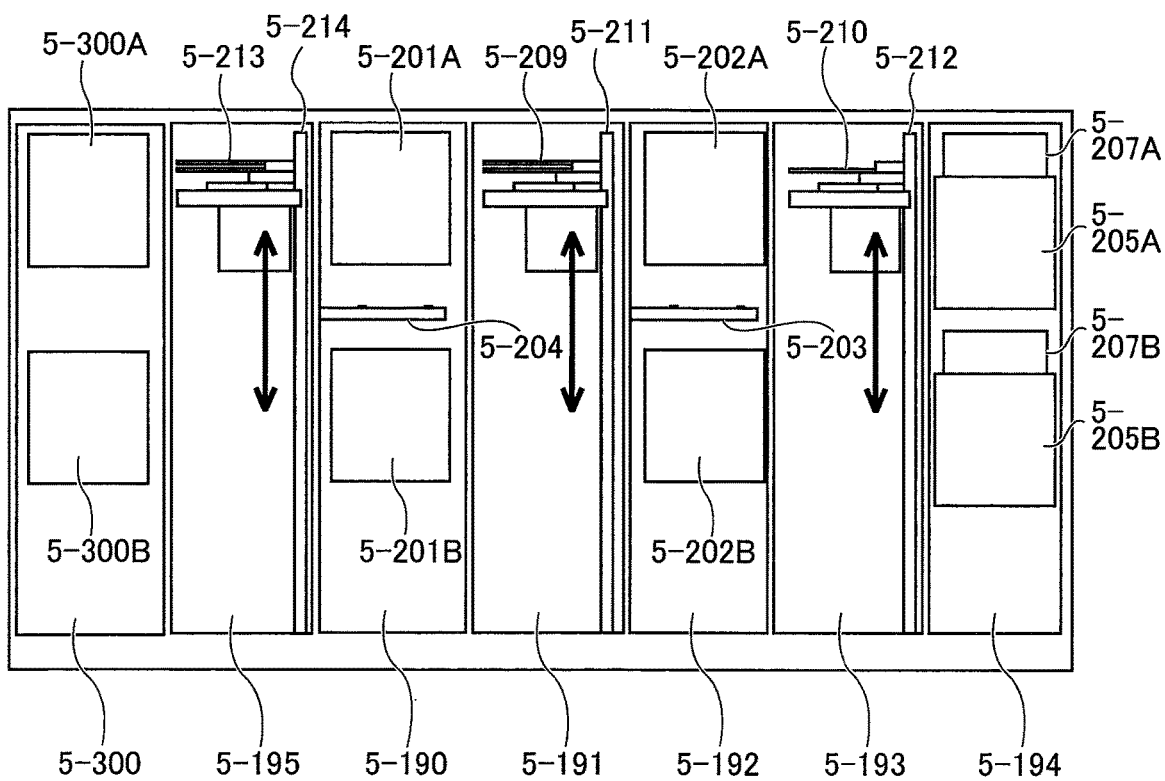
FIG. 41B is a side view showing the cleaning unit.

FIG. 41A is a plan view showing the cleaning unit 5-4, and FIG. 41B is a side view showing the cleaning unit 5-4. As shown in FIGS. 41A and 41B, the cleaning unit 5-4 is partitioned into a roll cleaning chamber 5-190, a first conveyance chamber 5-191, a pen cleaning chamber 5-192, a second conveyance chamber 5-193, a drying chamber 5-194, a buff process chamber 5-300 and a third conveyance chamber 5-195.

In the roll cleaning chamber 5-190, an upper roll cleaning module 5-201A and a lower roll cleaning module 5-201B, which are arranged along the vertical direction, are disposed. The upper roll cleaning module 5-201A is disposed above the lower roll cleaning module 5-201B. Each of the upper roll cleaning module 5-201A and the lower roll cleaning module 5-201B is a cleaner that supplies the cleaning liquid to the front and rear surfaces of the wafer while pressing the rotating two roll sponge members against the front and rear surfaces of the wafer, thereby cleaning the wafer. A wafer temporary stage 5-204 is provided between the upper roll cleaning module 5-201A and the lower roll cleaning module 5-201B.

In the pen cleaning chamber 5-192, an upper pen cleaning module 5-202A and a lower pen cleaning module 5-202B, which are arranged along the vertical direction, are disposed. The upper pen cleaning module 5-202A is disposed above the lower pen cleaning module 5-202B. Each of the upper pen cleaning module 5-202A and the lower pen cleaning module 5-202B is a cleaner that supplies the cleaning liquid to the surface of the wafer while pressing a rotating pencil sponge member against the surface of the wafer and swinging the sponge in the radial direction of the wafer, thereby cleaning the wafer. A wafer temporary stage 5-203 is provided between the upper pen cleaning module 5-202A and the lower pen cleaning module 5-202B.

In the drying chamber 5-194, an upper drying module 5-205A and a lower drying module 5-205B, which are arranged along the vertical direction, are disposed. The upper drying module 5-205A and the lower drying module 5-205B are separated from each other. Filter-fan units 5-207A and 5-207B that supply clean air into the drying modules 5-205A and 5-205B are provided above the upper drying module 5-205A and the lower drying module 5-205B, respectively.

The upper roll cleaning module 5-201A, the lower roll cleaning module 5-201B, the upper pen cleaning module 5-202A, the lower pen cleaning module 5-202B, the temporary stage 5-203, the upper drying module 5-205A and the lower drying module 5-205B are fixed to frames, not shown, with bolts and the like.

In the first conveyance chamber 5-191, a vertically movable first conveyor robot (conveyor mechanism) 5-209 is disposed. In the second conveyance chamber 5-193, a vertically movable second conveyor robot 5-210 is disposed. In the third conveyance chamber 5-195, a vertically movable third conveyor robot (conveyor mechanism) 5-213 is disposed. The first conveyor robot 5-209, the second conveyor robot 5-210 and the third conveyor robot 5-213 are movably supported by vertically extending support shafts 5-211, 5-212 and 5-214, respectively. The first conveyor robot 5-209, the second conveyor robot 5-210 and the third conveyor robot 5-213 internally includes drive mechanisms, such as motors, and are vertically movable along the support shafts 5-211, 5-212 and 5-214, respectively. As with the conveyor robot 5-22, the first conveyor robot 5-209 includes hands at upper and lower stages. As indicated by a broken line in FIG. 41A, in the first conveyor robot 5-209, the lower hand is disposed at a position accessible to the aforementioned temporary stage 5-180. When the lower hand of the first conveyor robot 5-209 accesses the temporary stage 5-180, a shutter (not shown) provided at the partition 5-1b is opened.

The first conveyor robot 5-209 operates so as to convey the wafer W between the temporary stage 5-180, the upper roll cleaning module 5-201A, the lower roll cleaning module 5-201B, the temporary stage 5-204, the temporary stage 5-203, the upper pen cleaning module 5-202A and the lower pen cleaning module 5-202B. The first conveyor robot 5-209 uses the lower hand for conveying the wafer having not been cleaned yet (wafer to which the slurry adheres), and uses the upper hand for conveying the cleaned wafer.

The second conveyor robot 5-210 operates so as to convey the wafer W between the upper pen cleaning module 5-202A, the lower pen cleaning module 5-202B, the temporary stage 5-203, the upper drying module 5-205A and the lower drying module 5-205B. Since the second conveyor robot 5-210 only conveys the cleaned wafer, this robot only includes one hand. The conveyor robot 5-22 shown in FIG. 39 uses the upper hand to takes the wafer from the upper drying module 5-205A or the lower drying module 5-205B, and returns the wafer to the wafer cassette. When the upper hand of the conveyor robot 5-22 accesses the drying modules 5-205A and 5-205B, the shutter (not shown) provided at the partition 5-1a is opened.

In the buff process chamber 5-300, an upper buff process module 5-300A and a lower buff process module 5-300B are provided. The third conveyor robot 5-213 operates so as to convey the wafer W between the upper roll cleaning module 5-201A, the lower roll cleaning module 5-201B, the temporary stage 5-204, the upper buff process module 5-300A and the lower buff process module 5-300B.

This embodiment exemplifies the example of disposing the buff process chamber 5-300, the roll cleaning chamber 5-190 and the pen cleaning chamber 5-192 in the cleaning unit 5-4, sequentially from the site far from the load/unload unit 5-2. The disposition is not limited to this example. The mode of disposing the buff process chamber 5-300, the roll cleaning chamber 5-190 and the pen cleaning chamber 5-192 may be appropriately selected according to the quality of wafer and the throughput. The upper buff process module 5-300A and the lower buff process module 5-300B are hereinafter described. Since the upper buff process module 5-300A and the lower buff process module 5-300B have similar configurations, only the upper buff process module 5-300A is described.

<Buff Process Module>

Figure 42:
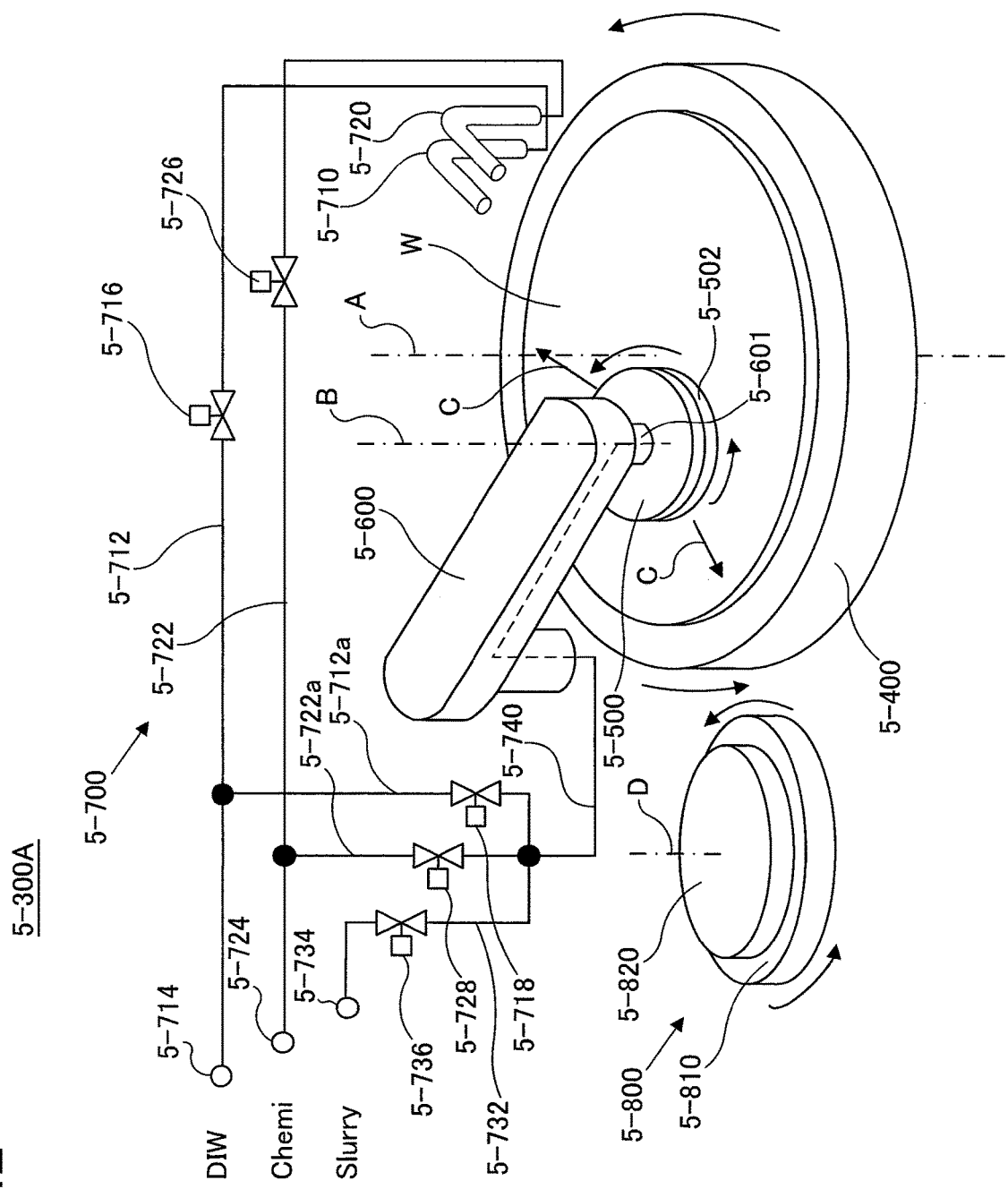
FIG. 42 is a diagram showing a schematic configuration of an upper buff process module.

FIG. 42 is a diagram showing a schematic configuration of the upper buff process module 5-300A. As shown in FIG. 42, the upper buff process module 5-300A includes: a buff table 5-400 on which the wafer W is mounted; a buff head 5-500 to which a buff pad 5-502 for applying a buff process to a processing target surface of the wafer W is attached; a buff arm 5-600 that holds the buff head 5-500; a liquid supply system 5-700 for supplying various types of process liquids; and a conditioner 5-800 for conditioning (dressing) the buff pad 5-502.

The buff table 5-400 includes a mechanism for sucking the wafer W. The buff table 5-400 can be rotated about a rotation axis A by a drive mechanism, not shown. The buff pad 5-502 is attached to a surface of the buff head 5-500 that faces the wafer W. The buff arm 5-600 can rotate the buff head 5-500 about a rotation axis B, and swing the buff head 5-500 in the radial direction of the wafer W as indicated by an arrow C. The buff arm 5-600 can swing the buff head 5-500 to a position where the buff pad 5-502 faces the conditioner 5-800.

The liquid supply system 5-700 includes a pure water nozzle 5-710 for supplying pure water (DIW) to the processing target surface of the wafer W. The pure water nozzle 5-710 communicates with a pure water supply source 5-714 through pure water piping 5-712. The pure water piping 5-712 is provided with an on-off valve 5-716 that can open and close the pure water piping 5-712. The on-off valve 5-716 opening and closing control through the control device, not shown, can supply the pure water to the processing target surface of the wafer W, at any timing.

The liquid supply system 5-700 includes a chemical solution nozzle 5-720 for supplying a chemical solution (Chemi) to the processing target surface of the wafer W. The chemical solution nozzle 5-720 communicates with a chemical solution supply source 5-724 through chemical solution piping 5-722. The chemical solution piping 5-722 is provided with an on-off valve 5-726 that can open and close the chemical solution piping 5-722. The on-off valve 5-726 opening and closing control through the control device can supply the chemical solution to the processing target surface of the wafer W, at any timing.

The upper buff process module 5-300A can selectively supply the pure water, chemical solution, or slurry to the processing target surface of the wafer W through the buff arm 5-600, the buff head 5-500, and the buff pad 5-502.

That is, branched pure water piping 5-712a is branched from the pure water piping 5-712 between the pure water supply source 5-714 and the on-off valve 5-716. Furthermore, branched chemical solution piping 5-722a is branched from the chemical solution piping 5-722 between the chemical solution supply source 5-724 and the on-off valve 5-726. The branched pure water piping 5-712a, the branched chemical solution piping 5-722a, and slurry piping 5-732, which communicates with a slurry supply source 5-734, join together into liquid supply piping 5-740. The branched pure water piping 5-712a is provided with an on-off valve 5-718 that can open and close the branched pure water piping 5-712a. The branched chemical solution piping 5-722a is provided with an on-off valve 5-728 that can open and close the branched chemical solution piping 5-722a. The slurry piping 5-732 is provided with an on-off valve 5-736 that can open and close the slurry piping 5-732.

A first end of the liquid supply piping 5-740 communicates with three systems of piping, which are the branched pure water piping 5-712a, the branched chemical solution piping 5-722a, and the slurry piping 5-732. The liquid supply piping 5-740 extends through the inside of the buff arm 5-600, the center of the buff head 5-500, and the center of the buff pad 5-502. A second end of the liquid supply piping 5-740 is opened toward the processing target surface of the wafer W. The control device, not shown, can supply the processing target surface of the wafer W with any one of the pure water, chemical solution, and slurry, or a mixed liquid that is any combination thereof, by controlling on and off of the on-off valve 5-718, the on-off valve 5-728 and the on-off valve 5-736.

The upper buff process module 5-300A supplies the wafer W with the process liquid through the liquid supply piping 5-740, rotates the buff table 5-400 about the rotation axis A, presses the buff pad 5-502 against the processing target surface of the wafer W, and swings the buff head 5-500 in the direction of arrow C while rotating this head about the rotation axis B, thereby allowing the buff process to be applied to the wafer W. Note that the buff pad of this embodiment has a considerably smaller diameter than the wafer, which is a processing target, has. This is because a high flatness can be achieved by the buff process.

Here, the buff process includes at least one of a buff-polishing process and a buff-cleaning process. The buff-polishing process is a process that relatively moves a wafer W and a buff pad 5-502 against each other while the buff pad 5-502 is in contact with the wafer W, and causes a slurry to intervene between the wafer W and the buff pad 5-502, thereby polishing and removing unwanted portions of a processing target surface of the wafer W. The buff-polishing process is a process that can apply a stronger physical action force to the wafer W than the physical action force applied to the wafer W by the roll sponge in the roll cleaning chamber 5-190 and the physical action force applied to the wafer W by the pen sponge in the pen cleaning chamber 5-192. The buff-polishing process can achieve removal of a surface part which is damaged by a scratch or the like or to which contaminants adhere, additional removal of a portion which cannot have been removed by main polishing in the main polishing unit 5-3, or improvement in morphology after the main polishing.

The buff-cleaning process is a process that relatively moves the wafer W and the buff pad 5-502 against each other while the buff pad 5-502 is in contact with the wafer W, and causes the cleaning process liquid (the chemical solution, or the chemical solution and pure water) to intervene between the wafer W and the buff pad 5-502, thereby removing contaminants on the surface of the wafer W or modifying the property of the processing target surface. The buff-cleaning process is a process that can apply a stronger physical action force to the wafer W than the physical action force applied to the wafer W by the roll sponge in the roll cleaning chamber 5-190 and the physical action force applied to the wafer W by the pen sponge in the pen cleaning chamber 5-192.

The conditioner 5-800 is a member for conditioning the surface of the buff pad 5-502. The conditioner 5-800 includes a dressing table 5-810, and a dresser 5-820 installed on the dressing table 5-810. The dressing table 5-810 can be rotated about a rotation axis D by a drive mechanism, not shown. The dresser 5-820 may be formed of a diamond dresser or a brush dresser, or a combination of these dressers.

When the buff pad 5-502 is conditioned, the upper buff process module 5-300A swings the buff arm 5-600 such that the buff pad 5-502 reaches a position facing the dresser 5-820. The upper buff process module 5-300A rotates the dressing table 5-810 about the rotation axis D while rotating the buff head 5-500, and presses the buff pad 5-502 against the dresser 5-820, thereby conditioning the buff pad 5-502.

<Conditioner>

Figure 43:
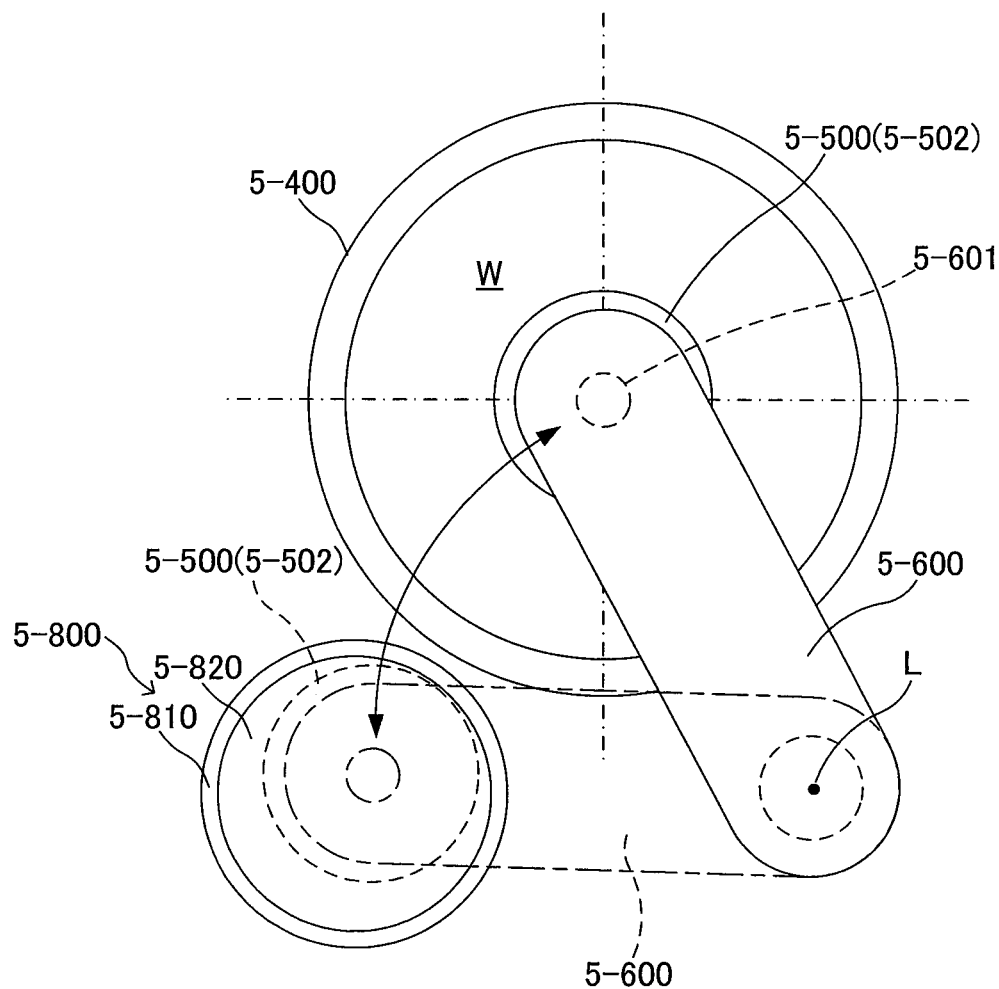
FIG. 43 is a diagram for illustrating the positional relationship between the buff table and a dressing table and swing of a buff arm.

Next, referring to the various drawings, specific processes of conditioning for the conditioner 5-800 and the buff pad 5-502 are described. FIG. 43 shows a buff table 5-400 that holds the wafer W, and a dressing table 5-810 that supports the dresser 5-820 for conditioning the buff pad 5-502. These dresser 5-820 and the dressing table 5-810 and other configuration components constitute the conditioner 5-800.

The conditioner 5-800 is disposed adjacent to the buff table 5-400, and positioned at a radius position substantially identical to that of the buff table 5-400 with respect to the center of swing L of the buff arm 5-600. Accordingly, when the buff arm 5-600 is swung (swung counterclockwise in FIG. 43), the buff pad 5-502 can be positioned above the dresser 5-820 in the conditioner 5-800. In the conditioner 5-800, the dressing table 5-810 is rotated, which causes a combined operation with the rotation of the buff pad 5-502, thereby applying the dressing process to the surface of the buff pad 5-502.

Figure 44:
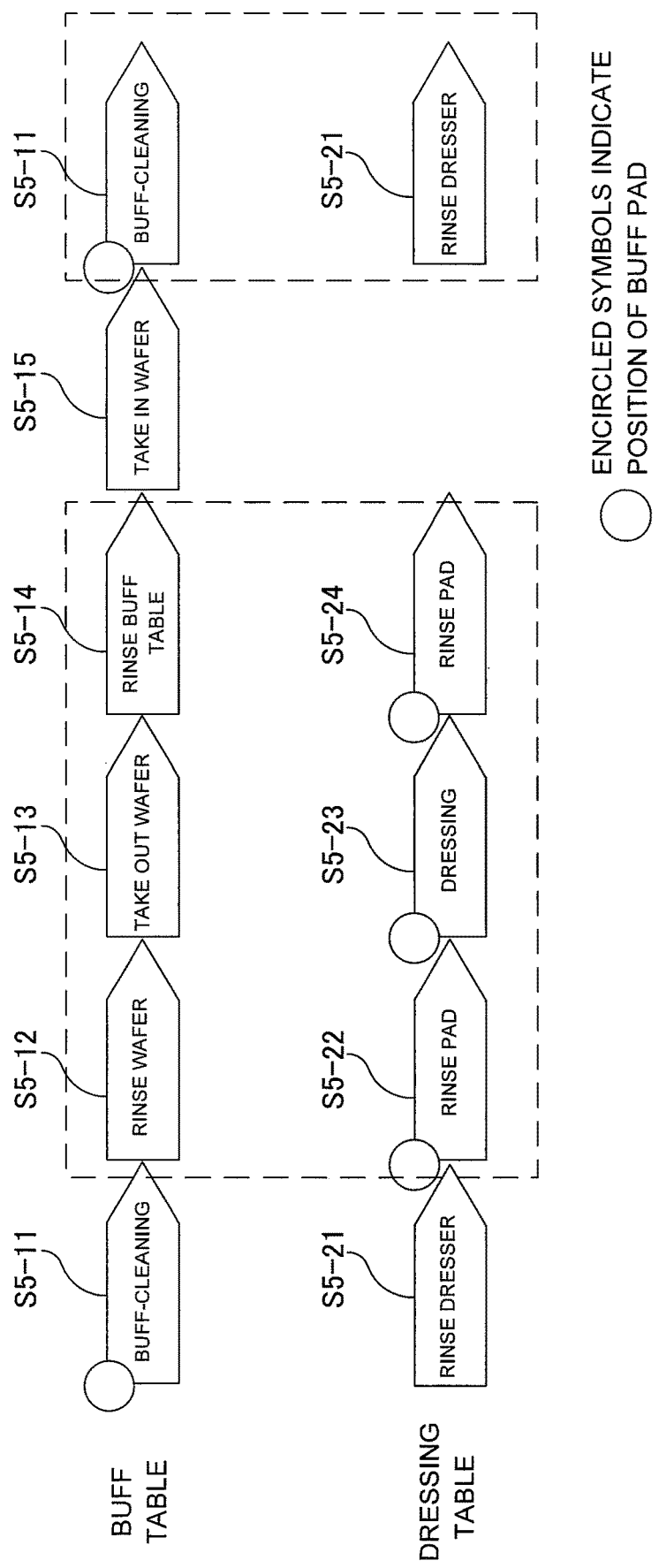
FIG. 44 is a diagram showing processing procedures in the buff table and the dressing table disclosed in FIG. 43.
Figure 45:
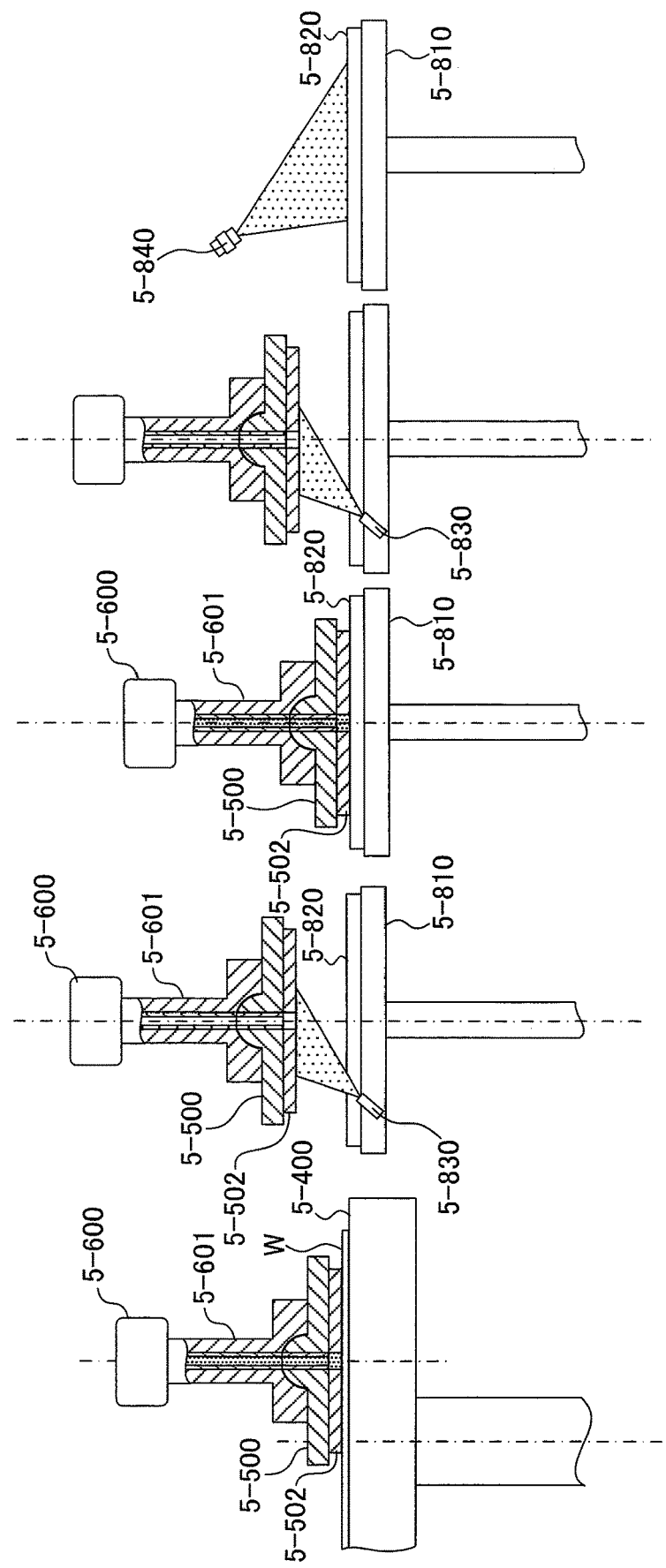
FIGS. 45A, 45B, 45C, 45D, and 45E are diagrams illustrating the operations of the buff table, the dressing table, and the buff head showing the processing procedures disclosed in FIG. 44.

FIGS. 44 and 45 are diagrams for illustrating the buff-cleaning and accompanying specific processes. In FIG. 44, the upper stage shows the processes at the buff table 5-400, and the lower stage shows the processes at the dressing table 5-810. These series of processes are performed simultaneously in parallel. Each of the circles in the diagram shows the position of the buff pad 5-502. For example, during the buff-cleaning process, the buff pad 5-502 is positioned on the buff table 5-400. During a subsequent pad rinsing process, this pad moves onto the dressing table 5-810. Note that in FIG. 45, a part of the buff head 5-500 is a sectional view for the sake of illustration. The buff head 5-500 used in this embodiment is provided with a gimbal mechanism that includes concave and convex surfaces, thereby allowing slight precession of the buff head 5-500.

First, on the buff table 5-400, the buff-cleaning process (step S5-11) is applied to the wafer W. Needless to say, at this time, the buff pad 5-502 is positioned on the buff table 5-400. During the buff-cleaning process, the process liquid for buff-cleaning is supplied from the liquid supply piping 5-740, through the inside of the buff arm and the inside of the buff head rotating shaft 5-601 (see FIG. 43), to the center of the buff pad 5-502. At the same time, the buff arm 5-600 is swung in a state where the rotating buff pad 5-502 is pressed against the wafer W, thus applying the cleaning process to the surface of the wafer W rotating together with the buff table 5-400 (see FIG. 45A). The buff pad 5-502 moves above the dresser 5-820 in the next process, and subsequently dressing-related processes are performed. These processes are described later.

On the buff table 5-400, a wafer rinsing process (step S5-12) is applied. The wafer rinsing process is a process of cleaning the wafer W with DIW. After completion of applying the wafer rinsing process to the wafer W, the wafer W is then taken out of the buff table 5-400 (step S5-13) and conveyed to the next step. Subsequently, the buff table 5-400 is cleaned with DIW according to the buff table rinsing process (step S5-14). The series of processes at the buff table has thus been completed. A new wafer W to be processed next is taken in (step S5-15), and the above processes are repeated.

On the other hand, on the dressing table 5-810, the dressing process is applied to the buff pad 5-502 in parallel to the above processes. The buff pad 5-502 (see FIG. 45A) used for the buff-cleaning (step S5-11) is moved above the dresser 5-820. At this time, the buff pad 5-502 faces perpendicularly downward. The cleaning liquid (DIW) is jetted from a buff pad cleaning mechanism 5-830 disposed obliquely downward of the buff pad 5-502, thus applying the pad rinsing process to the surface of the buff pad 5-502 (step S5-22) (see FIG. 45B). During the pad rinsing process, the buff pad 5-502 is rotated, thereby allowing the entire surface to be uniformly cleaned. The cleaning liquid used for cleaning the buff pad may be an ultrasonic cleaning liquid.

Next, the buff head 5-500 is lowered and brought into contact with the dresser 5-820, and the dressing process is applied to the buff pad 5-502 (step S5-23) (see FIG. 45C). The dressing process is performed in a state where the process liquid is supplied to the center of the buff pad 5-502. During the dressing process, both the buff pad 5-502 and the dresser 5-820 rotate. The dressing process is performed in a state where the rotation axis of the buff pad 5-502 deviates from the rotation axis of the dresser 5-820. This measures are taken in order to prevent specific parts of the buff pad 5-502 and the dresser 5-820 from continuously sliding against each other.

After the dressing process, the buff head 5-500 ascends again, the cleaning liquid is jetted from the aforementioned buff pad cleaning mechanism 5-830 toward the buff pad, and this buff pad having been subjected to the dressing process is then subjected to the pad rinsing process again (step S5-24) (see FIG. 45D). A dresser rinsing process (step S5-21) is applied to the dresser 5-820 having been used for the dressing process (S5-23), with the cleaning liquid (DIW) jetted from the dresser cleaning mechanism 5-840 provided adjacent thereto (see FIG. 45E). During the dresser rinsing process, the dressing table 5-810 is rotated, thereby allowing the surface of the dresser 5-820 to be uniformly cleaned.

The description has thus been made for the case where the buff pad 5-502 faces perpendicularly downward. However, the present invention is not limited to this case. The present invention is also applicable to the case where the buff pad 5-502 faces perpendicularly upward, and the case where this pad faces horizontally.

Figure 46:
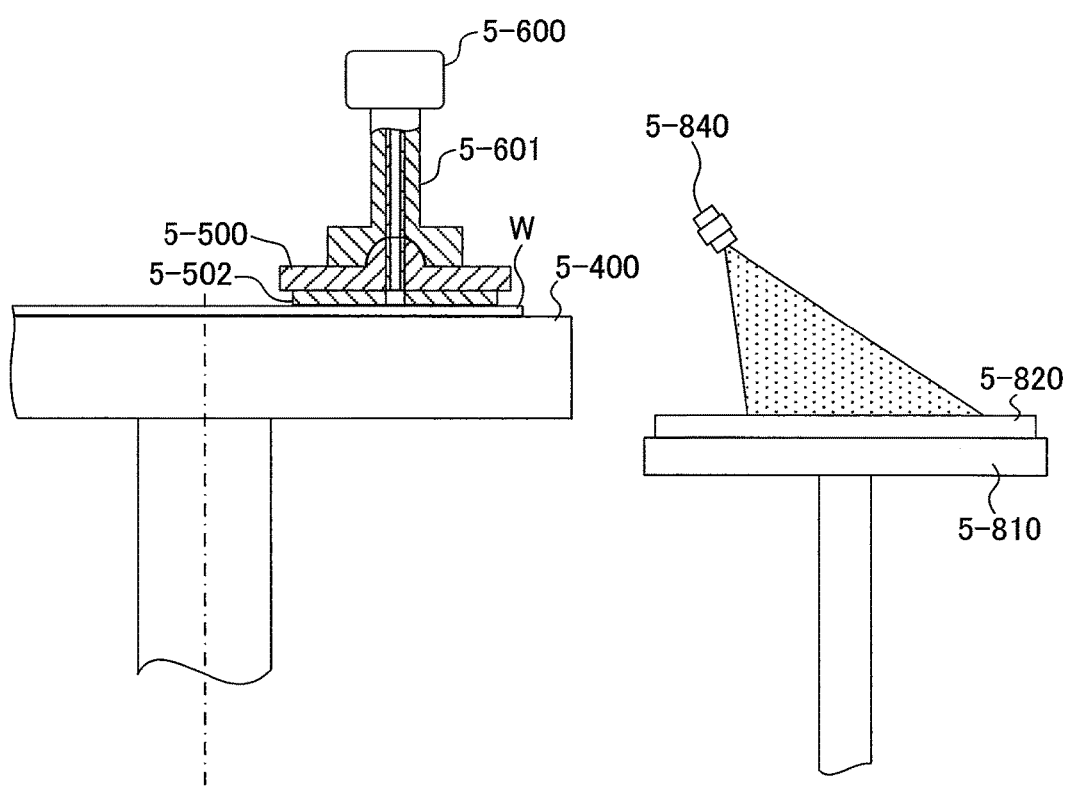
FIG. 46 is a diagram showing an embodiment where the dresser is disposed at a lower position than the position of the buff table.

Next, one characteristic point of this embodiment is described with reference to FIG. 46. As shown in FIG. 46, this embodiment has one characteristic point where the dresser 5-820 is disposed lower than the buff table 5-400. Such a configuration is adopted because of the following reasons. That is, when the dresser rinsing process is applied to the dresser 5-820, the cleaning liquid is jetted from the dresser cleaning mechanism 5-840. If no measures were taken at this time, the cleaning liquid used for the dresser rinsing would be dispersed toward the buff table 5-400 and contaminate the wafer W in processing. It can be also considered that the process liquid used for the buff-cleaning would be contaminated, thereby affecting the process performance. These problems occur because the dresser rinsing process is performed at the same time of various processes for the wafer W on the buff table 5-400.

To address the above problems, disposition of the dresser 5-820 at the lower position than that of the buff table 5-400 can effectively prevent the cleaning liquid from being dispersed to the buff table 5-400. Since the cleaning liquid is jetted to the dresser 5-820 by the dresser cleaning mechanism 5-840 from an obliquely above position, the difference in height between the buff table 5-400 and the dresser 5-820 prevents the cleaning liquid from being dispersed to the buff table 5-400. A difference in height even of several centimeters exerts sufficient contamination preventing effect.

Figure 47A:
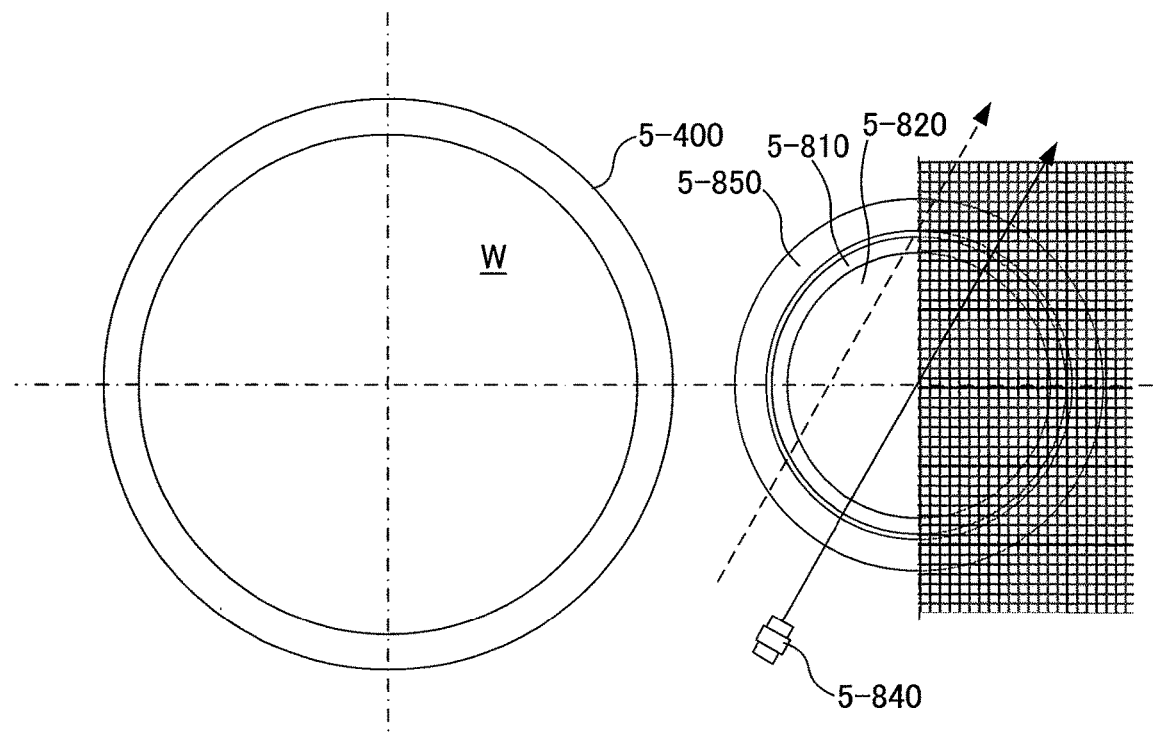
FIGS. 47A and 47B are diagrams showing other configuration examples for preventing the wafer from being contaminated.
Figure 47B:
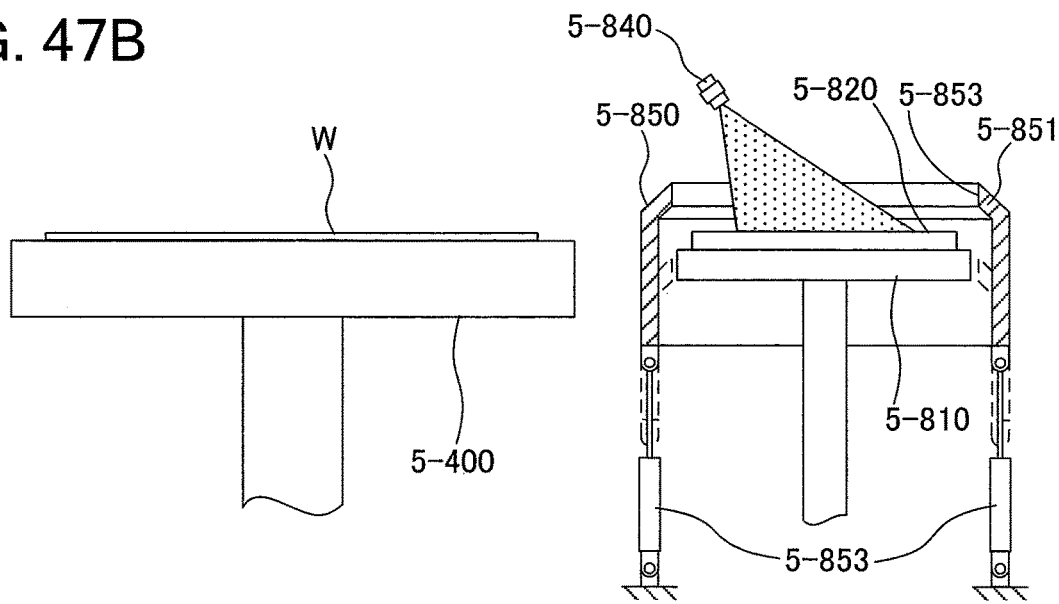

Next, referring to FIGS. 47A and 47B, other characteristic points of this embodiment are described. FIG. 47A is a diagram showing an example characterized by the cleaning liquid jetting direction. In this example, the initial jetting direction is configured such that the cleaning liquid is jetted toward the dresser 5-820 and then dispersed in the direction away from the buff table 5-400. In the schematic example of FIG. 47A, the cleaning liquid is jetted from the dresser cleaning mechanism 5-840, and passes through the center of the dresser 5-820, and is dispersed in the direction away from the buff table (shaded area in FIG. 47A).

That is, a line passing through the center of the buff table 5-400 and the center of the dresser 5-820 is drawn, a line orthogonal to this line is further drawn at the center of the dresser 5-820, and the jetting direction is configured such that the dispersion should be toward an area far from the buff table 5-400 over the orthogonal line as a boundary. Furthermore, in other words, the dresser cleaning mechanism 5-840 is disposed in an area other than the shaded area with respect to the orthogonal line, which serves as the boundary. However, the dresser cleaning mechanism 5-840 cannot be disposed above the buff table 5-400. Consequently, as shown in FIG. 47A, this mechanism is disposed between the buff table 5-400 and the dressing table 5-810, and jets the cleaning liquid to the dresser 5-820 in an oblique direction. The above description has used the example where the cleaning liquid schematically passes through the center of the dresser 5-820. As indicated by a broken arrow, the cleaning liquid may be jetted toward the position offset from the center of the dresser 5-820.

Figure 52:
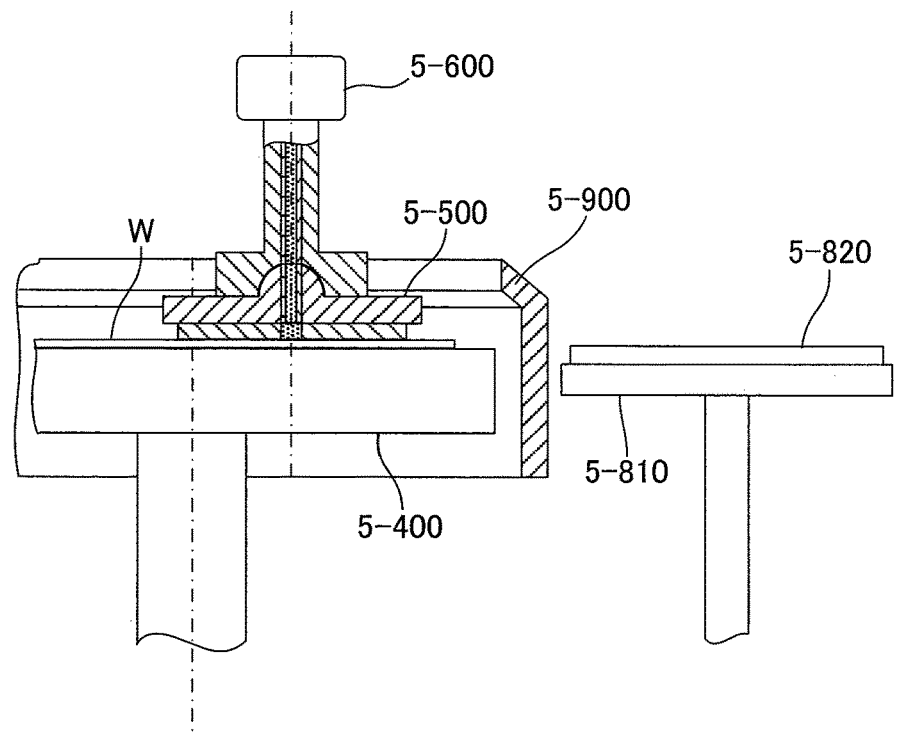
FIG. 52 is a diagram showing an example where the buff table cover is provided around the buff table.

Next, referring to FIGS. 47A and 47B, another characteristic point of this embodiment is described. FIG. 47B is characterized in that a dresser cover 5-850 is provided around the dressing table 5-810. Here, for the sake of description, description is made using an example where the upper surface of the dresser 5-820 has a height substantially identical to that of the upper surface of the wafer W. In this embodiment, the substantially cylindrical dresser cover 5-850 is provided around the dressing table 5-810. An inwardly inclined section 5-851 is provided at the upper end of the dresser cover 5-850. The inside of this section is defined as an opening 5-853. The inner diameter of the opening 5-853 is slightly larger than the diameter of the dressing table 5-810. Even when the dresser cover 5-850 vertically moves, this cover is not in contact with the outer peripheral portion of the dressing table 5-810. The inclined section 5-851 is for effectively preventing the cleaning liquid from being dispersed out of the dresser cover 5-850. Even with a simple cylindrical dresser cover, an effect of preventing the cleaning liquid from being dispersed is exerted. Consequently, the inclined section 5-851 is not a necessary configuration element. FIG. 47B thus shows the example where the dresser cover 5-850 is provided around the dressing table 5-810. However, a cover for preventing the cleaning liquid from being dispersed may be provided around the buff table 5-400 as shown in FIG. 52. The cover for preventing the cleaning liquid from being dispersed is not limited to the dresser cover 5-850 provided around the dressing table 5-810 and the buff table cover 5-900 provided around the buff table 5-400. Alternatively, any cover provided between the buff table 5-400 and the dressing table 5-810 may be adopted. In the conditioner 5-800, the cover provided between the buff table 5-400 and the dressing table 5-810 may include a contact avoiding mechanism similar to a contact avoiding mechanism which will be described below.

Furthermore, the dresser cover 5-850 may be provided with a contact avoiding mechanism for avoiding contact with the buff pad 5-502. The buff pad 5-502 attached to the buff head 5-500 sometimes horizontally moves at the height equivalent to the surface of the dresser 5-820 during transition from the buff-cleaning process to the dressing process. In this case, as shown in FIG. 47B, if the upper end of the dresser cover 5-850 is disposed at a higher position than the surface of the dresser 5-820, the buff head 5-500 and the buff pad 5-502 is brought into contact with the dresser cover 5-850. The contact avoiding mechanism is for avoiding such a contact.

Various specific configurations of contact avoiding mechanisms may be considered. For example, a specific example may be exemplified where the dresser cover moving mechanism is a cylinder 5-853 that vertically moves the dresser cover 5-850. In FIG. 47B, the state where the dresser cover 5-850 covers the dresser 5-820 is indicated by solid lines, and the state where the dresser cover 5-850 descends is indicated by broken lines. The direction in which the dresser cover 5-850 is moved has thus been described as the vertical direction. This configuration is adopted because the case is assumed where the dresser 5-820 is installed with a horizontal orientation. If the dresser 5-820 is installed with a vertical orientation, the dresser cover 5-850 is required to be moved in the horizontal direction. In other words, the direction is the axial direction of the rotation axis of the dressing table 5-810. If the dresser cover 5-850 is not provided with the contact avoiding mechanism but contact is avoided by another configuration instead, the dresser cover 5-850 may has a fixed configuration.

Figure 48A:
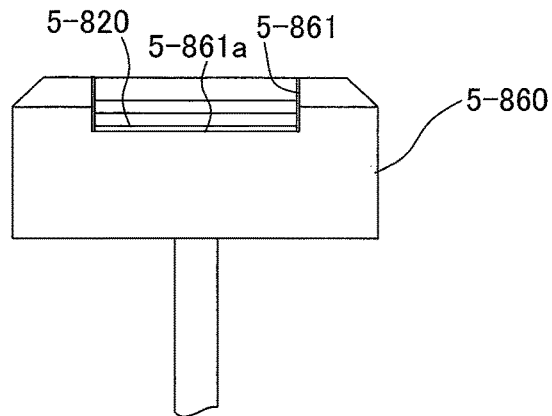
FIGS. 48A, 48B and 48C are diagrams showing an embodiment of the dresser cover disclosed in FIG. 47B where the dresser cover itself has further characteristics.
Figure 48B:
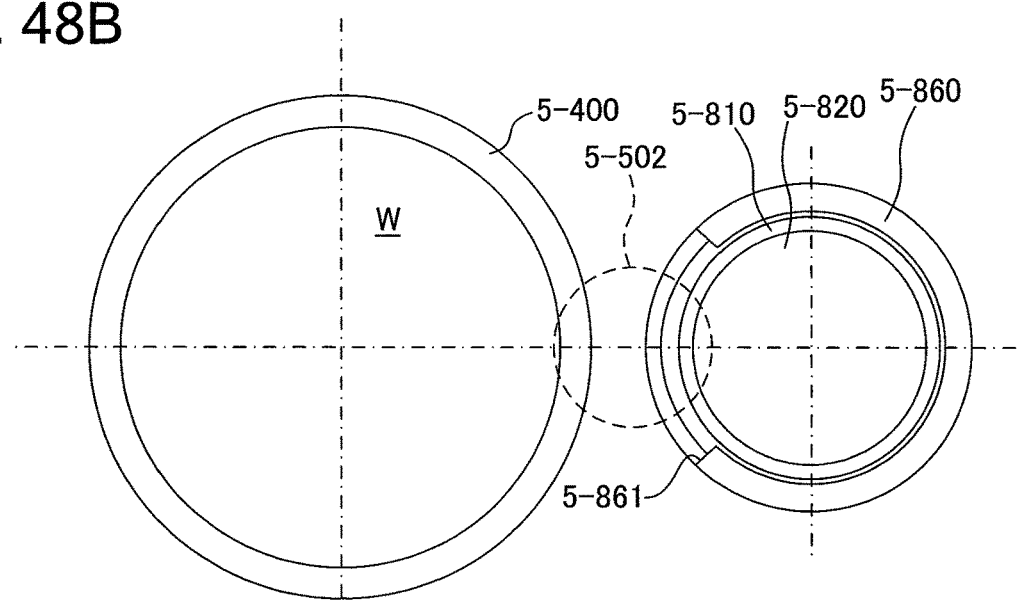
Figure 48C:
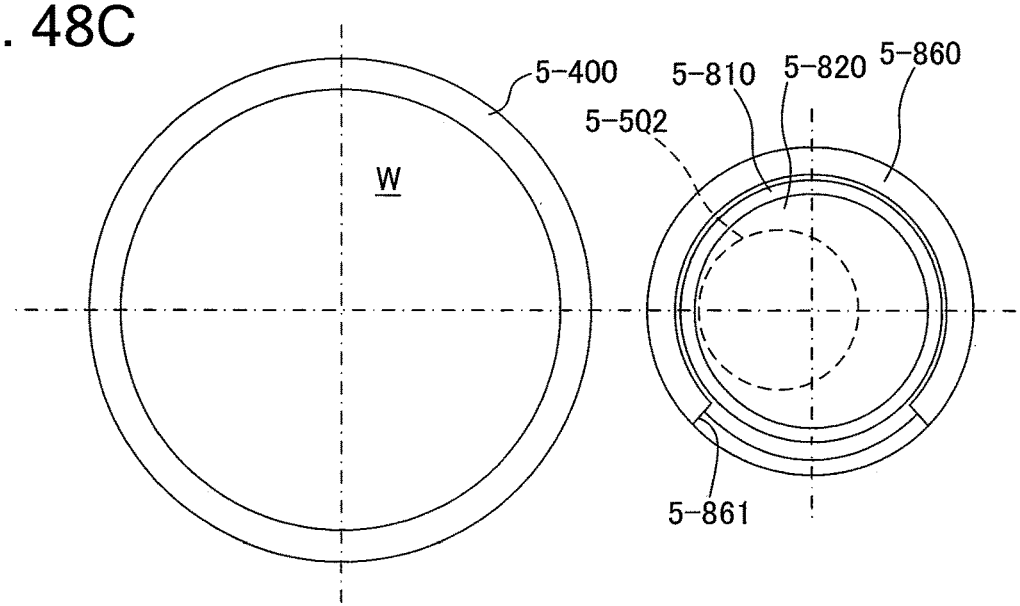

FIGS. 48A, 48B and 48C are diagrams for illustrating another example of the contact avoiding mechanism. First, FIG. 48A shows an example where a notch is formed at a part of the dresser cover 5-860. More specifically, the notch 5-861 having a predetermined height is formed at a part of the upper end region of the dresser cover 5-860 along the circumferential direction. The depth of the notch 5-861 corresponds to a position where its lower end 5-861a is slightly lower than the surface of the dresser 5-820. This is because if the lower end 5-861a of the notch 5-861 is lower than the surface of the dresser 5-820 during horizontal movement of the buff pad 5-502 toward the dresser 5-820, the contact between the horizontally moving buff pad 5-502 with the dresser cover 5-860 is avoided.

Next, referring to FIGS. 48B and 48C, the operation of the dresser cover 5-860 is described. FIG. 48B is a top view of the dresser 5-820, and shows the state where the notch 5-861 of the dresser cover 5-860 opens toward the buff table 5-400. With such a configuration of the notch 5-861 opening toward the buff table 5-400, even when the buff head 5-500 and the buff pad 5-502 horizontally move from the buff table 5-400, these head and pad can pass through the notch 5-861 and reach the surface of the dresser 5-820. However, if the dresser rinsing process were performed still in this state, the cleaning liquid would sometimes be dispersed to the wafer W on the buff table 5-400 through the notch 5-861 and contaminate the wafer W.

To prevent such contamination, the dresser cover 5-860 is turned by about 90 degrees along a horizontal plane in the state where the buff pad 5-502 has been completely moved above the dresser 5-820 (see FIG. 48C). According to such an operation, the side of the buff table 5-400 is covered with the wall of the dresser cover 5-860, which prevents the cleaning liquid from being dispersed toward the buff table 5-400. Meanwhile, the cleaning liquid is sometimes dispersed toward the side with the notch 5-861 (lower side in FIG. 48C). However, the dispersion does not contaminate the wafer W. The rotation angle is not limited to 90 degrees. The requirement is that the notch 5-861 does not face the buff table 5-400. Accordingly, any angle, such as 60, 135 or 180 degrees, may be adopted. Various rotational drive mechanisms for rotating the dresser cover 5-860 may be considered. A rotary actuator, or a combination of a servomotor and a link mechanism may be adopted.

Figure 49A:
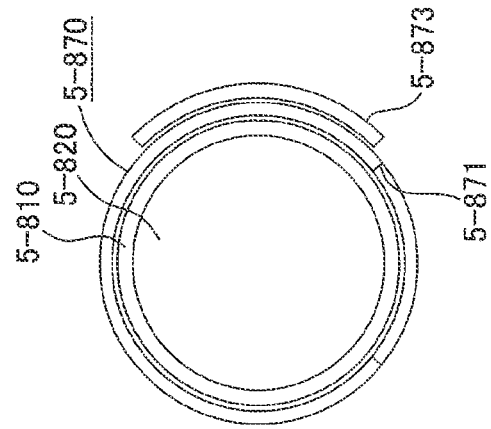
FIGS. 49A, 49B, 49C, 49D, 49E and 49F are diagrams showing a dresser cover that includes a notch and a movable cover member.
Figure 49B:
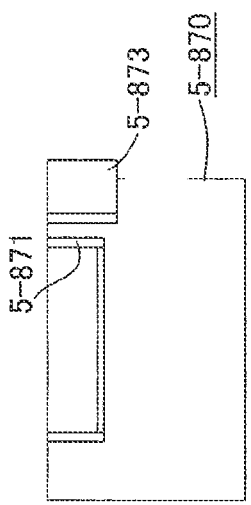

Next, referring to FIGS. 49A, 49B, 49C, 49D, 49E and 49F, still another example of the contact avoiding mechanism is described. The example of FIG. 49 is common to the example of FIG. 48 in that the notch 5-871 is formed at the dresser cover 5-870. However, the examples are different in that this example includes a movable cover member 5-873. The movable cover member 5-873 opens and closes the notch 5-871. More specifically, this member has a shape of a rectangular member curved along the outer peripheral curved surface of the dresser cover 5-870. FIGS. 49A and 49B show a state where the movable cover member 5-873 closes the notch 5-871. The movable cover member 5-873 overlaps with the area of the notch 5-871, and can prevent the cleaning liquid from being dispersed from the inside of the dresser cover 5-870.

Figure 49C:
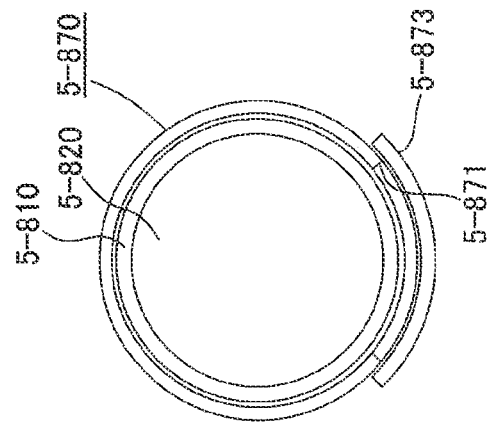
Figure 49D:
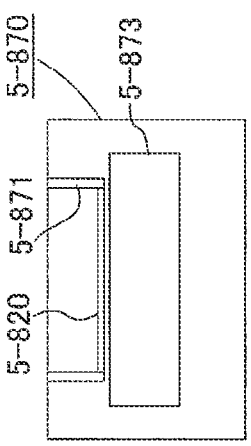
Figure 49E:
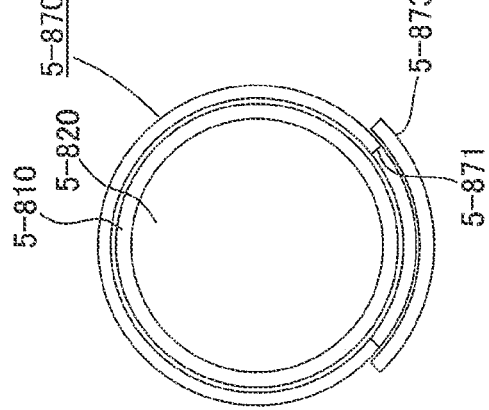
Figure 49F:
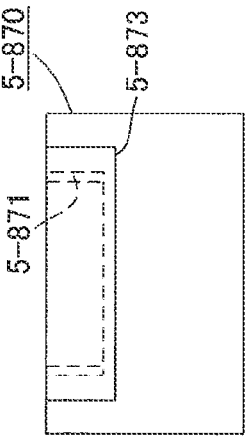

FIGS. 49C and 49D show a state where the movable cover member 5-873 moves downward in FIG. 49D and the notch 5-871 is exposed. In order to move the movable cover member 5-873, measures are required to be taken. For example, according to the measures, rails or the like, not shown, are vertically arranged on the outer peripheral surface of the dresser cover 5-870. However, the measures are only one example. Alternatively, an actuator or the like (not shown) separated from the dresser cover may be linked to the movable cover member 5-873, and the operation of the actuator may move the movable cover member 5-873. FIGS. 49E and 49F show an example where the movable cover member 5-873 is moved along the circumferential direction of the dresser cover 5-870. In particular, the illustrated example shows a state after movement by an angle of about 90 degrees. Also to achieve such movement, predetermined rails and actuator are required to be used.

As described above, in the case of adopting the dresser cover 5-870 that includes the movable cover member 5-873, the notch 5-871 is closed with the movable cover member 5-873 during dresser rinsing, as shown in FIGS. 49A and 49B. Consequently, the wafer W is not contaminated by the cleaning liquid. On the other hand, in the case of applying the dressing process to the buff pad 5-502, the movable cover member 5-873 is moved to open the notch 5-871. In the state where the notch 5-871 is exposed, even when the buff head 5-500 and the buff pad 5-502 are horizontally moved toward the dresser 5-820, the head and pad are not in contact with the dresser cover 5-870 and can be moved above the upper surface of the dresser 5-820. After the buff pad 5-502 has been completely moved above the dresser 5-820, the movable cover member 5-873 closes the notch 5-871 again. Consequently, even when the dresser 5-820 applies the dressing process or the like to the buff pad 5-502, the process liquid is prevented from being dispersed and contaminating the wafer W.

Figure 50:
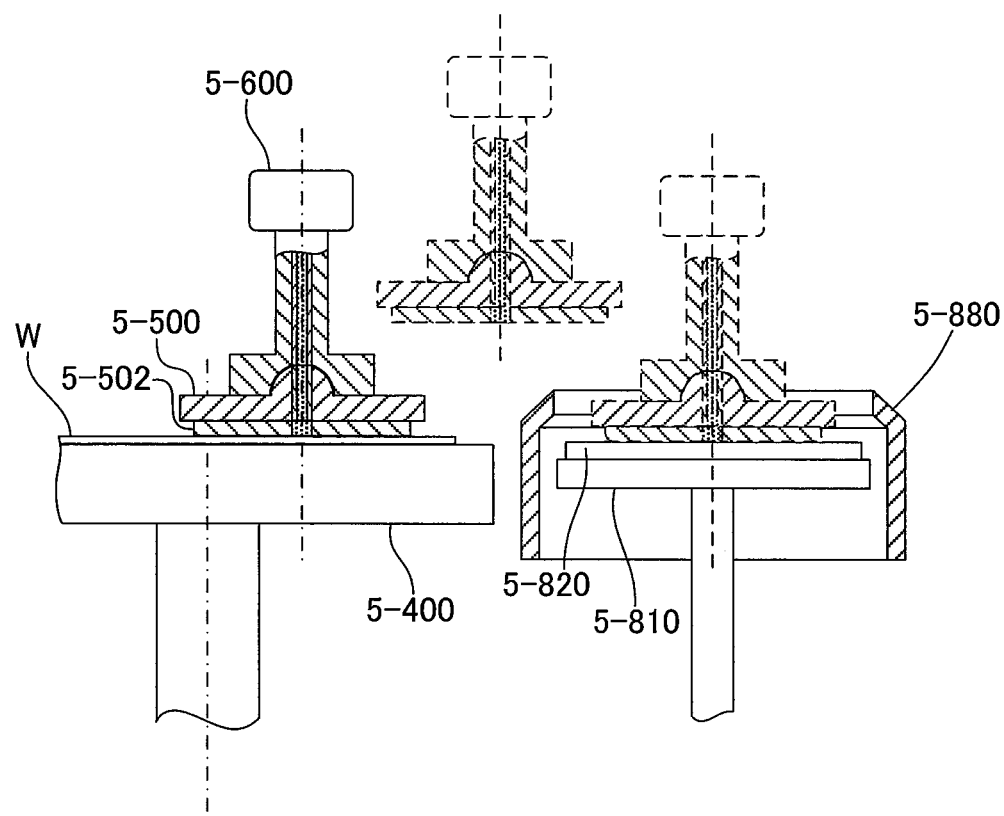
FIG. 50 is a diagram for illustrating a configuration in the case where the buff head moves in the vertical direction to avoid contact with the dresser cover.

Next, referring to FIG. 50, another configuration example for avoiding contact between the buff head 5-500 and the dresser cover 5-880 is described. In this example, the dresser cover 5-880 is a fixed type cover. Meanwhile, the buff arm 5-600 can be apart from the surfaces of wafer W and dresser 5-820. In the example of this embodiment, the buff arm 5-600 (buff head) is movable along the direction of the rotation axis of the dresser 5-820 or the direction of the rotation axis of the wafer W (vertical direction). The buff arm 5-600 (buff head) is movable between the conditioner (dressing table 5-810) and the buff table 5-400 in the state of having been moved to a higher position than that of the dresser cover 5-880. Consequently, after the buff-cleaning process, the buff arm 5-600 once ascends and crosses the dresser cover 5-880 and then descends until contact with the surface of the dresser 5-820. Consequently, the buff pad 5-502 can be moved between the buff table 5-400 and the dresser 5-820, without providing the dresser cover 5-880 with the contact avoiding mechanism. Note that there is no problem if any of the contact avoiding mechanisms of the dresser covers 5-850, 5-860 and 5-870 is provided together.

Figure 51:
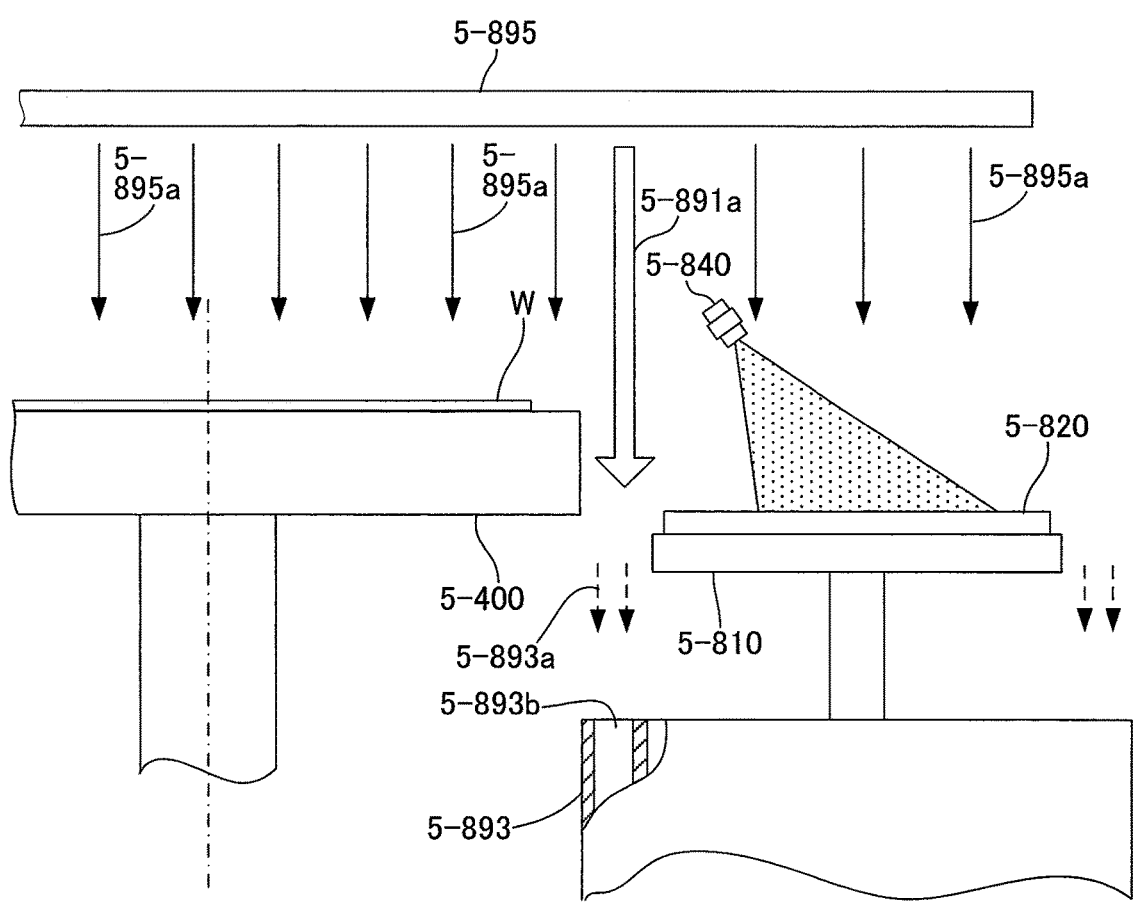
FIG. 51 is a schematic diagram for illustrating an air curtain formed between the buff table and the dressing table, a locally exhausted state formed around the dressing table, and a descending air current from above the buff table.

Next, referring to FIG. 51, a configuration for effectively preventing the wafer W from being contaminated is described. This example is characterized in that a descending air current 5-895a is generated above the buff table 5-400 and the dressing table 5-810, an air curtain 5-891a is formed between the buff table 5-400 and the dressing table 5-810 by means of a part of the descending air current 5-895a, and a locally exhausted state 5-893a is formed around the dressing table 5-810. First, the air curtain 5-891a is described. The air curtain is formation of an air current in a predetermined space according to which the air current serves as a boundary, and flows of air between subspaces are blocked at the boundary. In this embodiment, a descending air current generating mechanism 5-895 is provided above the buff table 5-400 and the dressing table 5-810. The descending air current generating mechanism 5-895 generates the descending air current 5-895a (downflow) in the entire buff process module including the buff table 5-400 and the dressing table 5-810. A downward airflow from above between the buff table 5-400 and the dressing table 5-810, which is a part of the descending air current 5-895a, serves as the air curtain 5-891a. That is, the descending air current generating mechanism 5-895 also has a function as an air curtain forming mechanism. The air curtain 5-891a prevents the process liquid or the cleaning liquid dispersed during the dressing process and the dresser rinsing process from being dispersed toward the buff table 5-400.

The air curtain cooperates with supply of DIW during the dresser rinsing. That is, while DIW is supplied to the dresser 5-820 for the dresser rinsing, the air curtain 5-891a is formed. On the contrary, while supply of DIW is stopped, formation of the air curtain 5-891a is also stopped because the cleaning liquid is not dispersed. Consequently, the air curtain 5-891a does not affect conveyance of the wafer W and movement of the buff pad 5-502.

The locally exhausted state 5-893a is formed around the dressing table 5-810 by a local exhaust mechanism 5-893. The locally exhausted state 5-893a is achieved by a method of sucking a locally generated gas and the like to prevent diffusion to the surroundings. In this embodiment, it is preferred that a circular sucking inlet 5-893b be provided along the outer peripheral portion of the dressing table 5-810 to form the locally exhausted state 5-893a around the dressing table 5-810. Consequently, even when the cleaning liquid is dispersed in the dresser rinsing process or the like, the local exhaust prevents the buff table 5-400 from being contaminated. The local exhausted state is not necessarily formed over the entire periphery of the dressing table 5-810. The state is only required to be formed in at least a space between the buff table 5-400 and the dressing table 5-810.

Furthermore, the descending air current generating mechanism 5-895 forms the descending air current in the entire buff process module. The descending air current 5-895a collides with the wafer W on the buff table 5-400 and then flows outward in the radial direction. Consequently, if the cleaning liquid is dispersed from the side of the dressing table 5-810, the liquid can be pushed back outward in the radial direction by the airflow flowing outward in the radial direction on the buff table 5-400. The descending air current 5-895a can be used together with the aforementioned local exhaust 5-893a to exert a higher contamination preventing effect.

According to the configuration in FIG. 51 and the above description, the descending air current 5-895a including the air curtain 5-891a is used in combination with the local exhaust 5-893a. However, the present invention is not limited to the case. Alternatively, each of the descending air current 5-895a including the air curtain 5-891a and the local exhaust 5-893a can be independently used.

FIG. 52 shows an example where the cover is not provided for the dresser 5-820 but is provided for the buff table 5-400. The buff table cover 5-900 is formed so as to surround the buff table 5-400 over the periphery. Even when the cleaning liquid or the like is dispersed from the dresser 5-820, the wafer W is prevented from being contaminated. The buff table cover 5-900 of this embodiment includes an inclined section at the upper end. Alternatively, the cover may have a simple cylindrical shape. The cover is not necessarily provided around the entire periphery of the buff table 5-400. Alternatively, the cover may be only provided at least between the buff table 5-400 and the dressing table 5-810. The buff table cover 5-900 may be provided with a contact avoiding mechanism for avoiding contact with the buff head 5-500, as described above.

Figure 53:
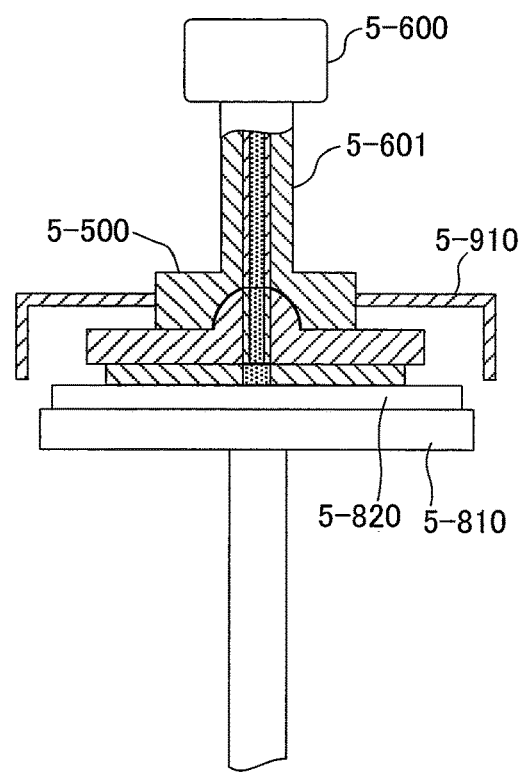
FIG. 53 is a diagram showing a buff head cover provided over the buff head.

Next, referring to FIG. 53, a modified example of a cover for preventing dispersion is described. In the example shown in FIG. 53, a buff head cover 5-910 is attached to the buff head 5-500. That is, the buff head cover 5-910 having a shape of a cylinder with a bottom is provided at a predetermined position on the buff head 5-500 such that the opening of this cover is oriented downward. The dimensions and shape of the buff head cover 5-910 are configured such that the lower edge of this cover is at a slightly higher position than that of the surface of the dresser 5-820. The inner diameter of the buff head cover 5-910 is larger than the diameter of the dresser 5-820. Consequently, if the process liquid flowing through the boundary between the buff pad 5-502 and the dresser 5-820 is dispersed owing to the centrifugal force, the buff head cover 5-910 prevents the dispersion. In particular, the buff head cover 5-910 is swung together with the buff arm. Consequently, this cover can always receive the process liquid and the cleaning liquid that are dispersed from the buff pad and the dresser.

The above embodiments with reference to FIGS. 39 to 53 have thus been described in detail that the dresser is provided at the lower position than that of the buff table, the cleaning liquid is jetted in the direction away from the buff table, and the cover is provided around the dresser or the buff table. Each of these configuration components can solely prevent the wafer from being contaminated. Consequently, only if the dresser is provided at the lower position than that of the buff table to implement the present invention, adjustment of the cleaning liquid jetting direction and provision of the cover are not necessary. In other words, each of the configuration components can solely constitute the present invention. Any combination of these configuration components can also constitute the present invention.

A conditioning device, buff process apparatus, substrate processing apparatus, dresser, and conditioning method according to one embodiment of the invention of the present application are hereinafter described with reference to FIGS. 54 to 62.

A. EXEMPLARY EMBODIMENT

Figure 54:
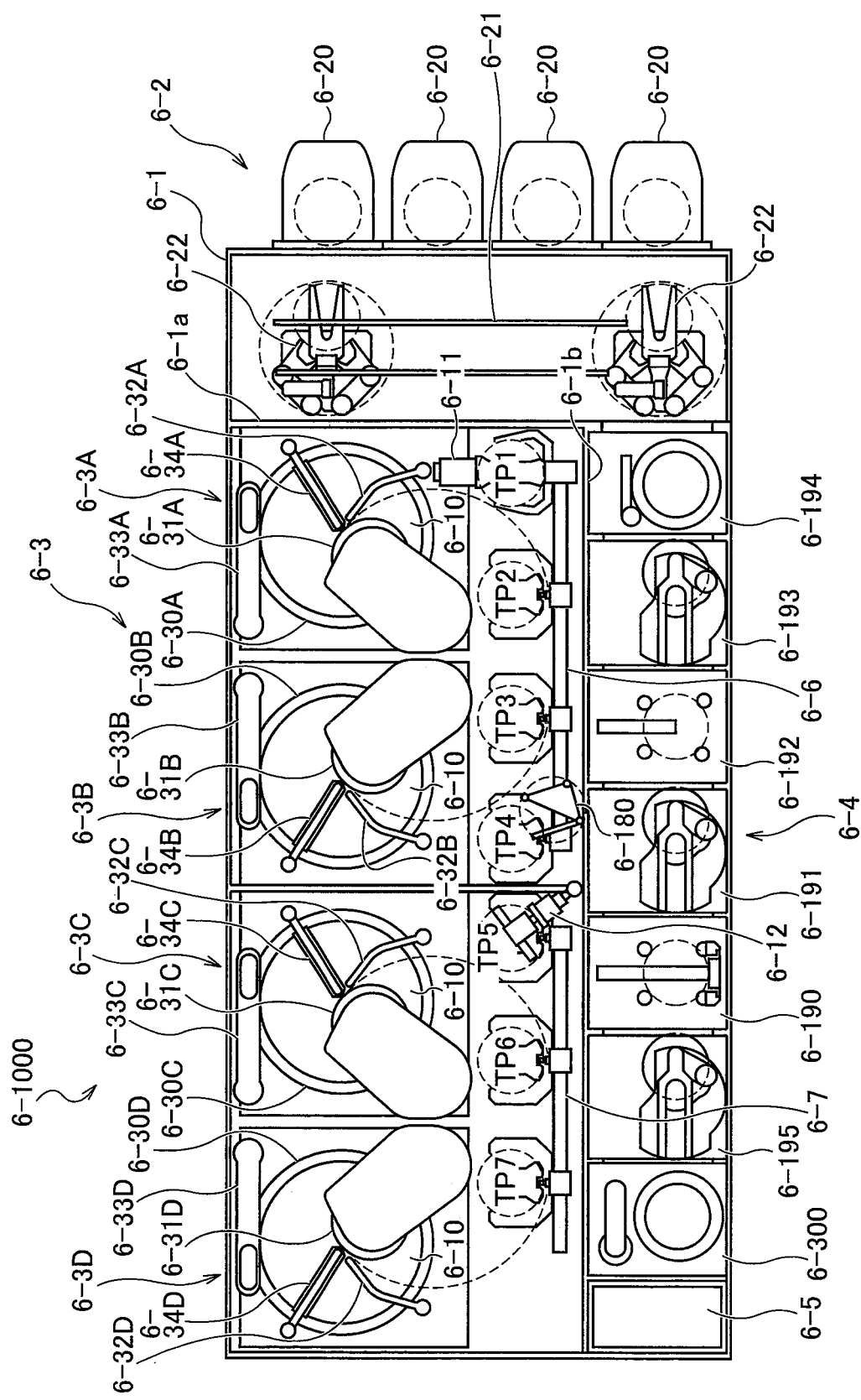
FIG. 54 is a schematic plan view showing the overall configuration of a substrate processing apparatus according to one exemplary embodiment.

FIG. 54 is a plan view showing the overall configuration of the substrate processing apparatus according to one embodiment of the present invention. As shown in FIG. 54, the substrate processing apparatus 6-1000 includes a substantially rectangular housing 6-1. The inside of the housing 6-1 is separated by partitions 6-1a and 6-1b into a load/unload unit 6-2, a polishing unit 6-3 and a cleaning unit 6-4. The load/unload unit 6-2, the polishing unit 6-3 and the cleaning unit 6-4 are each independently assembled and independently exhausted. The cleaning unit 6-4 includes an electric power supply (not shown) that supplies electric power to the substrate processing apparatus, and a control device 6-5 that controls a substrate processing operation.

The load/unload unit 6-2 includes at least two (four in this embodiment) front loaders 6-20 where wafer cassettes for stocking multiple wafers (substrates) are mounted. These front loaders 6-20 are disposed adjacent to the housing 6-1, and disposed in the width direction of the substrate processing apparatus (the direction perpendicular to the longitudinal direction). The front loader 6-20 is configured to be capable of being mounted with an open cassette, a SMIF (Standard Manufacturing Interface) pod, or a FOUP (Front Opening Unified Pod).

In the load/unload unit 6-2, a traveling mechanism 6-21 is laid along the arrangement of the front loaders 6-20. Two conveyor robots 6-22 that can travel along the arrangement direction of the wafer cassettes are installed on the traveling mechanism 6-21. The conveyor robots 6-22 are configured to be capable of accessing the wafer cassettes mounted on the front loaders 6-20 by traveling on the traveling mechanism 6-21. Each conveyor robot 6-22 takes a wafer having not been processed yet from the wafer cassette and returns a processed wafer to the wafer cassette.

The polishing unit 6-3 defines a region where a wafer is polished (flattened). The polishing unit 6-3 includes a first polishing unit 6-3A, a second polishing unit 6-3B, a third polishing unit 6-3C, and a fourth polishing unit 6-3D. As shown in FIG. 54, these polishing units 6-3A to 6-3D are arranged along the longitudinal direction of the substrate processing apparatus.

As shown in FIG. 54, the first polishing unit 6-3A includes: a polishing table 6-30A mounted with a polishing pad 6-10 having a polishing surface; a top ring 6-31A for polishing a wafer while holding the wafer and pressing the wafer against the polishing pad 6-10 on the polishing table 6-30A; a polishing liquid supply nozzle 6-32A for supplying the polishing pad 6-10 with the polishing liquid or dressing liquid (e.g., pure water); a dresser 6-33A for dressing the polishing surface of the polishing pad 6-10; and an atomizer 6-34A that atomizes a mixed fluid of liquid (e.g., pure water) and a gas (e.g., nitrogen gas) or a liquid (e.g., pure water), and jets the atomized fluid to the polishing surface.

Likewise, the second polishing unit 6-3B includes a polishing table 6-30B, a top ring 6-31B, a polishing liquid supply nozzle 6-32B, a dresser 6-33B, and an atomizer 6-34B. The third polishing unit 6-3C includes a polishing table 6-30C, a top ring 6-31C, a polishing liquid supply nozzle 6-32C, a dresser 6-33C, and an atomizer 6-34C. The fourth polishing unit 6-3D includes a polishing table 6-30D, a top ring 6-31D, a polishing liquid supply nozzle 6-32D, a dresser 6-33D, and an atomizer 6-34D.

Since the first polishing unit 6-3A, the second polishing unit 6-3B, the third polishing unit 6-3C and the fourth polishing unit 6-3D have the same configuration as each other, only the first polishing unit 6-3A is hereinafter described.

Figure 55:
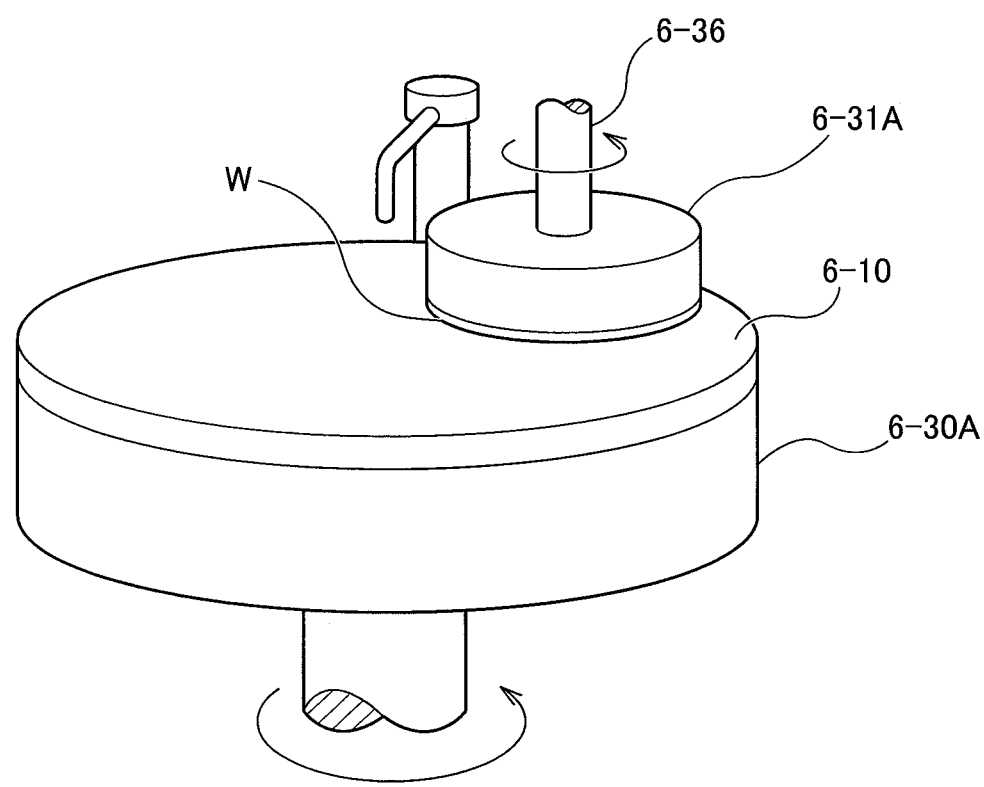
FIG. 55 is a perspective view schematically showing a polishing unit.

FIG. 55 is a perspective view schematically showing the first polishing unit 6-3A. The top ring 6-31A is supported by a top ring shaft 6-36. The polishing pad 6-10 is pasted on the upper surface of the polishing table 6-30A. The upper surface of the polishing pad 6-10 thus forms a polishing surface for polishing the wafer W. Instead of the polishing pad 6-10, fixed abrasive grains may be adopted. The top ring 6-31A and the polishing table 6-30A are configured to rotate about the respective axes, as indicated by arrows. The wafer W is held onto the lower surface of the top ring 6-31A by vacuum suction. During polishing, the polishing liquid is supplied to the polishing surface of the polishing pad 6-10 from the polishing liquid supply nozzle 6-32A, and the wafer W, which is a polishing target, is pressed by the top ring 6-31A against the polishing surface, thus allowing the wafer W to be polished.

Next, the conveyor mechanism for conveying the wafer is described. As shown in FIG. 54, a first linear transporter 6-6 is disposed adjacent to the first polishing unit 6-3A and the second polishing unit 6-3B. The first linear transporter 6-6 is a mechanism that conveys the wafer between four conveyance positions (a first conveyance position 6-TP1, a second conveyance position 6-TP2, a third conveyance position 6-TP3 and a fourth conveyance position 6-TP4 sequentially from the site near the load/unload unit) along the direction in which the polishing units 6-3A and 6-3B are disposed.

Furthermore, a second linear transporter 6-7 is disposed adjacent to the third polishing unit 6-3C and the fourth polishing unit 6-3D. The second linear transporter 6-7 is a mechanism that conveys the wafer between three conveyance positions (a fifth conveyance position 6-TP5, a sixth conveyance position 6-TP6 and a seventh conveyance position 6-TP7 sequentially from the site near the load/unload unit) along the direction in which the polishing units 6-3C and 6-3D are disposed.

The wafer is conveyed by the first linear transporter 6-6 to the polishing units 6-3A and 6-3B. The top ring 6-31A of the first polishing unit 6-3A moves between the polishing position and the second conveyance position 6-TP2 by a swing operation of the top ring head. Consequently, the wafer is passed to the top ring 6-31A at the second conveyance position 6-TP2. Likewise, the top ring 6-31B of the second polishing unit 6-3B moves between the polishing position and the third conveyance position 6-TP3, and the wafer is passed to the top ring 6-31B at the third conveyance position 6-TP3. The top ring 6-31C of the third polishing unit 6-3C moves between the polishing position and the sixth conveyance position 6-TP6, and the wafer is passed to the top ring 6-31C at the sixth conveyance position 6-TP6. The top ring 6-31D of the fourth polishing unit 6-3D moves between the polishing position and the seventh conveyance position 6-TP7, and the wafer is passed to the top ring 6-31D at the seventh conveyance position 6-TP7.

A lifter 6-11 for receiving the wafer from the conveyor robot 6-22 is disposed at the first conveyance position 6-TP1. The wafer is passed from the conveyor robot 6-22 to the first linear transporter 6-6 via the lifter 6-11. A swing transporter 6-12 is disposed among the first linear transporter 6-6, the second linear transporter 6-7 and the cleaning unit 6-4. The swing transporter 6-12 includes a hand that is movable between the fourth conveyance position 6-TP4 and the fifth conveyance position 6-TP5. The wafer is passed from the first linear transporter 6-6 to the second linear transporter 6-7 by the swing transporter 6-12. The wafer is conveyed by the second linear transporter 6-7 to the third polishing unit 6-3C and/or the fourth polishing unit 6-3D. The wafer polished by the polishing unit 6-3 is conveyed to the temporary stage 6-180 by the swing transporter 6-12. The wafer mounted on the temporary stage 6-180 is then conveyed to the cleaning unit 6-4.

Figure 56A:
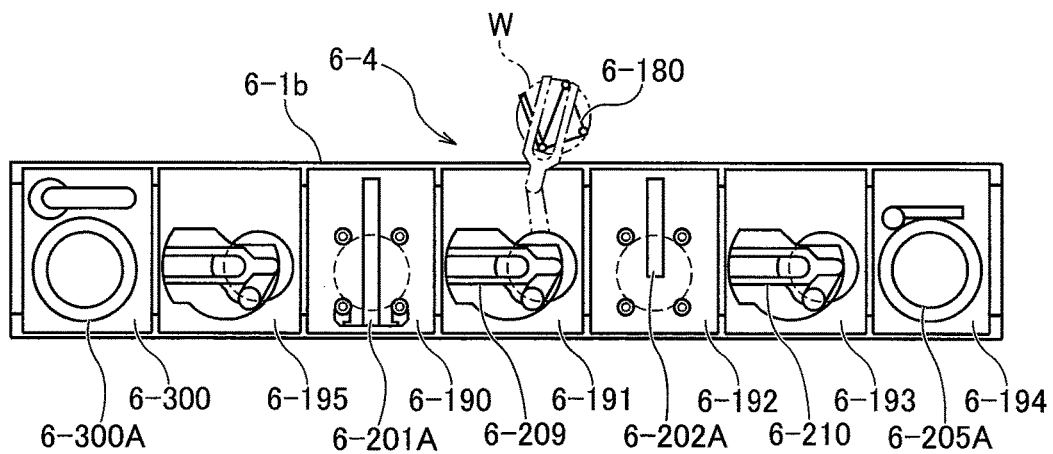
FIG. 56A is a schematic plan view of a cleaning unit.
Figure 56B:
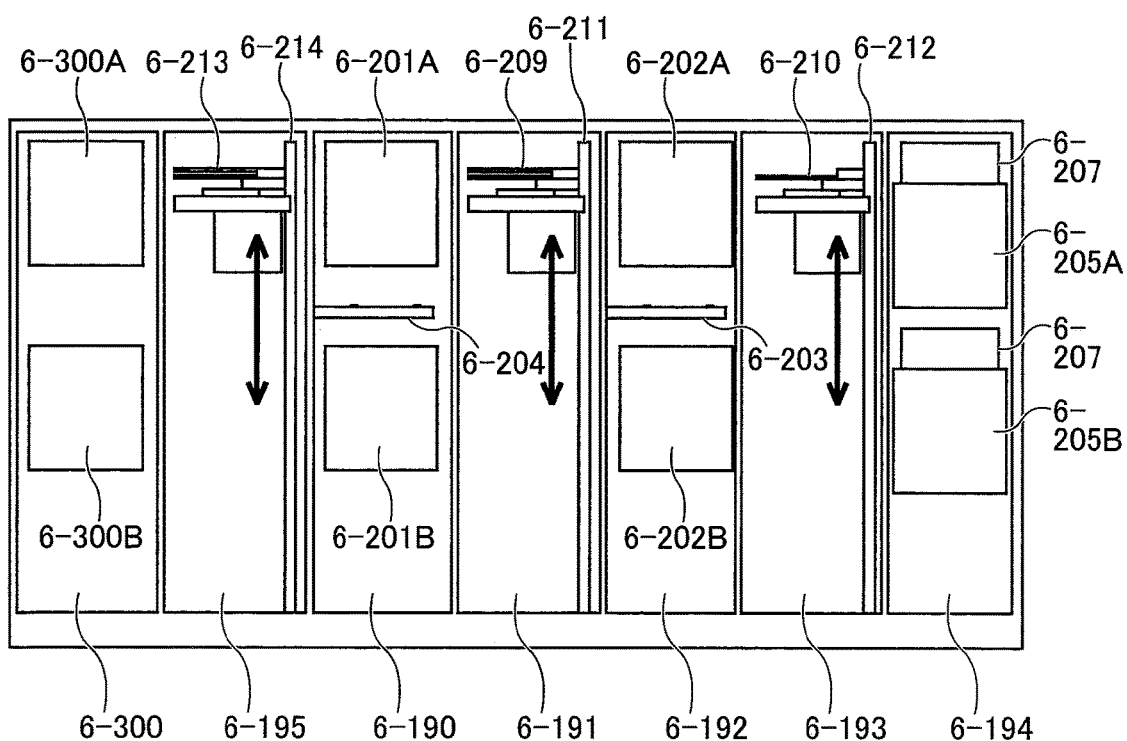
FIG. 56B is a schematic side view of a cleaning unit.

FIG. 56A is a plan view showing the cleaning unit 6-4, and FIG. 56B is a side view showing the cleaning unit 6-4. As shown in FIGS. 56A and 56B, the cleaning unit 6-4 is partitioned into a roll cleaning chamber 6-190, a first conveyance chamber 6-191, a pen cleaning chamber 6-192, a second conveyance chamber 6-193, a drying chamber 6-194, a buff process chamber 6-300 and a third conveyance chamber 6-195.

In the roll cleaning chamber 6-190, an upper roll cleaning module 6-201A and a lower roll cleaning module 6-201B, which are arranged along the vertical direction, are disposed. The upper roll cleaning module 6-201A is disposed above the lower roll cleaning module 6-201B. Each of the upper roll cleaning module 6-201A and the lower roll cleaning module 6-201B is a cleaner that supplies the cleaning liquid to the front and rear surfaces of the wafer while pressing the rotating two roll sponge members against the front and rear surfaces of the wafer, thereby cleaning the wafer. A wafer temporary stage 6-204 is provided between the upper roll cleaning module 6-201A and the lower roll cleaning module 6-201B.

In the pen cleaning chamber 6-192, an upper pen cleaning module 6-202A and a lower pen cleaning module 6-202B, which are arranged along the vertical direction, are disposed. The upper pen cleaning module 6-202A is disposed above the lower pen cleaning module 6-202B. Each of the upper pen cleaning module 6-202A and the lower pen cleaning module 6-202B is a cleaner that supplies the cleaning liquid to the surface of the wafer while pressing a rotating pencil sponge member against the surface of the wafer and swinging the sponge in the radial direction of the wafer, thereby cleaning the wafer. A wafer temporary stage 6-203 is provided between the upper pen cleaning module 6-202A and the lower pen cleaning module 6-202B.

In the drying chamber 6-194, an upper drying module 6-205A and a lower drying module 6-205B, which are arranged along the vertical direction, are disposed. The upper drying module 6-205A and the lower drying module 6-205B are separated from each other. Filter-fan units 6-207A and 6-207B that supply clean air into the drying modules 6-205A and 6-205B are provided above the upper drying module 6-205A and the lower drying module 6-205B, respectively.

In the first conveyance chamber 6-191, a vertically movable first conveyor robot (conveyor mechanism) 6-209 is disposed. In the second conveyance chamber 6-193, a vertically movable second conveyor robot 6-210 is disposed. In the third conveyance chamber 6-195, a vertically movable third conveyor robot (conveyor mechanism) 6-213 is disposed. The first conveyor robot 6-209, the second conveyor robot 6-210 and the third conveyor robot 6-213 are movably supported by vertically extending support shafts 6-211, 6-212 and 6-214, respectively. The first conveyor robot 6-209, the second conveyor robot 6-210 and the third conveyor robot 6-213 internally include drive mechanisms, such as motors, and are configured to be vertically movable along the support shafts 6-211, 6-212 and 6-214, respectively. The first conveyor robot 6-209 includes vertically arranged two hands. As indicated by a broken line in FIG. 56A, in the first conveyor robot 6-209, the lower hand is disposed at a position accessible to the aforementioned temporary stage 6-180.

The first conveyor robot 6-209 operates so as to convey the wafer W between the temporary stage 6-180, the upper roll cleaning module 6-201A, the lower roll cleaning module 6-201B, the temporary stage 6-204, the temporary stage 6-203, the upper pen cleaning module 6-202A and the lower pen cleaning module 6-202B. The first conveyor robot 6-209 uses the lower hand for conveying the wafer having not been cleaned yet (wafer to which the slurry adheres), and uses the upper hand for conveying the cleaned wafer.

The second conveyor robot 6-210 operates so as to convey the wafer W between the upper pen cleaning module 6-202A, the lower pen cleaning module 6-202B, the temporary stage 6-203, the upper drying module 6-205A and the lower drying module 6-205B. Since the second conveyor robot 6-210 only conveys the cleaned wafer, this robot only includes one hand. The conveyor robot 6-22 shown in FIG. 54 uses the upper hand to takes the wafer from the upper drying module 6-205A or the lower drying module 6-205B, and returns the wafer to the wafer cassette.

In the buff process chamber 6-300, an upper buff process module 6-300A and a lower buff process module 6-300B are provided. The third conveyor robot 6-213 operates so as to convey the wafer W between the upper roll cleaning module 6-201A, the lower roll cleaning module 6-201B, the temporary stage 6-204, the upper buff process module 6-300A and the lower buff process module 6-300B.

This embodiment exemplifies the example of disposing the buff process chamber 6-300, the roll cleaning chamber 6-190 and the pen cleaning chamber 6-192 in the cleaning unit 6-4, sequentially from the site far from the load/unload unit 6-2. The disposition is not limited to this example. The mode of disposing the buff process chamber 6-300, the roll cleaning chamber 6-190 and the pen cleaning chamber 6-192 may be appropriately selected according to the quality of wafer and the throughput. Since the upper buff process module 6-300A and the lower buff process module 6-300B have similar configurations, only the upper buff process module 6-300A is hereinafter described.

Figure 57:
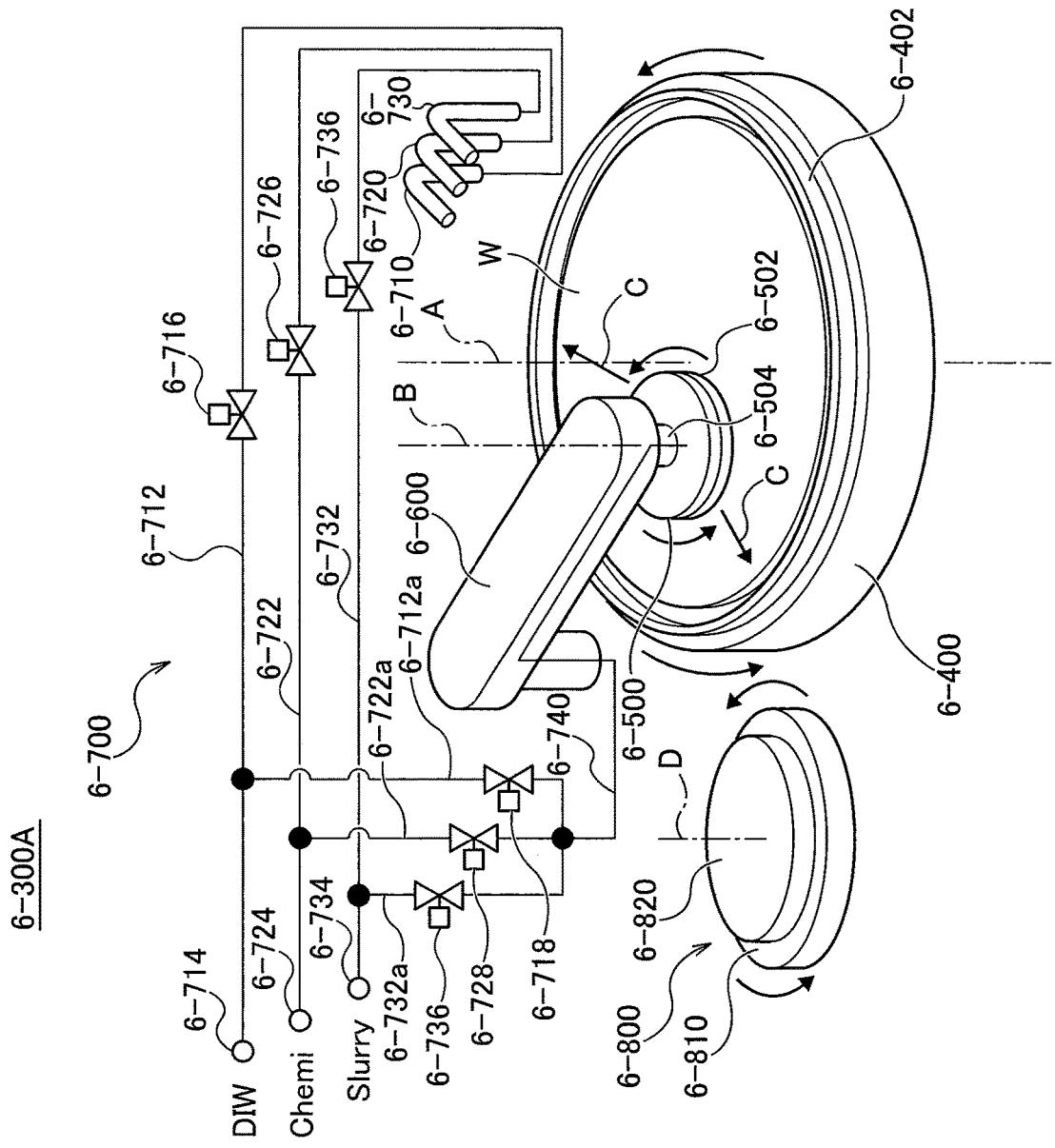
FIG. 57 is a diagram showing a schematic configuration of a buff process module.

FIG. 57 is a diagram showing a schematic configuration of an upper buff process module. As shown in FIG. 57, the upper buff process module 6-300A includes: a buff table 6-400 for supporting the wafer W, which is a type of substrate; a buff head 6-500 to which a buff pad 6-502 for applying a buff process to a processing target surface of the wafer W is attached; a buff arm 6-600 that holds the buff head 6-500; a liquid supply system 6-700 for supplying various types of process liquids; and a conditioner 6-800 for conditioning the buff pad 6-502.

The buff table 6-400 includes a mechanism for holding the wafer W. In this exemplary embodiment, the wafer holding mechanism is a vacuum-sucking type mechanism. Alternatively, the mechanism may be of any type. For example, the wafer holding mechanism may be a clamp type mechanism that clamps the front and rear surfaces of the wafer at least at one point on the periphery of the wafer W. Alternatively, the mechanism may be a roller chuck type mechanism that holds the side of the wafer W at least at one point on the periphery of the wafer W. In this exemplary embodiment, the buff table 400 holds the wafer W such that the processing target surface of the wafer W faces upward.

The buff table 6-400 is configured to be rotated about a rotation axis A by a drive mechanism, not shown. A buff head 6-500 is attached to the buff arm 6-600 via a rotatably configured shaft 6-504. A buff pad 6-502 for applying the buff process to the wafer W is attached onto the surface of the buff head 6-500 that faces the wafer (or the buff table 6-400). The buff arm 6-600 is configured to rotate the buff head 6-500 about a rotation axis B. The area of the buff pad 6-502 is smaller than the area of the wafer W (or the buff table 6-400). Consequently, the buff arm 6-600 is configured to be capable of swinging the buff head 6-500 in the radial direction of the wafer W as indicated by arrows C. Consequently, the buff process can be uniformly applied to the wafer W. The buff arm 6-600 is configured to be capable of swinging the buff head 6-500 to a position where the buff pad 6-502 faces the conditioner 6-800. The buff head 6-500 is configured to be movable by an actuator (not shown) in a direction toward the buff table 6-400 and in a direction away from the buff table 6-400 (vertically in this exemplary embodiment). Consequently, the buff pad 6-502 is pressed against the wafer W at a predetermined pressure. This configuration can be achieved by expansion and contraction of the shaft 6-504, or achieved by vertical movement of the buff arm 6-600.

The liquid supply system 6-700 includes a pure water external nozzle 6-710 for supplying pure water (indicated as DIW in the diagram) to the processing target surface of the wafer W. The pure water external nozzle 6-710 communicates with a pure water supply source 6-714 through pure water piping 6-712. The pure water piping 6-712 is provided with an on-off valve 6-716 that can open and close the pure water piping 6-712. The control device 6-5 can control opening and closing of the on-off valve 6-716 to supply the pure water to the processing target surface of the wafer W, at any timing.

The liquid supply system 6-700 includes a chemical solution external nozzle 6-720 for supplying a chemical solution (indicated as Chemi in the diagram) to the processing target surface of the wafer W. The chemical solution external nozzle 6-720 communicates with a chemical solution supply source 6-724 through chemical solution piping 6-722. The chemical solution piping 6-722 is provided with an on-off valve 6-726 that can open and close the chemical solution piping 6-722. The control device 6-5 can control open and close of the on-off valve 6-726 to supply the chemical solution to the processing target surface of the wafer W, at any timing.

The liquid supply system 6-700 includes a slurry external nozzle 6-730 for supplying a slurry (indicated as Slurry in the diagram) to the processing target surface of the wafer W. The slurry external nozzle 6-730 communicates with a slurry supply source 6-734 through slurry piping 6-732. The slurry piping 6-732 is provided with an on-off valve 6-736 that can open and close the slurry piping 6-732. The control device 6-5 can control open and close of the on-off valve 6-736 to supply the slurry to the processing target surface of the wafer W, at any timing.

In this exemplary embodiment, all the external nozzles 6-710, 6-720 and 6-730 are disposed at fixed positions, and supply the pure water, chemical solution, and slurry to the fixed positions, respectively. The process liquids are supplied to the positions where the liquids are effectively supplied to the buff pad 6-502 by rotation of the wafer W. The external nozzles 6-710, 6-720 and 6-730 may be configured as one or two nozzles common to at least two of various types of process liquids. The external nozzle may be configured to supply at least one process liquid among the pure water, chemical solution and slurry.

The buff process module 6-300A is configured to be capable of selectively supplying the process liquid (pure water, chemical solution, or slurry) to the processing target surface of the wafer W through the buff arm 6-600, the buff head 6-500, and the buff pad 6-502. That is, branched pure water piping 6-712a is branched from the pure water piping 6-712 between the pure water supply source 6-714 and the on-off valve 6-716. Likewise, branched chemical solution piping 6-722a is branched from the chemical solution piping 6-722 between the chemical solution supply source 6-724 and the on-off valve 6-726. Branched slurry piping 6-732a is branched from the slurry piping 6-732 between the slurry supply source 6-734 and the on-off valve 6-736. The branched pure water piping 6-712a, the branched chemical solution piping 6-722a, and the branched slurry piping 6-732a join together into liquid supply piping 6-740. The branched pure water piping 6-712a is provided with an on-off valve 6-718 that can open and close the branched pure water piping 6-712a. The branched chemical solution piping 6-722a is provided with an on-off valve 6-728 that can open and close the branched chemical solution piping 6-722a. The branched slurry piping 6-732a is provided with an on-off valve 6-736 that can open and close the branched slurry piping 6-732a.

Figure 58:
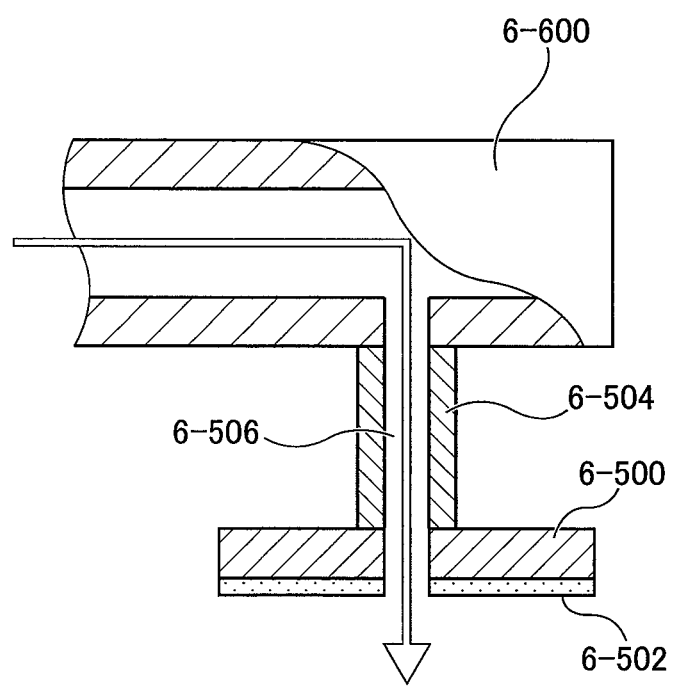
FIG. 58 is a schematic diagram showing the internal structure of a buff head.

The liquid supply piping 6-740 communicates with the inside of the buff arm 6-600, the interior of the center of the buff head 6-500, and the interior of the center of the buff pad 6-502. More specifically, as shown in FIG. 58, an internal supply line 6-506 is formed in the buff arm 6-600, the buff head 6-500 and the buff pad 6-502. The internal supply line 6-506 communicates with the liquid supply piping 6-740. The internal supply line 6-506 opens toward the upper surface (the processing target surface of the wafer W) of the buff table 6-400. This configuration allows the process liquid to be supplied from the center of the buff pad 6-502 through the internal supply line 6-506 during the buff process. The process liquid supplied from the center of the buff pad 6-502 can be uniformly spread between the buff pad 6-502 and the wafer W owing to the centrifugal force due to rotation of the buff head 6-500 and the supply pressure of the process liquid. In order to control the flow of the process liquid, that is, to facilitate guiding, outward in the radial direction, the process liquid supplied from the center of the buff pad 6-502, grooves may be formed on the buff pad 6-502. For example, the grooves may be radially formed.

In this exemplary embodiment, only one opening of the internal supply line 6-506 is provided at the center of the buff pad 6-502. Alternatively, multiple openings may be provided. For example, the internal supply line 6-506 may be branched toward openings which are arranged in a distributed manner, according to a water-pool jacket structure formed in the buff head 6-500. The openings may be arranged in a distributed manner so as to have different positions in the radial direction. The control device 5 can supply the processing target surface of the wafer W with any one of the pure water, chemical solution, and slurry, or a mixed liquid that is any combination thereof, by controlling on and off of the on-off valve 6-718, the on-off valve 6-728 and the on-off valve 6-736. As apparent from the above description, the buff process module 6-300A includes two series of process liquid supply means, which are the external nozzles 6-710, 6-720 and 6-730 and the internal supply line 6-506.

The buff process module 6-300A supplies the wafer W with the process liquid through at least one series between the series of external nozzles 6-710, 6-720 and 6-730 and the series of internal supply line 6-506, rotates the buff table 6-400 about the rotation axis A, presses the buff pad 6-502 against the processing target surface of the wafer W, and swings the buff head 6-500 in the direction of arrow C while rotating this head about the rotation axis B, thereby allowing the buff process to be applied to the wafer W. The relative motion between the buff table 6-400 and the buff head 6-500 during the buff process is not limited to the above example. Alternatively, the motion may be achieved by at least one of a rotational motion, translational motion, arc motion, reciprocating motion, scrolling motion, and angular rotational motion (motion of rotating by a predetermined angle less than 360 degrees).

In the present application, the buff process includes at least one of the buff-polishing process and the buff-cleaning process. The buff-polishing process is a process that relatively moves the wafer W and the buff pad 6-502 against each other while the buff pad 6-502 is in contact with the wafer W, and causes the slurry or the like to intervene between the wafer W and the buff pad 6-502, thereby polishing and removing unwanted portions of the processing target surface of the wafer W. Typically, the buff-polishing process is for what is called final polishing after main polishing that is performed for the sake of flattening the unevenness on the wafer, and for removing an unwanted film formed on the surface other than the trenches and the inside of via-holes. The amount of removing process after buff-polishing is, for example, to an extent ranging from several nanometers to several tens of nanometers. The buff pad 6-502 may be, for example, a pad including foamed polyurethane and non-woven fabric that are stacked on each other (more specifically, e.g., a commercially available series of IC1000®/SUBA®), or a suede-like porous polyurethane non-fibrous pad (more specifically, e.g., a commercially available POLITEX®) or the like. The buff-polishing process is a process that can apply a stronger physical action force to the wafer W than the physical action force applied to the wafer W by the roll sponge made of PVA in the roll cleaning chamber 6-190 and the physical action force applied to the wafer W by the pen sponge made of PVA in the pen cleaning chamber 6-192. The buff-polishing process can achieve removal of a surface part which is damaged by a scratch or the like or a surface part to which foreign substances adhere, additional removal of a portion which cannot have been removed by main polishing in the polishing unit 6-3, or improvement in morphology, such as on unevenness in micro regions and film thickness distribution over the entire substrate after main polishing.

The buff-cleaning process is a finishing process that relatively moves the wafer W and the buff pad 6-502 against each other while the buff pad 6-502 is in contact with the wafer W, and causes the cleaning process liquid (the chemical solution, pure water, or a mixture thereof) to intervene between the wafer W and the buff pad 6-502, thereby removing foreign substances on the surface of the wafer W or modifying the property of the processing target surface. The buff pad 6-502 may be the aforementioned series of IC1000®/SUBA®, or series of POLITEX® or the like. The buff-cleaning process is a process that can apply a stronger physical action force to the wafer W than the physical action force applied to the wafer W by the roll sponge made of PVA in the roll cleaning chamber 6-190 and the physical action force applied to the wafer W by the pen sponge made of PVA in the pen cleaning chamber 6-192. The buff-cleaning process can effectively clean and remove highly adhesive foreign substances and the like that cannot be removed only by contact with a sponge member made of PVA. Alternatively, for the buff-cleaning process according to the present invention, PVA sponge may be adopted as the buff pad.

The conditioner 6-800 conditions the surface of the buff pad 6-502. The conditioning includes shaving the surface of the buff pad, cleaning the surface while shaving this surface, and cleaning the surface without shaving this surface. In this exemplary embodiment, the conditioner 6-800 is disposed outside of the buff table 6-400. The conditioner 6-800 includes a base plate 6-810, and a dresser 6-820 installed on the base plate 6-810. The base plate 6-810 is configured to be capable of being rotated about a rotation axis D by a drive mechanism, not shown. In this exemplary embodiment, the area of the dresser 6-820 is larger than the area of the buff pad 6-502. Alternatively, the relationship of largeness in area between the dresser 6-820 and the buff pad 6-502 may be freely configured. The details of the dresser 6-820 are described later.

When the buff pad 6-502 is conditioned, the buff process module 6-300A swings the buff arm 6-600 such that the buff pad 6-502 reaches a position facing the dresser 6-820. The buff process module 6-300A rotates the base plate 6-810 about the rotation axis D while rotating the buff head 6-500, and presses the buff pad 6-502 against the dresser 6-820, thereby conditioning the buff pad 6-502. At this time, the buff head 6-500 is freely moved in the horizontal direction, as with the case during the buff process. This movement allows the processing target surface of the buff pad 6-502 to be uniformly conditioned. For example, this conditioning operation can be performed while the buff-processed wafer W is replaced with a wafer W to be buff-processed next.

The buff process module 6-300A described above performs the buff process as a postprocess for the chemical-mechanical-polished wafer W, thereby allowing final polishing to be performed while reducing the damage (defect) to the wafer W, and allowing the damage caused by the chemical mechanical polishing process to be removed. Furthermore, this module can more effectively clean and remove highly adhesive foreign substances than the conventional roll cleaning and pen cleaning can.

Figure 59A:
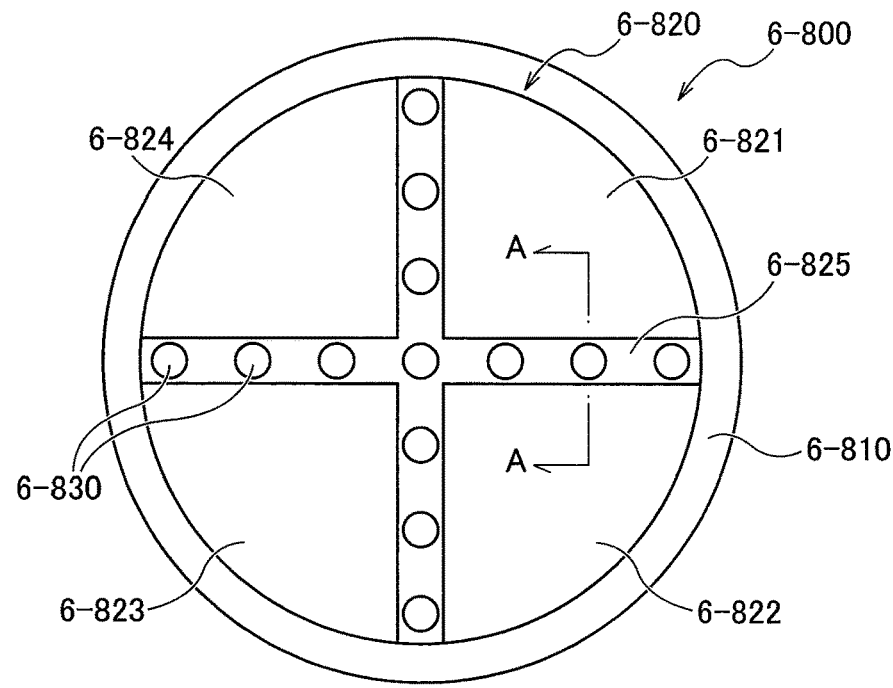
FIG. 59A is a schematic plan view showing the configuration of a conditioning device.
Figure 59B:
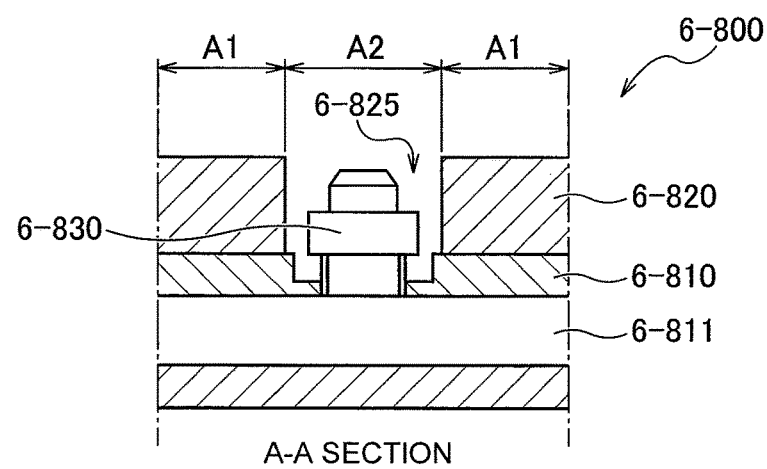
FIG. 59B is a schematic partial sectional view showing the configuration of the conditioning device.

FIG. 59A is a schematic plan view showing the configuration of the conditioner 6-800. FIG. 59B is a schematic partial sectional view taken along line A-A of FIG. 59A. As shown in FIGS. 59A and 59B, the dresser 6-820 is provided on the base plate 6-810. As shown in FIG. 59A, in this exemplary embodiment, the dresser 6-820 includes multiple (herein, four) dresser blocks 6-821 to 6-824 separated from each other at intervals. In this exemplary embodiment, the dresser blocks 6-821 to 6-824 each have a quarter round shape. However, the dresser block may have any shape instead. In this exemplary embodiment, the dresser blocks 6-821 to 6-824 are made of diamond. These dresser blocks 6-821 to 6-824 are arranged such that grooves 6-825 are formed on two orthogonal lines between the blocks.

In the grooves 6-825 (i.e., on the base plate 6-810), multiple jet nozzles 6-830 are provided at intervals. Alternatively, the number of jet nozzles 6-830 may be one. These jet nozzles 6-830 are disposed such that the tops of the jet nozzles 6-830 are at positions retracted below from the upper surface of the dresser 6-820. That is, when the buff pad 6-502 is in contact with the upper surface of the dresser 6-820, the jet nozzles 6-830 are not in contact with the buff pad 6-502.

In the base plate 6-810, a water jacket 6-811 is formed. The water jacket 6-811 communicates with each of the pure water supply source 6-714 (see FIG. 57) and the jet nozzles 6-830. That is, the water jacket 6-811 functions as a common supply path for supplying the pure water to each jet nozzle 6-830. This configuration can simplify the configuration of the pure water supply path. Consequently, the size of the conditioner 6-800 can be reduced. Furthermore, the conditioner 6-800 can be easily manufactured or maintained.

When the conditioner 6-800 conditions the buff pad 6-502, the buff pad 6-502 attached to the buff head 6-500 is disposed above the dresser 6-820 and the jet nozzles 6-830 by swing of the buff arm 6-600. Furthermore, the buff head 6-500 moves downward, thereby lowering the buff pad 6-502 to be in contact with the upper surface of the dresser 6-820. Consequently, the buff pad 6-502 can be pressed against the dresser 6-820 at a predetermined pressure. The rotation of the buff head 6-500 rotates the buff pad 6-502 while the rotation of the base plate 6-810 rotates the dresser 6-820 and the jet nozzles 6-830, and the pure water is jetted from the jet nozzles 6-830, thereby allowing the buff pad 6-502 to be conditioned. At this time, in first areas A1 (see FIG. 59B) where the dresser 6-820 is provided, the dresser 6-820 and the buff pad 6-502 are relatively moved in a state where the dresser and the pad are in contact with each other, thereby dressing the buff pad 6-502. At the same time, in second areas A2 (see FIG. 59B) where the jet nozzles 6-830 are provided (i.e., the dresser 6-820 is not provided), the pure water is jetted from the jet nozzles 6-830 toward the buff pad 6-502, thereby cleaning this buff pad 6-502. In this exemplary embodiment, the total area of first areas A1 is larger than the total area of the second areas A2. Alternatively, the relationship of the magnitude in area between the first areas A1 and the second areas A2 may be freely configured.

This conditioner 6-800 can perform two types of conditioning (dressing and cleaning) using the dresser 6-820 and the jet nozzles 6-830. Consequently, the buff pad 6-502 can be effectively conditioned. For example, in the case where grooves are formed on the buff pad 6-502, the areas on the buff pad 6-502 where no groove is formed is dressed while particles entering in the grooves (e.g., the slurry used for polishing, substrate polishing dust, etc.) can be removed by pure water jet. Furthermore, the installation space for the conditioner 6-800 can be reduced in comparison with the case of installing multiple conditioners each having a single type of conditioning function (e.g., a conditioner for dressing and a conditioner for cleaning). Furthermore, in the case of applying multiple types of conditioning to the buff pad 6-502, there is no need to move the buff pad 6-502 between the multiple conditioners. Consequently, the time required for conditioning the buff pad 6-502 can be reduced by a time for the movement.

Figure 59C:
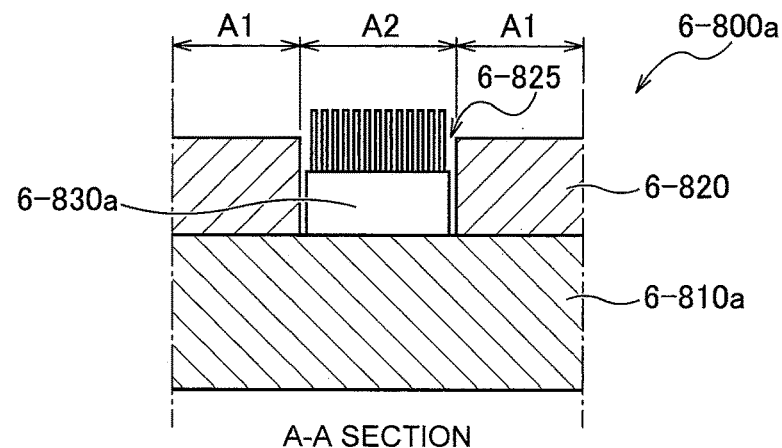
FIG. 59C is a schematic partial sectional view showing the configuration of a conditioning device according to a modified example.

FIG. 59C is a schematic partial sectional view of a conditioner 6-800*a* according to an alternative embodiment. In FIG. 59C, the same symbols as those of FIG. 59B are assigned to the same configuration components as those of FIG. 59B. In this example, the conditioner 6-800*a* includes brushes 6-830*a* instead of the jet nozzles 6-830. The brushes 6-830*a* are provided on the base plate 6-810*a*. In the base plate 6-810*a*, the water jacket 6-811 is not provided. The distal ends of the brushes 6-830*a* are positioned upward with respect to the upper surface of the dresser 6-820. When the buff pad 6-502 is conditioned, the buff pad 6-502 is lowered to be in contact with the upper surface of the dresser 6-820. Consequently, during conditioning, the dresser 6-820 and the buff pad 6-502 are in contact with each other in the first areas A1 while the brushes 6-830*a* and the buff pad 6-502 are in contact with each other in the second areas A2. Consequently, two types of conditioning can be performed at the same time. The length and hardness of the brushes 6-830*a* are adjusted, thereby allowing the conditioning characteristics of the brushes 6-830*a* to be adjusted.

Figure 60:
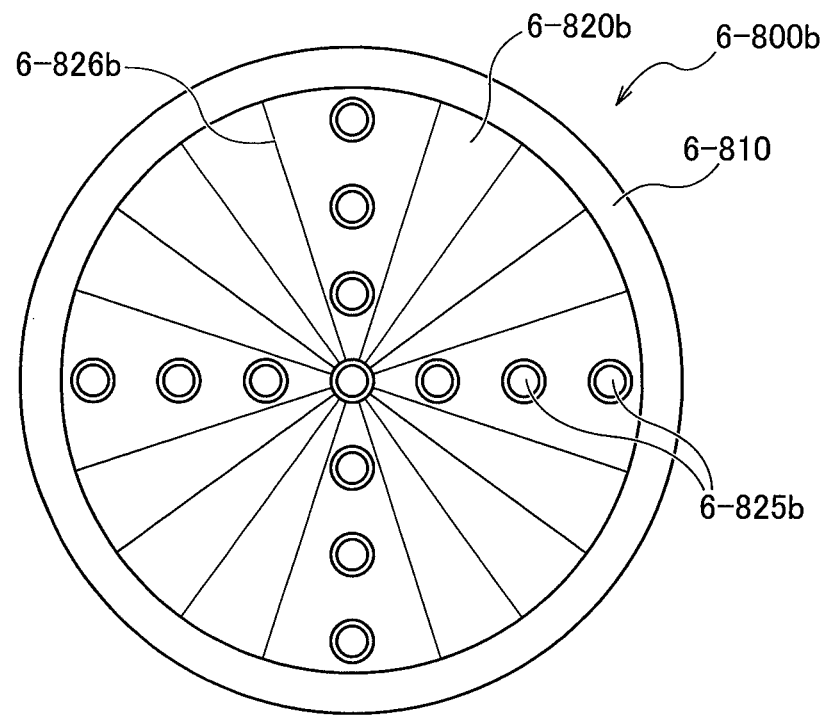
FIG. 60 is a schematic plan view showing the configuration of a conditioning device according to a modified example.

FIG. 60 is a schematic plan view of a conditioner 6-800*b* according to another alternative embodiment. In FIG. 60, the same symbols as those of FIG. 59A are assigned to the same configuration components as those of FIG. 59A. The conditioner 6-800*b* includes a single dresser 6-820*b*. That is, the dresser 6-820*b* is not divided into multiple blocks. The dresser 6-820*b* has a plurality of through-holes formed through the dresser 6-820*b* in the front-and-rear-surface direction (that is, the thickness direction). These through-holes 6-825*b* are arranged along two lines that are orthogonal to each other. In each through-hole 6-825*b*, jet nozzles 6-830 (see FIG. 59B) are provided on the base plate 6-810. As shown in FIG. 59B, in the base plate 6-810, a water jacket 6-811 (not shown in FIG. 60) that communicates with each through-hole 6-825*b* are formed. Thus, the jet nozzles 6-830 are provided in the holes. The holes may be blind holes. In this case, the jet nozzles 6-830 are provided on the dresser 6-820*b*. The jet nozzles 6-830 are not necessarily provided in the holes. Alternatively, these nozzles may be provided in grooves or notches formed at the dresser 6-820*b*. It is sufficient that the jet nozzles and the dresser are disposed in an installation range of the base plate 6-810 in a manner residing together.

On the upper surface of the dresser 6-820*b*, multiple grooves 6-826*b* are formed. Each groove 826*b* extends from the center of the dresser 6-820*b* to the periphery in a radial direction, and is thus radially formed. This conditioner 6-800*b* facilitates discharging the pure water supplied from the jet nozzles 6-830 during conditioning, to the outside of the dresser 6-820*b* through the grooves 6-826*b*. As a result, adhering objects removed by the pure water jet are easily discharged to the outside together with the pure water.

Figure 61:
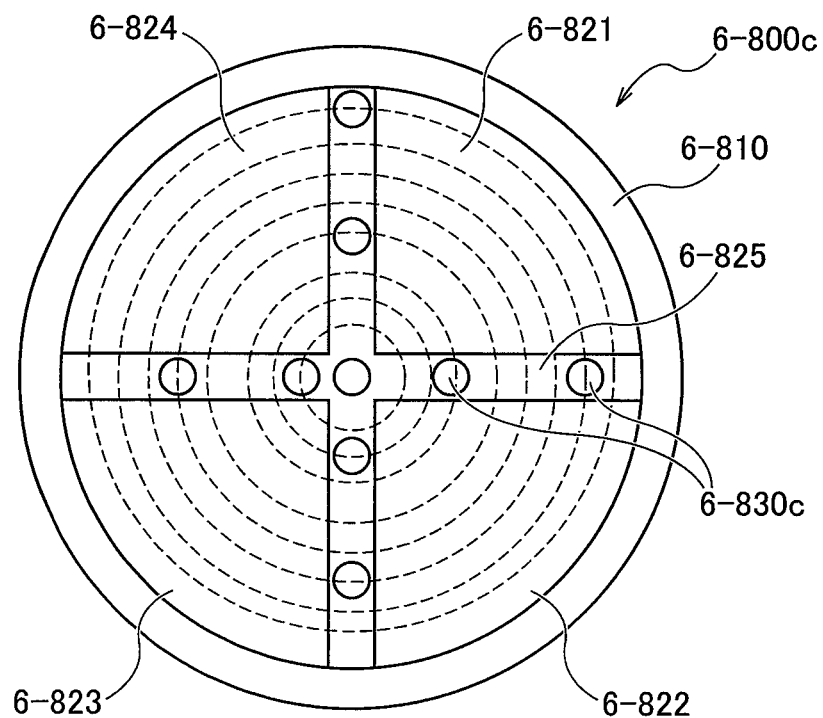
FIG. 61 is a schematic plan view showing the configuration of a conditioning device according to a modified example.

FIG. 61 is a schematic plan view of a conditioner 6-800*c* according to still another alternative embodiment. In FIG. 61, the same symbols as those of FIG. 59A are assigned to the same configuration components as those of FIG. 59A. The conditioner 6-800*c* is different from the conditioner 6-800 shown in FIG. 59A in the disposition of the jet nozzles 6-830*c*. In this example, the jet nozzles 6-830*c* are disposed at different positions in the radial direction from each other. According to this configuration, during rotation of the dresser 6-820 and the jet nozzles 6-830*c* due to rotation of the base plate 6-810, the jet nozzles 6-830*c* are arranged on the respective rotation trajectories different from each other. Consequently, even a small number of jet nozzles 6-830*c* can condition the entire surface of the buff pad 6-502. In other words, the number of jet nozzles 6-830*c* can be reduced. As a result, the dressing area by the dresser 6-820 can be increased, and the maintenance cost can be reduced.

Figure 62:
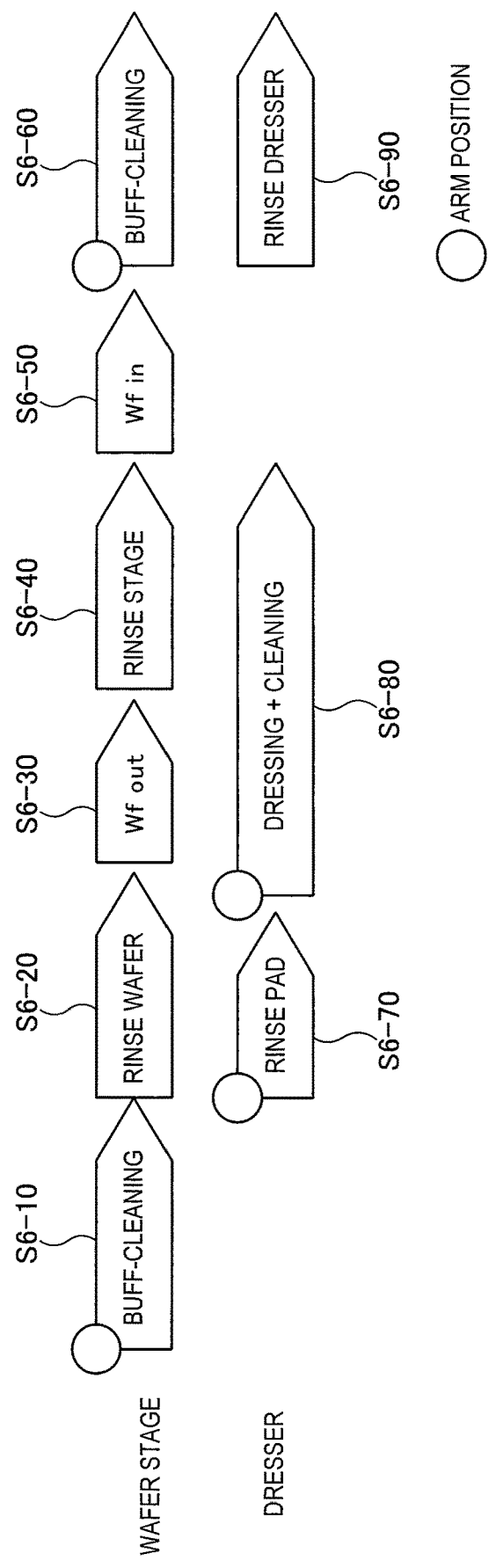
FIG. 62 is a diagram illustrating an example of the buff process and conditioning procedures of the buff pad.

FIG. 62 is a diagram illustrating one example of procedures of the buff process (here, illustrated as the buff-cleaning process) and conditioning the buff pad. In FIG. 62, encircled symbols assigned to the blocks representing respective steps indicate the position of the buff arm 6-600, that is, which side the buff pad 6-502 resides between the buff table 6-400 and the conditioner 6-800. According to the illustrated procedures, first, the buff arm 6-600 (buff pad 6-502) is disposed on the side of the buff table 6-400. On the buff table 6-400, the buff-cleaning process is applied to the wafer W using the buff pad 6-502 (step S6-10). More specifically, in a state where the chemical solution is supplied from at least one of the internal supply line 6-506 and the chemical solution external nozzle 6-720, the wafer W that is rotated together with the buff table 6-400 is in contact with the buff pad 6-502 that is rotated by the buff head 6-500, and the buff process is applied to the wafer W. After completion of the buff-cleaning process, on the buff table 6-400, the pure water is supplied onto the wafer W from at least one of the internal supply line 6-506 and the pure water external nozzle 6-710, and the wafer W is rinsed (step S6-20). During the step S6-20, the buff arm 6-600 (buff pad 6-502) is moved from the buff table 6-400 to the conditioner 6-800, and the buff pad 6-502 is rinsed (step S6-70). More specifically, in a state where the buff pad 6-502 and the dresser 6-820 are apart from each other, the pure water is jetted from the jet nozzles 6-830 toward the buff pad 6-502, thereby rinsing the buff pad 6-502. At this time, the buff pad 6-502 and the dresser 6-820 are relatively rotated, thereby rinsing the entire surface of the buff pad 6-502. In the case where the conditioner that includes no jet nozzle (e.g., the conditioner 6-800*a* shown in FIG. 59C) is used, the pure water may be jetted obliquely upward from the external nozzle provided outside of the dresser 6-820 toward the buff pad 6-502. In this case, the pure water is jetted from the external nozzle toward a region that covers at least the radius of the buff pad 6-502 while the buff pad 6-502 is rotated, thereby allowing the entire surface of the buff pad 6-502 to be rinsed. Thus, rinsing is performed while the buff pad 6-502 is rotated, which can facilitate discharging, outward, the pure water having been contaminated because being used in rinsing, by means of the centrifugal force. However, in the case of using an external nozzle that can cover the entire surface of the buff pad 6-502 as the jetting area, rinsing may be performed in a state where the buff pad 6-502 is stopped, i.e., in a non-rotational state.

After rinsing of the wafer W is finished on the buff table 6-400, this wafer W is conveyed from the buff table 6-400 (step S6-30). The pure water is supplied from the pure water external nozzle 6-710 to the buff table 6-400 from which the wafer W has been conveyed, and the buff table 6-400 is rinsed (step S6-40). During steps S6-30 and S6-40, the buff arm 6-600 is still disposed on the side of the conditioner 6-800. In the conditioner 6-800, during steps S6-30 and S6-40, the buff pad 6-502 is conditioned. In this exemplary embodiment, dressing and cleaning are performed as conditioning at the same time (step S6-80). The configuration of the conditioner 6-800 for performing such conditioning is described later.

Meanwhile, on the buff table 6-400, after completion of rinsing of the buff table 6-400, a wafer W to be subjected to the buff-cleaning process next is conveyed onto the buff table 6-400 (step S6-50). After the wafer W is mounted on the buff table 6-400, the buff arm 6-600 is moved toward the buff table 6-400. As with the aforementioned step S6-10, the buff-cleaning process is applied to the newly conveyed wafer W (step S6-60). During step S6-60, in the conditioner 6-800, the dresser 6-820 is rinsed (step S6-90). More specifically, the pure water is jetted obliquely downward toward the dresser 6-820 from the external nozzle provided outside of the dresser 6-820, thereby rinsing the dresser 6-820. During rinsing, the dresser 6-820 may be rotated as with the aforementioned step S6-70, or stopped. Step S6-90 can be started immediately after step S6-80. Alternatively, step S6-90 may be performed after step S6-80 is finished and the buff arm 6-600 is moved to the side of the buff table 6-400.

B. MODIFIED EXAMPLES

B-1. Modified Example 1

The jet nozzles 6-830 may be through-holes that penetrate the dresser 6-820 between the front and rear surfaces. That is, the through-holes may function as the jet nozzles. This configuration can simplify the configuration of the conditioner 6-800. Also in this case, a water jacket that communicates with each through-hole may be formed in the base plate 6-810.

B-2. Modified Example 2

The above exemplary embodiment describes the configuration of performing two types of conditioning at the same time. Alternatively, the two types of conditioning may be sequentially performed. For example, conditioning by the dresser 6-820 may be performed first, and subsequently conditioning by the jet nozzles 6-830 may be performed. More specifically, first, without jetting pure water from the jet nozzles 6-830, the dresser 6-820 and the buff pad 6-502 may be caused to be in contact with each other, and the first conditioning may be performed. Subsequently, in a state where the buff head 6-500 is raised (i.e., the distance between the base plate 6-810 and the buff pad 6-502 is larger than that in the case of the first conditioning, in other words, the state where the dresser 6-820 and the buff pad 6-502 are not in contact with each other), the pure water may be jetted from the jet nozzles 6-830, and the second conditioning may be performed. According to the procedures, the pure water is jetted from the jet nozzles 6-830 in the state where a gap is formed between the buff pad 6-502 and the dresser 6-820. Consequently, conditioning dust generated by the first conditioning is easily discharged outside in the second conditioning. Note that the first conditioning may be performed after the second conditioning is performed.

Thus, in the case where control of jetting the pure water from the jet nozzles 6-830 in the state where the buff pad 6-502 and the dresser 6-820 are apart from each other is performed, the jet nozzles 6-830 may be configured such that the respective jetting areas of jet nozzles 6-830 do not overlap with each other during conditioning. Control of preventing the jetting areas from overlapping with each other is facilitated by disposition of the jet nozzles 6-830 in a manner where the positions of these nozzles in the radial direction are different from each other. This configuration can prevent the jets of pure water emitted by the respective jet nozzles 6-830 from colliding with each other, which in turn can prevent the pressure applied by the pure water to the buff pad 6-502 from being reduced. Consequently, the conditioning performance due to the collision can be prevented from being reduced.

B-3. Modified Example 3

The dresser 6-820 is not necessarily made of diamond. Alternatively, this dresser may be made of any material capable of conditioning the buff pad 6-502 by being in contact with the buff pad 6-502 and relatively moving against the buff pad 6-502. For example, the dresser 6-820 may be made of a ceramic material. Alternatively, the dresser 6-820 may be a brush. Thus, the conditioner 6-800 may be achieved by freely combining contact type conditioning means, and fluid jetting type conditioning means.

Furthermore, the conditioner 6-800 may be achieved by combining first contact type conditioning means with second contact type conditioning means. For example, the first contact type conditioning means may be any one of a brush, diamond and ceramic. The second contact type conditioning means may be any one of a brush, diamond and ceramic that have conditioning characteristics different from those of the first contact type conditioning means. More specifically, each of the first contact type conditioning means and the second contact type conditioning means may be a brush. In this case, the first contact type conditioning means and the second contact type conditioning means may adopt brushes that have length and hardness different from each other. In the case where the conditioner 6-800 does not include the jet nozzles 6-830, the conditioning liquid may be supplied from the internal supply line 6-506. It is a matter of course that the conditioner 6-800 may include three or more types of conditioning means. For example, the jet nozzles 6-830 and the brushes may be disposed in the grooves 6-825 shown in FIG. 59A.

B-4. Modified Example 4

In the case where the multiple jet nozzles 6-830*c* are disposed at different positions in the radial direction from each other as shown in FIG. 61, the multiple jet nozzles 6-830*c* may be configured such that the fluid jetting rates from the respective nozzles are different from each other. This configuration can achieve highly flexible conditioning. For example, the jet nozzles 6-830*c* disposed relatively outward in the radial direction are required to jet the pure water to areas having larger diameters than the jet nozzles 6-830c disposed relatively inward are, and therefore cover larger areas to be conditioned. In conformity with this configuration, the jet nozzles 6-830c disposed outward are set to have higher jetting rates than the jet nozzles 6-830c disposed inward. This setting can balance the distribution of flow rates per area of pure water colliding with the buff pad 6-502. Alternatively, in the case where brushes (e.g., brushes 6-830a shown in FIG. 59C) having a lower conditioning performance than pure water jetting has are provided inward with respect to the radial direction in addition to the jet nozzles 6-830c, the jet nozzles 6-830c disposed inward may have higher jetting rates than the jet nozzles 6-830c disposed outward have, in order to complement conditioning by the brushes. Thus, it can be appropriately set which side jet nozzles 6-830c in the radial direction have relatively higher jetting rates. Jetting flow rate control may be achieved, for example, by adjusting the diameters of the jetting holes of the jet nozzles 6-830c.

B-5. Modified Example 5

Instead of the configuration where the buff head 6-500 moves from the buff table 6-400 in the horizontal direction (a direction orthogonal to the direction of gravitational force) to a position below the conditioner 6-800, a configuration may be adopted where the conditioner 6-800 moves in the horizontal direction to a position below the buff head 6-500. In this case, it is preferred that conditioning be performed after the wafer W be conveyed from the buff table 6-400, in order to prevent substances removed by the conditioner from being dispersed on the wafer W. Alternatively, a configuration may be adopted where both the buff head 6-500 and the conditioner 6-800 move to predetermined conditioning positions. In this case, it is preferred that the conditioning positions be outside of the buff table 6-400.

B-6. Modified Example 6

The buff table 6-400 may be configured so as to hold the wafer W to face any direction. For example, the buff table 6-400 may be configured so as to hold the wafer W to face the direction opposite to that of the above exemplary embodiment. That is, instead of the configuration where the buff table 6-400 holds the wafer W such that the normal of the processing target surface of the wafer W extending from this processing target surface in the direction away from the buff table 6-400 is oriented upward in the direction of gravitational force, a configuration may be adopted where the buff table 6-400 holds the wafer W such that the normal is oriented downward in the vertical direction. Alternatively, the buff table 6-400 may be configured such that the normal of the processing target surface of the wafer W extending from this the processing target surface in the direction away from the buff table 6-400 is oriented in the horizontal direction (a direction orthogonal to the direction of gravitational force). In these cases, the conditioner 6-800 may be oriented such that the processing surface of the conditioner 6-800 is oriented in the direction facing the processing surface of the buff pad 6-502.

B-7. Modified Example 7

The buff process modules 6-300A and 6-300B do not necessarily have the configuration included in the cleaning unit 6-4. Alternatively, these modules may be included in the polishing unit 6-3.

The embodiments of the present invention have been described above on the basis of the exemplary embodiments with reference to FIGS. 54 to 62. The embodiments of the present invention are for facilitating understanding of the present invention, but is not for limit the present invention. The present invention can be modified and improved without departing from the spirit of the invention. Furthermore, it is a matter of course that the present invention encompasses the equivalents of the invention. Within a scope of capable of solving at least a part of the aforementioned problems or a scope of exerting at least a part of the advantageous effects, any combination and omission of the configuration components described in the claims and specifications are allowed.

REFERENCE SIGNS LIST

1-300A Buff process module
1-400 Buff table
1-402 Support surface
1-404 Opening
1-410 Fluid passage
1-450 Stage film
1-480 Lift pin
1-500 Buff head
1-502 Buff pad
1-600 Buff arm
1-650 Cleaning arm
1-652 Cleaning head
1-654 Cleaning member
1-656 Roll sponge
1-680 Atomizer cleaner
1-682 Ultrasonic cleaner
1-684 Cavitation jet cleaner
1-710 Pure water nozzle
1-714 Pure water supply source
1-720 First chemical solution nozzle
1-720-2 Second chemical solution nozzle
1-724 First chemical solution supply source
1-724-2 Second chemical solution supply source
3-300 Buff process chamber
3-400 Buff table
3-500 Buff head
3-502 Buff pad
3-503 Liquid outlet
3-600 Buff arm
3-601 Rotating shaft
3-800 Conditioner
3-810 Dressing table
3-820, 3-820A, 3-820B Dresser
3-821A, 3-821B Dresser groove
3-910 Buff head cover
3-960 Brush-cleaning mechanism
3-961 Brush section
3-963 Main body
3-965 Liquid passage
3-967 Liquid jet orifice
3-970 Base
3-1000 Substrate processing apparatus
4-300 Buff process chamber
4-400 Buff table
4-500 Buff head
4-502 Buff pad
4-600 Buff arm
4-601 Rotating shaft
4-800 Conditioner
4-810 Dressing table 4-820 Dresser
4-830 Buff pad cleaning mechanism
4-840 Dresser cleaning mechanism
4-910 Buff head cover
4-920 Fixed cover
4-921 Notch
4-950, 4-951A, 4-951B Atomizer (Cleaning mechanism)
4-951*a* Rotating shaft of atomizer
4-951*b* Cylinder
4-953 Dead space
4-955 Cover
4-1000 Substrate processing apparatus
5-300 Buff process chamber
5-400 Buff table
5-500 Buff head
5-502 Buff pad
5-600 Buff arm
5-601 Rotating shaft
5-800 Conditioner
5-810 Dressing table
5-820 Dresser
5-830 Buff pad cleaning mechanism
5-840 Dresser cleaning mechanism
5-850 Dresser cover
5-851 Inclined section
5-853 Cylinder
5-860 Dresser cover
5-861 Notch
5-861*a* Lower end of notch
5-870 Dresser cover
5-871 Notch
5-873 Movable cover member
5-880 Dresser cover
5-891 Air curtain forming mechanism
5-891*a* Air curtain
5-893 Locally exhausted state forming mechanism
5-893*a* Locally exhausted state
5-893*b* Sucking inlet
5-895 Descending air current generating mechanism
5-895*a* Descending air current
5-900 Buff table cover
5-910 Buff head cover
5-920 Fixed cover
5-921 Notch
5-1000 Substrate processing apparatus
6-1 Housing
6-2 Load/unload unit
6-1*a*, 6-1*b* Partition
6-3, 6-3A, 6-3B, 6-3C, 6-3D Polishing unit
6-4 Cleaning unit
6-5 Control device
6-6, 6-7 Linear transporter
6-10 Polishing pad
6-11 Lifter
6-12 Swing transporter
6-20 Front loader
6-21 Traveling mechanism
6-22 Conveyor robot
6-30A, 6-30B, 6-30C, 6-30D Polishing table
6-31A, 6-31B, 6-31C, 6-31D Top ring
6-32A, 6-32B, 6-32C, 6-32D Polishing liquid supply nozzle
6-33A, 6-33B, 6-33C, 6-33D Dresser
6-34A, 6-34B, 6-34C, 6-34D Atomizer
6-36 Top ring shaft
6-180 Temporary stage
6-190 Roll cleaning chamber
6-191 First conveyance chamber
6-192 Pen cleaning chamber
6-193 Second conveyance chamber
6-194 Drying chamber
6-195 Third conveyance chamber
6-201A, 6-201B Roll cleaning module
6-202A, 6-202B Pen cleaning module
6-203, 6-204 Temporary stage
6-205A, 6-205B Drying module
6-207 Filter-fan unit
6-209, 6-210, 6-213 Conveyor robot
6-211 Support shaft
6-300 Buff process chamber
6-300A, 6-300B Buff process module
6-400 Buff table
6-500 Buff head
6-502 Buff pad
6-504 Shaft
6-506 Internal supply line
6-580 Conditioner
6-600 Buff arm
6-700 Liquid supply system
6-710 Pure water external nozzle
6-712 Pure water piping
6-712*a* Branched pure water piping
6-714 Pure water supply source
6-716 On-off valve
6-718 On-off valve
6-720 Chemical solution external nozzle
6-722 Chemical solution piping
6-722*a* Branched chemical solution piping
6-724 Chemical solution supply source
6-726 On-off valve
6-728 On-off valve
6-730 Slurry external nozzle
6-732 Slurry piping
6-732*a* Branched slurry piping
6-734 Slurry supply source
6-736 On-off valve
6-740 Liquid supply piping
6-800, 6-800*a*, 6-800*b*, 6-800*c* Conditioner
6-810, 6-810*a* Base plate
6-811 Water jacket
6-820, 6-820*b* Dresser
6-821 to 6-824 Dresser block
6-825 Groove
6-825*b* Through-hole
6-826*b* Groove
6-830 Jet nozzle
6-830*a* Brush
6-830*c* Jet nozzle
6-1000 Substrate processing apparatus
L Center of swing of buff arm
W Wafer

What is claimed is:

1. An apparatus for buff-processing a processing target object, comprising:
a buff table that includes a support surface for supporting the processing target object;
a nozzle for supplying the support surface with a chemical solution for cleaning the support surface of the buff table; and
a buff head to which a buff pad for buff-processing the processing target object through physical contact is attached, wherein a cleaning member including a brush or a sponge member for cleaning the support surface of the buff table through physical contact is attached to the buff head, wherein the buff pad attached to the buff head and the cleaning member attached to the buff head are configured to independently ascend and descend relative to each other, and wherein the cleaning member protrudes with respect to the buff pad when cleaning the support surface of the buff table;

wherein the buff table includes a fluid passage that extends to the support surface and is for supplying a fluid to the support surface through the buff table while the support surface of the buff table is cleaned, wherein the fluid passage is connected to a pure water and/or chemical solution supply source, and wherein the fluid passage is configured to be communicable with a vacuum source for causing the processing target object to be vacuum-sucked onto the support surface while the processing target object is buff-processed.

2. The apparatus for buff-processing according to claim 1, wherein the buff table includes a stage film, and a surface of the stage film serves as the support surface for supporting the processing target object.

3. The apparatus for buff-processing according to claim 1, wherein the nozzle is configured such that a direction of the nozzle can be changed in a plane of the buff table.

4. The apparatus for buff-processing according to claim 1, wherein the nozzle is configured such that a direction of the nozzle can be changed in a plane perpendicular to a plane of the buff table.

5. The apparatus for buff-processing according to claim 1, wherein the nozzle is configured such that a position of the nozzle can be changed in a direction perpendicular to a plane of the buff table.

6. The apparatus for buff-processing according to claim 1, further including a fluid passage for supplying a fluid to the support surface through the buff head and the buff pad.

7. The apparatus for buff-processing according to claim 1, further including a roll sponge member configured to clean the support surface of the buff table through physical contact by rotating on the buff table.

8. The apparatus for buff-processing according to claim 1, further including at least one of an atomizer cleaner, an ultrasonic cleaner, and a cavitation jet cleaner for cleaning the support surface of the buff table.

9. The apparatus for buff-processing according to claim 1, wherein the buff table includes a conveyor mechanism for conveying the processing target object to and/or from the buff table, and the apparatus is configured such that the conveyor mechanism is cleaned while the support surface is cleaned.

* * * * *